United States Patent
Lee et al.

(10) Patent No.: US 9,917,257 B2
(45) Date of Patent: Mar. 13, 2018

(54) ORGANIC ELECTRONIC ELEMENT AND AN ELECTRONIC DEVICE COMPRISING IT

(71) Applicant: DUK SAN NEOLUX CO., LTD., Cheonan-si, Chungcheongnam-do (KR)

(72) Inventors: Bumsung Lee, Cheonan-si (KR); Sunhee Lee, Hwaseong-si (KR); Soungyun Mun, Cheonan-si (KR); Daesung Kim, Yongin-si (KR); Jungcheol Park, Suwon-si (KR); Yunsuk Lee, Seongnam-si (KR); Seungwon Yeo, Daejeon (KR); Junghwan Park, Hwaseong-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 321 days.

(21) Appl. No.: 14/808,058

(22) Filed: Jul. 24, 2015

(65) Prior Publication Data

US 2016/0028020 A1 Jan. 28, 2016

(30) Foreign Application Priority Data

Jul. 24, 2014 (KR) .................. 10-2014-0093922
May 14, 2015 (KR) .................. 10-2015-0067007

(51) Int. Cl.
| | | |
|---|---|---|
| H01L 51/00 | (2006.01) | |
| H01L 27/32 | (2006.01) | |
| H01L 51/50 | (2006.01) | |

(52) U.S. Cl.
CPC ...... *H01L 51/0061* (2013.01); *H01L 51/0059* (2013.01); *H01L 51/0071* (2013.01); *H01L 51/0072* (2013.01); *H01L 51/0074* (2013.01); *H01L 51/0081* (2013.01); *H01L 51/0085* (2013.01); *H01L 51/5096* (2013.01); *Y02E 10/549* (2013.01)

(58) Field of Classification Search
CPC ............. H01L 51/0059; H01L 51/0061; H01L 51/0071; H01L 51/0072; H01L 51/0074; H01L 51/0081; H01L 51/0085; H01L 51/5096; Y02E 10/549
See application file for complete search history.

(56) References Cited

U.S. PATENT DOCUMENTS

| | | | |
|---|---|---|---|
| 9,102,616 B2 * | 8/2015 | Kim ................. | C07D 209/80 |
| 2012/0217492 A1 | 8/2012 | Kim et al. | |

FOREIGN PATENT DOCUMENTS

| | | |
|---|---|---|
| JP | 2010-59147 A | 3/2010 |
| KR | 10-2011-0066766 A | 6/2011 |
| KR | 10-2011-0117549 A | 10/2011 |
| KR | 10-2014-0006708 A | 1/2014 |
| KR | 10-2014-0043224 A | 4/2014 |

OTHER PUBLICATIONS

Japanese Office Action for JP Application No. 2015-146433, dated Aug. 16, 2016, four pages.

* cited by examiner

*Primary Examiner* — Dawn Garrett
(74) *Attorney, Agent, or Firm* — Vorys, Sater, Seymour & Pease LLP; Mih Suhn Koh

(57) ABSTRACT

Disclosed is an organic electric element comprising a first electrode, a second electrode, and an organic material layer between the first electrode and the second electrode, wherein the organic material layer comprises the compound of Formula 1 and Formula 2 to improve driving voltage, luminous efficiency, color purity, and life span.

13 Claims, 1 Drawing Sheet

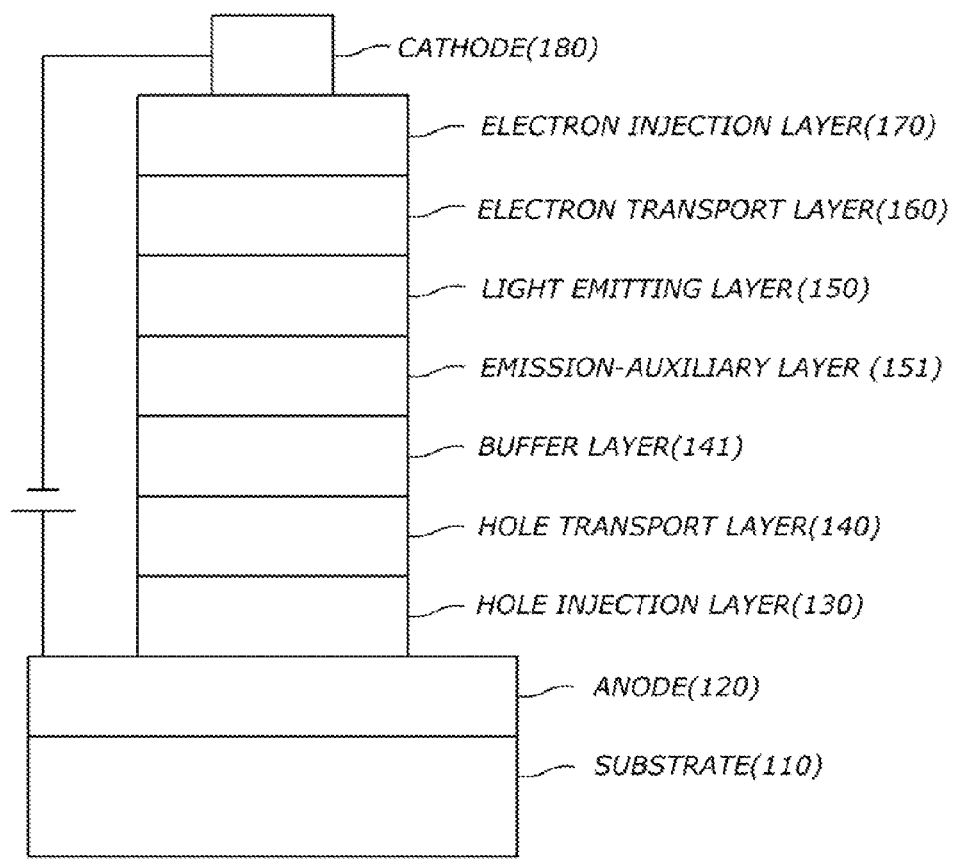

ORGANIC ELECTRONIC ELEMENT AND AN ELECTRONIC DEVICE COMPRISING IT

BACKGROUND

Technical Field

The present invention relates to organic electric elements, and electronic devices comprising the same.

Background Art

In general, an organic light emitting phenomenon refers to a phenomenon in which electric energy is converted into light energy of an organic material. An organic electric element utilizing the organic light emitting phenomenon usually has a structure including an anode, a cathode, and an organic material layer interposed therebetween. Here, in many cases, the organic material layer may have a multi-layered structure including multiple layers made of different materials in order to improve the efficiency and stability of an organic electric element, and for example, may include a hole injection layer, a hole transport layer, a light emitting layer, an electron transport layer, an electron injection layer, and the like.

A material used as an organic material layer in an organic electric element may be classified into a light emitting material and a charge transport material, for example, a hole injection material, a hole transport material, an electron transport material, an electron injection material, and the like according to its function. Further, the light emitting material may be divided into a high molecular weight type and a low molecular weight type according to its molecular weight, and may also be divided into a fluorescent material derived from electronic excited singlet states and a phosphorescent material derived from electronic excited triplet states according to its light emitting mechanism. Further, the light emitting material may be divided into blue, green, and red light emitting materials, and yellow and orange light emitting materials required for better natural color reproduction according to its light emitting color.

Meanwhile, when only one material is used as a light emitting material, there occur problems of shift of a maximum luminescence wavelength to a longer wavelength due to intermolecular interactions and lowering of the efficiency of a corresponding element due to a deterioration in color purity or a reduction in luminous efficiency. On account of this, a host/dopant system may be used as the light emitting material in order to enhance the color purity and increase the luminous efficiency through energy transfer. This is based on the principle that if a small amount of dopant having a smaller energy band gap than a host forming a light emitting layer is mixed in the light emitting layer, then excitons generated in the light emitting layer are transported to the dopant, thus emitting light with high efficiency. With regard to this, since the wavelength of the host is shifted to the wavelength band of the dopant, light having a desired wavelength can be obtained according the type of the dopant.

Currently, the power consumption is required more than more as size of display becomes larger and larger in the portable display market. Therefore, the power consumption is a very important factor in the portable display with a limited power source of the battery, and efficiency and life span issue also is solved.

Efficiency, life span, driving voltage, and the like are correlated with each other. For example, if efficiency is increased, then driving voltage is relatively lowered, and the crystallization of an organic material due to Joule heating generated during operation is reduced as driving voltage is lowered, as a result of which life span shows a tendency to increase. However, efficiency cannot be maximized only by simply improving the organic material layer. This is because long life span and high efficiency can be simultaneously achieved when an optimal combination of energy levels and T1 values, inherent material properties (mobility, interfacial properties, etc.), and the like among the respective layers included in the organic material layer is given.

Therefore it is required to develop a light emitting material that has high thermal stability and can achieve efficiently a charge balance in the light-emitting layer. In order to allow an organic electric element to fully exhibit the above-mentioned excellent features, it should be prerequisite to support a material constituting an organic material layer in the element, for example, a hole injection material, a hole transport material, a light emitting material, an electron transport material, an electron injection material, or the like, by a stable and efficient material. However, such a stable and efficient organic material layer material for an organic electric element has not yet been fully developed. Accordingly, there is a continuous need to develop new material of the emission-auxiliary layer, material of the hole transport layer, and host materials for an organic material layer.

SUMMARY

In order to solve one or more of the above-mentioned problems occurring in the prior art, an aspect of the present invention is to provide an organic electric element which has improved luminous efficiency, color purity, life span, and driving voltage, and an electronic device including the organic electric element.

In accordance with an aspect of the present invention, there is provided an organic electric element comprising at least one layer of the emission-auxiliary layer and the hole transport layer comprising a compound represented by Formula 1 below, singly or as a mixture of two or more, and the light emitting layer comprising a compound, represented by Formula 2 below, singly or as a mixture of two or more.

[Formula 1]

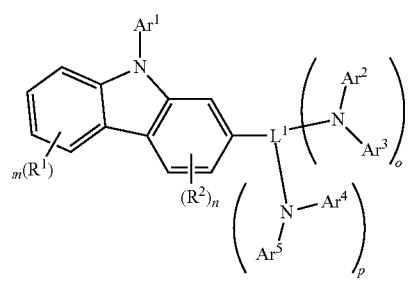

[Formula 2]

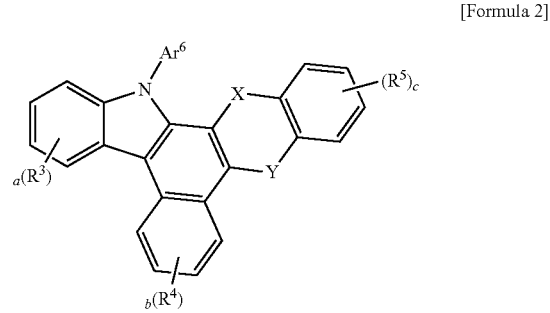

In another aspect of the present invention, there are provided an electronic device including the organic electric element.

An organic electric element according to one or more embodiments of the present invention not only has low driving voltage and, but can also be significantly improved in luminous efficiency, color purity, and life span.

BRIEF DESCRIPTION OF THE DRAWINGS

The FIGURE illustrates an example of an organic light emitting diode according to an embodiment of the present invention.

DETAILED DESCRIPTION

Hereinafter, some embodiments of the present invention will be described in detail with reference to the accompanying illustrative drawings.

In designation of reference numerals to components in respective drawings, it should be noted that the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

As used in the specification and the accompanying claims, unless otherwise stated, the following is the meaning of the term as follows.

Unless otherwise stated, the term "halo" or "halogen" as used herein includes fluorine, chlorine, bromine, or iodine.

Unless otherwise stated, the term "alkyl" or "alkyl group" as used herein has a single bond of 1 to 60 carbon atoms, and means aliphatic functional radicals including a linear alkyl group, a branched chain alkyl group, a cycloalkyl group (alicyclic), or an alkyl group substituted with a cycloalkyl.

Unless otherwise stated, the term "haloalkyl" or "halogen alkyl" as used herein includes an alkyl group substituted with a halogen.

Unless otherwise stated, the term "alkenyl" or "alkynyl" as used herein has, but not limited to, double or triple bonds of 2 to 60 carbon atoms, and includes a linear alkyl group, or a branched chain alkyl group, Unless otherwise stated, the term "cycloalkyl" as used herein means, but not limited to, alkyl forming a ring having 3 to 60 carbon atoms.

The term "alkoxyl group", "alkoxy group" or "alkyloxy group" as used herein means an oxygen radical attached to an alkyl group, but not limited to, and has 1 to 60 carbon atoms.

The term "aryloxyl group" or "aryloxy group" as used herein means an oxygen radical attached to an aryl group, but not limited to, and has 6 to 60 carbon atoms.

Unless otherwise stated, the term "fluorenyl group" or "fluorenylene group" as used herein means, univalent or bivalent functional group which R, R' and R" are all hydrogen in the structural formula below. Also, "substituted fluorenyl group" or "substituted fluorenylene group" means, functional group which at least any one of R, R' and R" is a functional group other than hydrogen and spiro compound which R and R' can be linked together with the carbon to which they are attached to form spiro compound.

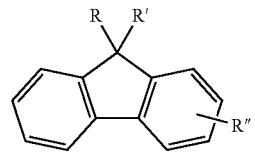

Unless otherwise stated, the term "aryl group" or "arylene group" as used herein has, but not limited to, 6 to 60 carbon atoms. The aryl group or arylene group means a monocyclic, ring assemblies, fused polycyclic system or spiro compound.

Unless otherwise stated, the term "heterocyclic group" as used herein means, but not limited to, a non-aromatic ring as well as an aromatic ring like "heteroaryl group" or "heteroarylene group". The heterocyclic group as used herein means, but not limited to, a ring containing one or more heteroatoms, and having 2 to 60 carbon atoms.

Unless otherwise stated, the term "heteroatom" as used herein represents at least one of N, O, S, P, and Si. The heterocyclic group means a monocyclic, ring assemblies, fused polycyclic system or spiro compound containing one or more heteroatoms.

Also, the term "heterocyclic group" may include $SO_2$ instead of carbon consisting of cycle. For example, "heterocyclic group" includes compound below.

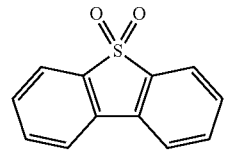 [SMILES: O=S1(=O)c2ccccc2-c2ccccc21]

Univalent or bivalent functional group as used herein is named a functional group name or writing the valence in front of the parent compound. For example, "bivalent benzothiophene" means a divalent functional group of the parent compound benzothiophene, similarly, "bivalent dibenzothiophene" means a divalent functional group of the parent compound dibenzothiophene, "bivalent furan" means a divalent functional group of the parent compound furan, "bivalent dibenzofuran" means a divalent functional group of the parent compound dibenzofura, and "bivalent pyrimidine" means a divalent functional group of the parent compound pyrimidine.

Unless otherwise stated, the term "ring" as used herein means, a monocyclic and polycyclic, an aliphatic ring and heterocyclic group containing at least one heteroatom, and an aromatic ring and a non-aromatic ring.

Unless otherwise stated, the term "polycyclic" as used herein means, ring assemblies like biphenyl and terphenyl, fused polycyclic system and spiro compound, an aromatic ring and a non-aromatic ring, and an aliphatic ring and heterocyclic group containing at least one heteroatom.

Unless otherwise stated, the term "ring assemblies" as used herein means, two or more cyclic systems (single rings or fused systems) which are directly joined to each other by double or single bonds are named ring assemblies when the number of such direct ring junctions is one less than the number of cyclic systems involved. The ring assemblies also mean, same or different ring systems are directly joined to each other by double or single bonds.

Unless otherwise stated, the term "fused polycyclic system" as used herein means, fused ring type which has at least two atoms as the common members, fused two or more aliphatic ring systems and a fuesd hetero ring system containing at least one heteroatom. fused polycyclic system is an aromatic ring, a hetero aromatic ring, an aliphatic ring, or the combination of these.

Unless otherwise stated, the term "spiro compound" as used herein has, a spiro union which means union having one atom as the only common member of two rings. The common atom is designated as 'spiro atom'. The compounds are defined as 'monospiro-', 'dispiro-' or 'trispiro-' depending on the number of spiro atoms in one compound.

The prefix "aryl" or "ar" means a radical substituted with an aryl group. For example, an arylalkyl may be an alkyl substituted with an aryl, and an arylalenyl may be an alkenyl substituted with aryl, and a radical substituted with an aryl has a number of carbon atoms as defined herein.

Unless otherwise stated, the term "substituted or unsubstituted" as used herein means that substitution is carried out by at least one substituent selected from the group consisting of, but not limited to, deuterium, halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthio group, a $C_6$-$C_{20}$ arylthio group, a $C_2$-$C_{20}$ alkenyl group, a $C_2$-$C_{20}$ alkynyl group, a $C_3$-$C_{20}$ cycloalkyl group, a $C_6$-$C_{60}$ aryl group, a $C_6$-$C_{20}$ aryl group substituted by deuterium, a $C_8$-$C_{20}$ arylalkenyl group, a silane group, a boron group, a germanium group, and a $C_5$-$C_{20}$ heterocyclic group.

Otherwise specified, the Formulas used in the present invention are as defined in the index definition of the substituent of the following Formula.

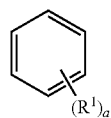

Wherein, when a is an integer of zero, the substituent $R^1$ is absent, when a is an integer of 1, the sole $R^1$ is linked to any one of the carbon atoms constituting the benzene ring, when a is an integer of 2 or 3, the substituent $R^1$s may be the same and different, and are linked to the benzene ring as follows. when a is an integer of 4 to 6, the substituents $R^1$s may be the same and different, and are linked to the benzene ring in a similar manner to that when a is an integer of 2 or 3, hydrogen atoms linked to carbon constituents of the benzene ring being not represented as usual.

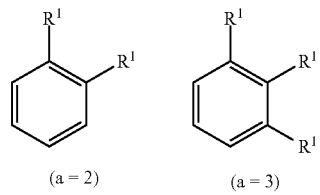

The FIGURE illustrates an organic electric element according to an embodiment of the present invention.

Referring to the FIGURE, an organic electric element 100 according to an embodiment of the present invention includes a first electrode 120 formed on a substrate 110, a second electrode 180, and an organic material layer between the first electrode 120 and the second electrode 180, which contains the inventive compound. Here, the first electrode 120 may be an anode (positive electrode), and the second electrode 180 may be a cathode (negative electrode). In the case of an inverted organic electric element, the first electrode may be a cathode, and the second electrode may be an anode.

The organic material layer includes a hole injection layer 130, a hole transport layer 140, a light emitting layer 150, an electron transport layer 160, and an electron injection layer 170 formed in sequence on the first electrode 120. Here, the layers included in the organic material layer, except the light emitting layer 150, may not be formed. The organic material layer may further include a hole blocking layer, an electron blocking layer, an emission-auxiliary layer 151, a buffer layer 141, etc., and the electron transport layer 160 and the like may serve as the hole blocking layer.

Although not shown, the organic electric element according to an embodiment of the present invention may further include at least one protective layer or one capping layer formed on at least one of the sides the first and second electrodes, which is a side opposite to the organic material layer.

The inventive compound employed in the organic material layer may be used as materials in the hole injection layer 130, the hole transport layer 140, the electron transport layer 160, the electron injection layer 170, the light emitting layer 150, the capping layer, or the emission-auxiliary layer 151. For example, the inventive compound may be used as the hole transport layer 140, the emission-auxiliary layer 151, and/or the light emitting layer 150.

The organic electric element according to an embodiment of the present invention may be manufactured using various deposition methods. The organic electric element according to an embodiment of the present invention may be manufactured using a PVD (physical vapor deposition) method or CVD (chemical vapor deposition) method. For example, the organic electric element may be manufactured by depositing a metal, a conductive metal oxide, or a mixture thereof on the substrate 110 to form the anode 120, forming the organic material layer including the hole injection layer 130, the hole transport layer 140, the light emitting layer 150, the electron transport layer 160, and the electron injection layer 170 thereon, and then depositing a material, which can be used as the cathode 180, thereon.

Also, the organic material layer may be manufactured in such a manner that a smaller number of layers are formed using various polymer materials by a soluble process or solvent process, for example, spin coating, dip coating, doctor blading, screen printing, inkjet printing, or thermal transfer, instead of deposition. Since the organic material layer according to the present invention may be formed in various ways, the scope of protection of the present invention is not limited by a method of forming the organic material layer.

According to used materials, the organic electric element according to an embodiment of the present invention may be of a top emission type, a bottom emission type, or a dual emission type.

A WOLED (White Organic Light Emitting Device) readily allows for the formation of ultra-high definition images, and is of excellent processability as well as enjoying the advantage of being produced using conventional color filter technologies for LCDs. In this regard, various structures for WOLEDs, used as back light units, have been, in the most part, suggested and patented. Representative among the structures are a parallel side-by-side arrangement of R(Red), G(Green), B(Blue) light-emitting units, a vertical stack arrangement of RGB light-emitting units, and a CCM (color conversion material) structure in which electroluminescence from a blue (B) organic light emitting layer, and photoluminescence from an inorganic luminescent using the electroluminescence are combined. The present invention is applicable to these WOLEDs.

Further, the organic electric element according to an embodiment of the present invention may be any one of an organic light emitting diode (OLED), an organic solar cell, an organic photo conductor (OPC), an organic transistor (organic TFT), and an element for monochromatic or white illumination.

Another embodiment of the present invention provides an electronic device including a display device, which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

Hereinafter, an organic electric element according to an aspect of the present invention will be described.

In accordance with an aspect of the present invention, there is provided an organic electric element comprising a first electrode, a second electrode, and an organic material layer formed between the first electrode and the second electrode, the organic material layer comprising a light emitting layer, an emission-auxiliary layer formed between the first electrode and the light emitting layer, and a hole transport layer formed between the first electrode and the emission-auxiliary layer.

At least one layer of the emission-auxiliary layer and the hole transport layer comprising a compound represented by Formula 1 below, singly or as a mixture of two or more, and the light emitting layer comprising a compound, represented by Formula 2 below, singly or as a mixture of two or more.

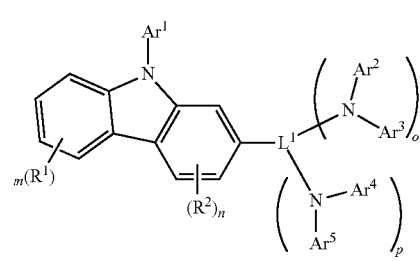

[Formula 1]

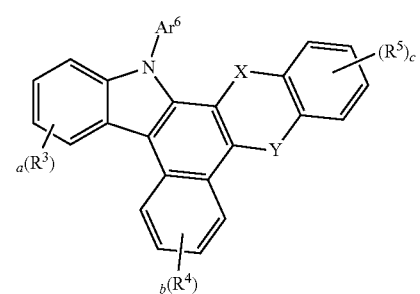

[Formula 2]

In Formulae 1 and 2, each symbol may be defined as follows.

$Ar^1$ to $Ar^6$ are independently selected from the group consisting of a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N($R^a$) ($R^b$). o and p are each an integer of 0 or 1, with the proviso that at least one of o and p is 1. In other words, o+p is an integer of 0 or 1.

Preferably, at least one of $Ar^2$ to $Ar^5$ may be $C_2$-$C_{60}$ heterocyclic group.

Also, preferably, $Ar^1$ to $Ar^5$ may be $C_6$-$C_{18}$ aryl group, a fluorenyl group, $C_3$-$C_{16}$ heterocyclic group or the combination of them, etc. Also preferably, $Ar^1$ to $Ar^5$ may be $C_6$, $C_{10}$, $C_{12}$, $C_{18}$ aryl group, $C_3$, $C_4$, $C_5$, $C_7$, $C_8$, $C_{10}$, $C_{12}$, $C_{16}$ heterocyclic group. Specifically, $Ar^1$ to $Ar^5$ may be a substituted with deuterium or unsubstituted phenyl group, a naphthyl group, a biphenylyl group, a substituted with deuterium or unsubstituted terphenyl group, a 9,9-dimethyl-9H-fluorenyl group, a 9,9-diphenyl-9H-fluorenyl group, a 9,9'-spirobifluorenyl group, a dibenzothienyl group, dibenzofuryl group, a substituted with substituents such as a phenyl, a naphthyl or biphenyl or unsubstituted carbazolyl group, a pyridyl group, a substituted with phenyl or unsubstituted pyrimidinyl group,

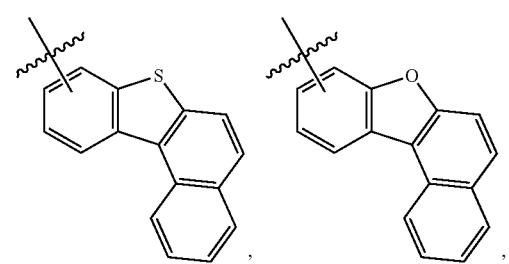

-continued

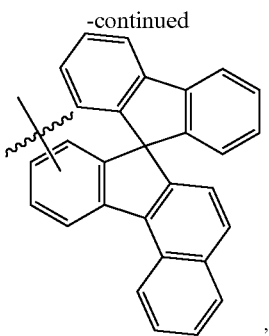

and so on.

Also, preferably, Ar⁶ may be a $C_6$ aryl group, a $C_3$-$C_{10}$ heterocyclic group or the combination of them, and so on. Specifically, Ar⁶ may be a phenyl, a pyridyl group, a pyrimidinyl group, a triazinyl group, a quinazolinyl group,

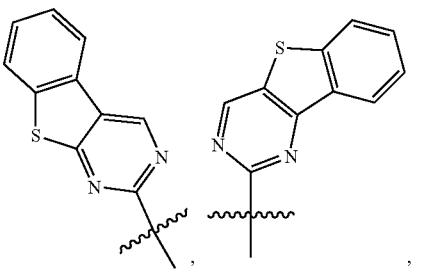

and so on, and each of them may be optionally substituted with substituents such as a phenyl, a naphthyl, a pyridyl group,

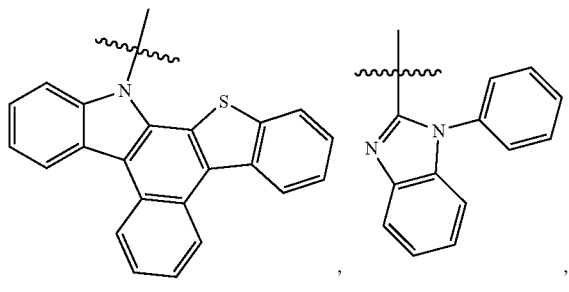

and so on.

Preferably, Ar¹ to Ar⁶ may be substituted by one or more substituents selected from the group consisting of deuterium, halogen, a silane group, a siloxane group, a boron group, a germanium group, a cyano group, a nitro group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted by deuterium, fluorenyl group, a $C_2$-$C_{20}$ heterocyclic group containing at least one heteroatom selected from the group consisting of O, N, S, Si, and P, a $C_3$-$C_{20}$ cycloalkyl group, a $C_7$-$C_{20}$ arylalkyl group, and a $C_8$-$C_{20}$ arylalkenyl group, an arylamine group and a heteroarylamine group.

R¹ to R⁵ may be independently selected from the group consisting of hydrogen, deuterium, halogen, a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N(R$^a$)(R$^b$). a, b, c, and m are each an integer from 1 to 4, and n is an integer from 1 to 3.

When a, b, c, m and n are each an integer of 2 or more, a plurality of R¹ to R⁵ may be the same or different from each other, and any two adjacent groups of R¹s to R⁵s are optionally linked together to form a ring. Here, the formed ring may be an aromatic ring or heteroaromatic ring, preferably, may be a $C_6$ aromatic ring, that is, a benzene ring, to form a naphthalene, phenanthrene, and so on, with the benzene ring to which they are attached.

Preferably, R¹ to R⁵ may be substituted by one or more substituents selected from the group consisting of deuterium, halogen, a silane group, a siloxane group, a boron group, a germanium group, a cyano group, a nitro group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted by deuterium, a fluorenyl group, a $C_2$-$C_{20}$ heterocyclic group, a $C_3$-$C_{20}$ cycloalkyl group, a $C_7$-$C_{20}$ arylalkyl group, and a $C_8$-$C_{20}$ arylalkenyl group, an arylamine group and a heteroarylamine group.

In Formulae 1, L¹ may be selected from the group consisting of a bivalent or trivalent $C_6$-$C_{60}$ aromatic hydrocarbons group, a bivalent or trivalent fluorene group, and a bivalent or trivalent $C_2$-$C_{60}$ heterocyclic group containing at least one heteroatom selected from the group consisting of O, N, S, Si, and P. Preferably, L¹ may be selected from the group consisting of a bivalent or trivalent $C_6$-$C_{12}$ aromatic hydrocarbons group, a bivalent or trivalent fluorene group, and a bivalent or trivalent $C_2$-$C_{12}$ heterocyclic group, specifically, a bivalent or trivalent and substituted with naphthyl or unsubstituted phenyl, biphenyl, pyridine, triazine, dibenzothiophe, 9,9-dimethyl-9H-fluorenyl group, and so on.

In formula 2, X and Y are independently selected from the group consisting of a single bond, S, O, N(R'), and C(R')(R''), but not all of X and Y is a single bond. In other words, X and Y are not a single bond at the same time. Here, R' and R'' are independently selected from the group consisting of hydrogen, a $C_6$-$C_{60}$ aryl group, a fluorenyl group, a $C_2$-$C_{60}$ heterocyclic group containing at least one heteroatom selected from the group consisting of O, N, S, Si, and P, and a $C_1$-$C_{50}$ alkyl group.

When Ar¹ to Ar⁶ and R¹ to R⁵ are -L'-N(R$^a$)(R$^b$), L' may be selected from the group consisting of a single bond, a $C_6$-$C_{60}$ arylene group, a fluorenylene group, a bivalent fused ring group of a $C_3$-$C_{60}$ aliphatic ring and a $C_6$-$C_{60}$ aromatic ring, and a bivalent $C_2$-$C_{60}$ heterocyclic group containing at least one heteroatom selected from the group consisting of O, N, S, Si, and P, and R$^a$ and R$^b$ may be independently selected from the group consisting of a $C_6$-$C_{60}$ aryl group, a fluorenyl group, a fused ring group of a $C_3$-$C_{60}$ aliphatic ring and a $C_6$-$C_{60}$ aromatic ring, and a $C_2$-$C_{60}$ heterocyclic group containing at least one heteroatom selected from the group consisting of O, N, S, Si, and P.

Meanwhile, when the above each symbol is a aryl group, fluorenyl group, fused ring group, heterocyclic group, alkyl group, alkenyl group, alkynyl group, alkoxy group, aryloxy group, arylene group, fluorenylene group, aromatic hydrocarbon group and fluorene group, each of them may be optionally substituted by one or more substituents selected from the group consisting of deuterium, halogen, a silane group, a siloxane group, a boron group, a germanium group, a cyano group, a nitro group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted by deuterium, a $C_2$-$C_{20}$ heterocyclic group containing at least one heteroatom selected from the group consisting of O, N, S, Si, and P, a $C_3$-$C_{20}$ cycloalkyl group, a $C_7$-$C_{20}$ arylalkyl group, a $C_8$-$C_{20}$ arylalkenyl group, an arylamine group and a heteroarylamine group.

The compound represented by Formula 1 above may be represented by Formula 3 or 4 below.

[Formula 3]

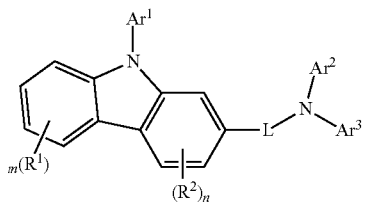

[Formula 4]

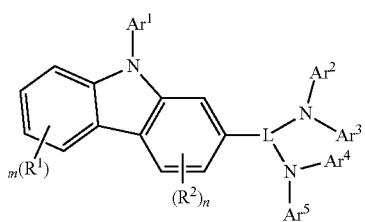

In Formulae 3 and 4, each symbol is defined as in Formula 1. For example, $Ar^1$ to $Ar^5$, L, $R^1$, $R^2$, m and n are defined as in Formula 1.

Specifically, the compound represented by Formulae 1, 3 and 4 above may be represented by one of compounds below.

P1-1

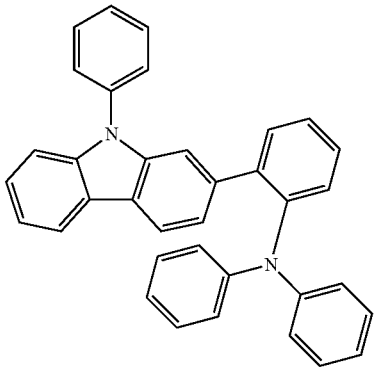

P1-2

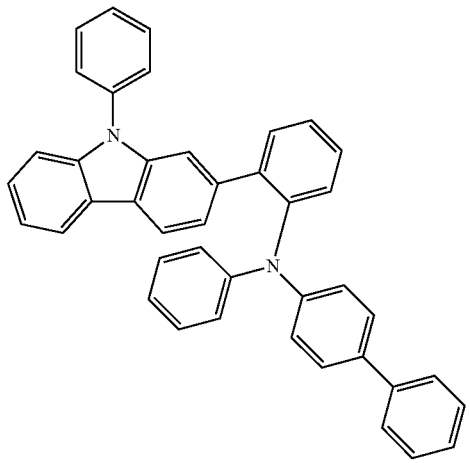

P1-3

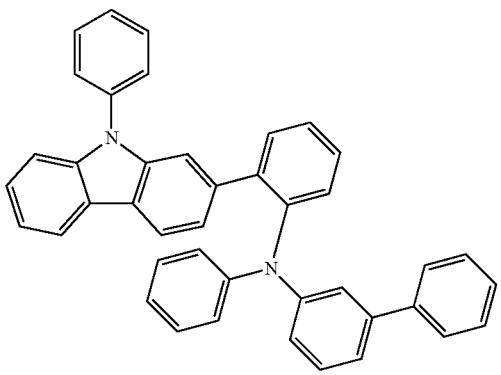

P1-4

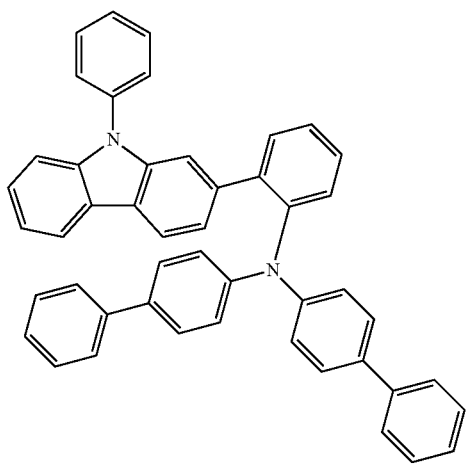

P1-5
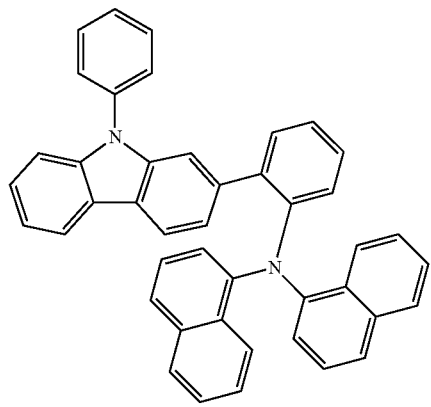
P1-6
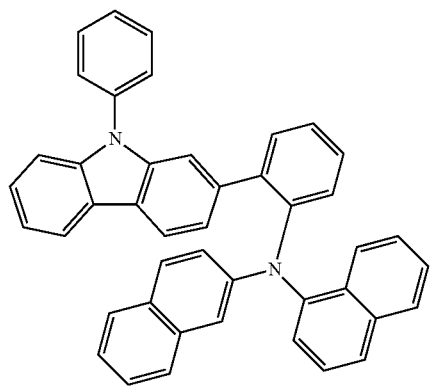
P1-7
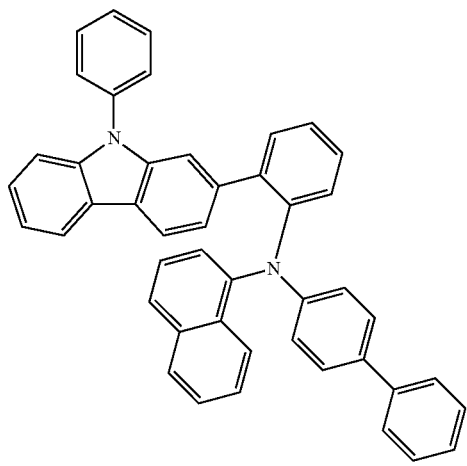
P1-8
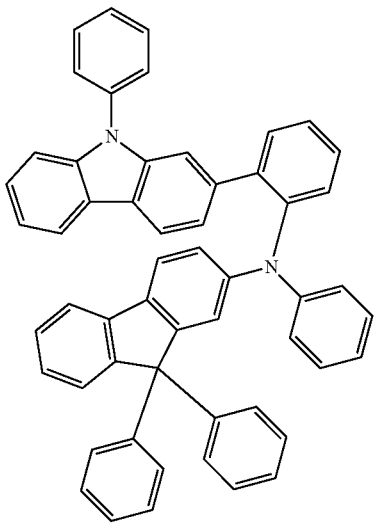
P1-9
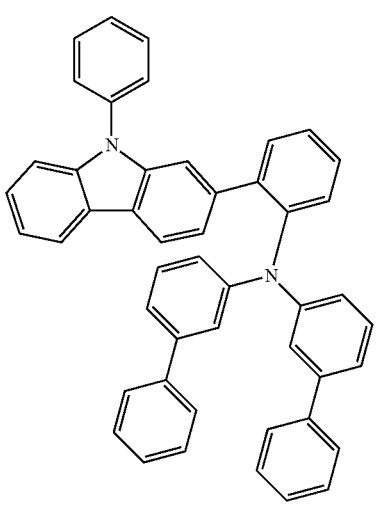
P1-10
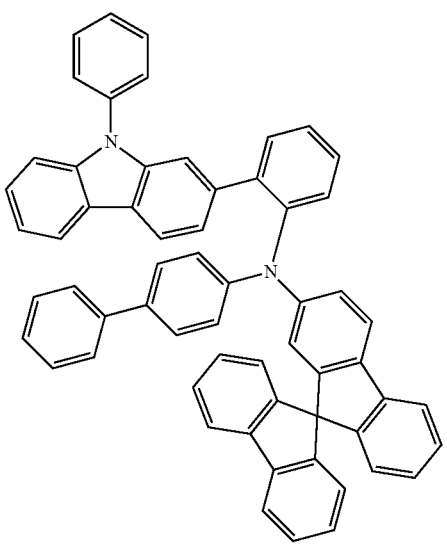

P1-11
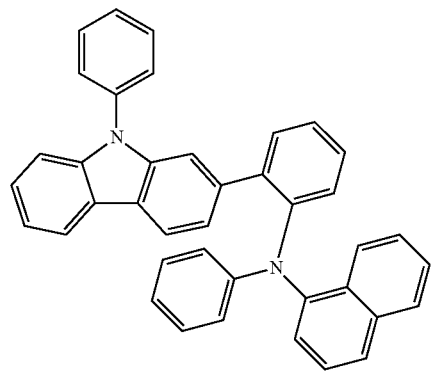
P1-12
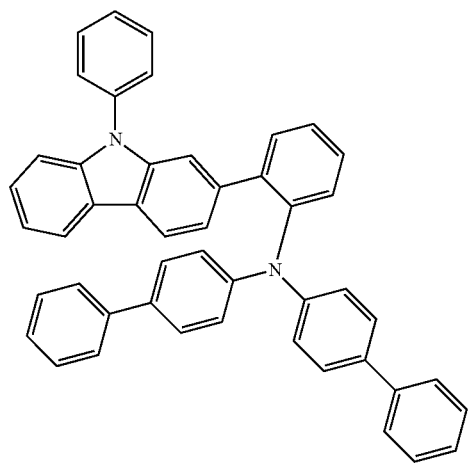
P1-13
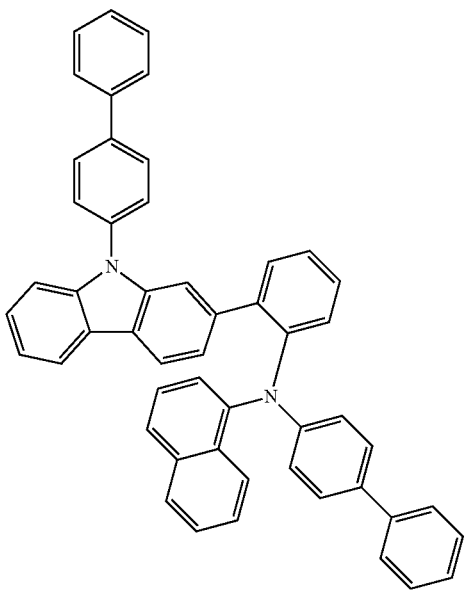
P1-14
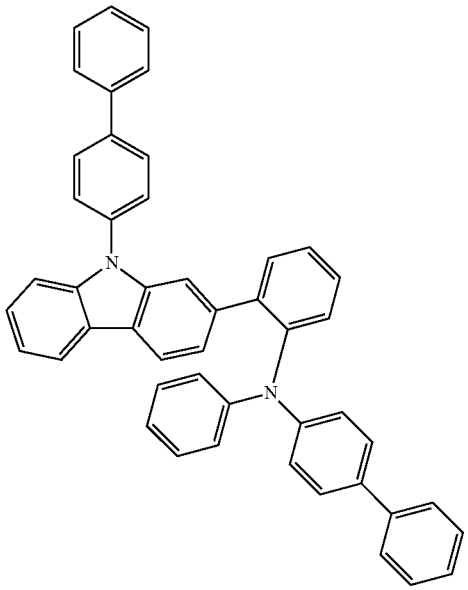
P1-15
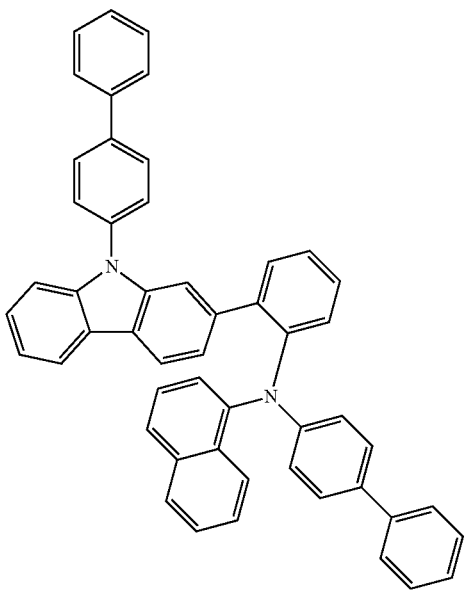

-continued
P1-16
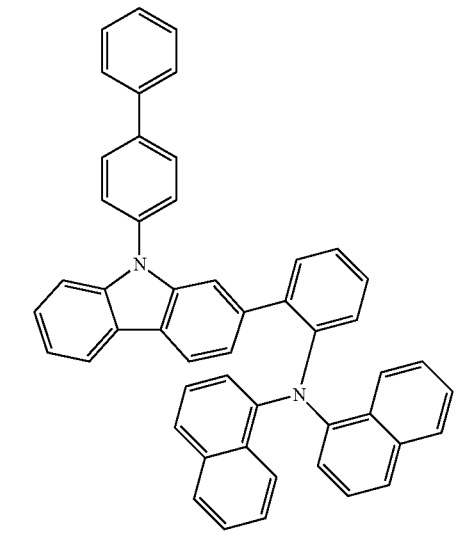
P1-17
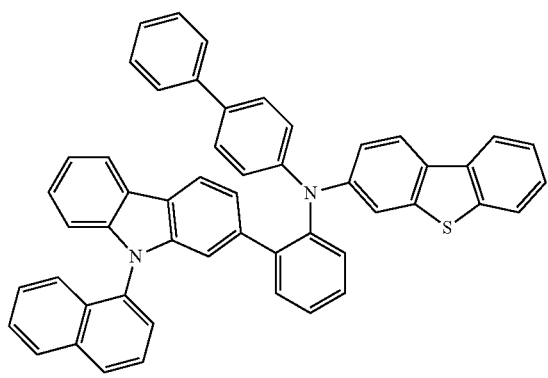
P1-18
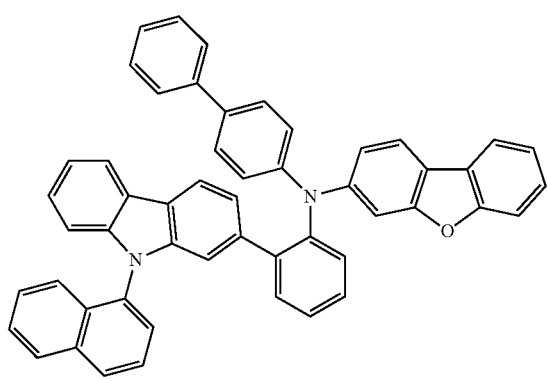
-continued
P1-19
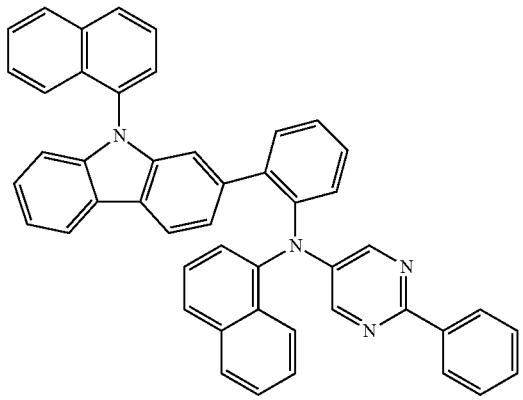
P1-20
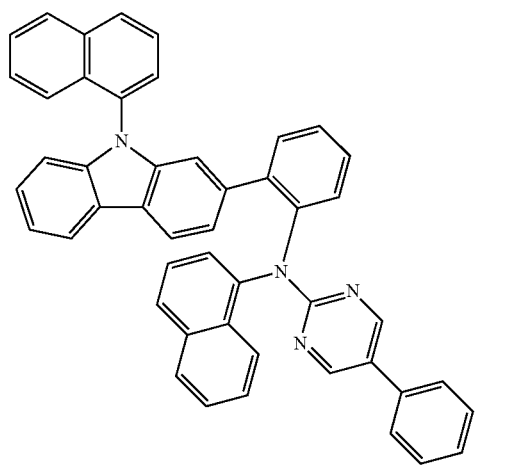
P1-21
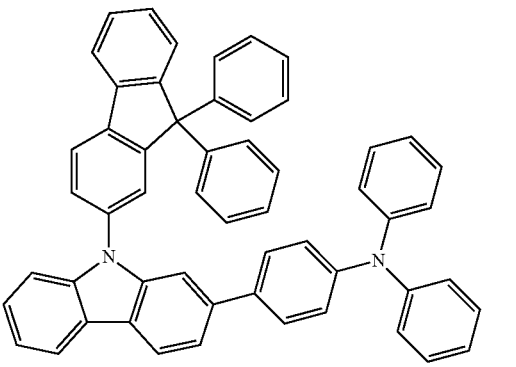
P1-22
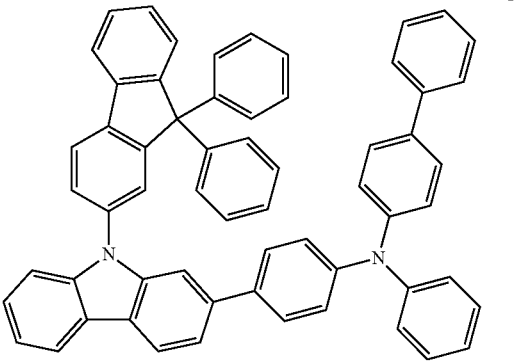

P1-23
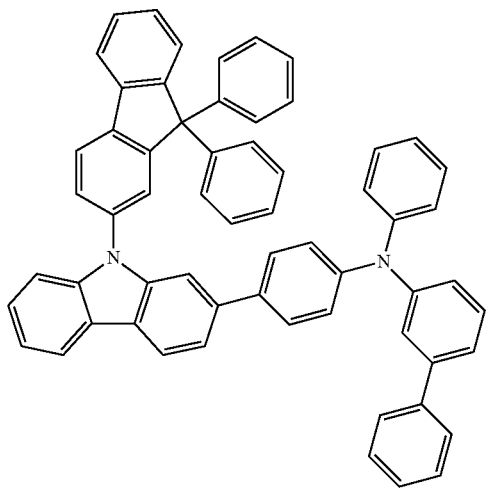
P1-24
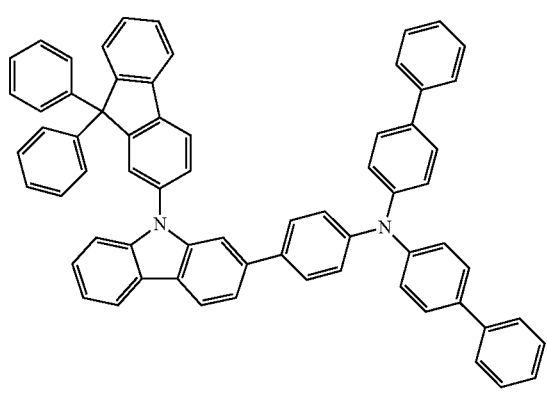
P1-25
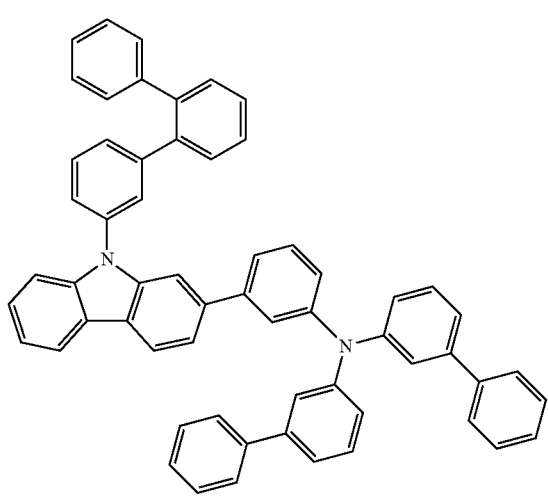
P1-26
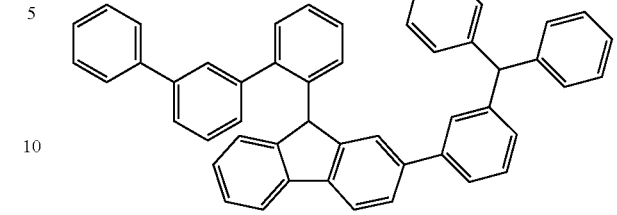
P1-27
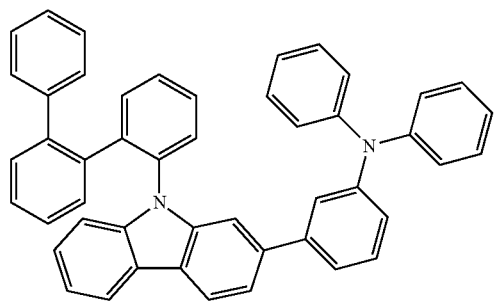
P1-28
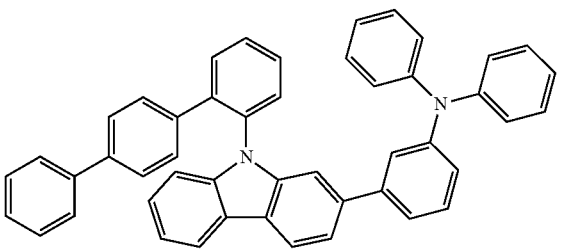
P1-29
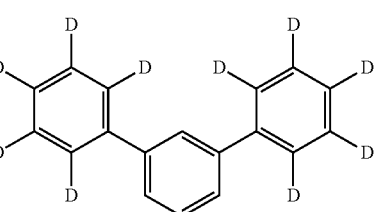
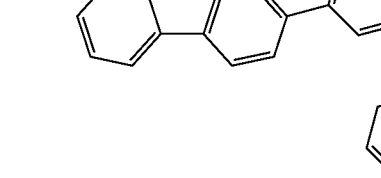

P1-30
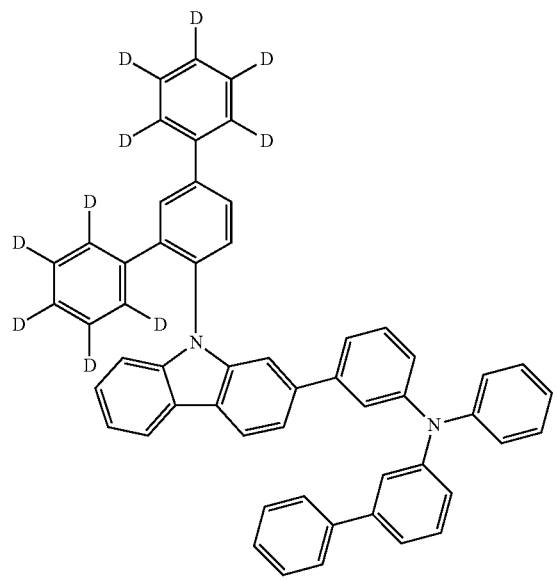
P1-31
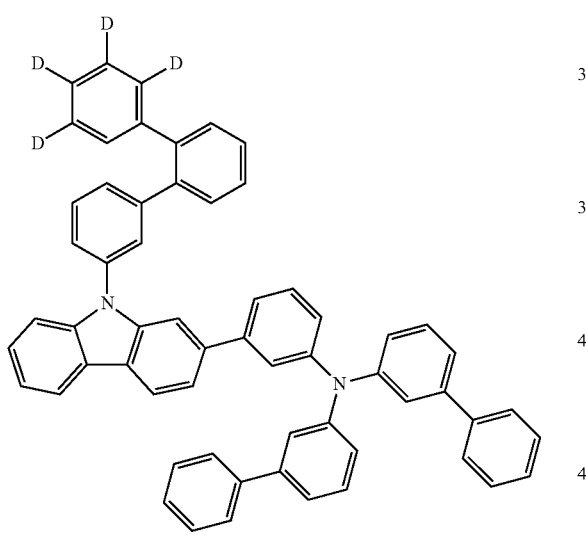
P1-32
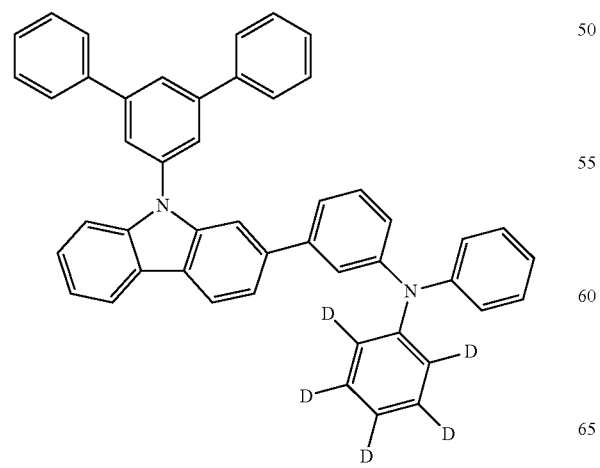
P1-33
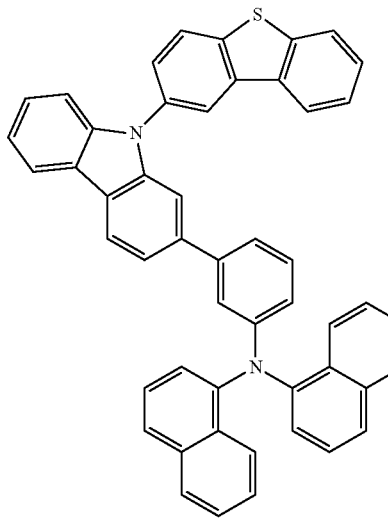
P1-34
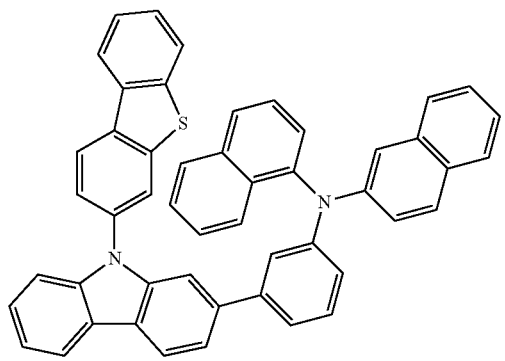
P1-35
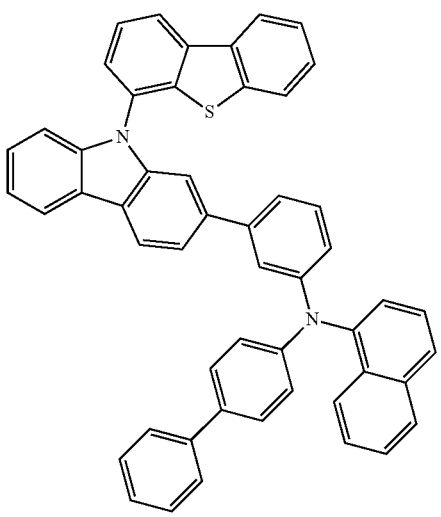

P1-36
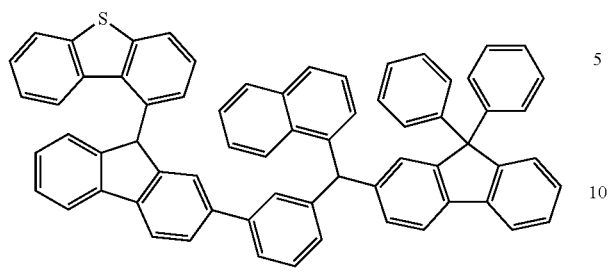
P1-37
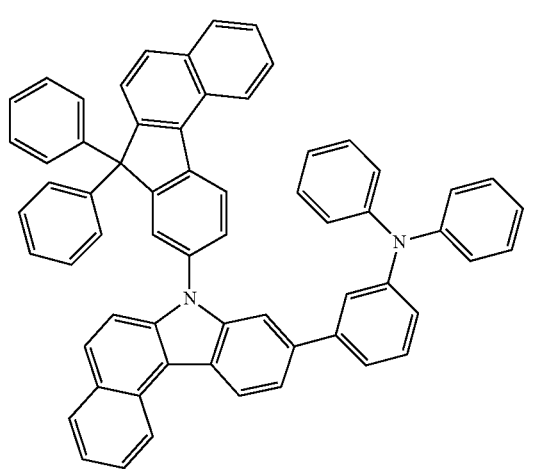
P1-38
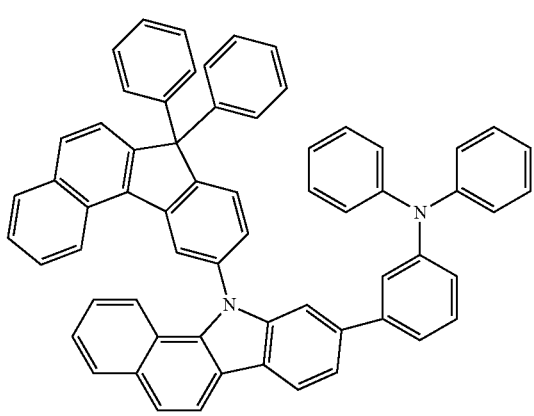
P1-39
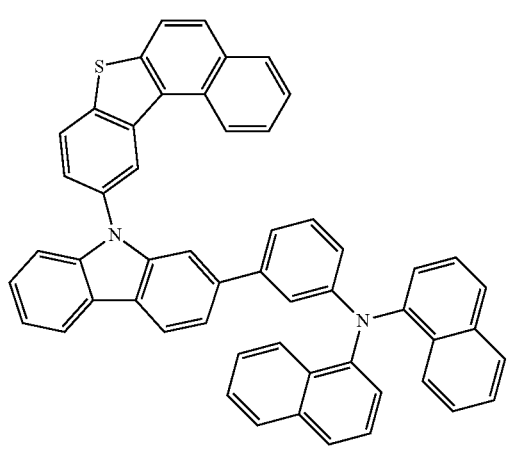
P1-40
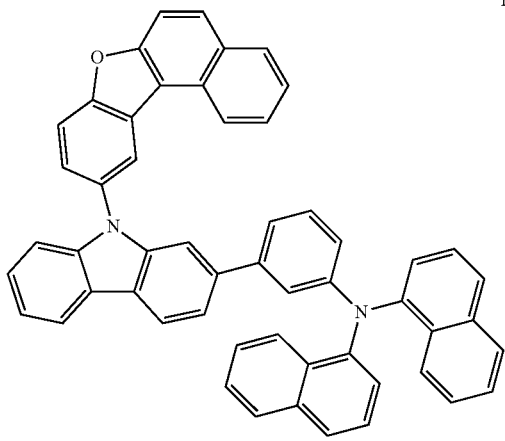
P1-41
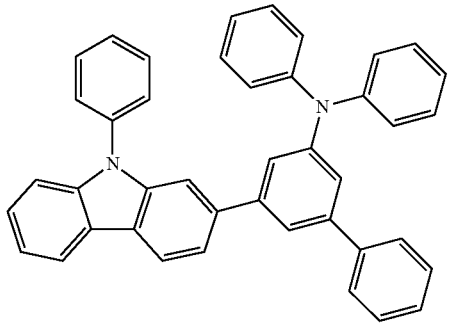
P1-42
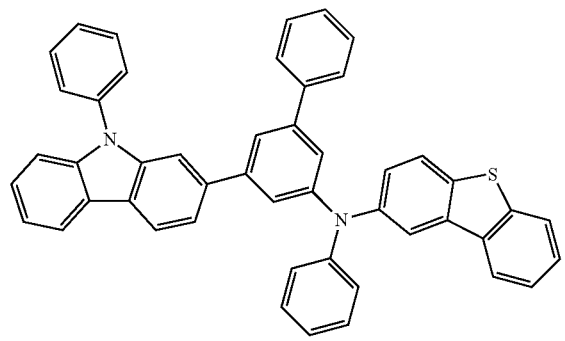
P1-43
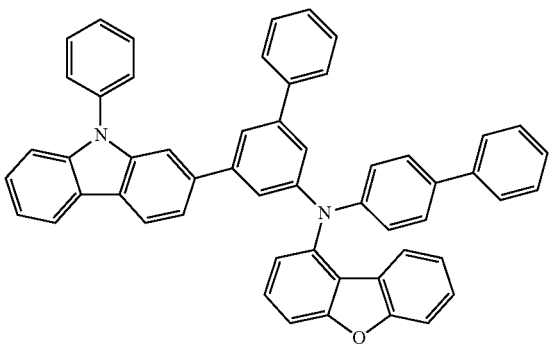

P1-44
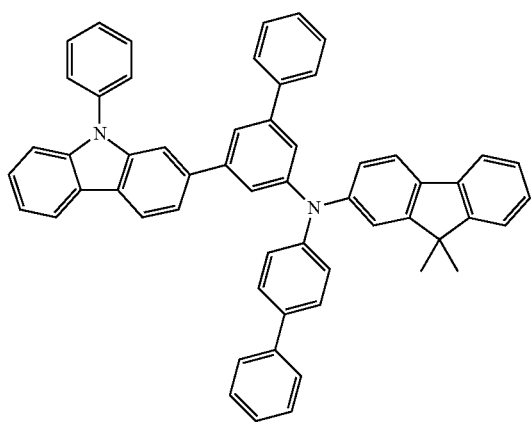
P1-47
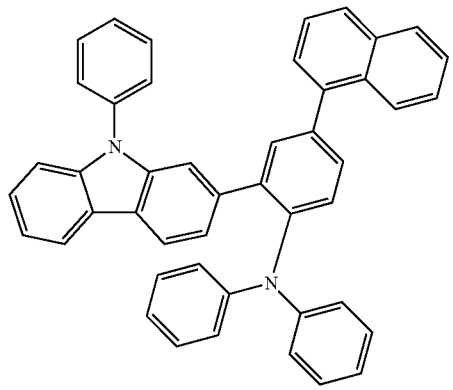
P1-45
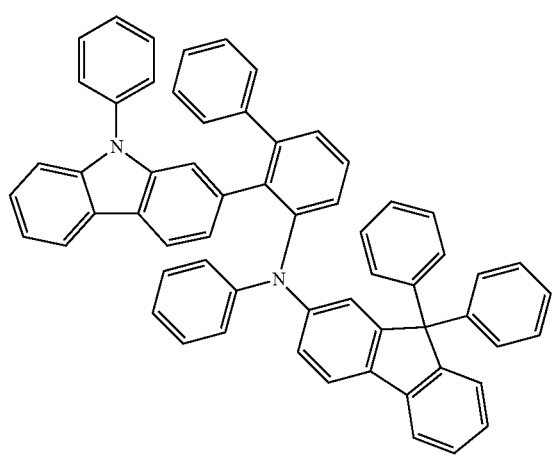
P1-48
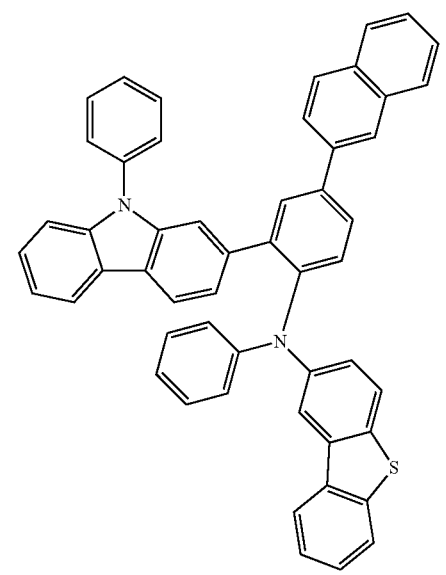
P1-46
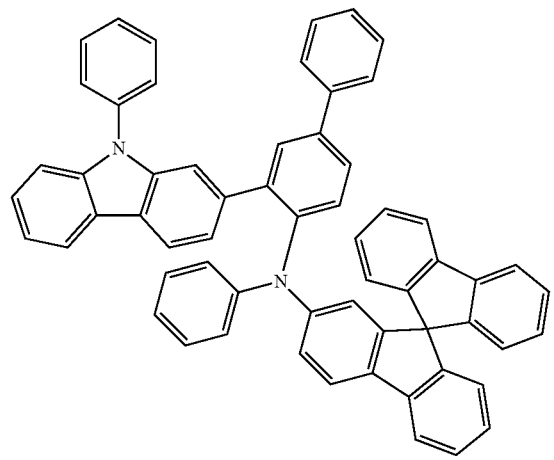
P1-49
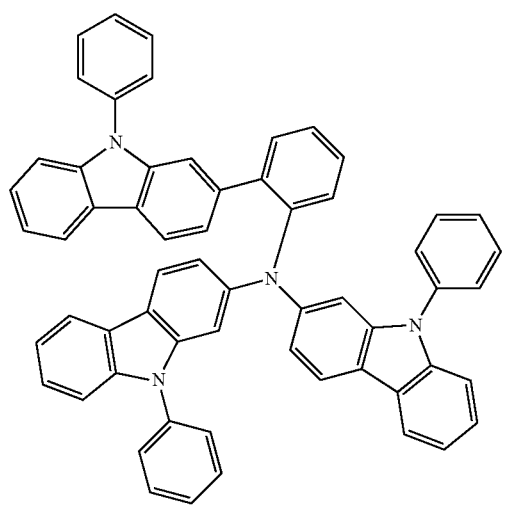

P1-50
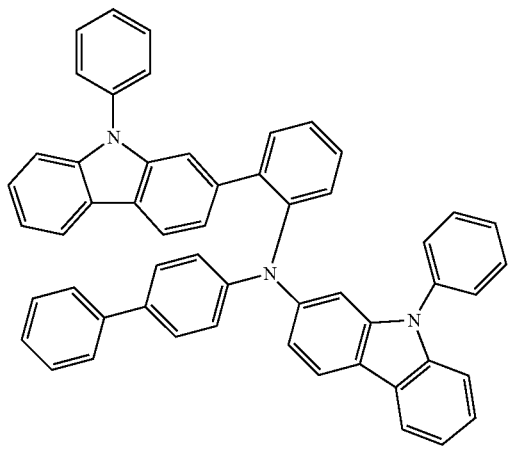
P1-51
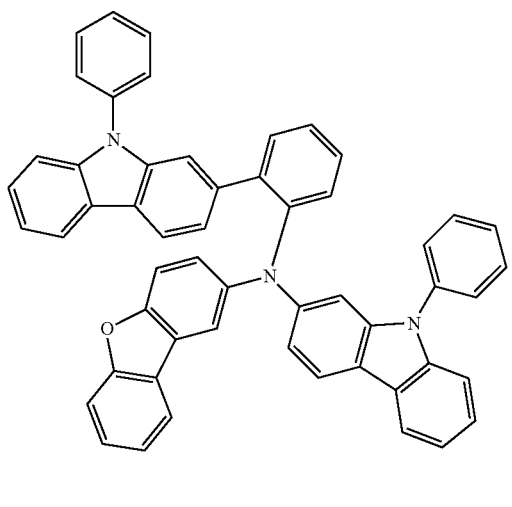
P1-52
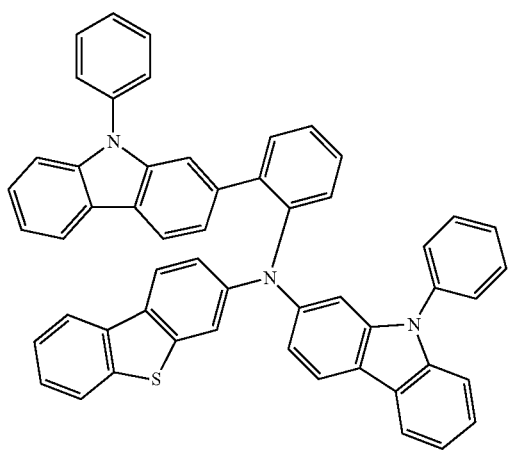
P1-53
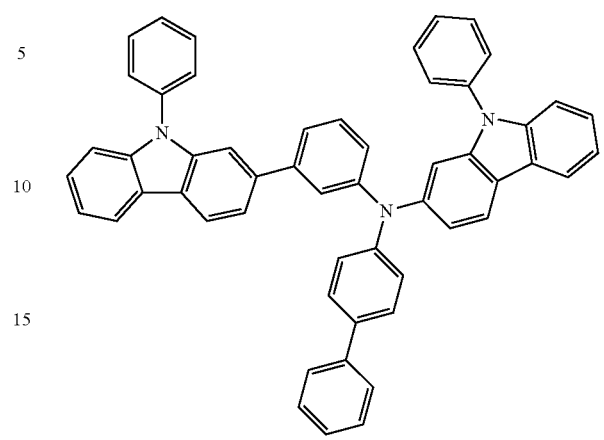
P1-54
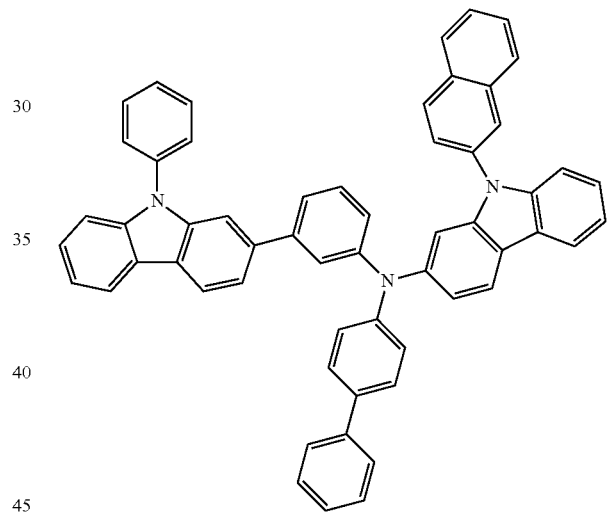
P1-55
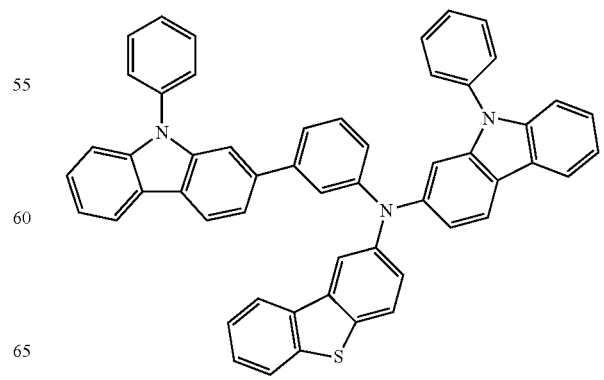

P1-56
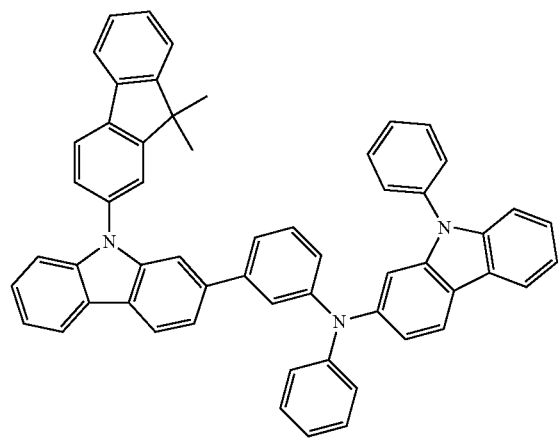
P1-57
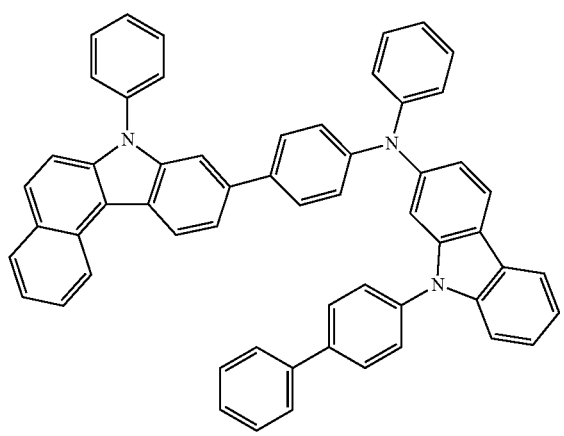
P1-58
P1-59
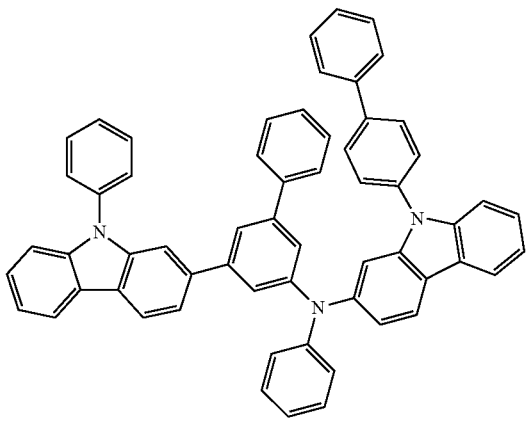
P1-60
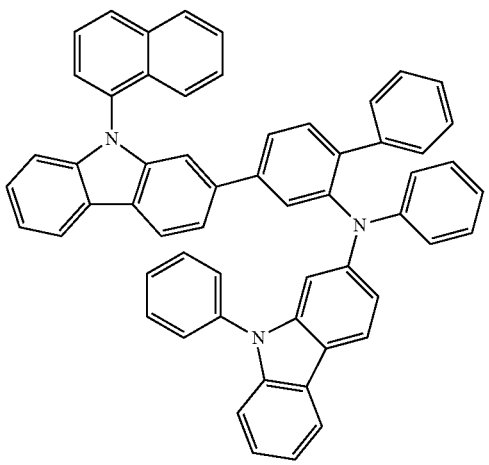
P1-61
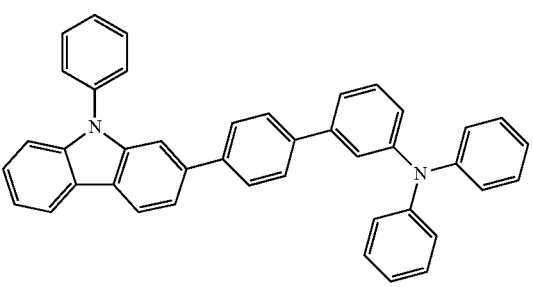
P1-62
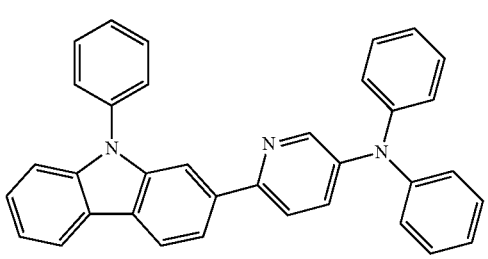

P1-63
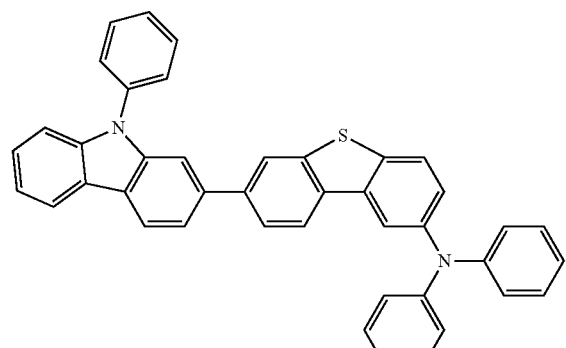
P1-64
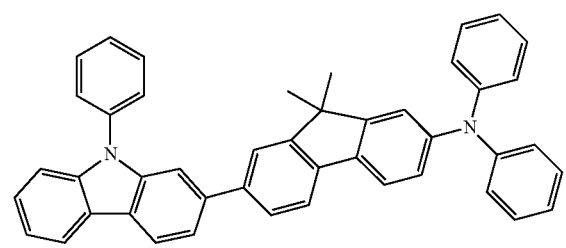
P1-65
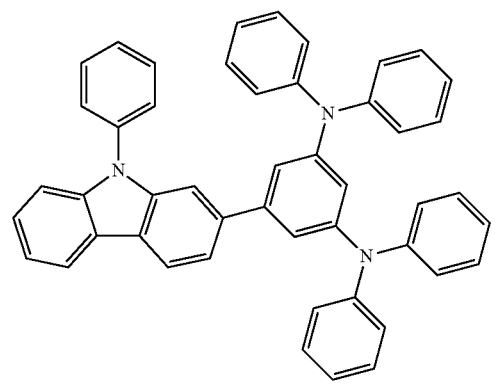
P1-66
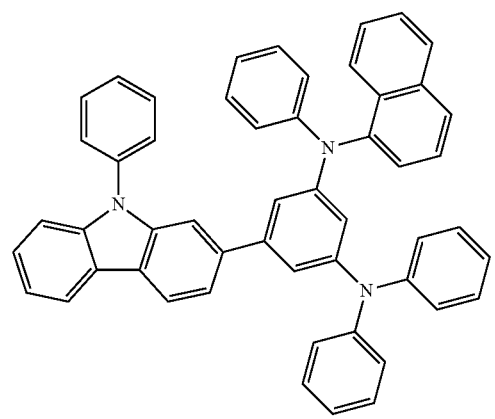
P1-67
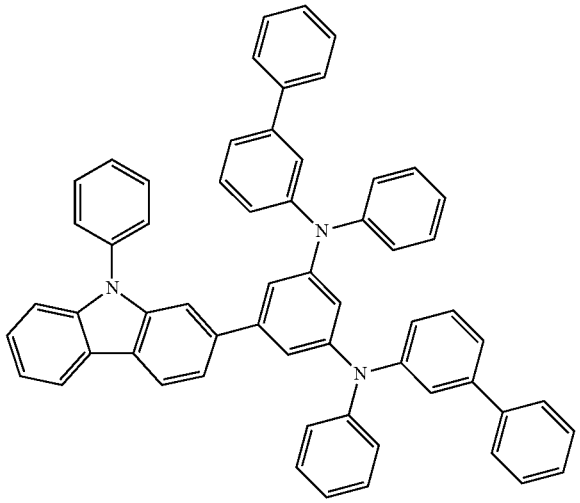
P1-68
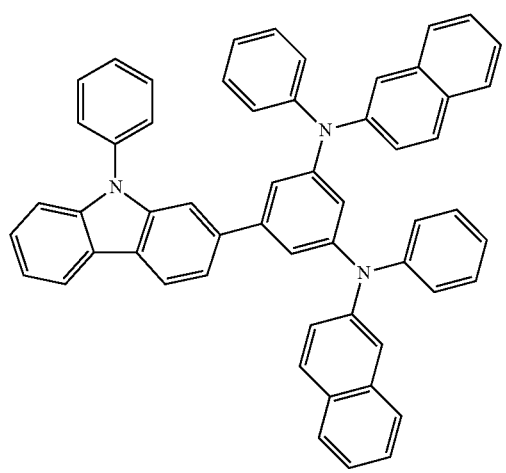
P1-69
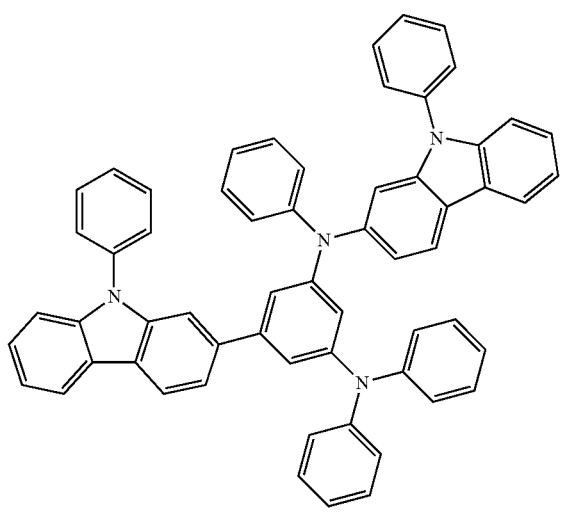

P1-70
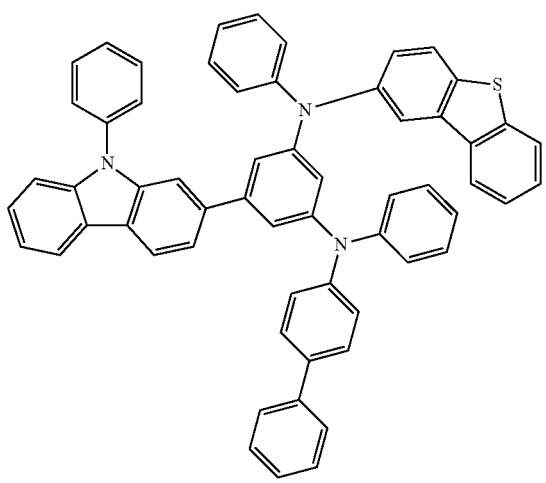
P1-73
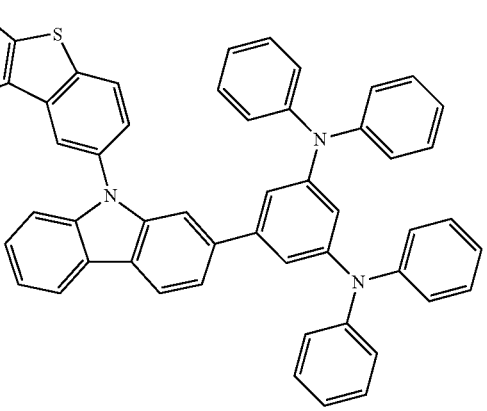
P1-71
P1-74
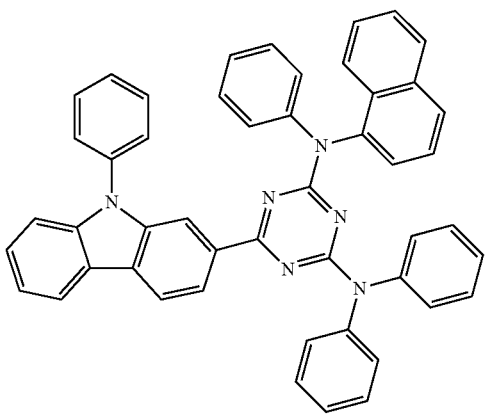
P1-72
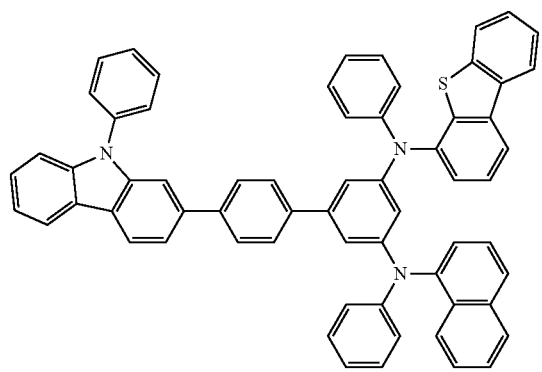
P1-75
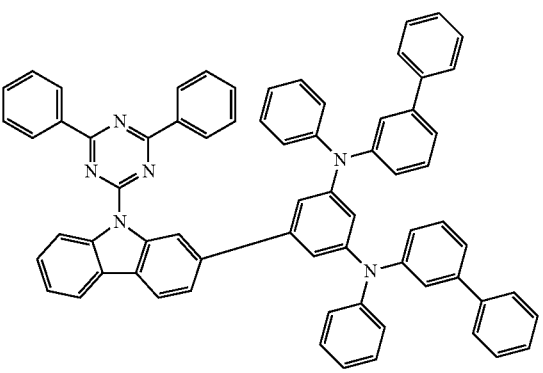

P1-76
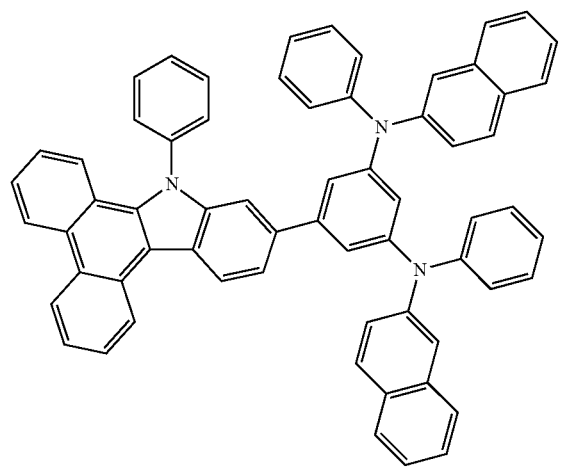
P1-79
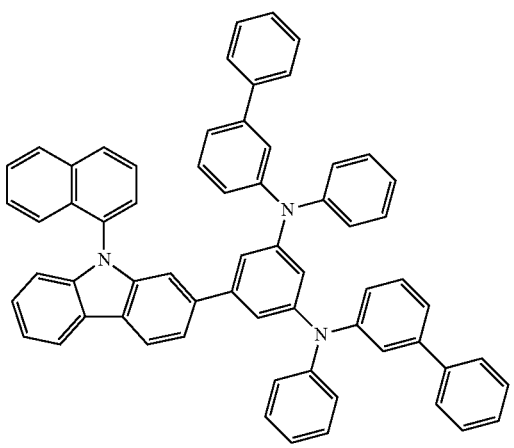
P1-77
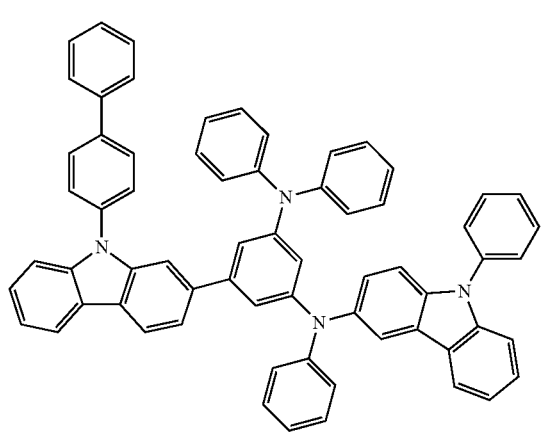
P1-80
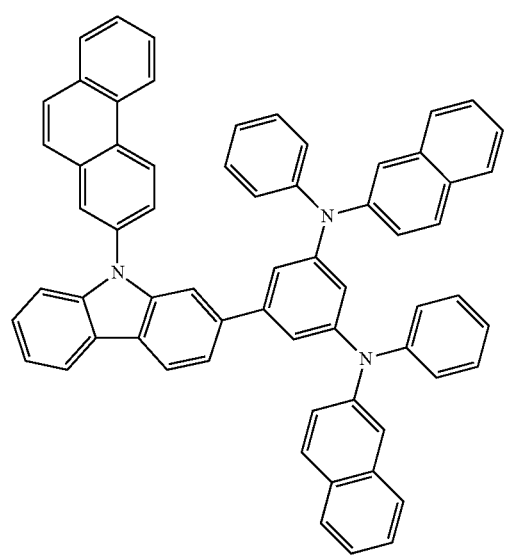
P1-78
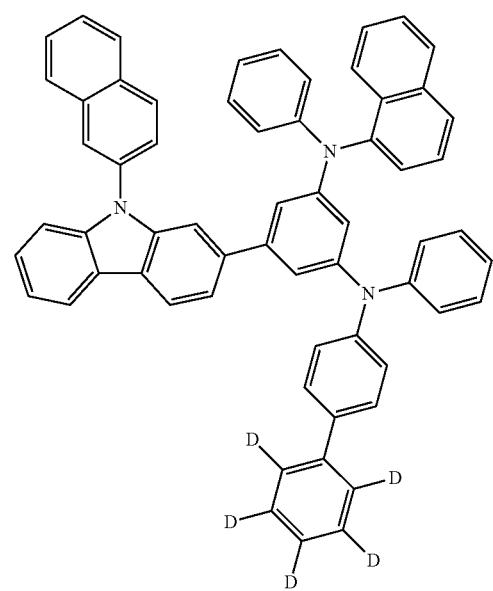
Furthermore, the compound represented by Formula 2 above may be represented by Formula 5 or 6 below. Formula 2 may be represented by Formula 5 when Y is a single bond, and Formula 2 may be represented by Formula 6 when X is a single bond
[Formula 5]
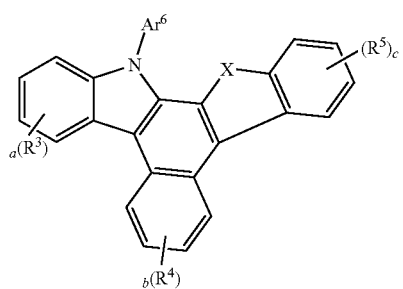

[Formula 6]
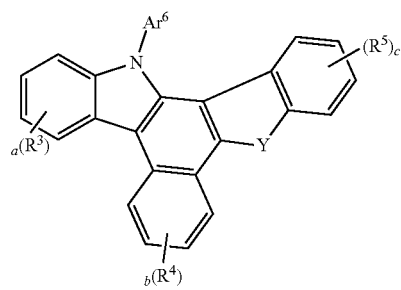
In Formulae 5 and 6, each symbol is defined as in Formula 2. For example, $Ar^6$, X, Y, $R^3$ to $R^5$, a, b and c are defined as in Formula 2.
Specifically, the compound represented by Formulae 2, 5 and 6 above may be represented by one of compounds below.
P2-1
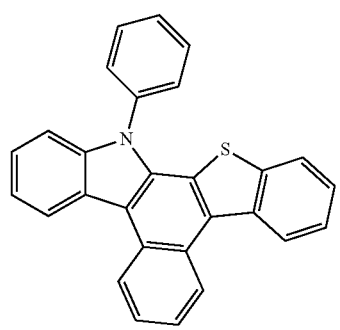
P2-2
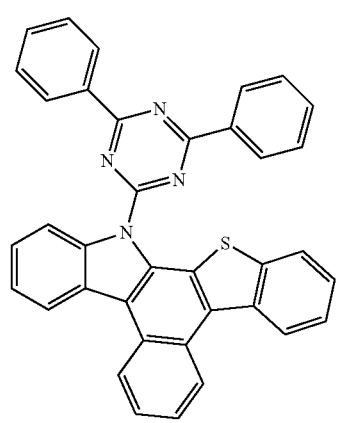
P2-3
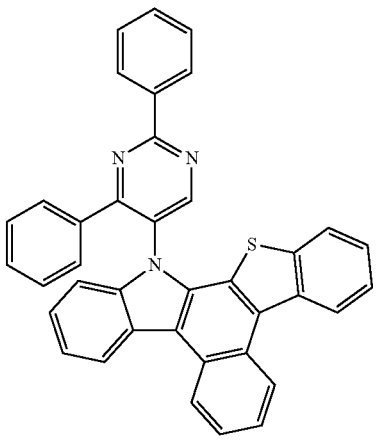
P2-4
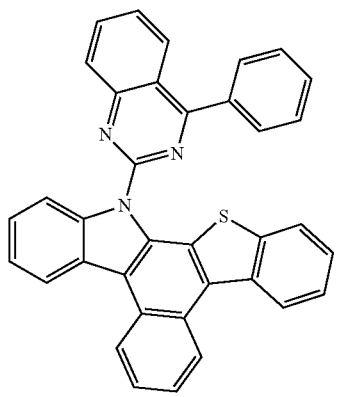
P2-5
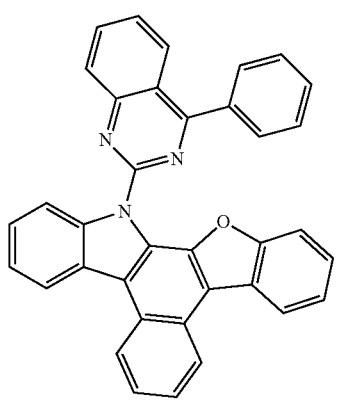

-continued
P2-6
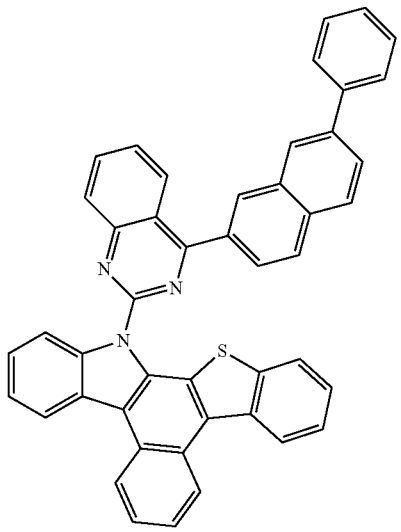
P2-7
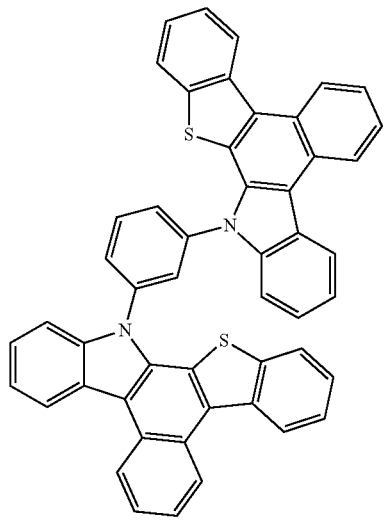
P2-8
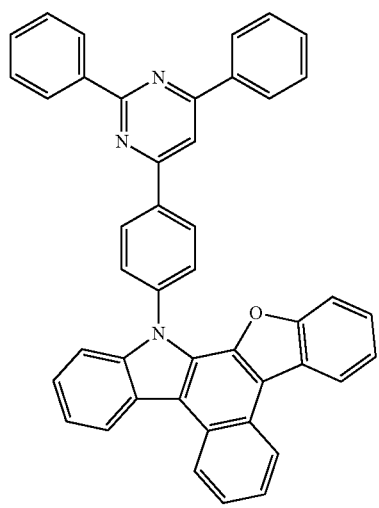
-continued
P2-9
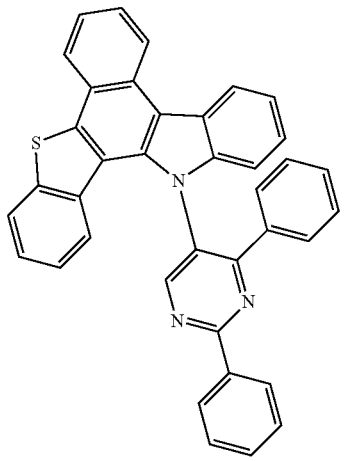
P2-10
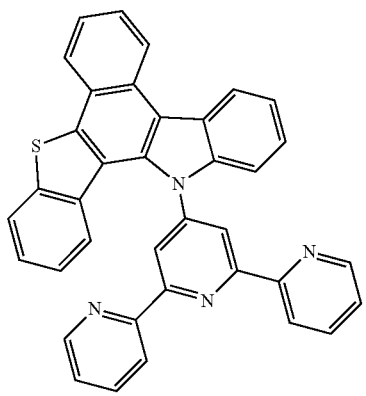
P2-11
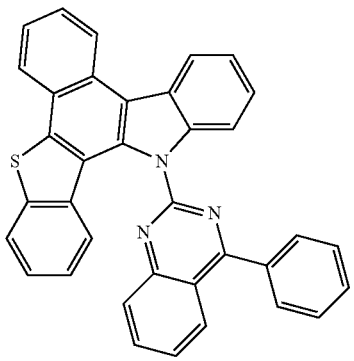

-continued
P2-12
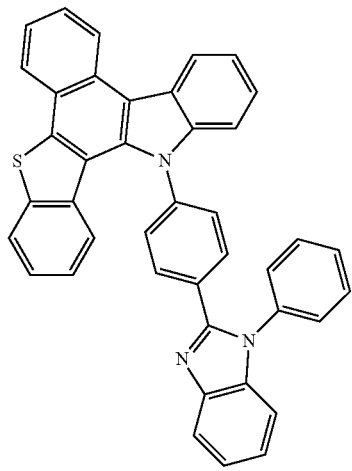
P2-13
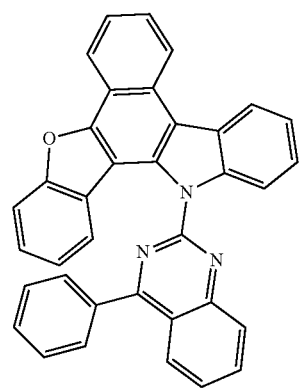
P2-14
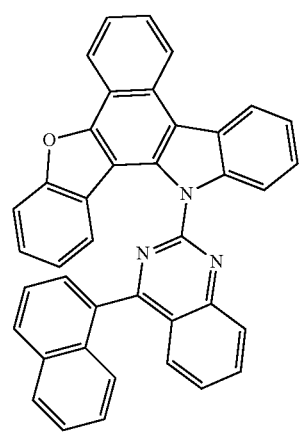
-continued
P2-15
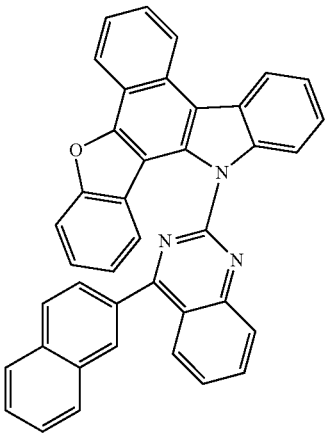
P2-16
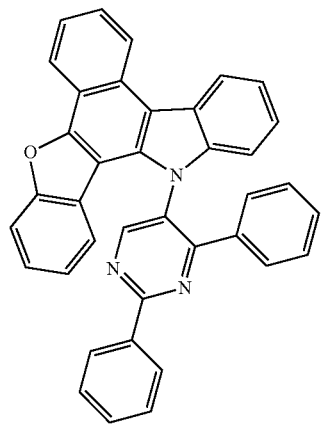
P2-17
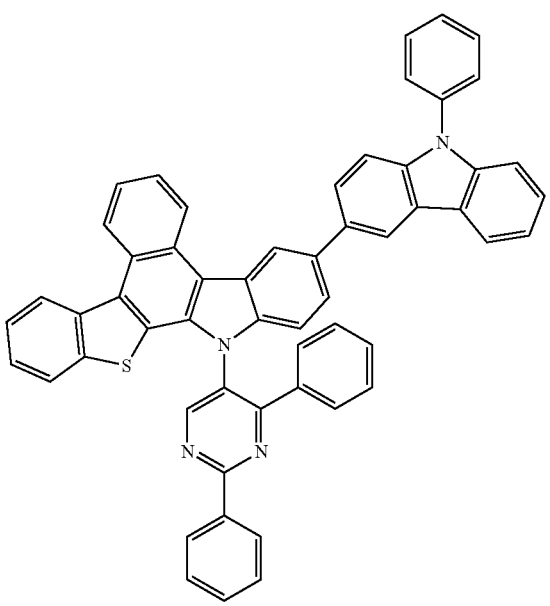

P2-18
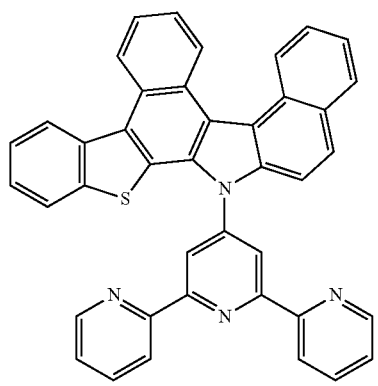
P2-19
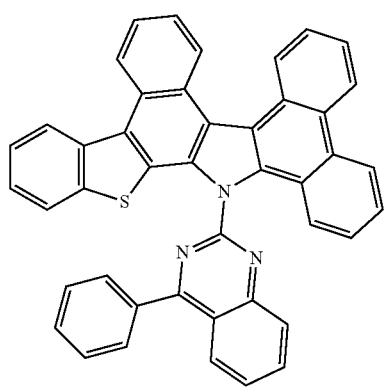
P2-20
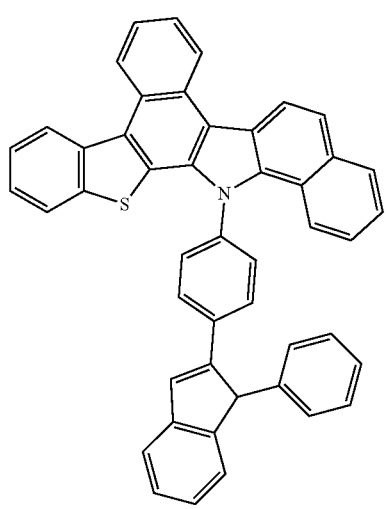
P2-21
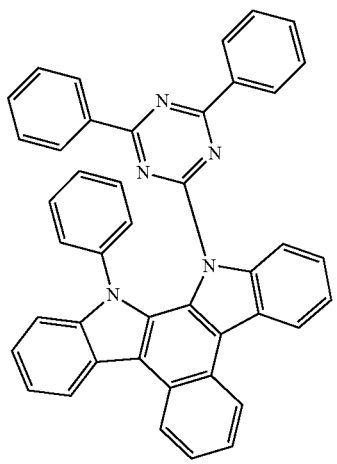
P2-22
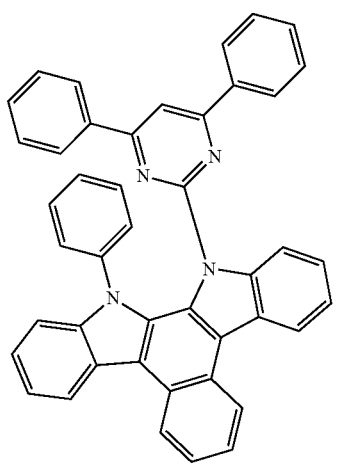
P2-23
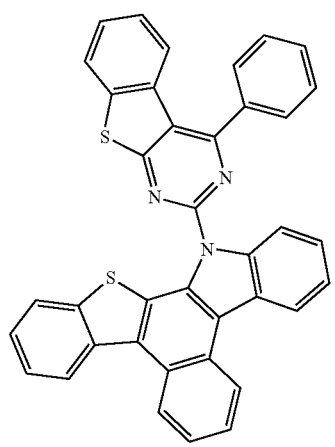

P-24

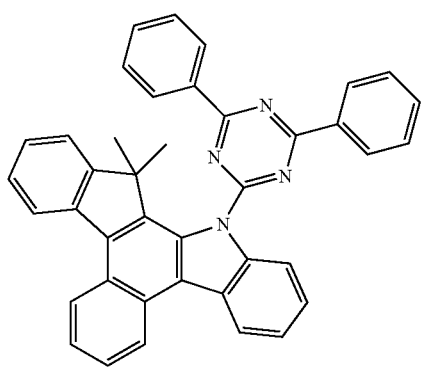

P2-25

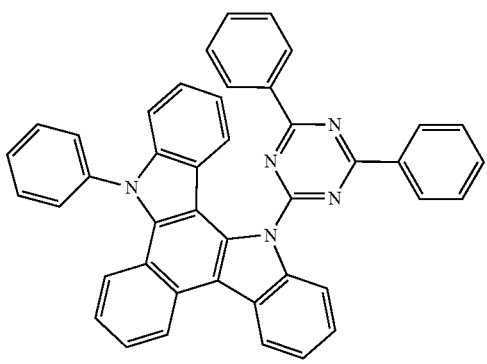

P2-26

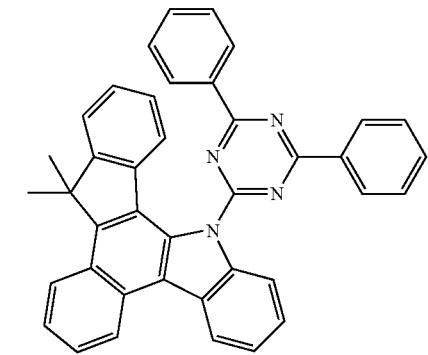

P2-27

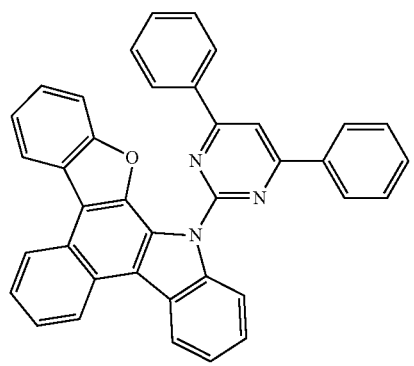

P2-28

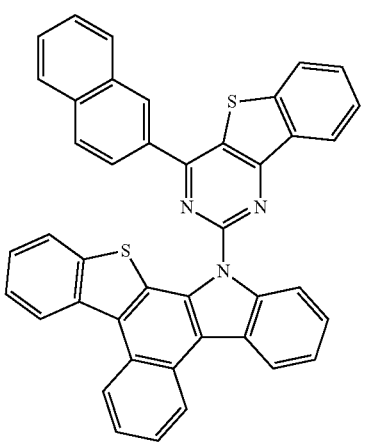

Preferably, an emission-auxiliary layer may comprise a compound represented by Formula 1 above, singly or as a mixture of two or more, and a hole transport layer may comprise a compound represented by Formula 7 below, singly or as a mixture of two or more.

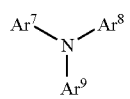

[Formula 7]

In Formula 7, $Ar^9$ may be represented by one of Formula 7-1 to 7-3 below.

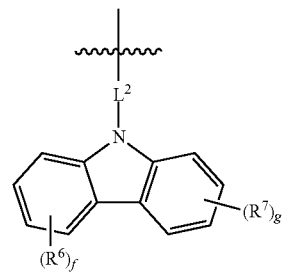

[Formula 7-1]

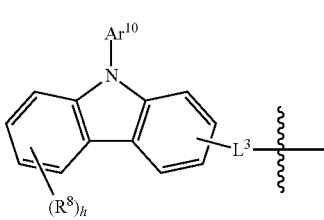

[Formula 7-2]

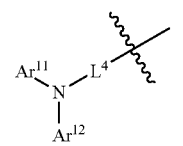

[Formula 7-3]

In Formulae 7, and 7-1 to 7-3, each symbol may be defined as below.

$Ar^7$, $Ar^8$, $Ar^{10}$ to $Ar^{12}$ are independently selected from the group consisting of a $C_6$-$C_{60}$ aryl group, a fluorenyl group, a C$_2$-C$_{60}$ heterocyclic group containing at least one heteroatom selected from the group consisting of O, N, S, Si, and P, a fused ring group of a C$_3$-C$_{60}$ aliphatic ring and a C$_6$-C$_{60}$ aromatic ring, a C$_1$-C$_{50}$ alkyl group, a C$_2$-C$_{20}$ alkenyl group, a C$_2$-C$_{20}$ alkynyl group, a C$_1$-C$_{30}$ alkoxy group, a C$_6$-C$_{30}$ aryloxy group, and -L'-N(R$^a$) (R$^b$). Preferably, Ar$^7$, Ar$^8$, Ar$^{10}$, Ar$^{11}$ and Ar$^{12}$ may be independently a C$_6$-C$_{12}$ aryl group, a fluorenyl group, or a C$_2$-C$_{12}$ heterocyclic group, specifically, a substituted by naphthyl, methoxyl group, pyrimidinyl group or tert-butyl group or unsubstituted phenyl, a substituted by fluor or unsubstituted biphenyl, naphthyl, dibenzothienyl group, dibenzofuryl group, 9,9-dimethyl-9H-fluorenyl group, 9,9-diphenyl-9H-fluorenyl group, 9,9-spirobifluorenyl group, and so on.

R$^6$ to R$^8$ may be independently selected from the group consisting of hydrogen, deuterium, halogen, a C$_6$-C$_{60}$ aryl group, a fluorenyl group, a C$_2$-C$_{60}$ heterocyclic group containing at least one heteroatom selected from the group consisting of O, N, S, Si, and P, a fused ring group of a C$_3$-C$_{60}$ aliphatic ring and a C$_6$-C$_{60}$ aromatic ring, a C$_1$-C$_{50}$ alkyl group, a C$_2$-C$_{20}$ alkenyl group, a C$_2$-C$_{20}$ alkynyl group, a C$_1$-C$_{30}$ alkoxy group, a C$_6$-C$_{30}$ aryloxy group, and -L'-N (R$^a$) (R$^b$). f, g, and h are each an integer from 1 to 4, and when f, g, and h are each an integer of 2 or more, a plurality of R$^6$ to R$^8$ may be the same or different from each other, a plurality of each R$^6$ to R$^8$ may be the same or different from themselves, and any two adjacent groups of R$^6$s to R$^8$s are optionally linked together to form a ring. Here, the formed ring may be an aromatic ring or heteroaromatic ring, preferably, may be a C$_6$ aromatic ring, that is, a benzene ring, to form a naphthalene, phenanthrene, and so on, with the benzene ring to which they are attached.

Preferably, R$^6$ to R$^8$ may be optionally substituted by one or more substituents selected from the group consisting of deuterium, halogen, a silane group, a siloxane group, a boron group, a germanium group, a cyano group, a nitro group, a C$_1$-C$_{20}$ alkylthio group, a C$_1$-C$_{20}$ alkoxy group, a C$_1$-C$_{20}$ alkyl group, a C$_2$-C$_{20}$ alkenyl group, a C$_2$-C$_{20}$ alkynyl group, a C$_6$-C$_{20}$ aryl group, a C$_6$-C$_{20}$ aryl group substituted by deuterium, a fluorenyl group, a C$_2$-C$_{20}$ heterocyclic group containing at least one heteroatom selected from the group consisting of O, N, S, Si, and P, a C$_3$-C$_{20}$ cycloalkyl group, a C$_7$-C$_{20}$ arylalkyl group, and a C$_8$-C$_{20}$ arylalkenyl group.

When R$^6$ to R$^8$ are -L'-N(R$^a$) (R$^b$), L' may be selected from the group consisting of a single bond, a C$_6$-C$_{60}$ arylene group, a fluorenylene group, a bivalent fused ring group of a C$_3$-C$_{60}$ aliphatic ring and a C$_6$-C$_{60}$ aromatic ring, and a bivalent C$_2$-C$_{60}$ heterocyclic group containing at least one heteroatom selected from the group consisting of O, N, S, Si, and P, and R$^a$ and R$^b$ may be independently selected from the group consisting of a C$_6$-C$_{60}$ aryl group, a fluorenyl group, a fused ring group of a C$_3$-C$_{60}$ aliphatic ring and a C$_6$-C$_{60}$ aromatic ring, and a C$_2$-C$_{60}$ heterocyclic group containing at least one heteroatom selected from the group consisting of O, N, S, Si, and P.

In Formulae 7-1 and 7-3, L$^2$ and L$^4$ may be selected from the group consisting of a C$_6$-C$_{60}$ arylene group, a fluorenylene group, a bivalent fused ring group of a C$_3$-C$_{60}$ aliphatic ring and a C$_6$-C$_{60}$ aromatic ring, and a C$_2$-C$_{60}$ heterocyclic group containing at least one heteroatom selected from the group consisting of O, N, S, Si, and P, and in Formula 7-2, L$^3$ is selected from the group consisting of a single bond, a C$_6$-C$_{60}$ arylene group, a fluorenylene group, a fused ring group of a C$_3$-C$_{60}$ aliphatic ring and a C$_6$-C$_{60}$ aromatic ring, and a C$_2$-C$_{60}$ heterocyclic group containing at least one heteroatom selected from the group consisting of O, N, S, Si, and P.

Preferably, When Ar$^7$, Ar$^8$, Ar$^{10}$, Ar$^{11}$, Ar$^{12}$, and R$^6$ to R$^8$ are each an aryl group, a fluorenyl group, a heterocyclic group, a fused ring group, an alkyl group, an alkenyl group, an alkynyl group, an alkoxy group or an aryloxy group, and when L$^1$ to L$^3$ are each an arylene group, a fluorenylene group, a fused ring group, or a heterocyclic group, Ar$^7$, Ar$^8$, Ar$^{10}$, Ar$^{11}$, Ar$^{12}$, R$^6$ to R$^8$, and L$^1$ to L$^3$ may be each substituted by one or more substituents selected from the group consisting of deuterium, halogen, a silane group, a siloxane group, a boron group, a germanium group, a cyano group, a nitro group, a C$_1$-C$_{20}$ alkylthio group, a C$_1$-C$_{20}$ alkoxy group, a C$_1$-C$_{20}$ alkyl group, a C$_2$-C$_{20}$ alkenyl group, a C$_2$-C$_{60}$ alkynyl group, a C$_6$-C$_{20}$ aryl group, a C$_6$-C$_{20}$ aryl group substituted by deuterium, a fluorenyl group, a C$_2$-C$_{20}$ heterocyclic group containing at least one heteroatom selected from the group consisting of O, N, S, Si, and P, a C$_3$-C$_{20}$ cycloalkyl group, a C$_7$-C$_{20}$ arylalkyl group, a C$_8$-C$_{20}$ arylalkenyl group, an arylamine group and a heteroarylamine group.

Specifically, the compound represented by Formula 7 above may be represented by one of compounds below.

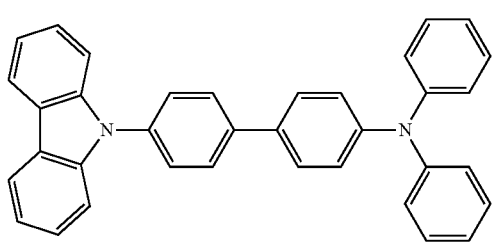

3-1

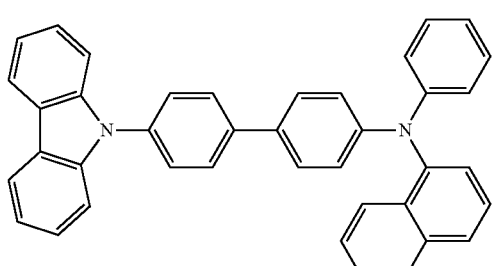

3-2

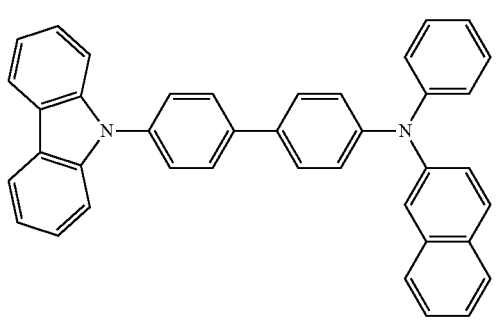

3-3

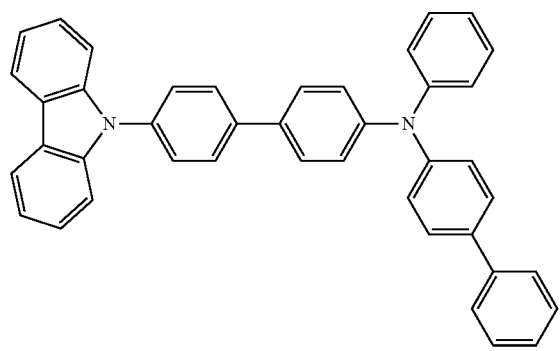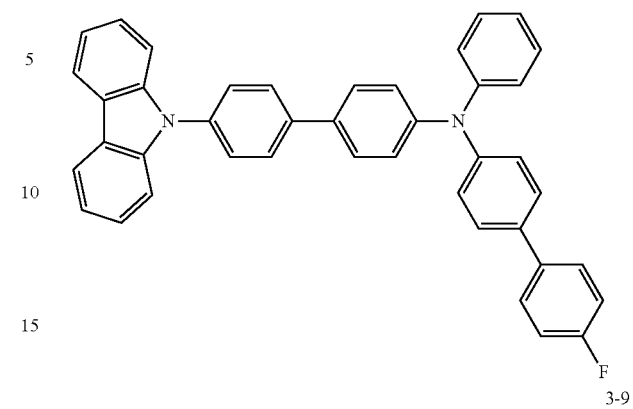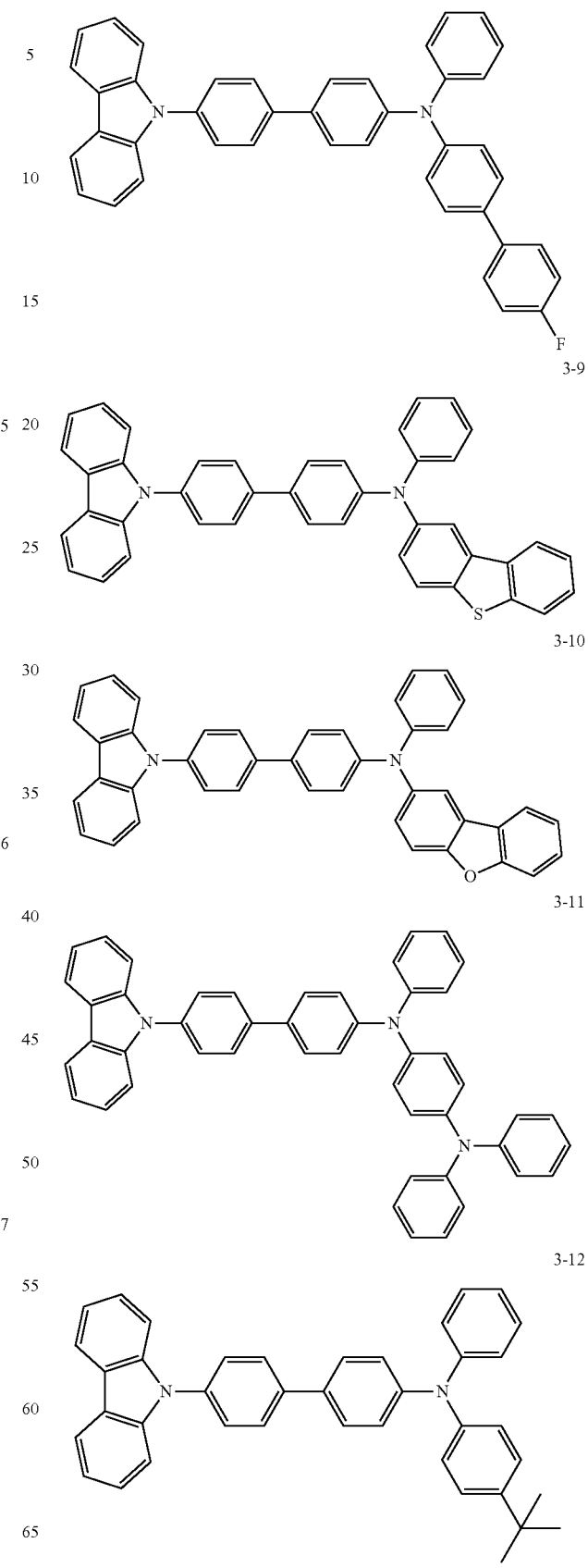

3-13
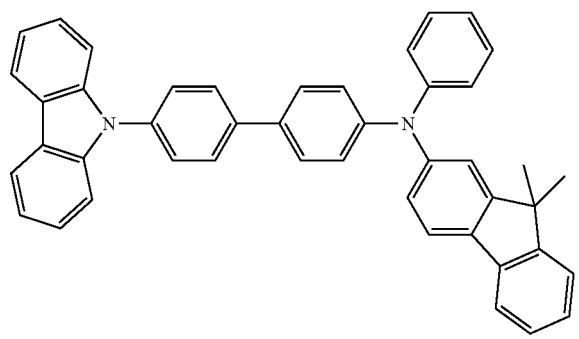
3-14
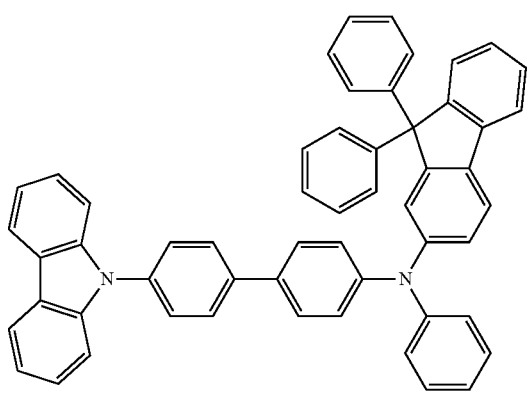
3-15
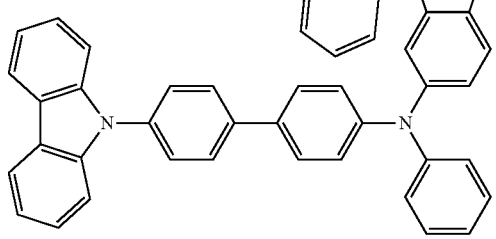
3-16
3-17
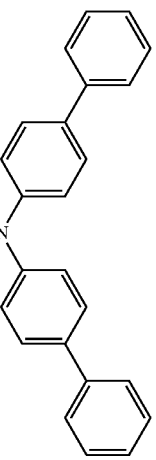
3-18
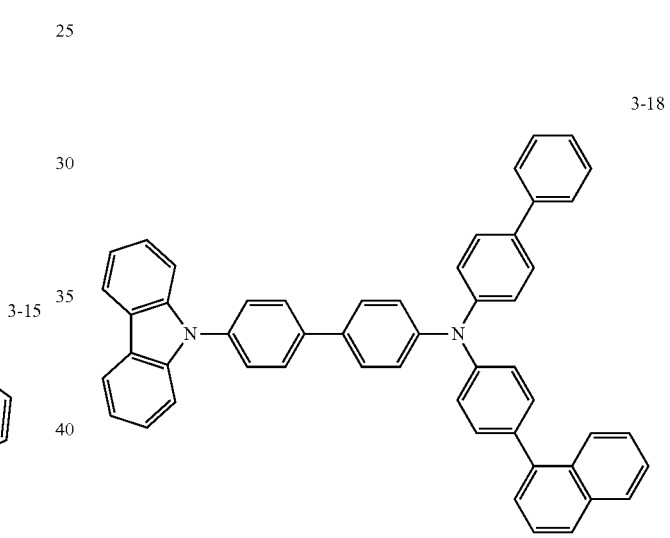
3-19
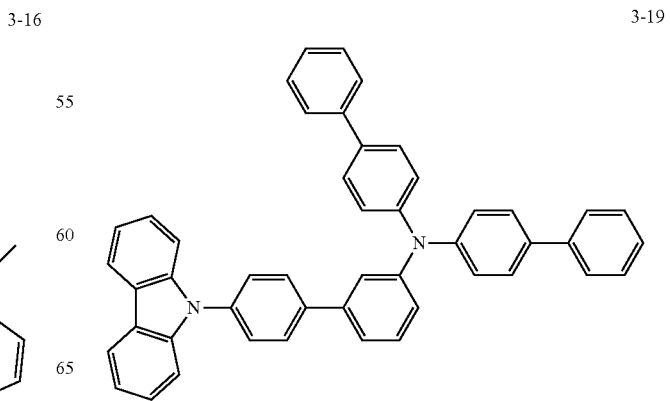

3-20
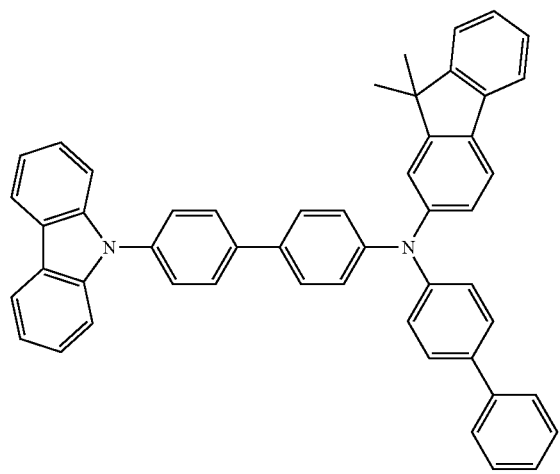
3-23
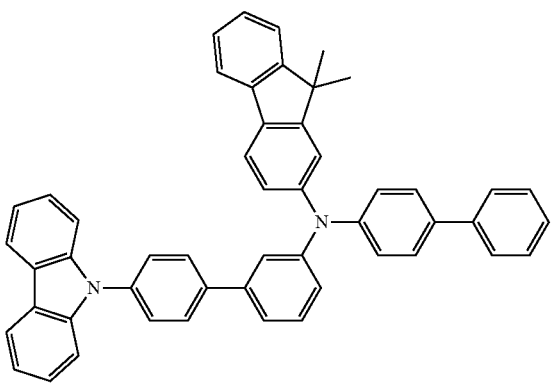
3-21
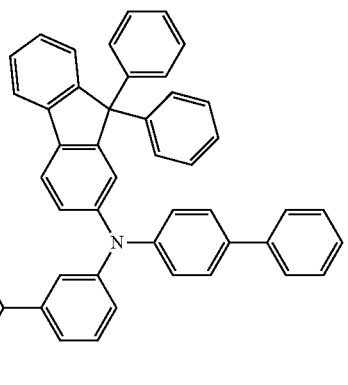
3-24
3-22
3-25
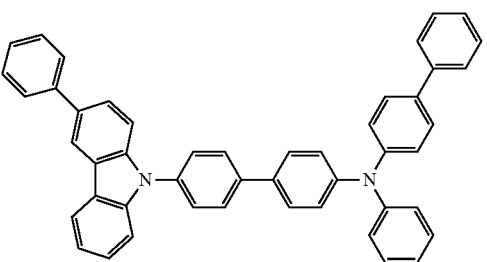
3-26
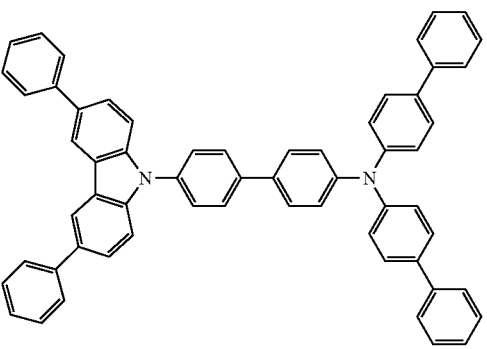

-continued
3-27
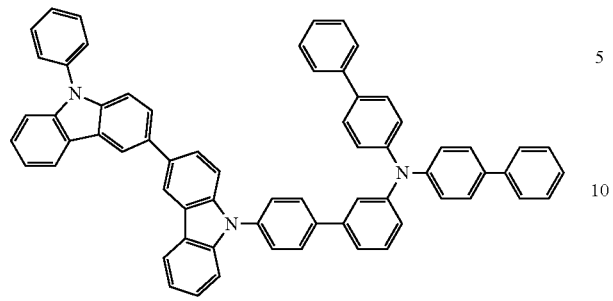
3-28
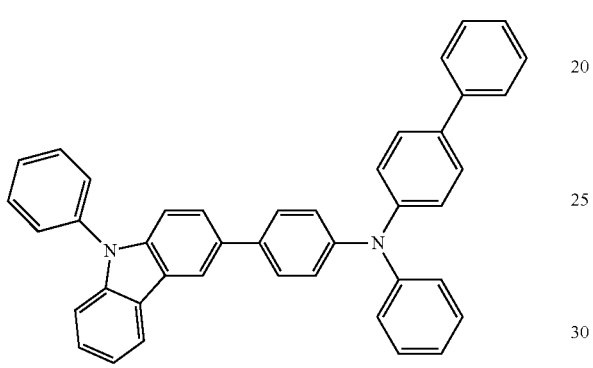
3-29
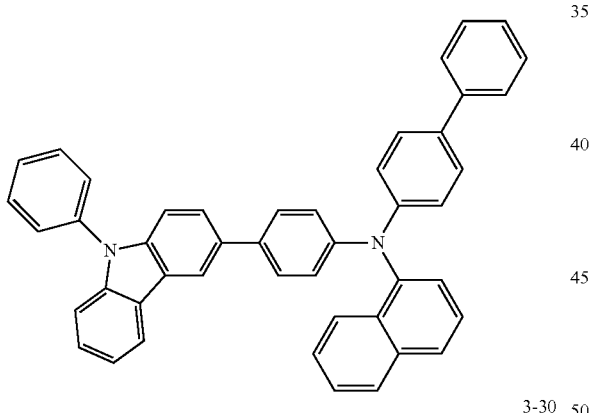
3-30
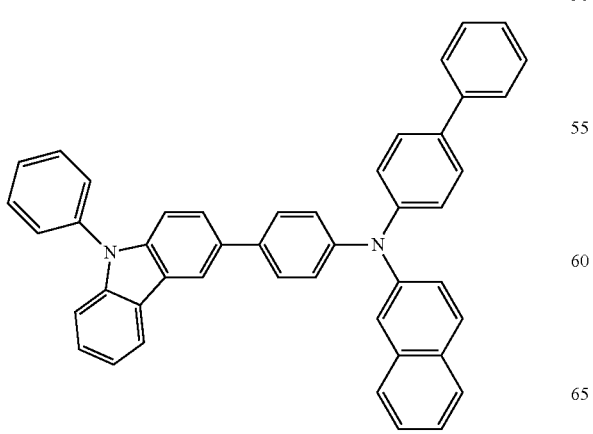
-continued
3-31
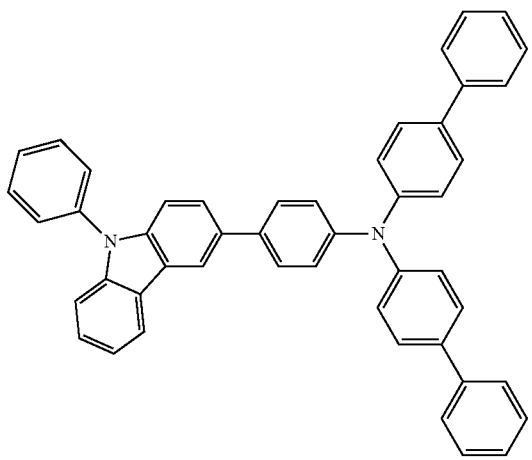
3-32
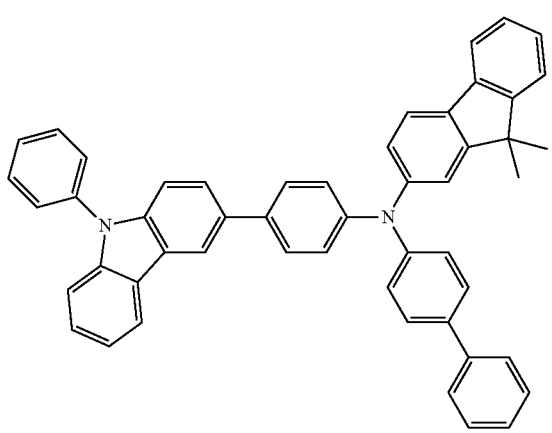
3-33
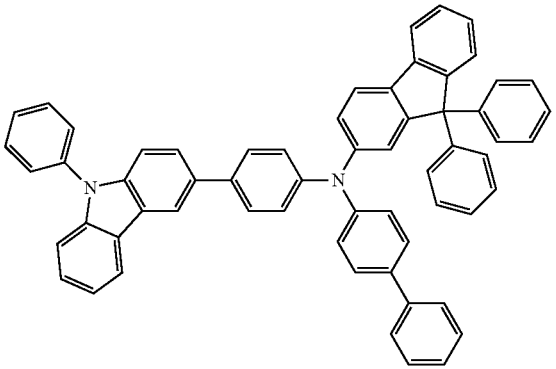

-continued
3-34
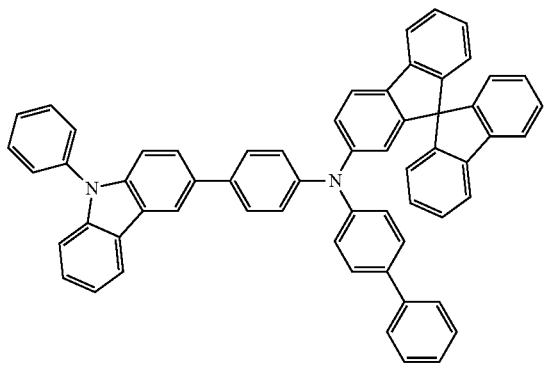
3-35
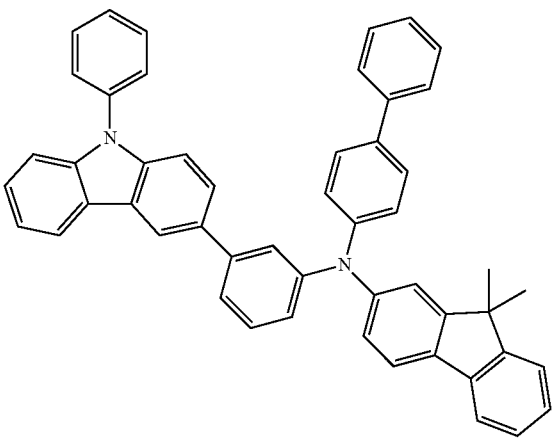
3-38
3-36
3-39
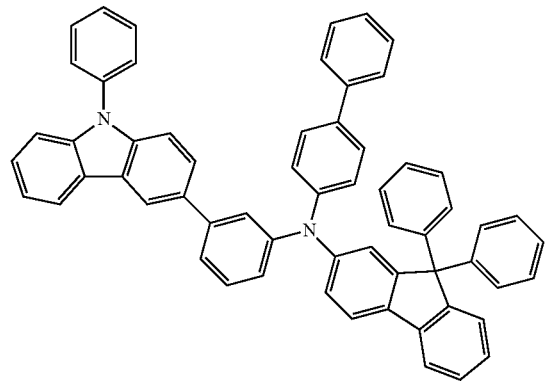
3-37
3-40
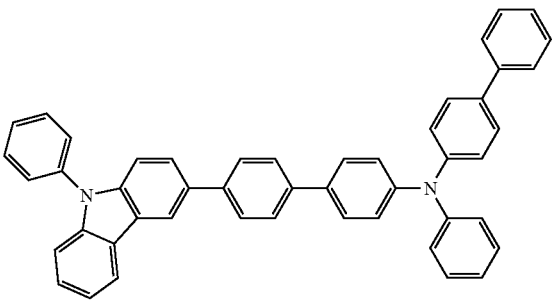
3-41
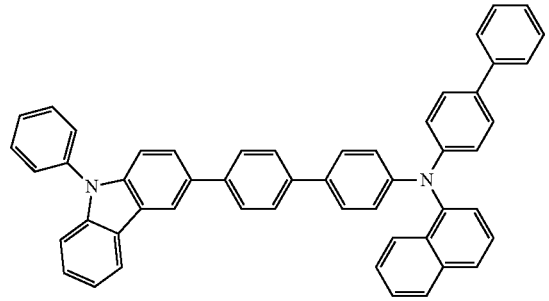

3-42
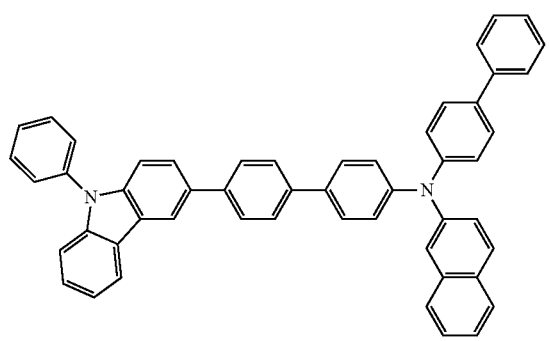
3-43
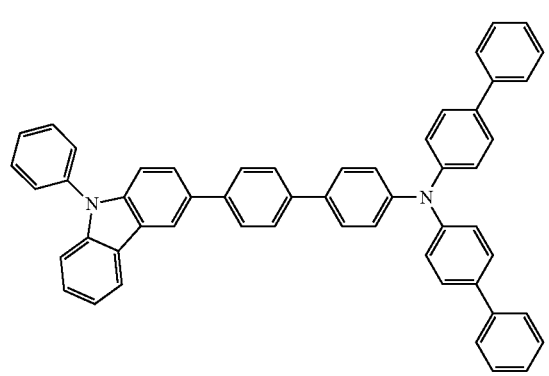
3-44
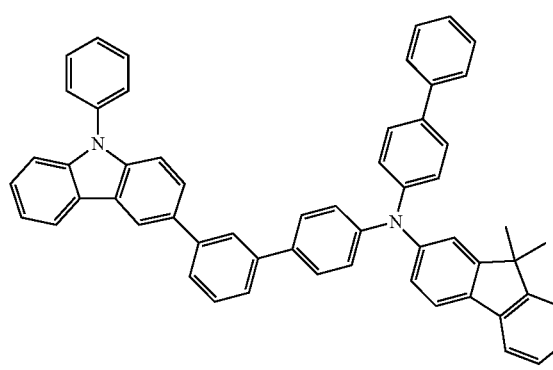
3-45
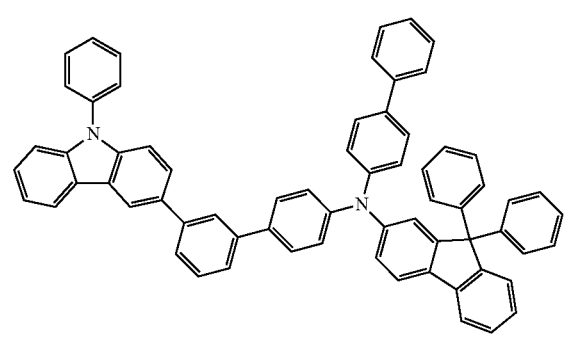
3-46
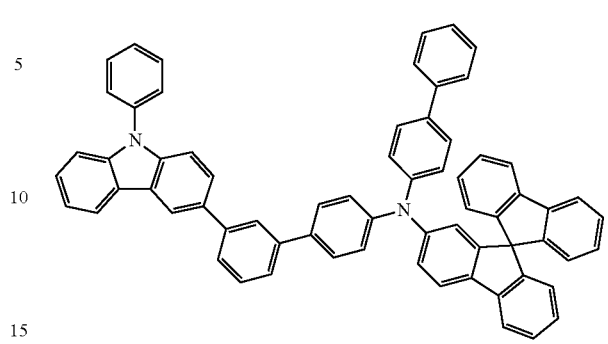
3-47
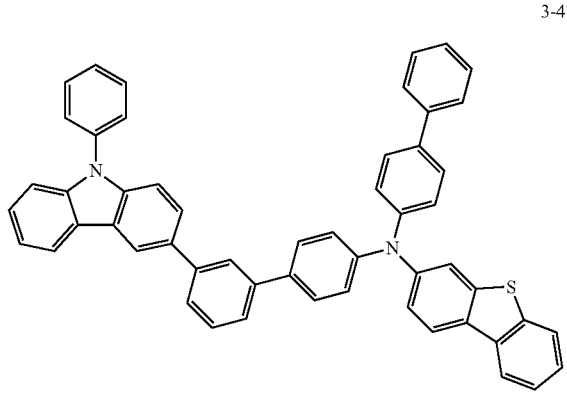
3-48
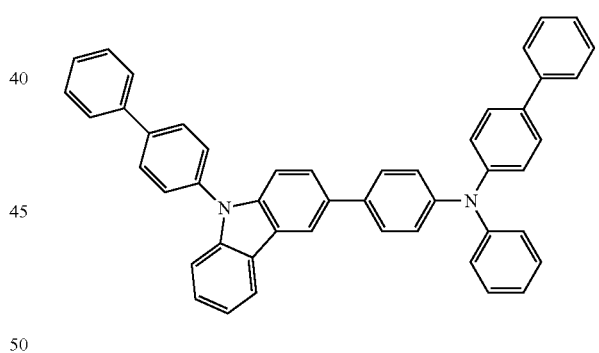
3-49
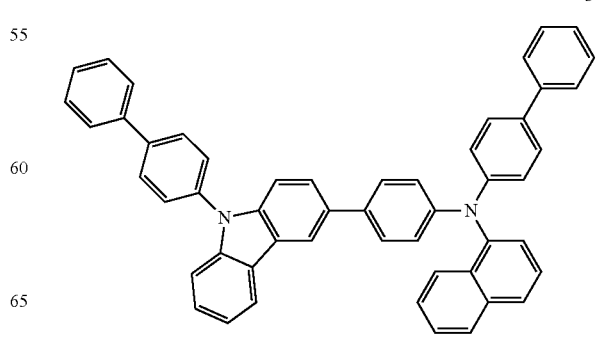

-continued
3-50
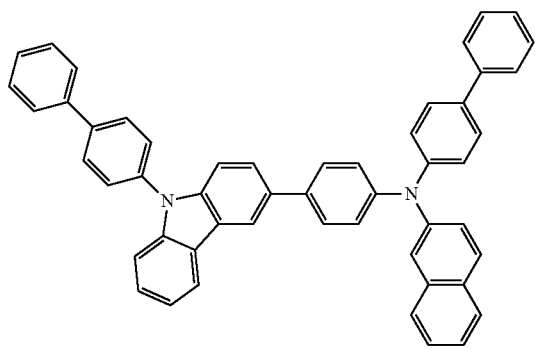
3-51
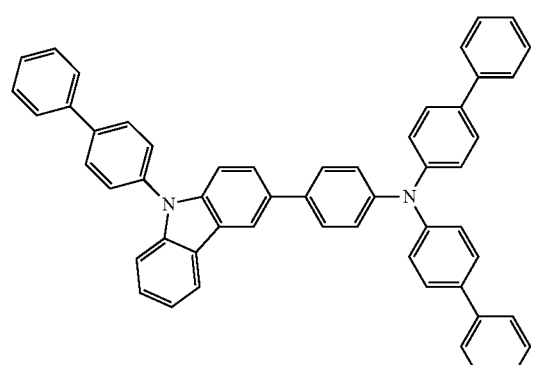
3-52
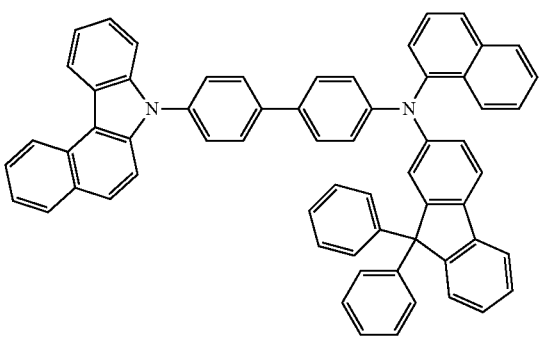
3-53
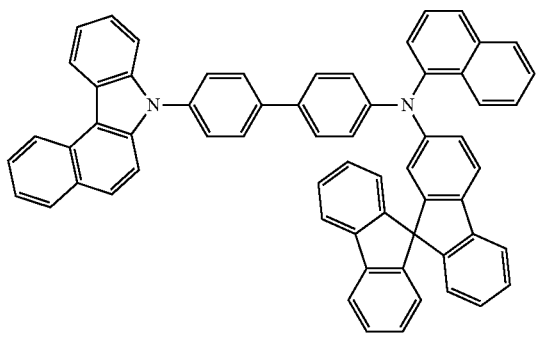
-continued
3-54
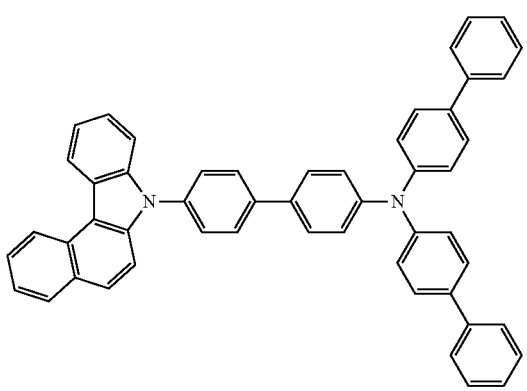
3-55
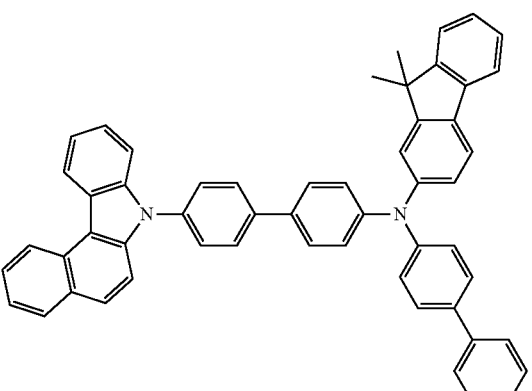
3-56
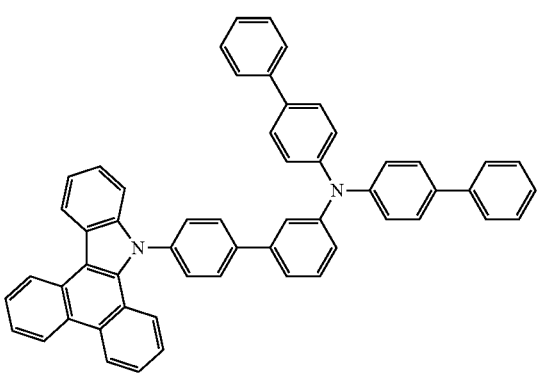
3-57
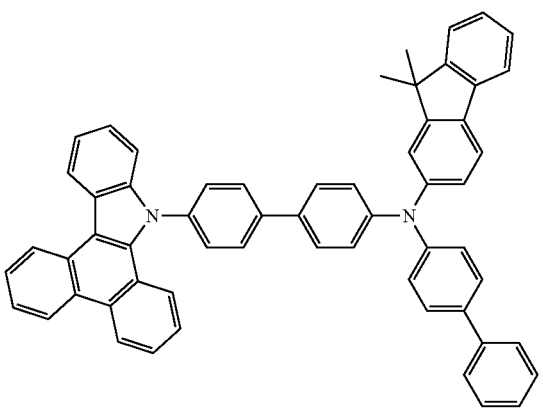

3-58
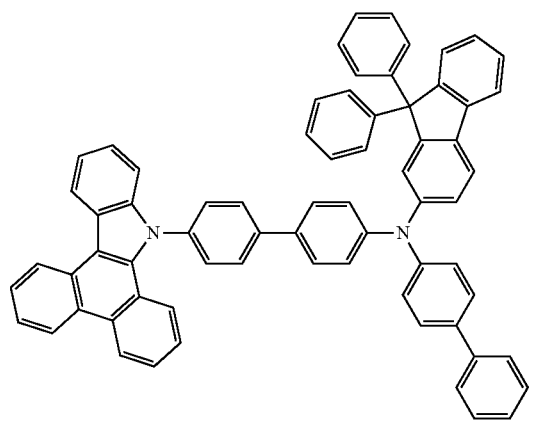
3-59
3-60
3-61
3-62
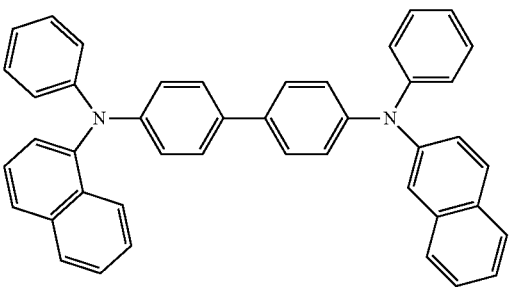
3-63
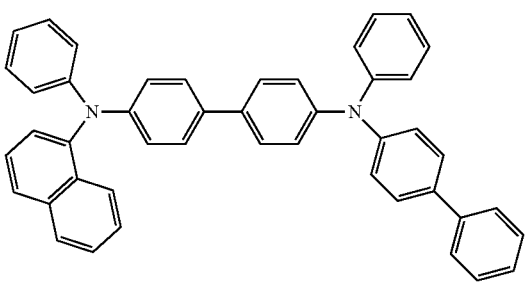
3-64
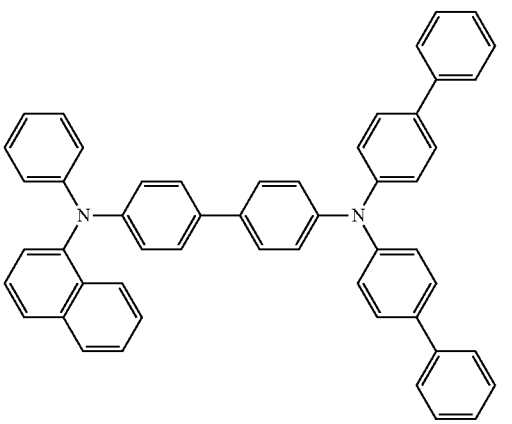
3-65
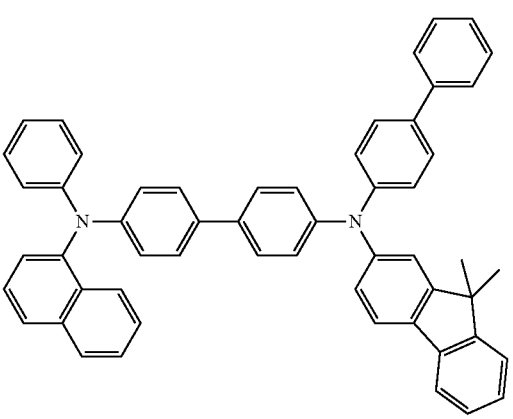

3-66

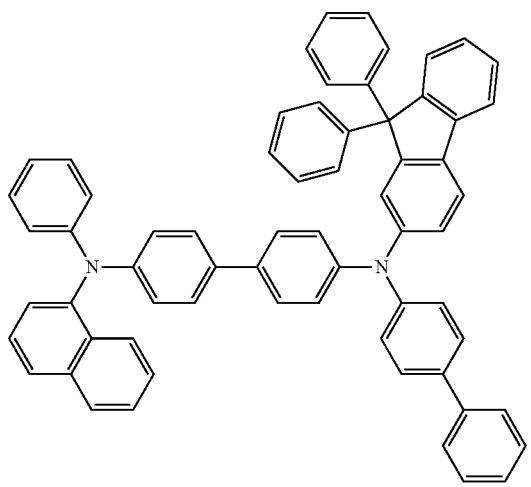

3-67

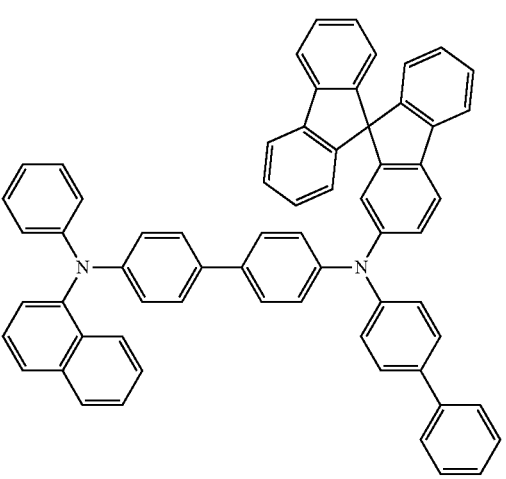

3-68

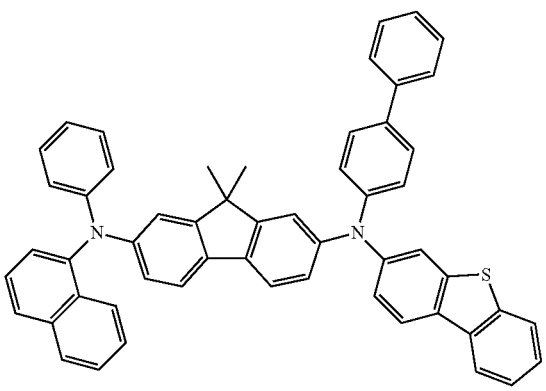

3-69

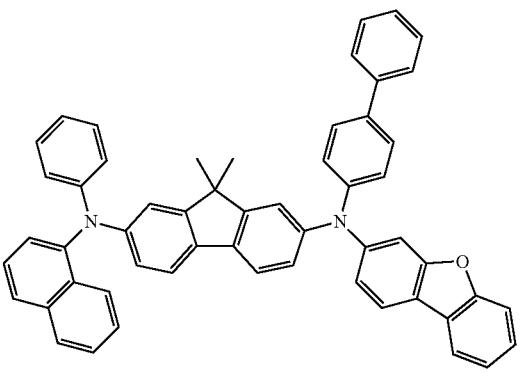

3-70

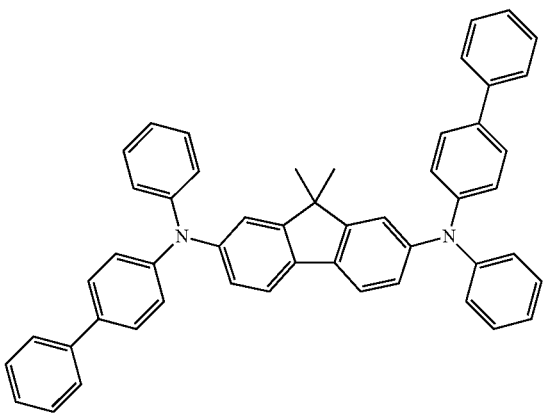

3-71

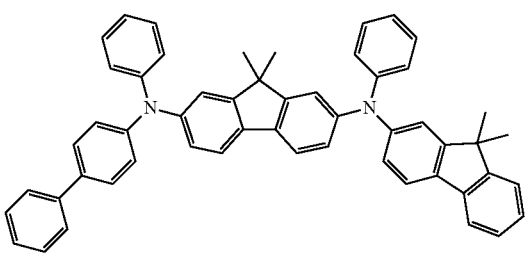

Preferably, the organic material layer according to a specific example of the present invention may be formed by any one of the process of spin coating, nozzle printing, inkjet printing, slot coating, dip coating and roll-to-roll.

In another aspect of the present invention, the present invention provides an organic electric element further including at least a layer to improve luminous efficiency which is formed on at least one of the sides the first and second electrodes, which is opposite to the organic material layer. Preferably, the layer to improve luminous efficiency may comprise the compound represented by Formula 1 above.

In another aspect of the present invention, the present invention provides an electronic device comprising a display device, which comprises the organic electric element containing the organic layer, wherein the organic layer comprises the compound according to the present invention, and a control unit for driving the display device. Here, the electronic device according to the present invention may be at least one of an organic light emitting diode, an organic solar cell, an organic photo conductor, an organic transistor, and an element for monochromatic or white illumination.

Hereinafter, Synthesis Examples of the compound represented by Formulae according to the present invention and Preparation Examples of an organic electric element will be described in detail by way of example. However, the following examples are only for illustrative purposes and are not intended to limit the scope of the invention.

SYNTHESIS EXAMPLE

The final product 1 of the present invention, represented by Formula 1, can be synthesized by reaction between Sub 1 and Sub 2 as illustrated in, but not limited to, the following Reaction Scheme 1.

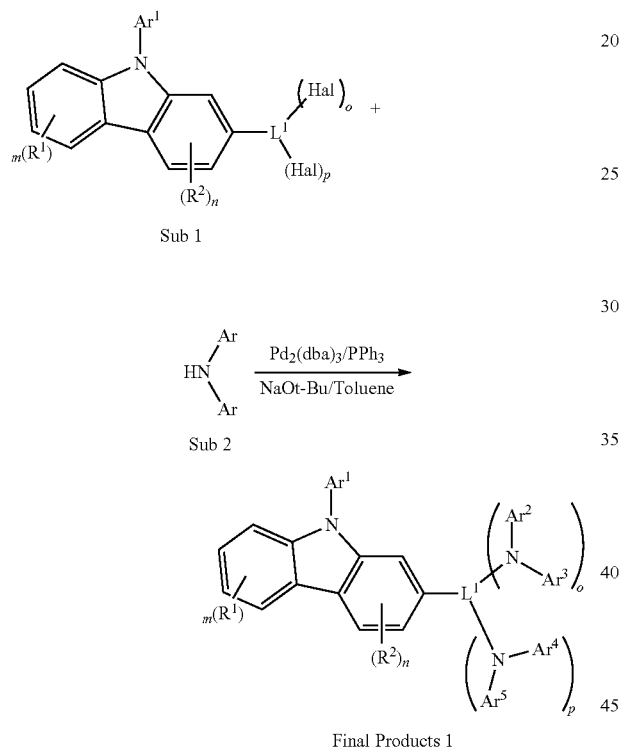

*Hal = halogen (F, Cl, Br, I)
*Ar = Ar² or Ar³ or A⁴ or Ar⁵

Synthesis Method of Sub 1

Sub 1 of Reaction Scheme 1 can be synthesized according to, but not limited to, the following Reaction Scheme 2.

<Reaction Scheme 2>

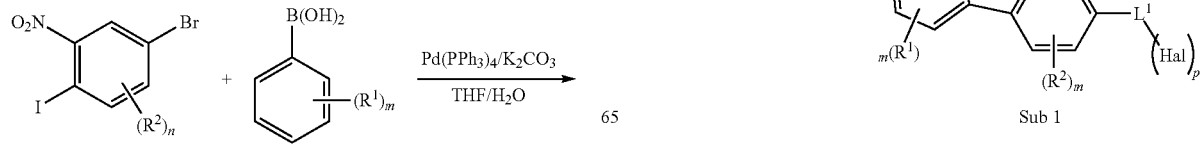

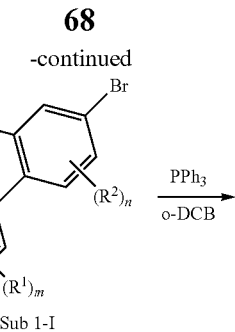

Sub 1-I

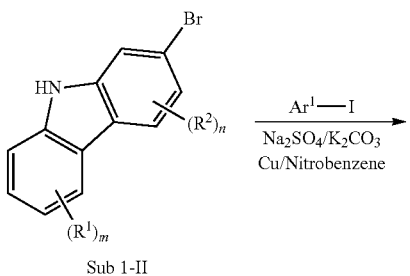

Sub 1-II

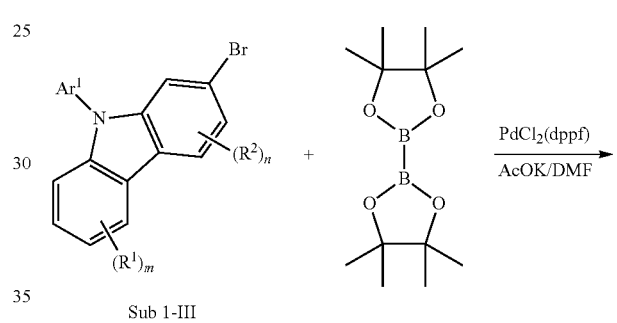

Sub 1-III

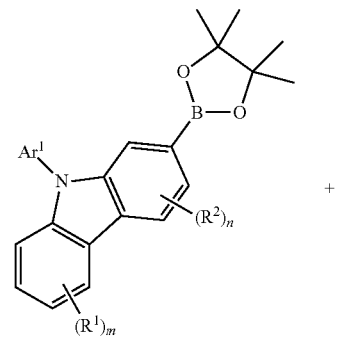

Sub 1-IV

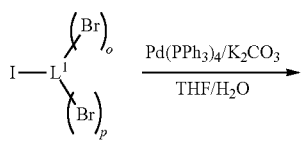

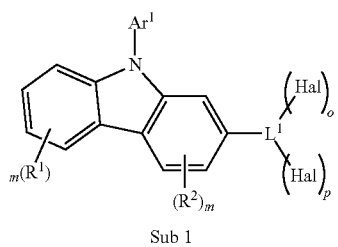

Sub 1

Synthesis Method of Sub 1-I-1

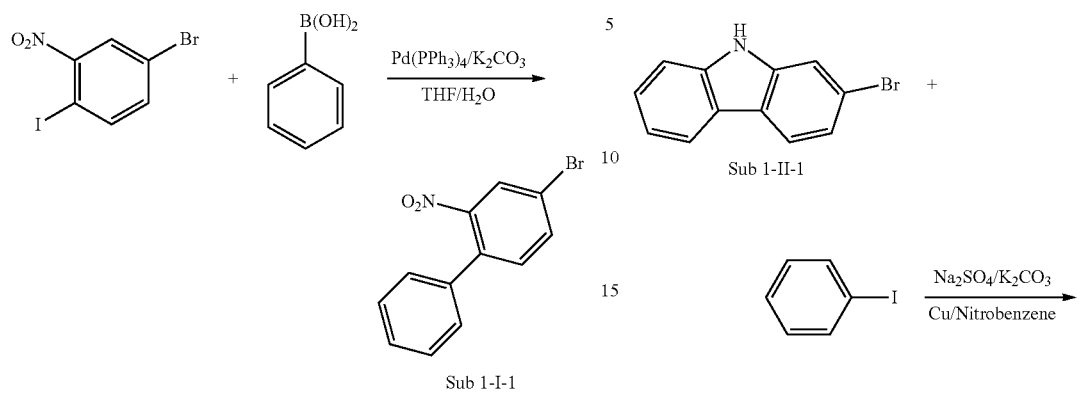

Phenylboronic acid (76.84 g, 630.2 mmol) as the starting material was dissolved in THF (2780 mL) in a round bottom flask, and 4-bromo-1-iodo-2-nitrobenzene (309.96 g, 945.3 mmol), Pd(PPh$_3$)$_4$ (36.41 g, 31.5 mmol), K$_2$CO$_3$ (261.3 g, 1890.6 mmol), and water (1390 mL) were added to the reaction solution, followed by stirring at 80° C. Upon completion of the reaction, the reaction product was extracted with CH$_2$Cl$_2$ and water. The extracted organic layer was dried with MgSO$_4$ and concentrated, and then the produced organic material was separated by a silica gel column and recrystallized to obtain 122.68 g of product (yield: 70%).

Synthesis Method of Sub 1-II-1

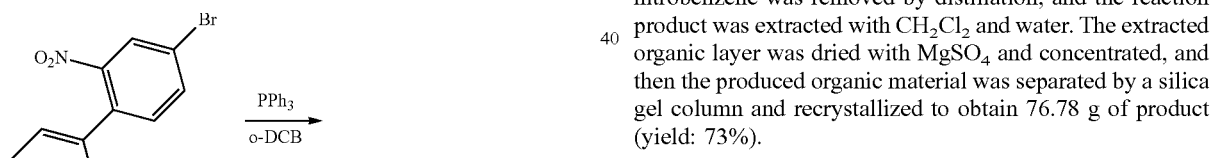

The obtained Sub 1-I-1 (122.68 g, 441.1 mmol) was dissolved in o-dichlorobenzene (1810 mL) in a round bottom flask, and triphenylphosphine (289.26 g, 1102.8 mmol) was added to the reaction solution, followed by stirring at 200° C. Upon completion of the reaction, o-dichlorobenzene was removed by distillation, and the reaction product was extracted with CH$_2$Cl$_2$ and water. The extracted organic layer was dried with MgSO$_4$ and concentrated, and then the produced organic material was separated by a silica gel column and recrystallized to obtain 80.34 g of product (yield: 74%).

(1) Synthesis Method of Sub 1-III-1

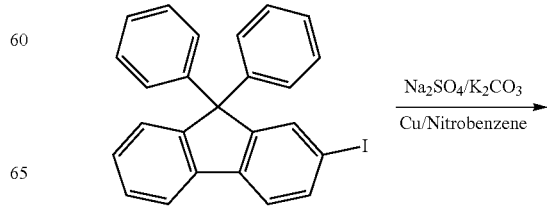

The obtained Sub 1-II-1 (80.34 g, 326.5 mmol) was dissolved in nitrobenzene (653 mL) in a round bottom flask, and iodobenzene (99.9 g, 489.7 mmol), Na$_2$SO$_4$ (46.37 g, 326.5 mmol), K$_2$CO$_3$ (45.12 g, 326.5 mmol), and Cu (6.22 g, 97.9 mmol) were added to the reaction solution, followed by stirring at 200° C. Upon completion of the reaction, nitrobenzene was removed by distillation, and the reaction product was extracted with CH$_2$Cl$_2$ and water. The extracted organic layer was dried with MgSO$_4$ and concentrated, and then the produced organic material was separated by a silica gel column and recrystallized to obtain 76.78 g of product (yield: 73%).

(2) Synthesis Method of Sub 1-III-2

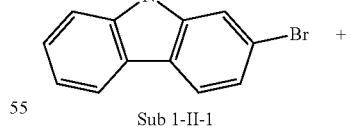

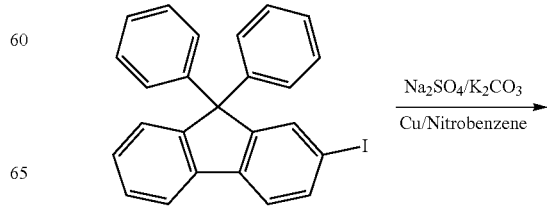

-continued

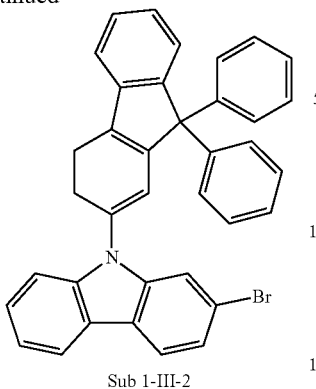

Sub 1-III-2

Using the obtained Sub 1-II-1 (70 g, 284.4 mmol) plus nitrobenzene (570 mL), 2-iodo-9,9-diphenyl-9H-fluorene (189.6 g, 426.7 mmol), Na₂SO₄ (40.4 g, 284.4 mmol), K₂CO₃ (39.3 g, 284.4 mmol), and Cu (5.42 g, 85.3 mmol), the same procedure as described in the synthesis method of Sub 1-III-1 was carried out to obtain 108.8 g of product (yield: 68%).

Synthesis Method of Sub 1-IV-1

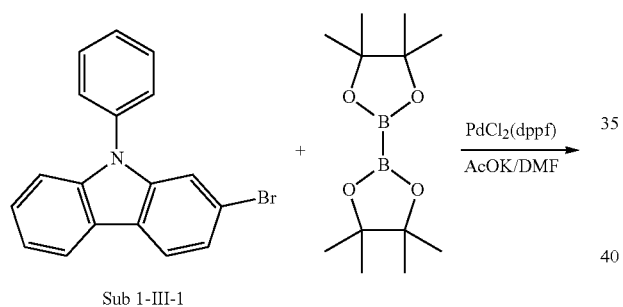

Sub 1-III-1

Sub 1-IV-1

The obtained Sub 1-III-1 (76.78 g, 238.3 mmol) was dissolved in DMF in a round bottom flask, and Bis(pinacolato)diboron (66.57 g, 262.1 mmol), Pd(dppf)Cl₂ (5.84 g, 7.1 mmol), and KOAc (70.16 g, 714.9 mmol) were added to the reaction solution, followed by stirring at 90° C. Upon completion of the reaction, DMF was removed by distillation, and the reaction product was extracted with CH₂Cl₂ and water. The extracted organic layer was dried with MgSO₄ and concentrated, and then the produced organic material was separated by a silica gel column and recrystallized to obtain 73.92 g (yield: 84%).

(1) Synthesis Method of Sub 1-1 (o=1, p=0)

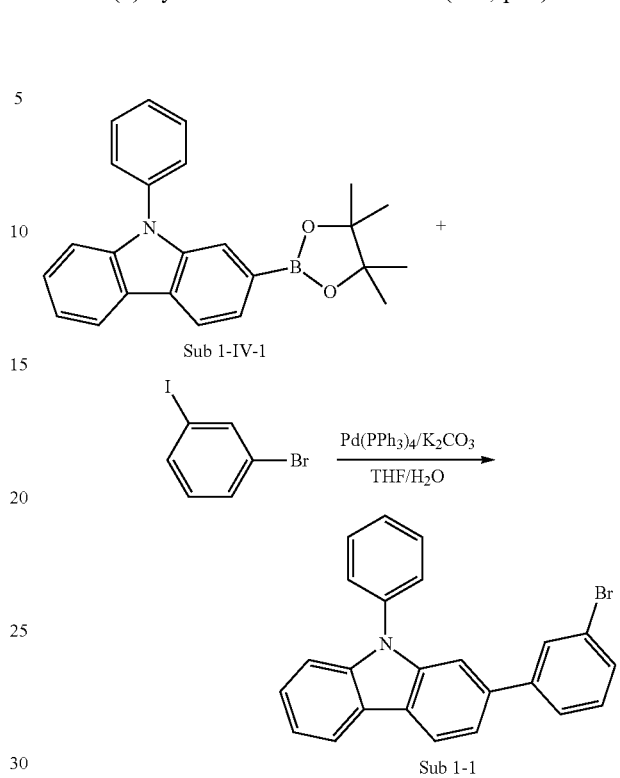

Sub 1-IV-1

Sub 1-1

The obtained Sub 1-IV-1 (73.92 g, 200.2 mmol) was dissolved in THF (880 mL) in a round bottom flask, and 1-bromo-2-iodobenzene (85.0 g, 300.3 mmol), Pd(PPh₃)₄ (11.6 g, 10 mmol), K₂CO₃ (83 g, 600.6 mmol), and water (440 mL) were added to the reaction solution, followed by stirring at 80° C. Upon completion of the reaction, the reaction product was extracted with CH₂Cl₂ and water. The extracted organic layer was dried with MgSO₄ and concentrated, and then the produced organic material was separated by a silica gel column and recrystallized to obtain 55.8 g (yield: 70%).

(2) Synthesis Method of Sub 1-14 (o=1, p=0)

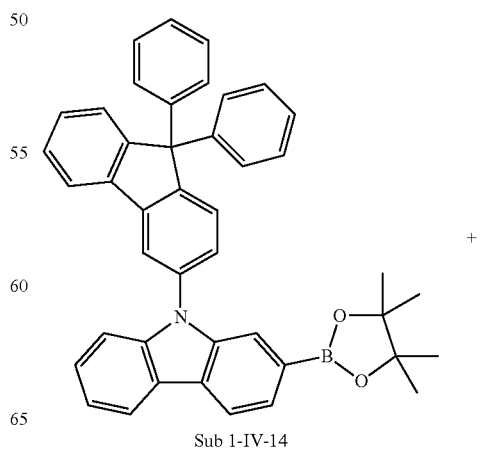

Sub 1-IV-14

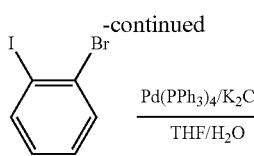

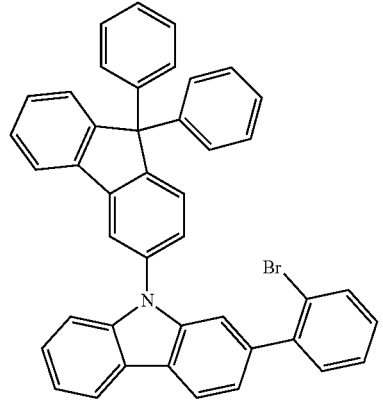

Sub 1-14

Using the obtained Sub 1-IV-14 (80.6 g, 132.3 mmol), THF 582 mL, 1-bromo-2-iodobenzene (56.2 g, 198.6 mmol), Pd(PPh$_3$)$_4$ (7.65 g, 6.62 mmol), K$_2$CO$_3$ (54.9 g, 397.2 mmol), and water (291 mL), the same procedure as described in the synthesis method of Sub 1-1 was carried out to obtain 52.4 g of product (yield: 62%).

(3) Synthesis Method of Sub 1-17 (o=1, p=0)

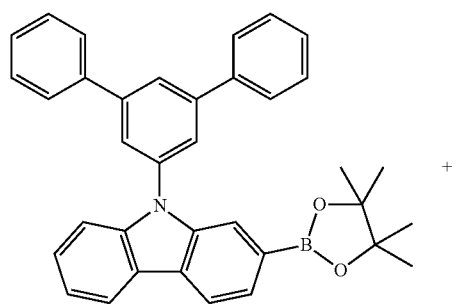

Sub 1-IV-17

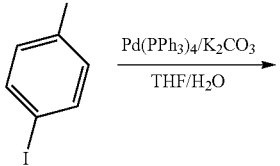

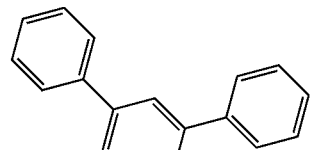

Sub 1-17

Using the obtained Sub 1-IV-17 (65.9 g, 126.4 mmol), THF 556 mL, 1-bromo-2-iodobenzene (53.8 g, 190 mmol), Pd(PPh$_3$)$_4$ (7.3 g, 6.32 mmol), K$_2$CO$_3$ (52.4 g, 319.1 mmol), and water (278 mL), the same procedure as described in the synthesis method of Sub 1-1 was carried out to obtain 45.2 g (yield: 65%).

(4) Synthesis Method of Sub 1-2 (o=1, p=1)

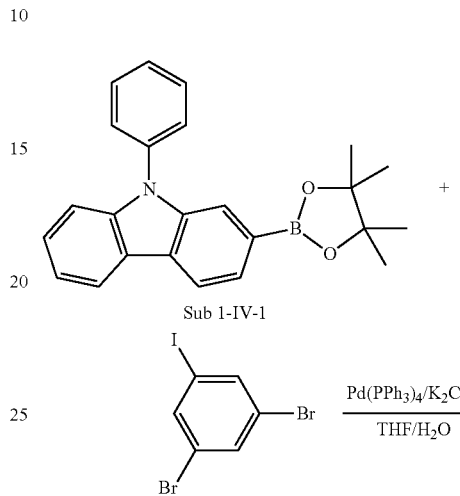

Sub 1-IV-1

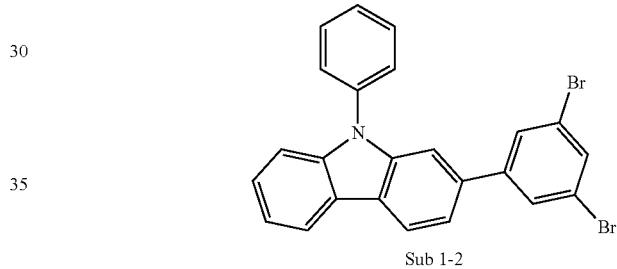

Sub 1-2

The obtained Sub 1-IV-1 (73.92 g, 200.2 mmol) was dissolved in THF (880 mL) in a round bottom flask, and 1,3-dibromo-5-iodobenzene (108.65 g, 300.3 mmol), Pd(PPh$_3$)$_4$ (11.6 g, 10 mmol), K$_2$CO$_3$ (83 g, 600.6 mmol), and water (440 mL) were added to the reaction solution, followed by stirring at 80° C. Upon completion of the reaction, the reaction product was extracted with CH$_2$Cl$_2$ and water. The extracted organic layer was dried with MgSO$_4$ and concentrated, and then the produced organic material was separated by a silica gel column and recrystallized to obtain 69.7 g (yield: 73%).

Meanwhile, examples of Sub 1 compounds include, but are not limited to, the following compounds, and Field Desorption Mass Spectrometry (FD-MS) data of the Sub 1 compounds are given in Table 1 below.

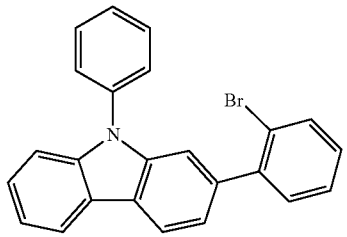

Sub 1-1

Sub 1-2
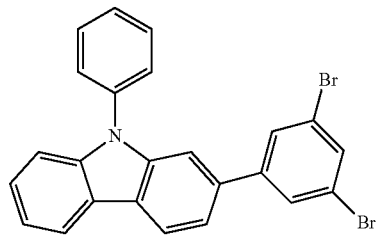
Sub 1-3
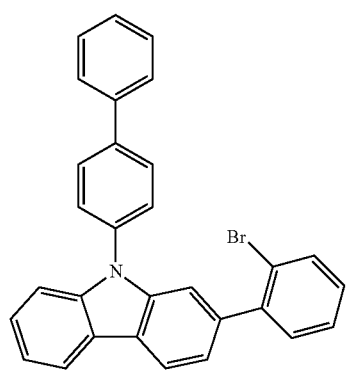
Sub 1-4
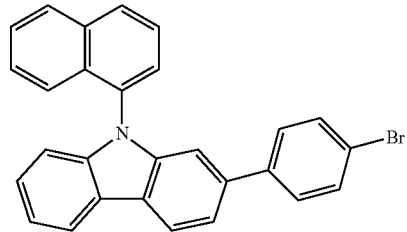
Sub 1-5
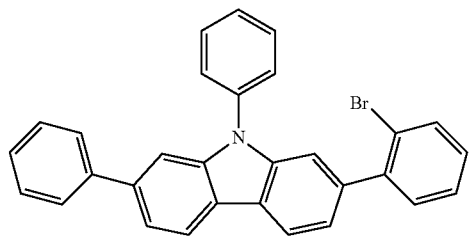
Sub 1-6
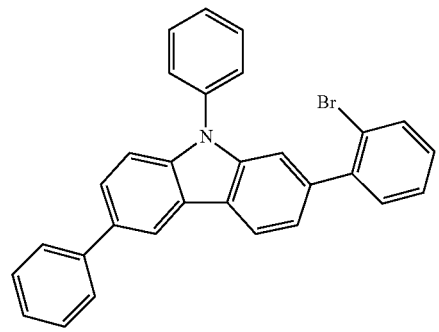
Sub 1-7
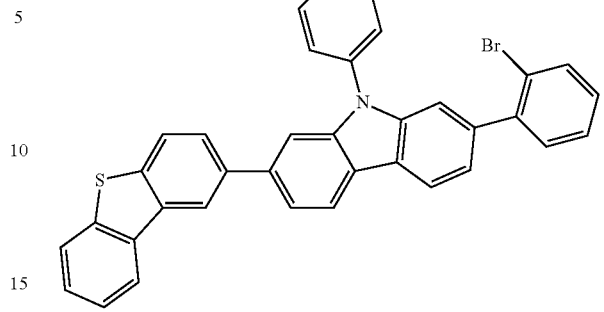
Sub 1-8
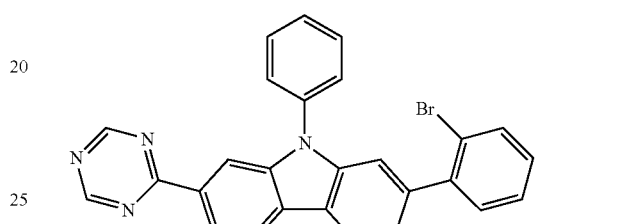
Sub 1-9
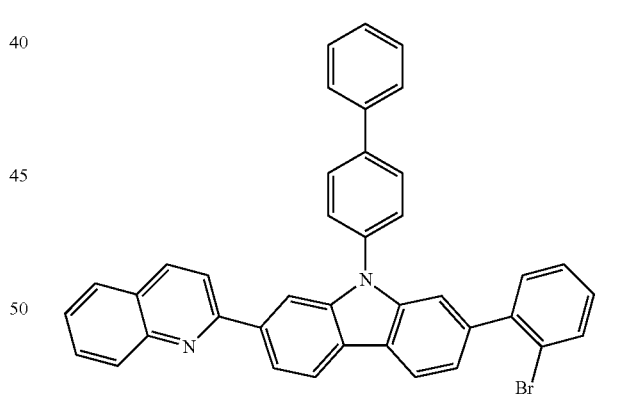
Sub 1-10
Sub 1-11
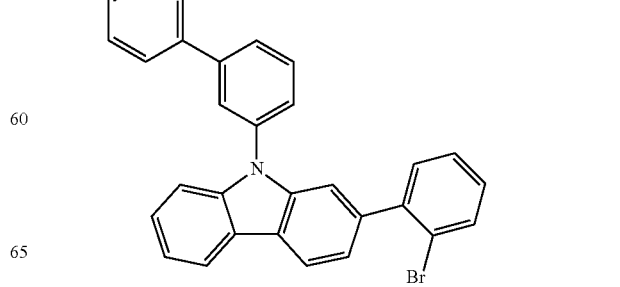

Sub 1-12
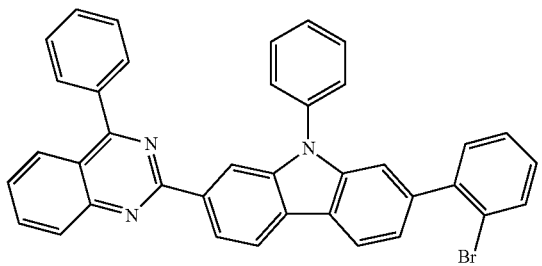
Sub 1-13
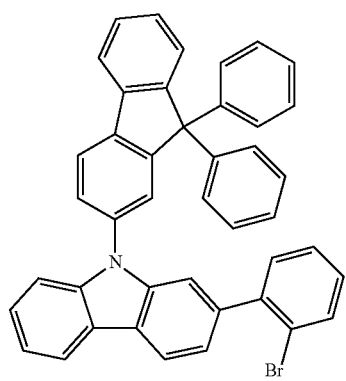
Sub 1-14
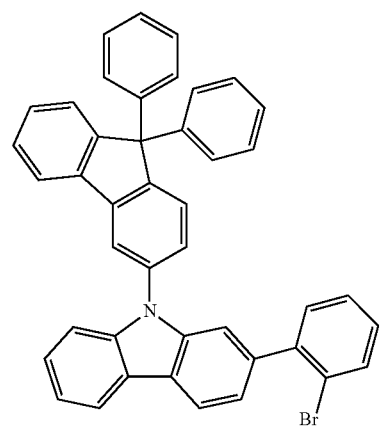
Sub 1-15
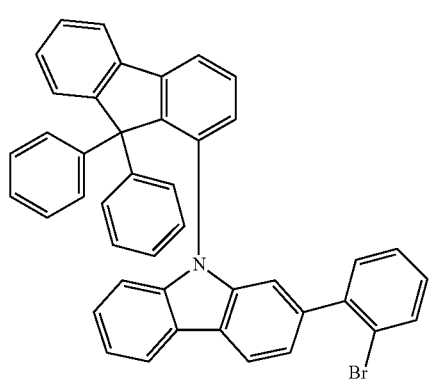
Sub 1-16
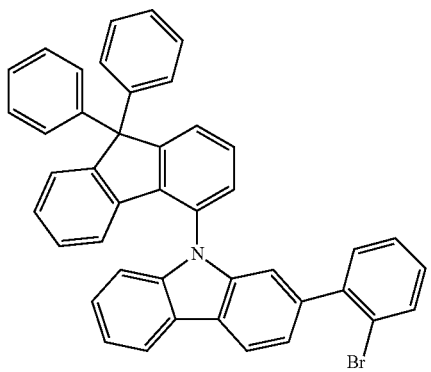
Sub 1-17
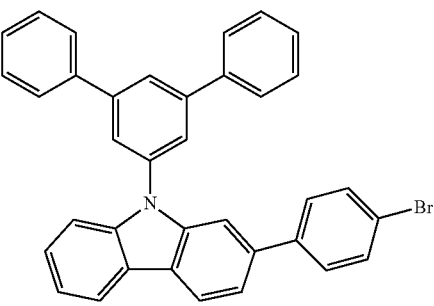
Sub 1-18
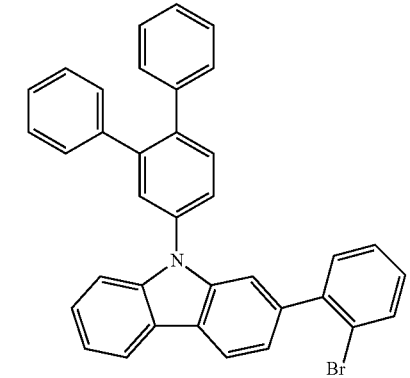
Sub 1-19
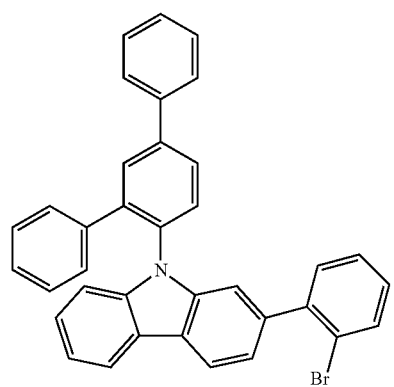

Sub 1-20
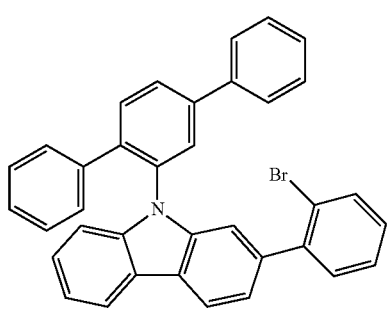
Sub 1-21
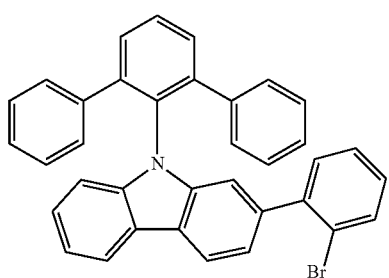
Sub 1-22
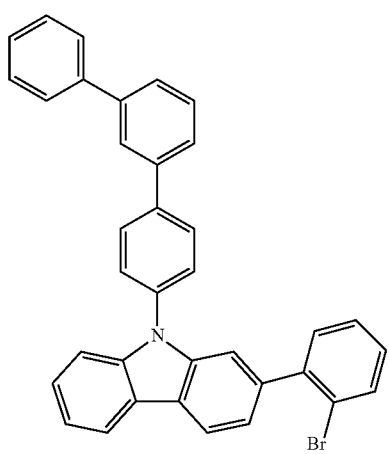
Sub 1-23
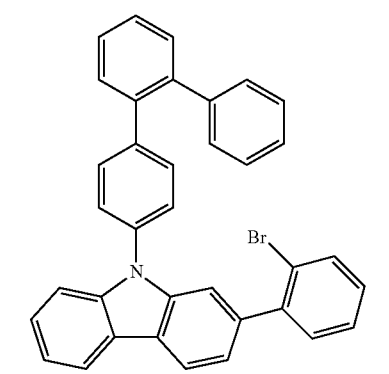
Sub 1-24
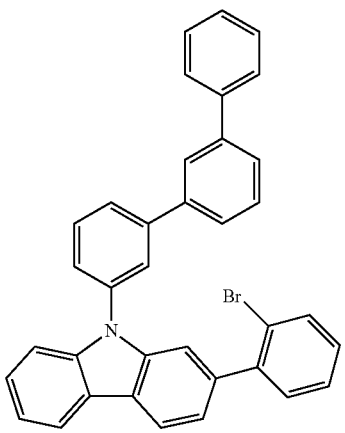
Sub 1-25
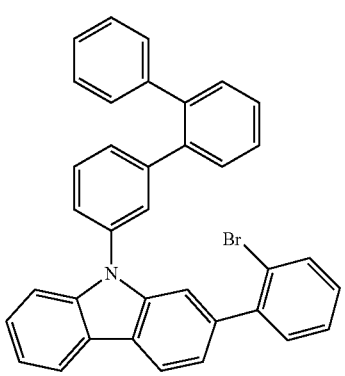
Sub 1-26
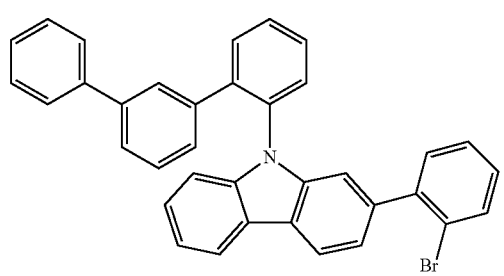
Sub 1-27
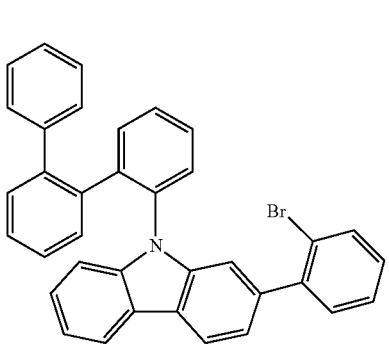

-continued
Sub 1-28
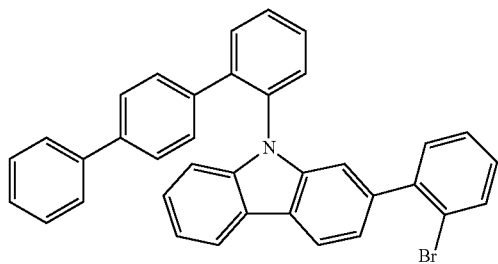
Sub 1-29
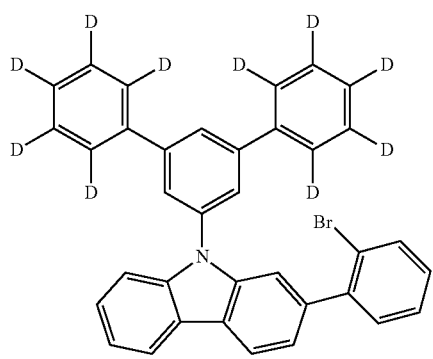
Sub 1-30
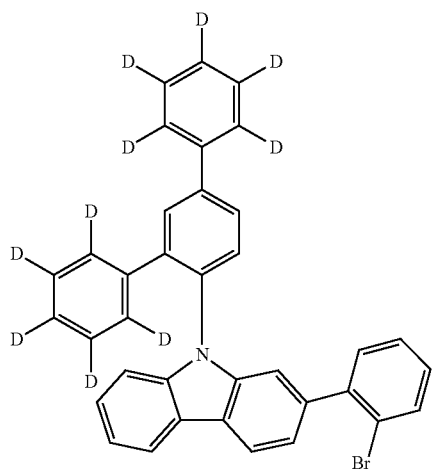
Sub 1-31
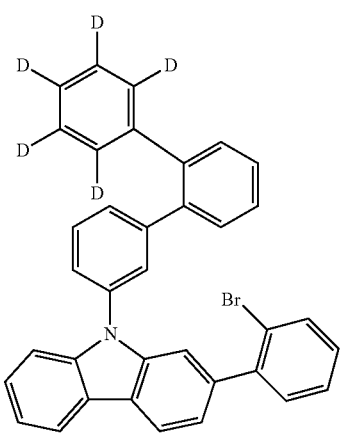
Sub 1-32
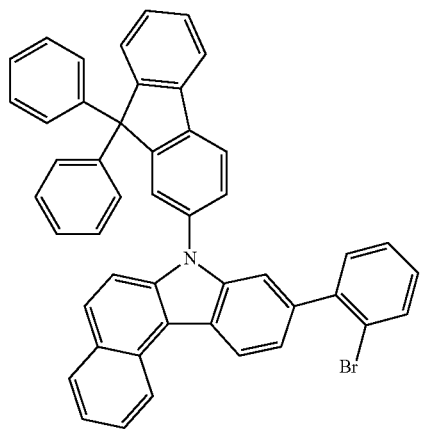
Sub 1-33
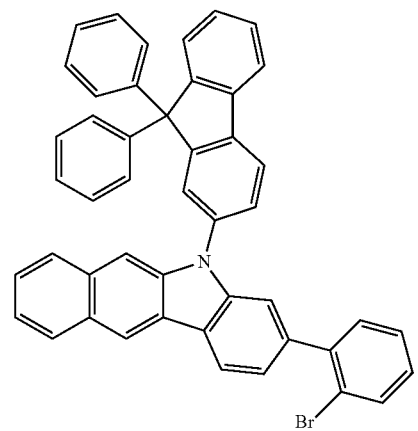
Sub 1-34
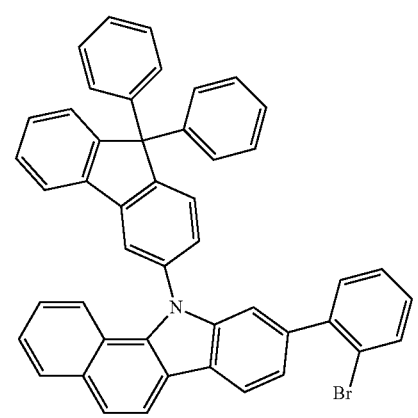

-continued
Sub 1-35
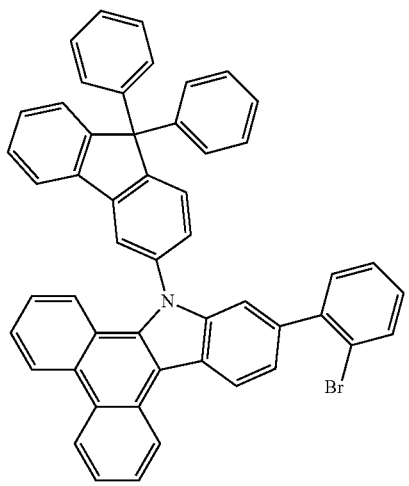
Sub 1-36
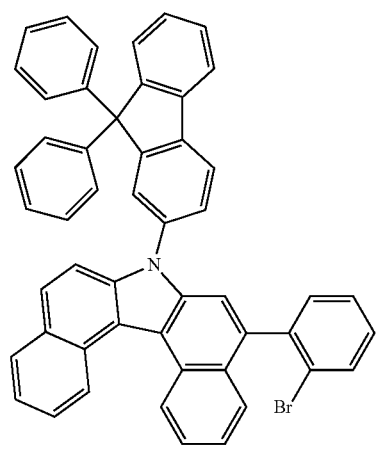
Sub 1-37
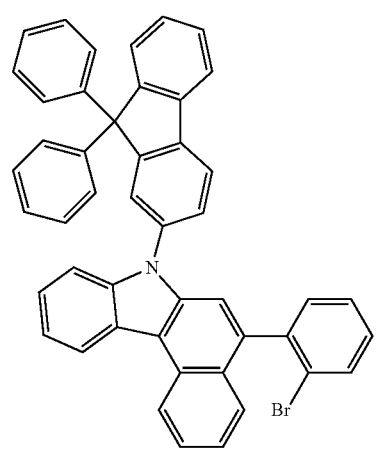
Sub 1-38
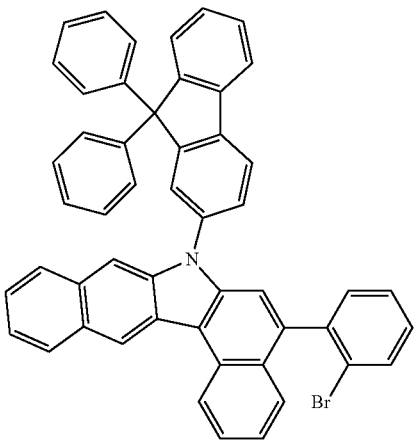
Sub 1-39
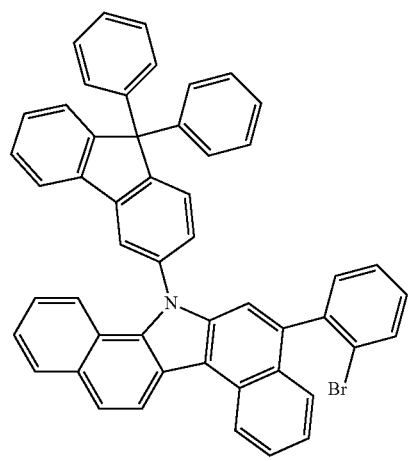
Sub 1-40
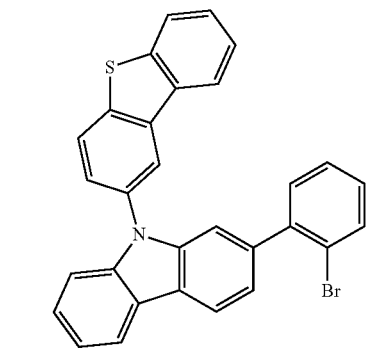
Sub 1-41
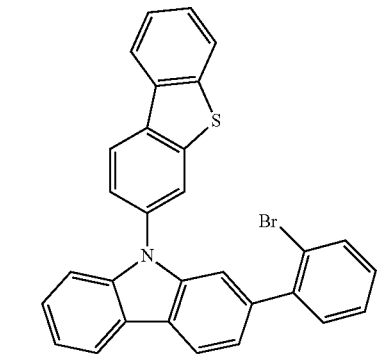

Sub 1-42
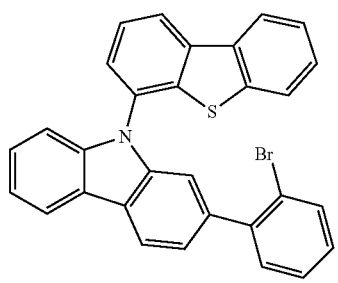
Sub 1-43
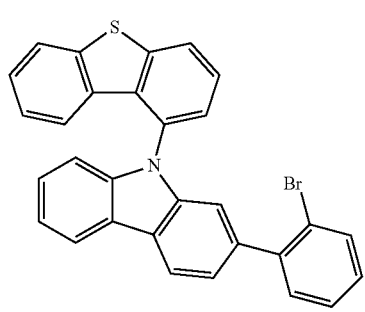
Sub 1-44
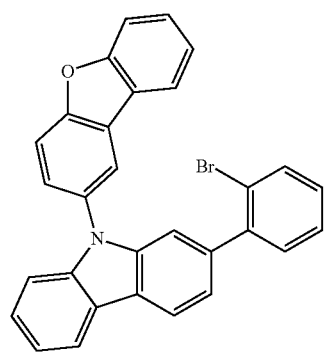
Sub 1-45
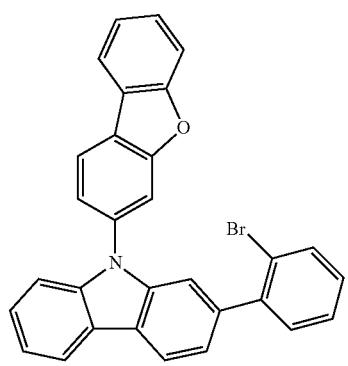
Sub 1-46
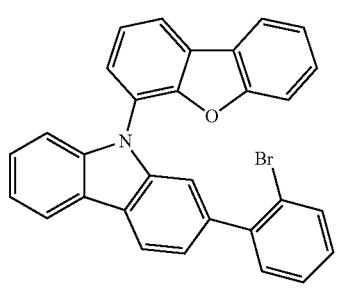
Sub 1-47
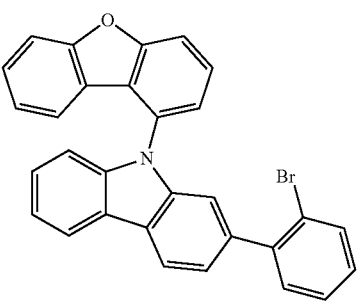
Sub 1-48
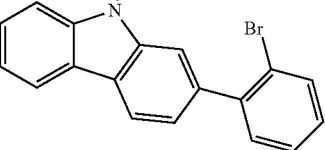
Sub 1-49
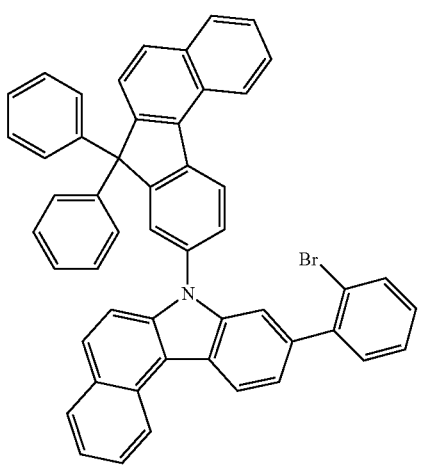
Sub 1-50

87
-continued
Sub 1-51
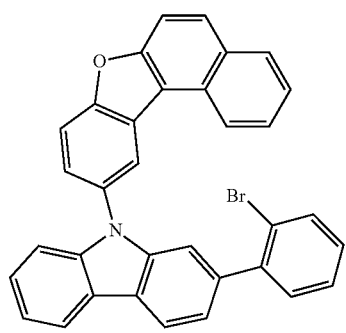
Sub 1-52
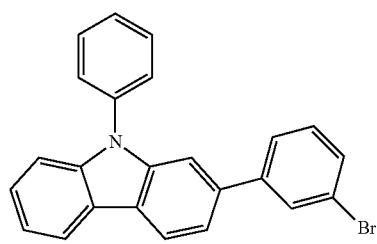
Sub 1-53
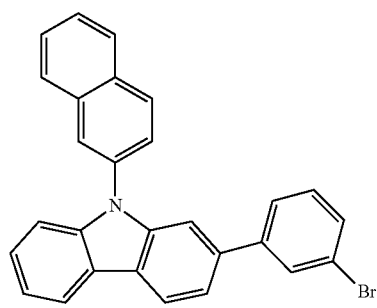
Sub 1-54
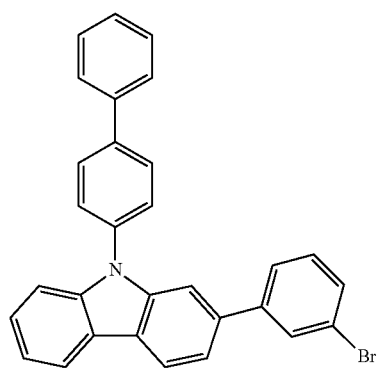
Sub 1-55
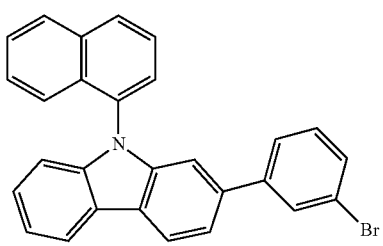
88
-continued
Sub 1-56
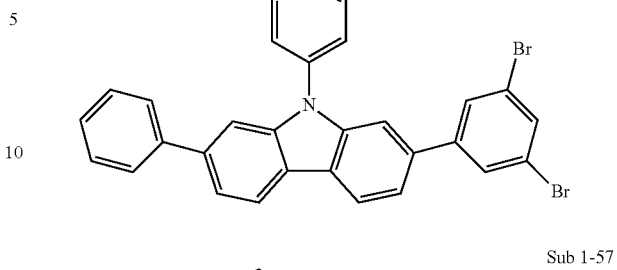
Sub 1-57
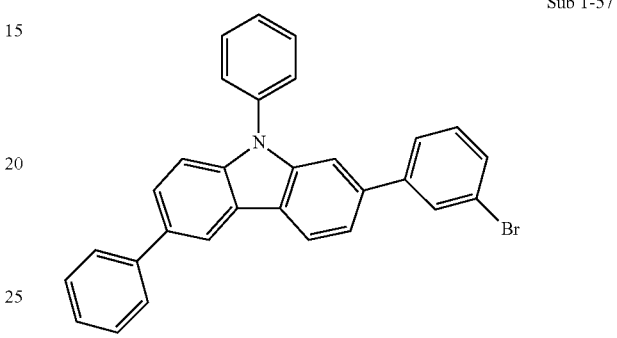
Sub 1-58
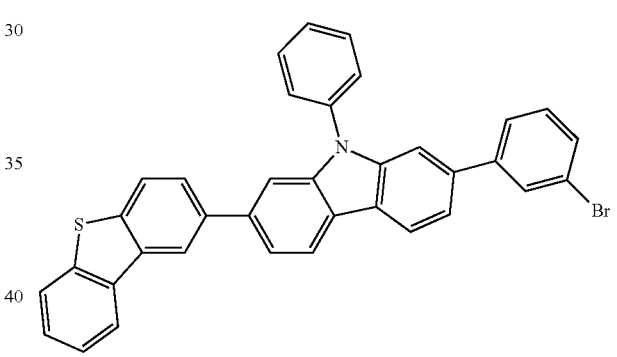
Sub 1-59
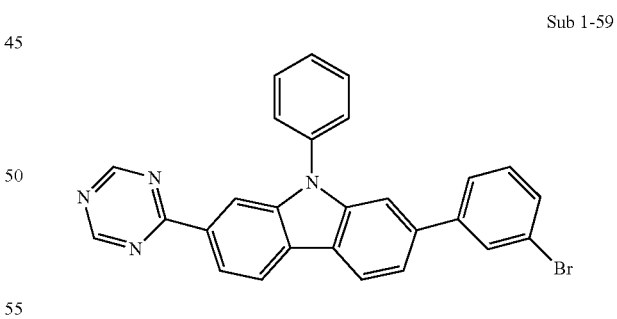
Sub 1-60
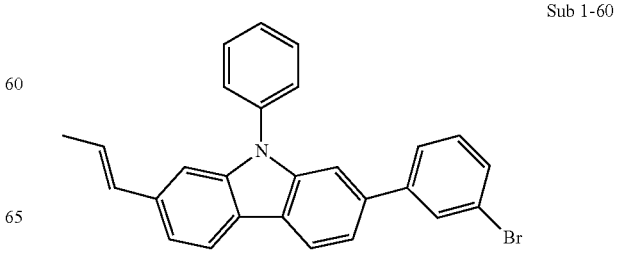

Sub 1-61
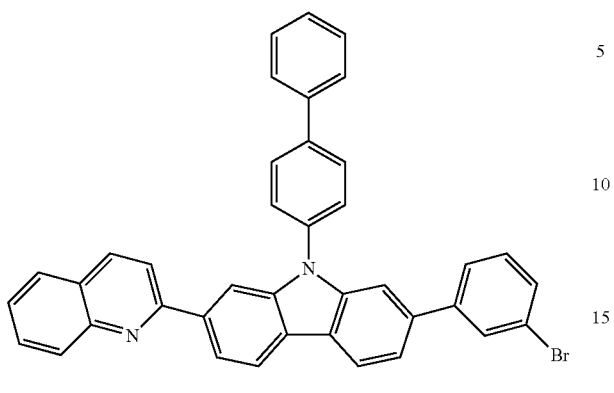
Sub 1-65
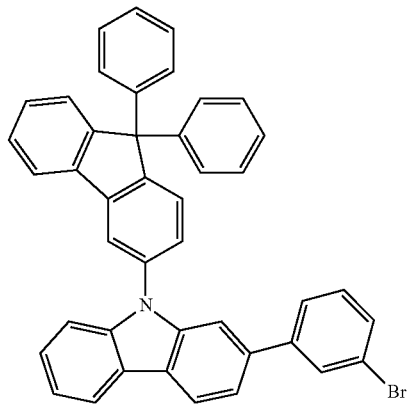
Sub 1-62
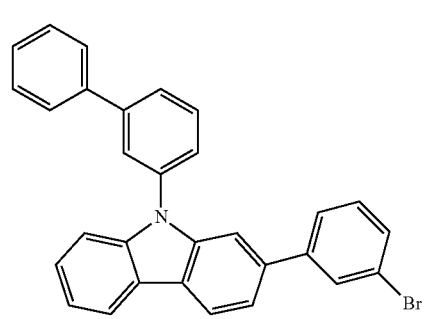
Sub 1-66
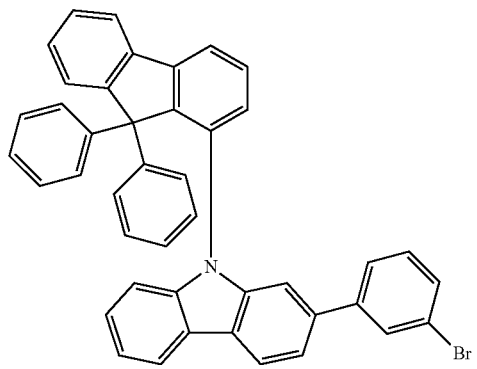
Sub 1-63
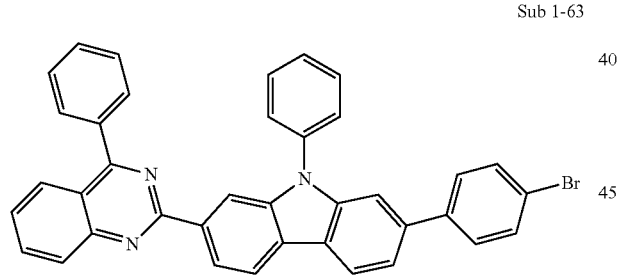
Sub 1-67
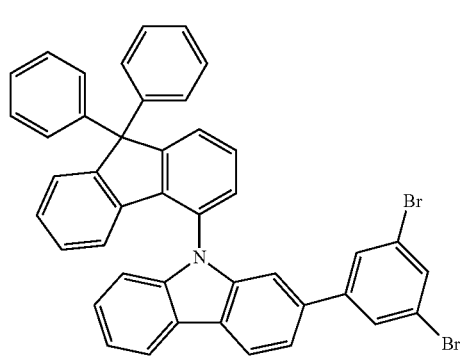
Sub 1-64
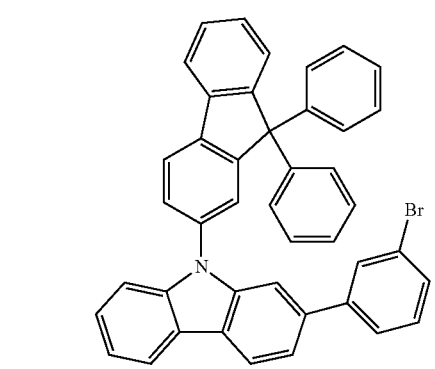
Sub 1-68
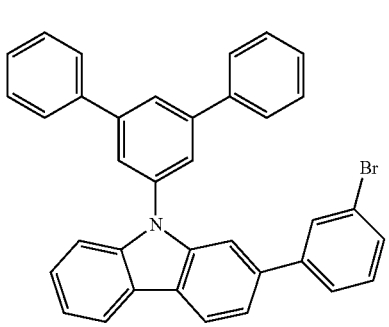

Sub 1-69
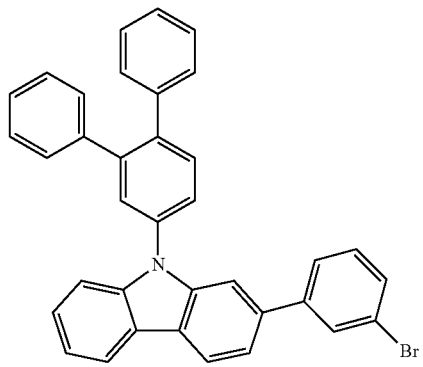
Sub 1-70
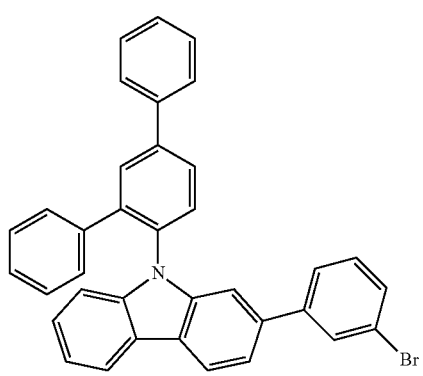
Sub 1-71
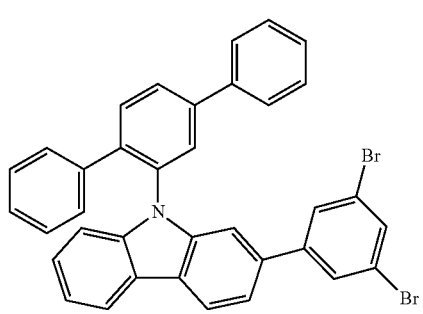
Sub 1-72
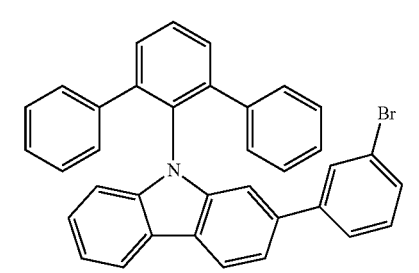
Sub 1-73
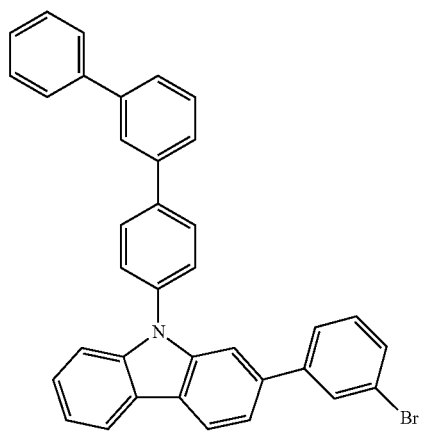
Sub 1-74
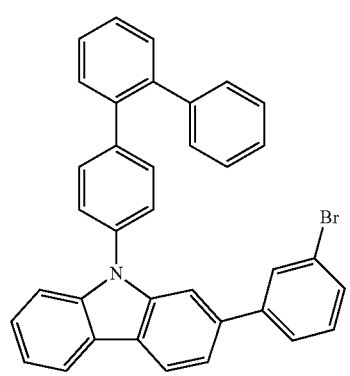
Sub 1-75
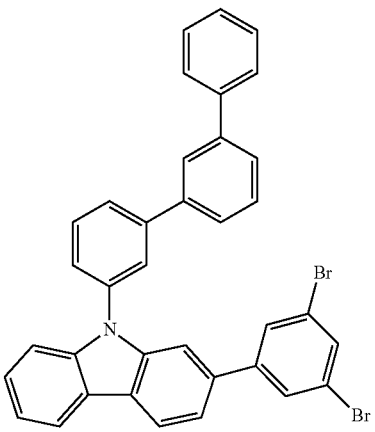
Sub 1-76
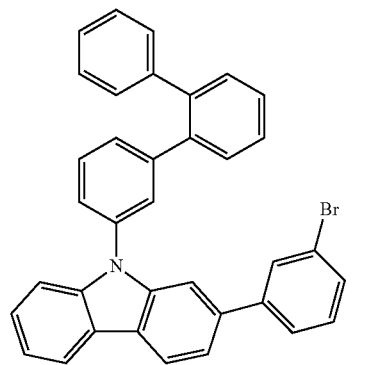

Sub 1-77
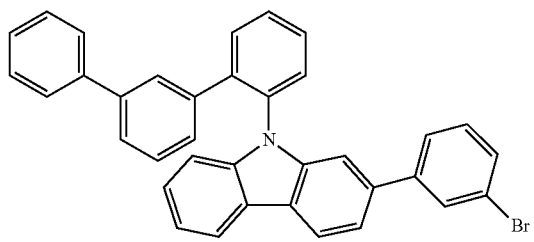
Sub 1-78
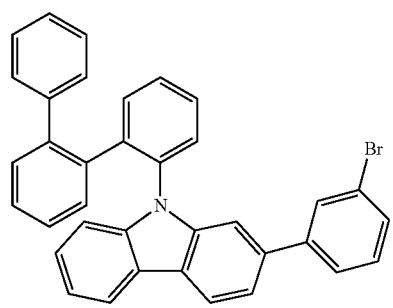
Sub 1-79
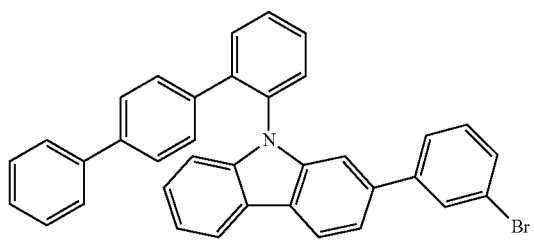
Sub 1-80
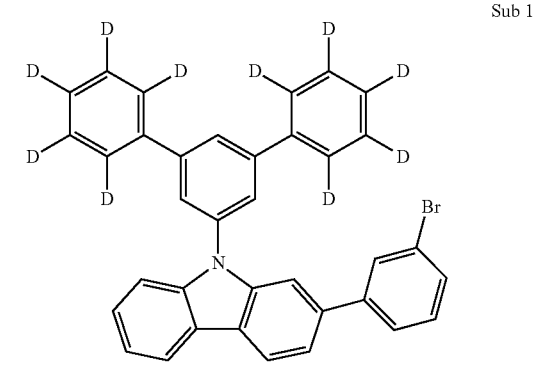
Sub 1-81
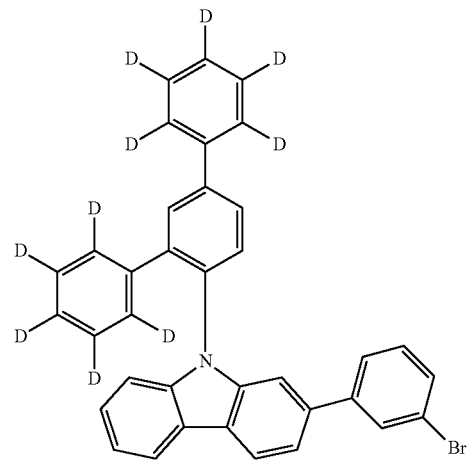
Sub 1-82
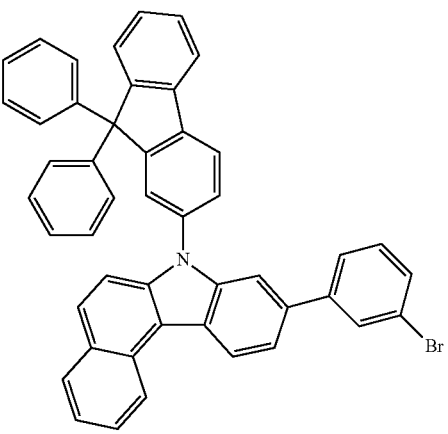
Sub 1-83
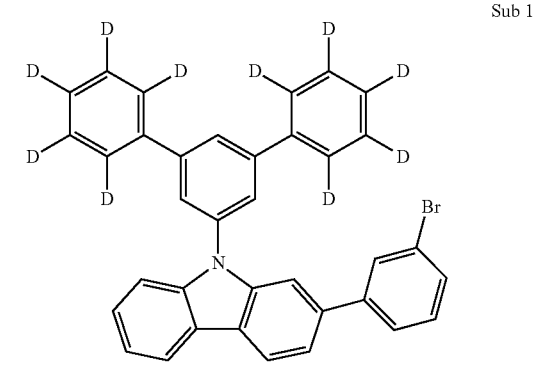

Sub 1-84
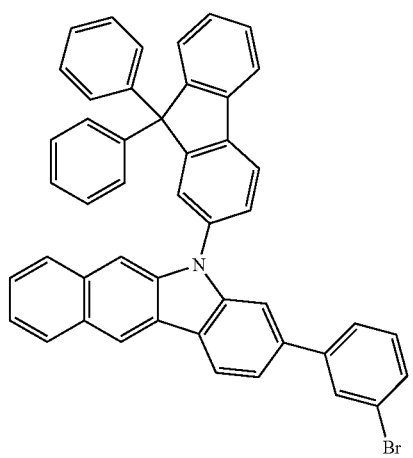
Sub 1-87
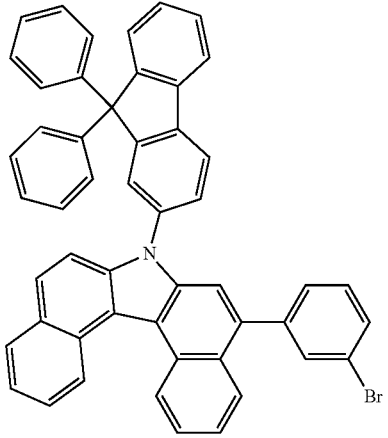
Sub 1-85
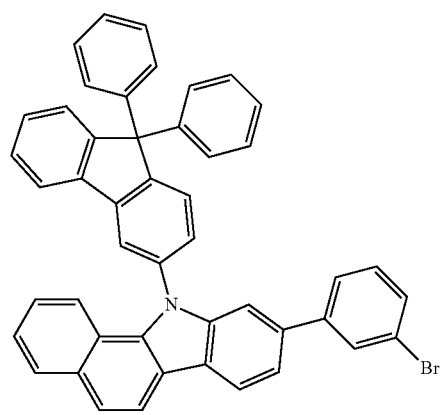
Sub 1-88
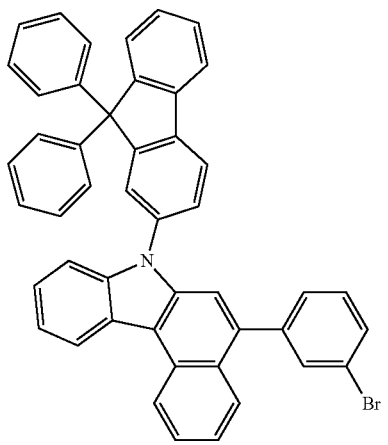
Sub 1-86
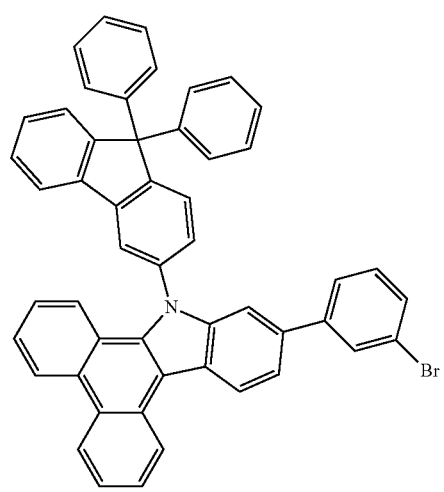
Sub 1-89
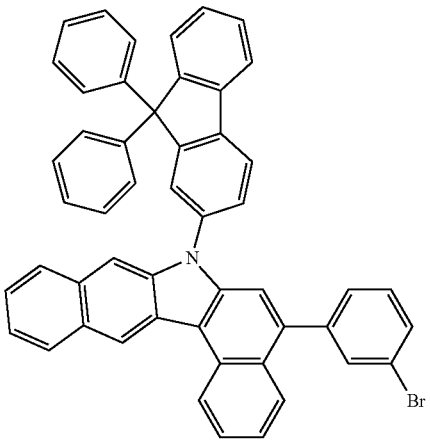

Sub 1-90
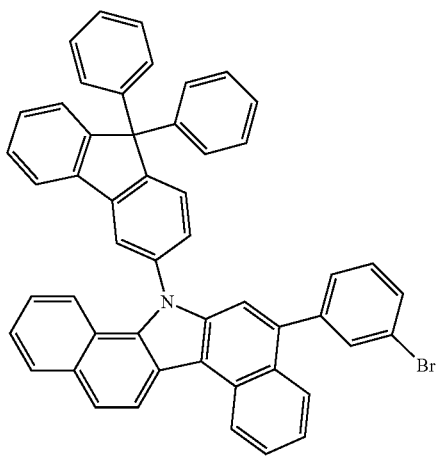
Sub 1-91
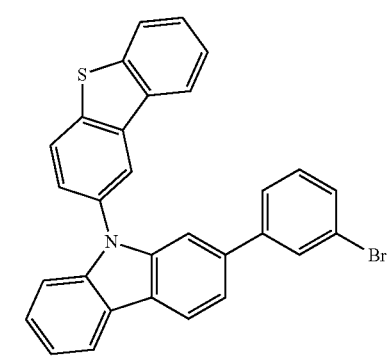
Sub 1-92
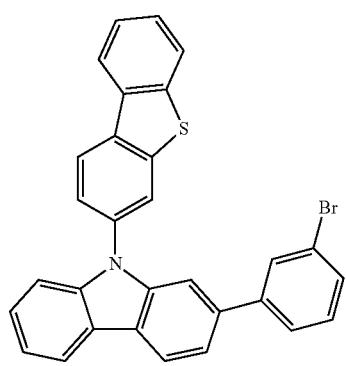
Sub 1-93
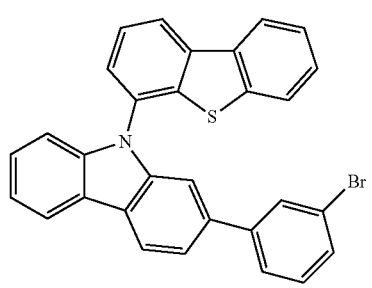
Sub 1-94
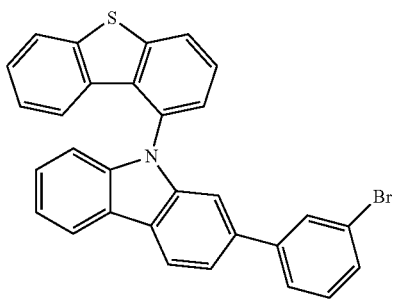
Sub 1-95
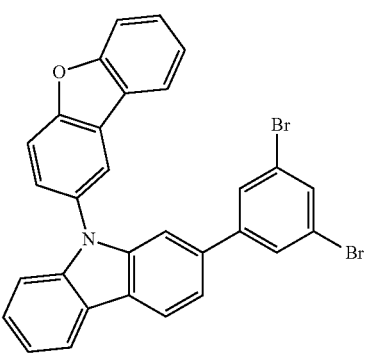
Sub 1-96
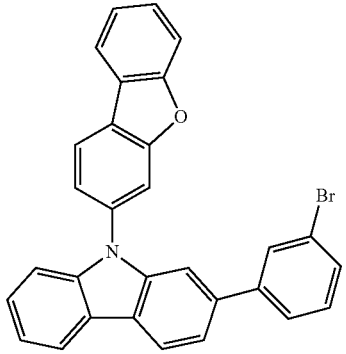
Sub 1-97
Sub 1-98
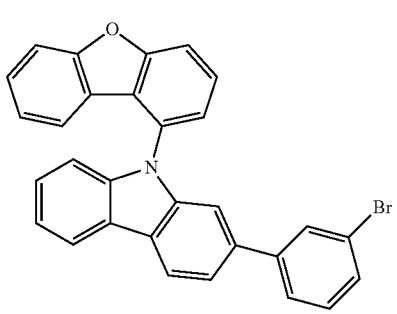

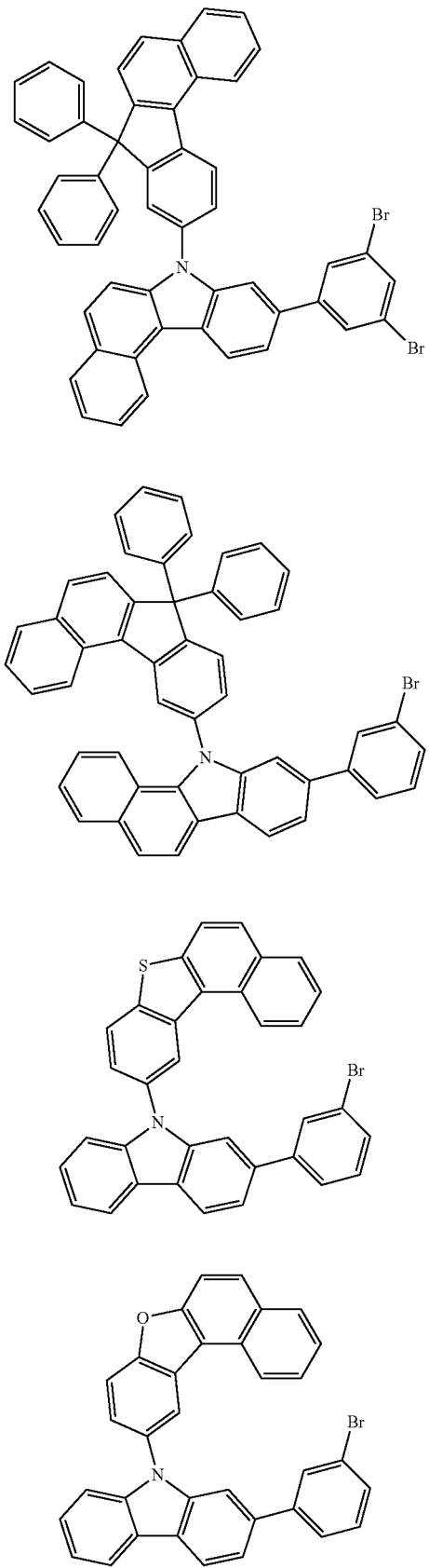

TABLE 1

| Compound | FD-MS |
|---|---|
| Sub 1-1 | m/z = 397.05 (C$_{24}$H$_{16}$BrN = 398.29) |
| Sub 1-2 | m/z = 474.96 (C$_{24}$H$_{15}$Br$_2$N = 477.19) |
| Sub 1-3 | m/z = 473.08 (C$_{30}$H$_{20}$BrN = 474.39) |
| Sub 1-4 | m/z = 447.06 (C$_{28}$H$_{18}$BrN = 448.35) |
| Sub 1-5 | m/z = 473.08 (C$_{30}$H$_{20}$BrN = 474.39) |
| Sub 1-6 | m/z = 473.08 (C$_{30}$H$_{20}$BrN = 474.39) |
| Sub 1-7 | m/z = 579.07 (C$_{36}$H$_{22}$BrNS = 580.54) |
| Sub 1-8 | m/z = 476.06 (C$_{27}$H$_{17}$BrN$_4$ = 477.35) |
| Sub 1-9 | m/z = 437.08 (C$_{27}$H$_{20}$BrN = 438.36) |
| Sub 1-10 | m/z = 600.12 (C$_{39}$H$_{25}$BrN$_2$ = 601.53) |
| Sub 1-11 | m/z = 473.08 (C$_{30}$H$_{20}$BrN = 474.39) |
| Sub 1-12 | m/z = 601.12 (C$_{38}$H$_{24}$BrN$_3$ = 602.52) |
| Sub 1-13 | m/z = 637.14 (C$_{43}$H$_{28}$BrN = 638.59) |
| Sub 1-14 | m/z = 637.14 (C$_{43}$H$_{28}$BrN = 638.59) |
| Sub 1-15 | m/z = 637.14 (C$_{43}$H$_{28}$BrN = 638.59) |
| Sub 1-16 | m/z = 637.14 (C$_{43}$H$_{28}$BrN = 638.59) |
| Sub 1-17 | m/z = 549.11 (C$_{36}$H$_{24}$BrN = 550.49) |
| Sub 1-18 | m/z = 549.11 (C$_{36}$H$_{24}$BrN = 550.49) |
| Sub 1-19 | m/z = 549.11 (C$_{36}$H$_{24}$BrN = 550.49) |
| Sub 1-20 | m/z = 549.11 (C$_{36}$H$_{24}$BrN = 550.49) |
| Sub 1-21 | m/z = 549.11 (C$_{36}$H$_{24}$BrN = 550.49) |
| Sub 1-22 | m/z = 549.11 (C$_{36}$H$_{24}$BrN = 550.49) |
| Sub 1-23 | m/z = 549.11 (C$_{36}$H$_{24}$BrN = 550.49) |
| Sub 1-24 | m/z = 549.11 (C$_{36}$H$_{24}$BrN = 550.49) |
| Sub 1-25 | m/z = 549.11 (C$_{36}$H$_{24}$BrN = 550.49) |
| Sub 1-26 | m/z = 549.11 (C$_{36}$H$_{24}$BrN = 550.49) |
| Sub 1-27 | m/z = 549.11 (C$_{36}$H$_{24}$BrN = 550.49) |
| Sub 1-28 | m/z = 549.11 (C$_{36}$H$_{24}$BrN = 550.49) |
| Sub 1-29 | m/z = 559.2 (C$_{36}$H$_{14}$D$_{10}$BrN = 560.6) |
| Sub 1-30 | m/z = 559.17 (C$_{36}$H$_{14}$D$_{10}$BrN = 560.6) |
| Sub 1-31 | m/z = 554.1 (C$_{36}$H$_{19}$D$_5$BrN = 555.52) |
| Sub 1-32 | m/z = 687.16 (C$_{47}$H$_{30}$BrN = 688.65) |
| Sub 1-33 | m/z = 687.16 (C$_{47}$H$_{30}$BrN = 688.65) |
| Sub 1-34 | m/z = 687.16 (C$_{47}$H$_{30}$BrN = 688.65) |
| Sub 1-35 | m/z = 737.17 (C$_{51}$H$_{32}$BrN = 738.71) |
| Sub 1-36 | m/z = 737.17 (C$_{51}$H$_{32}$BrN = 738.71) |
| Sub 1-37 | m/z = 687.16 (C$_{47}$H$_{30}$BrN = 688.65) |
| Sub 1-38 | m/z = 737.17 (C$_{51}$H$_{32}$BrN = 738.71) |
| Sub 1-39 | m/z = 737.17 (C$_{51}$H$_{32}$BrN = 738.71) |
| Sub 1-40 | m/z = 503.03 (C$_{30}$H$_{18}$BrNS = 504.44) |
| Sub 1-41 | m/z = 503.03 (C$_{30}$H$_{18}$BrNS = 504.44) |
| Sub 1-42 | m/z = 503.03 (C$_{30}$H$_{18}$BrNS = 504.44) |
| Sub 1-43 | m/z = 503.03 (C$_{30}$H$_{18}$BrNS = 504.44) |
| Sub 1-44 | m/z = 487.06 (C$_{30}$H$_{18}$BrNO = 488.37) |
| Sub 1-45 | m/z = 487.1 (C$_{30}$H$_{18}$BrNO = 488.37) |
| Sub 1-46 | m/z = 487.06 (C$_{30}$H$_{18}$BrNO = 488.37) |
| Sub 1-47 | m/z = 487.1 (C$_{30}$H$_{18}$BrNO = 488.37) |
| Sub 1-48 | m/z = 737.17 (C$_{51}$H$_{32}$BrN = 738.71) |
| Sub 1-49 | m/z = 737.17 (C$_{51}$H$_{32}$BrN = 738.71) |
| Sub 1-50 | m/z = 553.05 (C$_{34}$H$_{20}$BrNS = 554.50) |
| Sub 1-51 | m/z = 537.07 (C$_{34}$H$_{20}$BrNO = 538.43) |
| Sub 1-52 | m/z = 397.05 (C$_{24}$H$_{16}$BrN = 398.29) |
| Sub 1-53 | m/z = 447.06 (C$_{28}$H$_{18}$BrN = 448.35) |
| Sub 1-54 | m/z = 473.08 (C$_{30}$H$_{20}$BrN = 474.39) |
| Sub 1-55 | m/z = 447.06 (C$_{28}$H$_{18}$BrN = 448.35) |
| Sub 1-56 | m/z = 550.99 (C$_{30}$H$_{19}$Br$_2$N = 553.29) |
| Sub 1-57 | m/z = 473.08 (C$_{30}$H$_{20}$BrN = 474.39) |
| Sub 1-58 | m/z = 579.07 (C$_{36}$H$_{22}$BrNS = 580.54) |
| Sub 1-59 | m/z = 476.06 (C$_{27}$H$_{17}$BrN4 = 477.35) |
| Sub 1-60 | m/z = 437.08 (C$_{27}$H$_{20}$BrN = 438.36) |
| Sub 1-61 | m/z = 600.12 (C$_{39}$H$_{25}$BrN$_2$ = 601.53) |
| Sub 1-62 | m/z = 473.08 (C$_{30}$H$_{20}$BrN = 474.39) |
| Sub 1-63 | m/z = 601.12 (C$_{38}$H$_{24}$BrN$_3$ = 602.52) |
| Sub 1-64 | m/z = 637.14 (C$_{43}$H$_{28}$BrN = 638.59) |
| Sub 1-65 | m/z = 637.14 (C$_{43}$H$_{28}$BrN = 638.59) |
| Sub 1-66 | m/z = 637.14 (C$_{43}$H$_{28}$BrN = 638.59) |
| Sub 1-67 | m/z = 715.05 (C$_{43}$H$_{27}$Br$_2$N = 717.49) |
| Sub 1-68 | m/z = 549.11 (C$_{36}$H$_{24}$BrN = 550.49) |
| Sub 1-69 | m/z = 549.11 (C$_{36}$H$_{24}$BrN = 550.49) |
| Sub 1-70 | m/z = 549.11 (C$_{36}$H$_{24}$BrN = 550.49) |
| Sub 1-71 | m/z = 627.02 (C$_{36}$H$_{23}$Br$_2$N = 629.38) |
| Sub 1-72 | m/z = 549.11 (C$_{36}$H$_{24}$BrN = 550.49) |
| Sub 1-73 | m/z = 549.11 (C$_{36}$H$_{24}$BrN = 550.49) |
| Sub 1-74 | m/z = 549.11 (C$_{36}$H$_{24}$BrN = 550.49) |
| Sub 1-75 | m/z = 627.02 (C$_{36}$H$_{23}$Br$_2$N = 629.38) |
| Sub 1-76 | m/z = 549.11 (C$_{36}$H$_{24}$BrN = 550.49) |
| Sub 1-77 | m/z = 549.11 (C$_{36}$H$_{24}$BrN = 550.49) |
| Sub 1-78 | m/z = 549.11 (C$_{36}$H$_{24}$BrN = 550.49) |

TABLE 1-continued

| Compound | FD-MS |
|---|---|
| Sub 1-79 | m/z = 549.11 ($C_{36}H_{24}BrN$ = 550.49) |
| Sub 1-80 | m/z = 559.17 ($C_{36}H_{14}D_{10}BrN$ = 560.6) |
| Sub 1-81 | m/z = 559.2 ($C_{36}H_{14}D_{10}BrN$ = 560.6) |
| Sub 1-82 | m/z = 554.14 ($C_{36}H_{19}D_{5}BrN$ = 555.52) |
| Sub 1-83 | m/z = 687.16 ($C_{47}H_{30}BrN$ = 688.65) |
| Sub 1-84 | m/z = 687.16 ($C_{47}H_{30}BrN$ = 688.65) |
| Sub 1-85 | m/z = 687.16 ($C_{47}H_{30}BrN$ = 688.65) |
| Sub 1-86 | m/z = 737.17 ($C_{51}H_{32}BrN$ = 738.71) |
| Sub 1-87 | m/z = 737.17 ($C_{51}H_{32}BrN$ = 738.71) |
| Sub 1-88 | m/z = 687.16 ($C_{47}H_{30}BrN$ = 688.65) |
| Sub 1-89 | m/z = 737.17 ($C_{51}H_{32}BrN$ = 738.71) |
| Sub 1-90 | m/z = 737.17 ($C_{51}H_{32}BrN$ = 738.71) |
| Sub 1-91 | m/z = 503.03 ($C_{30}H_{18}BrNS$ = 504.44) |
| Sub 1-92 | m/z = 503.03 ($C_{30}H_{18}BrNS$ = 504.44) |
| Sub 1-93 | m/z = 503.03 ($C_{30}H_{18}BrNS$ = 504.44) |
| Sub 1-94 | m/z = 503.03 ($C_{30}H_{18}BrNS$ = 504.44) |
| Sub 1-95 | m/z = 564.97 ($C_{30}H_{17}Br_{2}NO$ = 567.3) |
| Sub 1-96 | m/z = 487.06 ($C_{30}H_{18}BrNO$ = 488.37) |
| Sub 1-97 | m/z = 487.1 ($C_{30}H_{18}BrNO$ = 488.37) |
| Sub 1-98 | m/z = 487.06 ($C_{30}H_{18}BrNO$ = 488.37) |
| Sub 1-99 | m/z = 815.08 ($C_{51}H_{31}Br_{2}N$ = 817.61) |
| Sub 1-100 | m/z = 737.17 ($C_{51}H_{32}BrN$ = 738.71) |
| Sub 1-101 | m/z = 553.05 ($C_{34}H_{20}BrNS$ = 554.50) |
| Sub 1-102 | m/z = 537.07 ($C_{34}H_{20}BrNO$ = 538.43) |

Synthesis Method of Sub 2

Sub 2 of Reaction Scheme 1 can be synthesized according to, but not limited to, the following Reaction Scheme 3.

<Reaction Scheme 3>

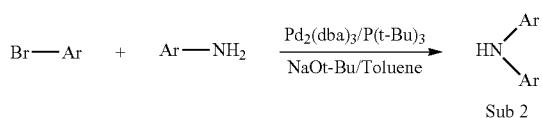

Synthesis Method of Sub 2-1

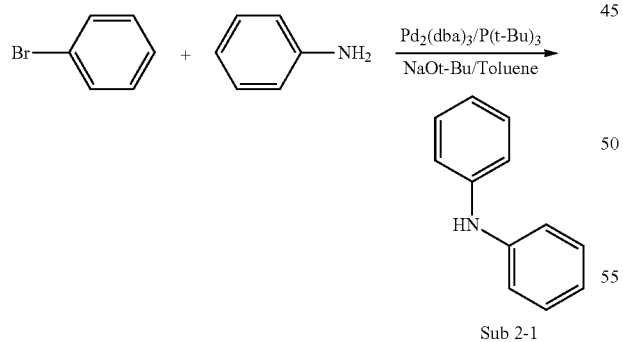

Sub 2-1

Bromobenzene (37.1 g, 236.2 mmol) was dissolved in toluene (2200 mL) in a round bottom flask, and aniline (20 g, 214.8 mmol), $Pd_2(dba)_3$ (9.83 g, 10.7 mmol), $P(t-Bu)_3$ (4.34 g, 21.5 mmol), and NaOt-Bu (62 g, 644.3 mmol) were added to the reaction solution, followed by stirring at 100° C. Upon completion of the reaction, the reaction product was extracted with $CH_2Cl_2$ and water. The extracted organic layer was dried with $MgSO_4$ and concentrated, and then the produced organic material was separated by a silica gel column and recrystallized to obtain 28 g (yield: 77%).

Synthesis Method of Sub 2-13

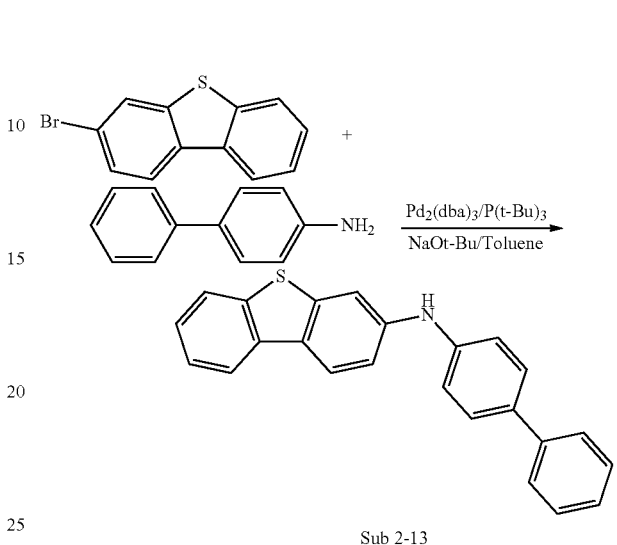

Sub 2-13

Using 3-bromodibenzo[b,d]thiophene (42.8 g, 162.5 mmol), toluene (1550 mL), [1,1'-biphenyl]-4-amine (25 g, 147.7 mmol), $Pd_2(dba)_3$ (6.76 g, 162.5 mmol), $P(t-Bu)_3$ (3 g, 14.8 mmol), and NaOt-Bu (42.6 g, 443.2 mmol), the same procedure as described in the synthesis method of Sub 2-1 was carried out to obtain 37.9 g (yield: 73%).

Meanwhile, examples of Sub 2 compounds include, but are not limited to, the following compounds, and FD-MS data of the Sub 2 compounds are given in Table 2 below.

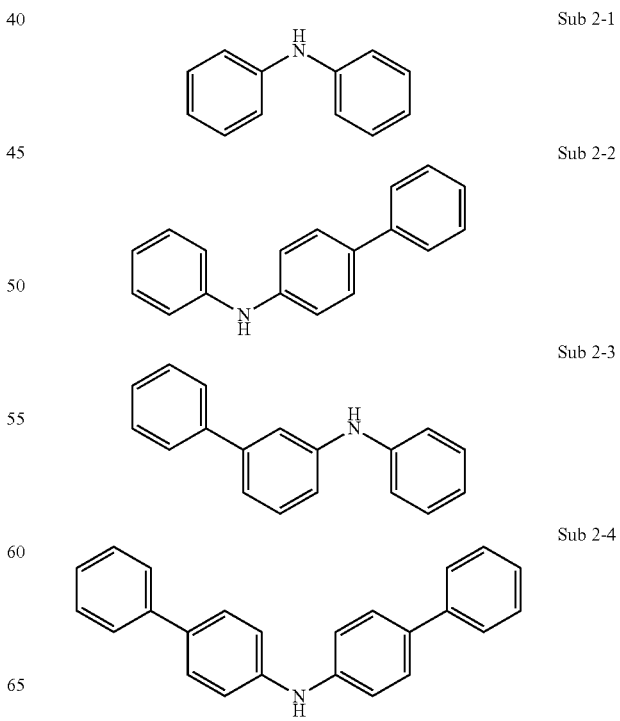

-continued
Sub 2-5
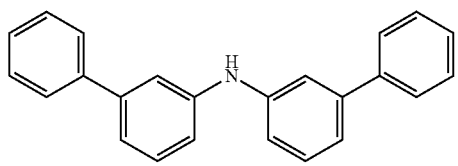
Sub 2-6
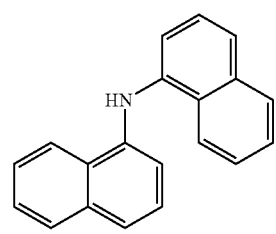
Sub 2-7
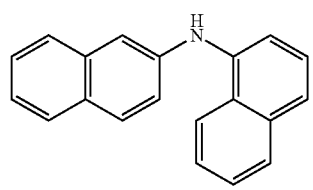
Sub 2-8
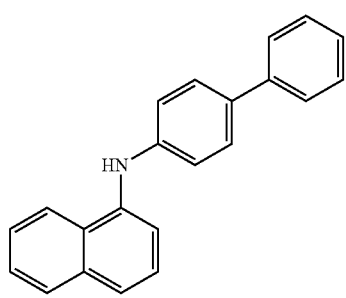
Sub 2-9
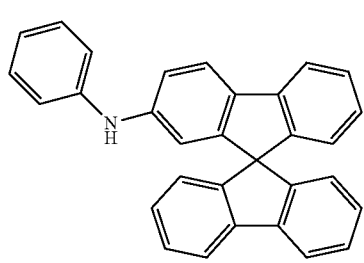
Sub 2-10
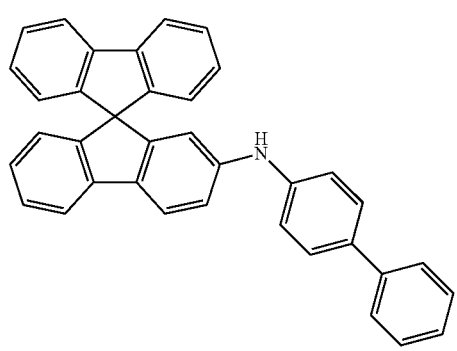
-continued
Sub 2-11
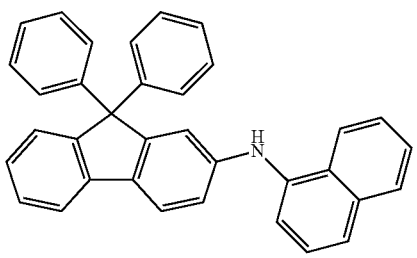
Sub 2-12
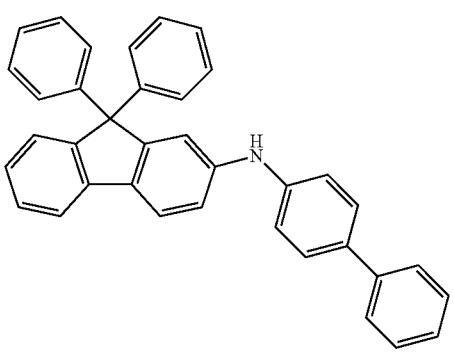
Sub 2-13
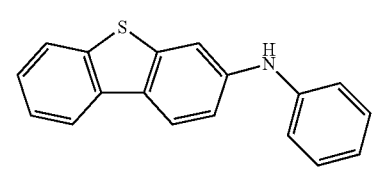
Sub 2-14
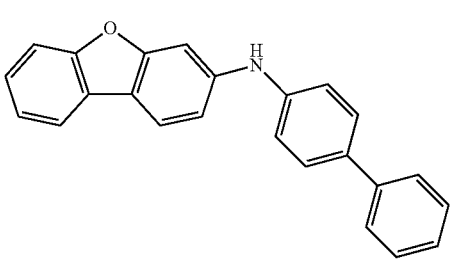
Sub 2-15
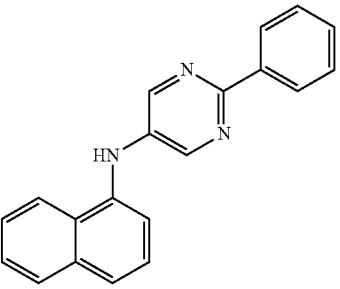
Sub 2-16
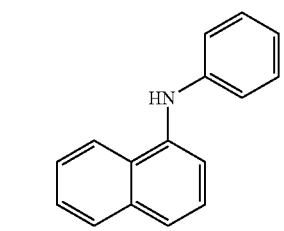

Sub 2-17
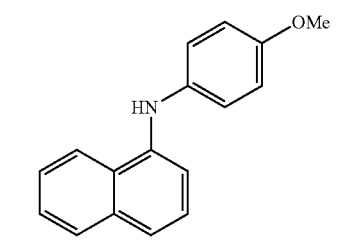
Sub 2-18
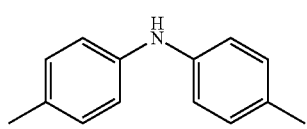
Sub 2-19
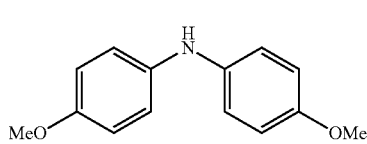
Sub 2-20
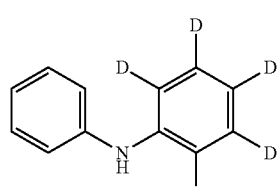
Sub 2-21
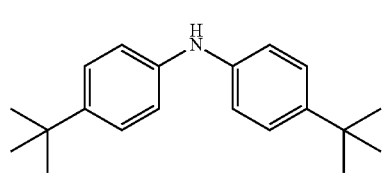
Sub 2-22
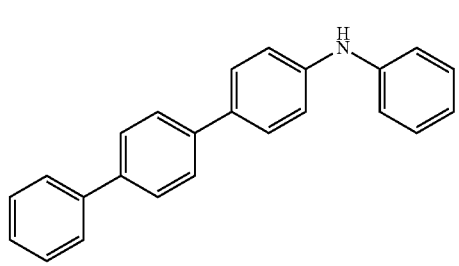
Sub 2-23
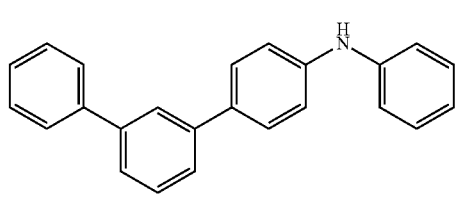
Sub 2-24
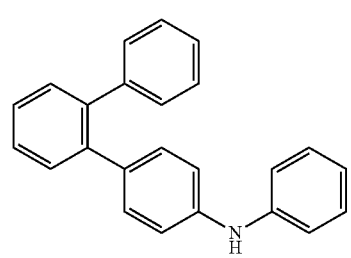
Sub 2-25
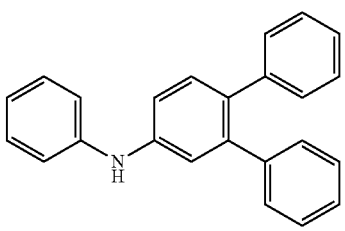
Sub 2-26
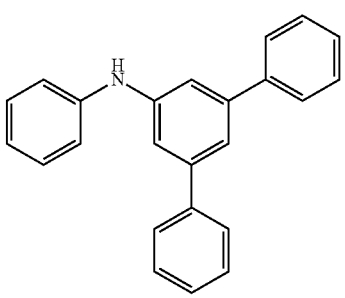
Sub 2-27
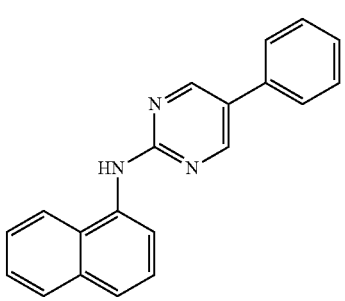
Sub 2-28
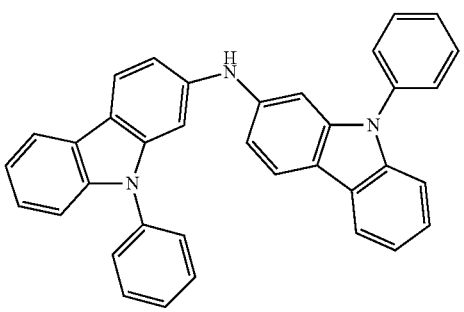
Sub 2-29
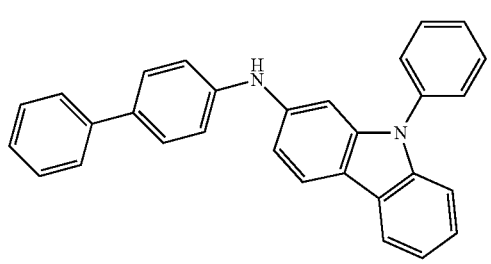

Sub 2-30
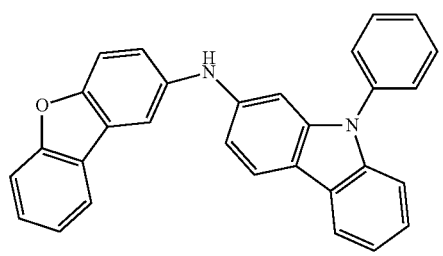
Sub 2-31
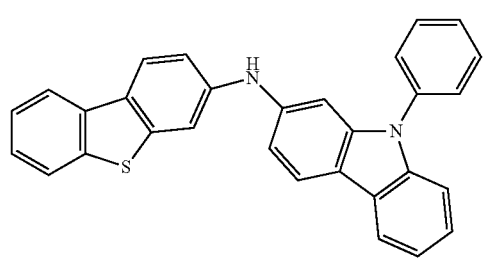
Sub 2-32
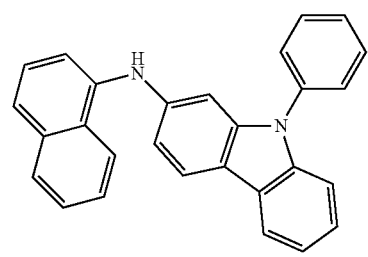
Sub 2-33
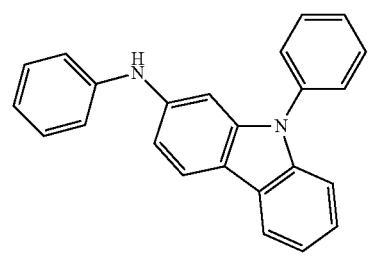
Sub 2-34
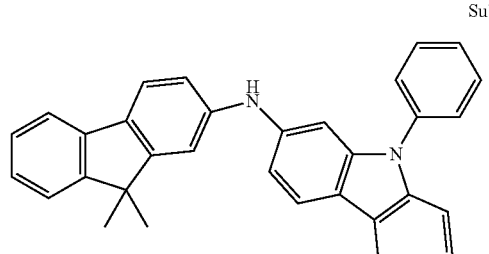
Sub 2-35
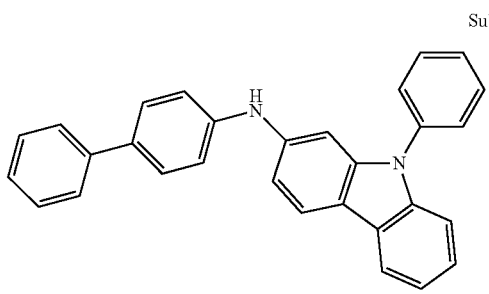
Sub 2-36
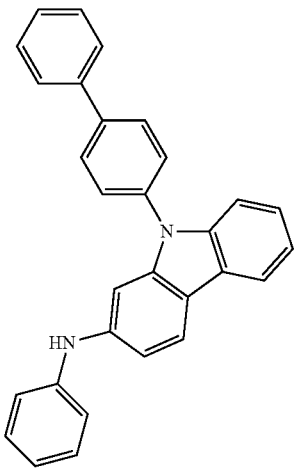
Sub 2-37
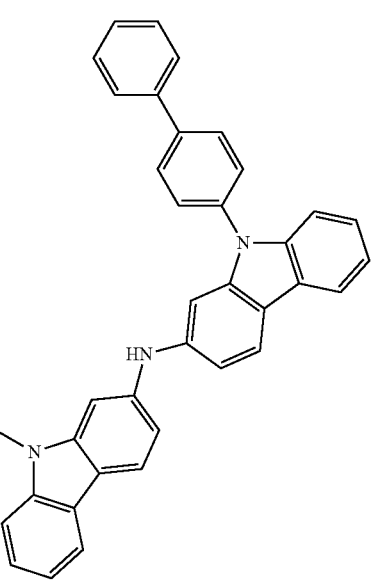
Sub 2-38
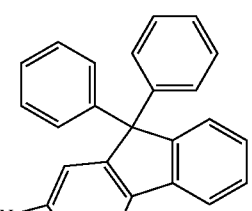

Sub 2-39
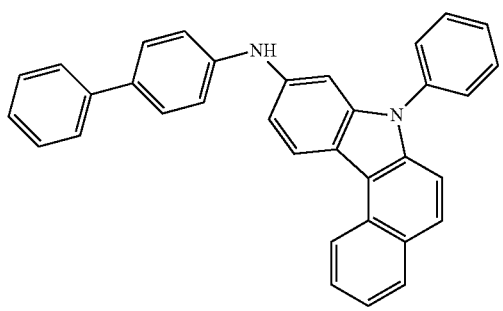
Sub 2-40
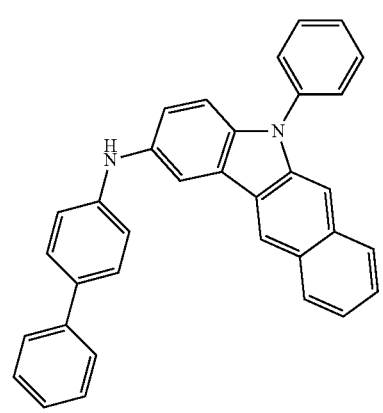
Sub 2-41
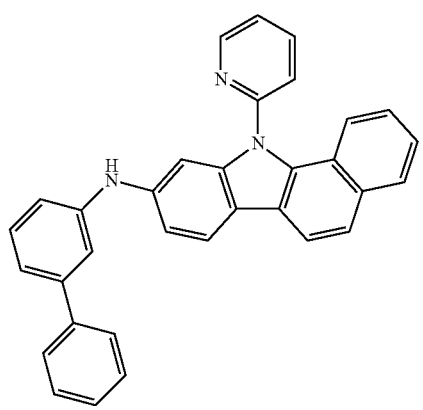
Sub 2-42
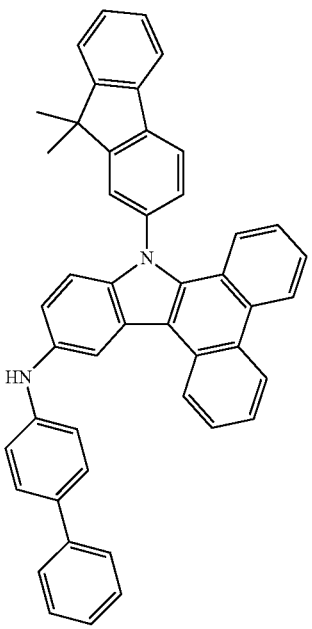
Sub 2-43
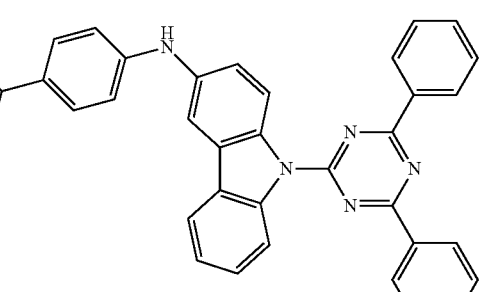
Sub 2-44
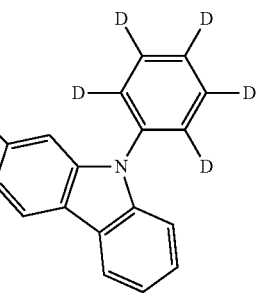
Sub 2-45

-continued

Sub 2-46

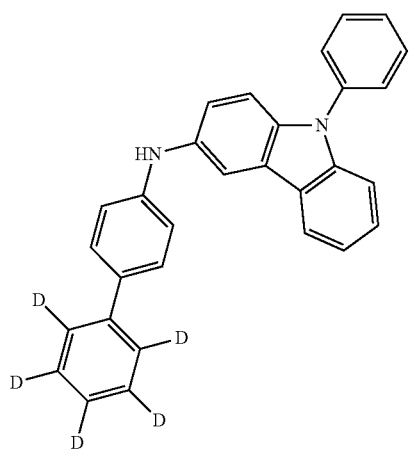

TABLE 2

| Compound | FD-MS |
|---|---|
| Sub 2-1 | m/z = 169.09 ($C_{12}H_{11}N$ = 169.22) |
| Sub 2-2 | m/z = 245.12 ($C_{18}H_{15}N$ = 245.32) |
| Sub 2-3 | m/z = 245.12 ($C_{18}H_{15}N$ = 245.32) |
| Sub 2-4 | m/z = 321.15 ($C_{24}H_{19}N$ = 321.41) |
| Sub 2-5 | m/z = 321.15 ($C_{24}H_{19}N$ = 321.41) |
| Sub 2-6 | m/z = 269.12 ($C_{20}H_{15}N$ = 269.34) |
| Sub 2-7 | m/z = 269.12 ($C_{20}H_{15}N$ = 269.34) |
| Sub 2-8 | m/z = 295.14 ($C_2H_{17}N$ = 295.38) |
| Sub 2-9 | m/z = 409.18 ($C_{31}H_{23}N$ = 409.52) |
| Sub 2-10 | m/z = 483.20 ($C_{37}H_{25}N$ = 483.60) |
| Sub 2-11 | m/z = 459.20 ($C_{35}H_{25}N$ = 459.58) |
| Sub 2-12 | m/z = 485.21 ($C_{37}H_{27}N$ = 485.62) |
| Sub 2-13 | m/z = 275.08 ($C_{18}H_{13}NS$ = 275.37) |
| Sub 2-14 | m/z = 335.13 ($C_{24}H_{17}NO$ = 335.40) |
| Sub 2-15 | m/z = 297.13 ($C_{20}H_{15}N_3$ = 297.35) |
| Sub 2-16 | m/z = 219.10 ($C_{16}H_{13}N$ = 219.28) |
| Sub 2-17 | m/z = 249.12 ($C_{17}H_{15}NO$ = 249.31) |
| Sub 2-18 | m/z = 197.12 ($C_{14}H_{15}N$ = 197.28) |
| Sub 2-19 | m/z = 229.11 ($C_{14}H_{15}NO_2$ = 229.27) |
| Sub 2-20 | m/z = 174.12 ($C_{12}H_6D_5N$ = 174.25) |
| Sub 2-21 | m/z = 281.21 ($C_{20}H_{27}N$ = 281.44) |
| Sub 2-22 | m/z = 321.15 ($C_{24}H_{19}N$ = 321.41) |
| Sub 2-23 | m/z = 321.15 ($C_{24}H_{19}N$ = 321.41) |
| Sub 2-24 | m/z = 321.15 ($C_{24}H_{19}N$ = 321.41) |
| Sub 2-25 | m/z = 321.15 ($C_{24}H_{19}N$ = 321.41) |
| Sub 2-26 | m/z = 321.15 ($C_{24}H_{19}N$ = 321.41) |
| Sub 2-27 | m/z = 297.13 ($C_{20}H_{15}N_3$ = 297.35) |
| Sub 2-28 | m/z = 499.20 ($C_{36}H_{25}N_3$ = 499.60) |
| Sub 2-29 | m/z = 499.20 ($C_{36}H_{22}N_2$ = 410.51) |
| Sub 2-30 | m/z = 424.16 ($C_{30}H_{20}N_{20}$ = 424.49) |
| Sub 2-31 | m/z = 440.13 ($C_{30}H_{20}N_2S$ = 440.56) |
| Sub 2-32 | m/z = 384.16 ($C_{28}H_{20}N_2$ = 384.47) |
| Sub 2-33 | m/z = 334.15 ($C_{24}H_{18}N_2$ = 334.41) |
| Sub 2-34 | m/z = 450.21 ($C_{33}H_{26}N_2$ = 450.57) |
| Sub 2-35 | m/z = 410.18 ($C_{30}H_{22}N_2$ = 410.51) |
| Sub 2-36 | m/z = 410.18 ($C_{30}H_{22}N_2$ = 410.51) |
| Sub 2-37 | m/z = 575.24 ($C_{42}H_{29}N_3$ = 575.70) |
| Sub 2-38 | m/z = 574.24 ($C_{43}H_{30}N_2$ = 574.71) |
| Sub 2-39 | m/z = 460.19 ($C_{34}H_{24}N_2$ = 460.57) |
| Sub 2-40 | m/z = 460.19 ($C_{34}H_{24}N_2$ = 460.57) |
| Sub 2-41 | m/z = 461.19 ($C_{33}H_{23}N_3$ = 461.56) |
| Sub 2-42 | m/z = 626.27 ($C_{47}H_{34}N_2$ = 626.79) |
| Sub 2-43 | m/z = 565.23 ($C_{39}H_{27}N_5$ = 565.67) |
| Sub 2-44 | m/z = 415.21 ($C_{30}H_{17}D_5N_2$ = 415.54) |
| Sub 2-45 | m/z = 486.21 ($C_{36}H_{26}N_2$ = 486.61) |
| Sub 2-46 | m/z = 415.21 ($C_{30}H_{17}D_5N_2$ = 415.54) |

Synthesis Method of Final Product 1

Synthesis Method of P1-1

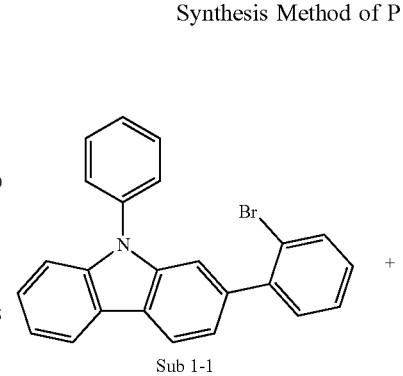

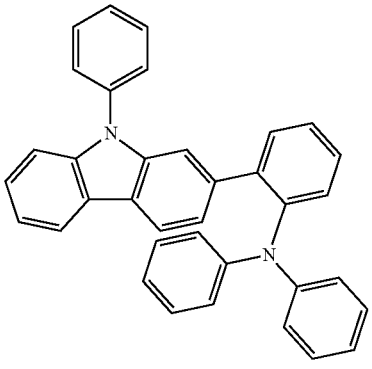

Sub 2-1 (6.4 g, 47.3 mmol) was dissolved in toluene (500 mL) in a round bottom flask, and Sub 1-1 (20.7 g, 52.0 mmol), Pd₂(dba)₃ (2.2 g, 2.4 mmol), P(t-Bu)₃ (1 g, 4.73 mmol), and NaOt-Bu (13.6 g, 141.8 mmol) were added to the reaction solution, followed by stirring at 100° C. Upon completion of the reaction, the reaction product was extracted with CH₂Cl₂ and water. The extracted organic layer was dried with MgSO₄ and concentrated, and then the produced organic material was separated by a silica gel column and recrystallized to obtain 16.2 g (yield: 70%).

Synthesis Method of P1-53

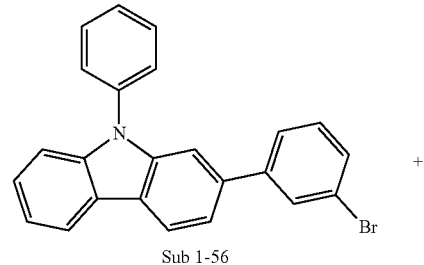

Sub 1-56

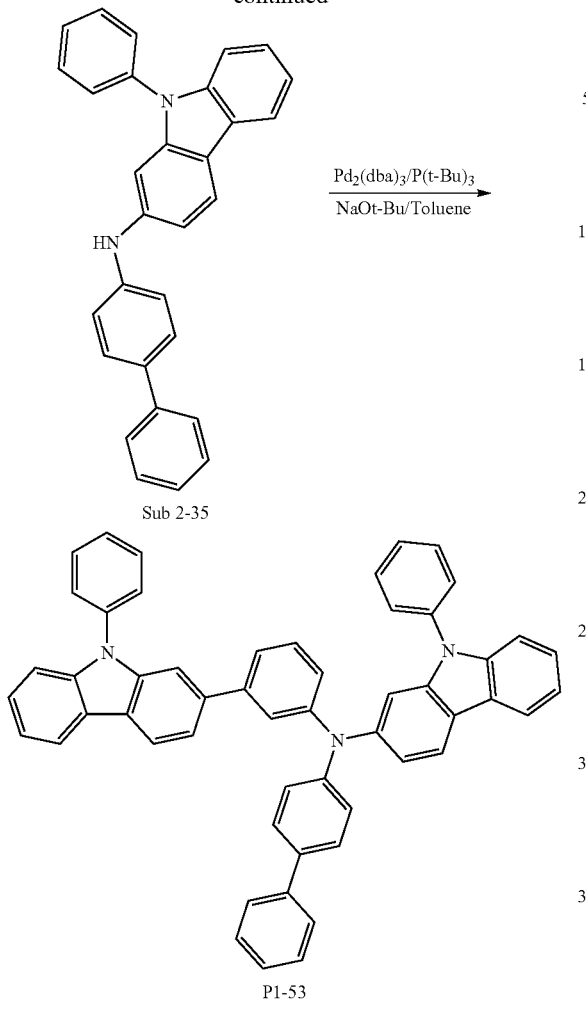

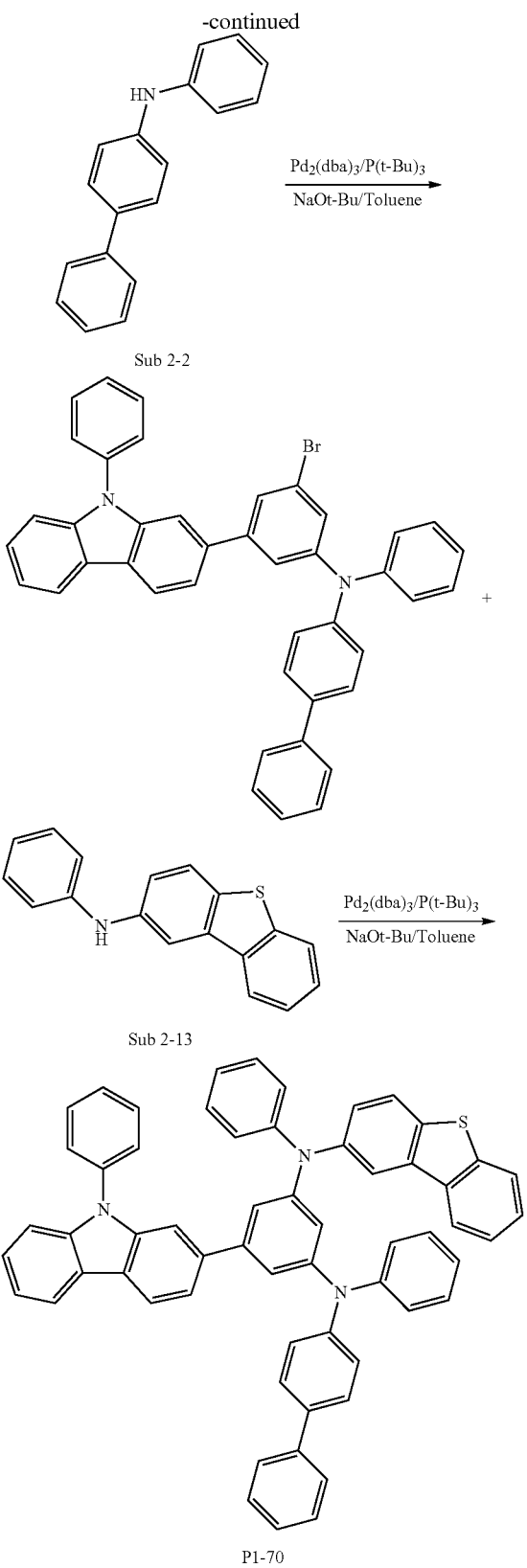

Sub 2-35 (19.4 g, 47.3 mmol) was dissolved in toluene (500 mL) in a round bottom flask, and Sub 1-56 (20.7 g, 52.0 mmol), Pd$_2$(dba)$_3$ (2.2 g, 2.4 mmol), P(t-Bu)$_3$ (1 g, 4.73 mmol), and NaOt-Bu (13.6 g, 141.8 mmol) were added to the reaction solution, followed by stirring at 100° C. Upon completion of the reaction, the reaction product was extracted with CH$_2$Cl$_2$ and water. The extracted organic layer was dried with MgSO$_4$ and concentrated, and then the produced organic material was separated by a silica gel column and recrystallized to obtain 28.8 g (yield: 70%).

Synthesis Method of P1-70

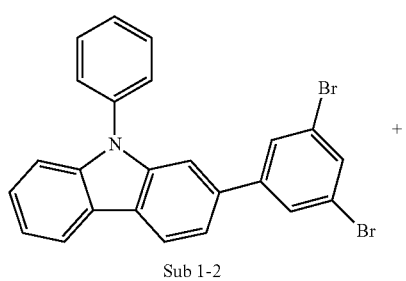

Sub 2-2 (11.6 g, 47.3 mmol) was dissolved in toluene (500 mL) in a round bottom flask, and Sub 1-2 (24.8 g, 52.0 mmol), Pd$_2$(dba)$_3$ (2.2 g, 2.4 mmol), P(t-Bu)$_3$ (1 g, 4.73 mmol), and NaOt-Bu (13.6 g, 141.8 mmol) were added to the reaction solution, followed by stirring at 100° C. Upon completion of the reaction, the reaction product was extracted with $CH_2Cl_2$ and water. The extracted organic layer was dried with $MgSO_4$ and concentrated, and then the produced organic material was separated by a silica gel column and recrystallized to obtain 25.0 g (yield: 75%). Using the obtained compound plus Sub 2-13 (6.6 g, 24 mmol), the same procedure as described in the synthesis method of P1-1 was carried out to obtain 22.0 g of product (yield: 74%).

TABLE 3

| Compound | FD-MS |
| --- | --- |
| P1-1 | m/z = 486.21 ($C_{36}H_{26}N_2$ = 486.61) |
| P1-2 | m/z = 562.24 ($C_{42}H_{30}N_2$ = 562.70) |
| P1-3 | m/z = 562.24 ($C_{42}H_{30}N_2$ = 562.70) |
| P1-4 | m/z = 638.27 ($C_{48}H_{34}N_2$ = 638.80) |
| P1-5 | m/z = 586.24 ($C_{44}H_{30}N_2$ = 586.72) |
| P1-6 | m/z = 586.24 ($C_{44}H_{30}N_2$ = 586.72) |
| P1-7 | m/z = 612.26 ($C_{46}H_{32}N_2$ = 612.76) |
| P1-8 | m/z = 726.30 ($C_{55}H_{38}N_2$ = 726.90) |
| P1-9 | m/z = 638.27 ($C_{48}H_{34}N_2$ = 638.80) |
| P1-10 | m/z = 800.32 ($C_{61}H_{40}N_2$ = 800.98) |
| P1-11 | m/z = 536.23 ($C_{40}H_{28}N_2$ = 536.66) |
| P1-12 | m/z = 688.29 ($C_{52}H_{36}N_2$ = 688.86) |
| P1-13 | m/z = 852.35 ($C_{65}H_{44}N_2$ = 853.06) |
| P1-14 | m/z = 638.27 ($C_{48}H_{34}N_2$ = 638.80) |
| P1-15 | m/z = 688.29 ($C_{52}H_{36}N_2$ = 688.86) |
| P1-16 | m/z = 662.27 ($C_{50}H_{34}N_2$ = 662.82) |
| P1-17 | m/z = 718.24 ($C_{52}H_{34}N_2S$ = 718.90) |
| P1-18 | m/z = 702.27 ($C_{52}H_{34}N_2O$ = 702.84) |
| P1-19 | m/z = 664.26 ($C_{48}H_{32}N_4$ = 664.79) |
| P1-20 | m/z = 664.26 ($C_{48}H_{32}N_4$ = 664.79) |
| P1-21 | m/z = 726.30 ($C_{55}H_{38}N_2$ = 726.90) |
| P1-22 | m/z = 802.33 ($C_{61}H_{42}N_2$ = 803.00) |
| P1-23 | m/z = 802.33 ($C_{61}H_{42}N_2$ = 803.00) |
| P1-24 | m/z = 878.37 ($C_{67}H_{46}N_2$ = 879.10) |
| P1-25 | m/z = 790.33 ($C_{60}H_{42}N_2$ = 790.99) |
| P1-26 | m/z = 638.27 ($C_{48}H_{34}N_2$ = 638.80) |
| P1-27 | m/z = 638.27 ($C_{48}H_{34}N_2$ = 638.80)) |
| P1-28 | m/z = 638.27 ($C_{48}H_{34}N_2$ = 638.80) |
| P1-29 | m/z = 648.33 ($C_{48}H_{24}D_{10}N_2$ = 648.86) |
| P1-30 | m/z = 724.37 ($C_{54}H_{28}D_{10}N_2$ = 724.95) |
| P1-31 | m/z = 795.37 ($C_{60}H_{37}D_5N_2$ = 796.02) |
| P1-32 | m/z = 643.30 ($C_{48}H_{29}D_5N_2$ = 643.83) |
| P1-33 | m/z = 692.23 ($C_{50}H_{32}N_2S$ = 692.87) |
| P1-34 | m/z = 692.23 ($C_{50}H_{32}N_2S$ = 692.87) |
| P1-35 | m/z = 718.24 ($C_{52}H_{34}N_2S$ = 718.90) |
| P1-36 | m/z = 882.31 ($C_{65}H_{42}N_2S$ = 883.11) |
| P1-37 | m/z = 826.33 ($C_{63}H_{42}N_2$ = 827.02) |
| P1-38 | m/z = 826.33 ($C_{63}H_{42}N_2$ = 827.02) |
| P1-39 | m/z = 742.24 ($C_{54}H_{34}N_2S$ = 742.93) |
| P1-40 | m/z = 726.27 ($C_{54}H_{34}N_2O$ = 726.86) |
| P1-41 | m/z = 562.24 ($C_{42}H_{30}N_2$ = 562.70) |
| P1-42 | m/z = 668.23 ($C_{48}H_{32}N_2S$ = 668.85) |
| P1-43 | m/z = 728.28 ($C_{54}H_{36}N_2O$ = 728.88) |
| P1-44 | m/z = 754.33 ($C_{57}H_{42}N_2$ = 754.96) |
| P1-45 | m/z = 802.33 ($C_{61}H_{42}N_2$ = 803.00) |
| P1-46 | m/z = 800.32 ($C_{61}H_{40}N_2$ = 800.98) |
| P1-47 | m/z = 612.26 ($C_{46}H_{32}N_2$ = 612.76) |
| P1-48 | m/z = 718.24 ($C_{52}H_{34}N_2S$ = 718.90) |
| P1-49 | m/z = 816.33 ($C_{60}H_{40}N_4$ = 816.99) |
| P1-50 | m/z = 727.30 ($C_{54}H_{37}N_3$ = 727.89) |
| P1-51 | m/z = 741.28 ($C_{54}H_{35}N_3O$ = 741.88) |
| P1-52 | m/z = 757.26 ($C_{54}H_{35}N_3S$ = 757.94) |
| P1-53 | m/z = 727.30 ($C_{54}H_{37}N_3$ = 727.89) |
| P1-54 | m/z = 777.31 ($C_{58}H_{39}N_3$ = 777.95) |
| P1-55 | m/z = 757.26 ($C_{54}H_{35}N_3S$ = 757.94) |
| P1-56 | m/z = 767.33 ($C_{57}H_{41}N_3$ = 767.96) |
| P1-57 | m/z = 777.31 ($C_{58}H_{39}N_3$ = 777.95) |
| P1-58 | m/z = 817.35 ($C_{61}H_{43}N_3$ = 818.01) |
| P1-59 | m/z = 803.33 ($C_{60}H_{41}N_3$ = 803.99) |
| P1-60 | m/z = 777.31 ($C_{58}H_{39}N_3$ = 777.95) |
| P1-61 | m/z = 562.24 ($C_{42}H_{30}N_2$ = 562.70) |
| P1-62 | m/z = 487.20 ($C_{35}H_{25}N_3$ = 487.59) |
| P1-63 | m/z = 592.20 ($C_{42}H_{28}N_2S$ = 592.75) |
| P1-64 | m/z = 602.27 ($C_{45}H_{34}N_2$ = 602.76) |

TABLE 3-continued

| Compound | FD-MS |
| --- | --- |
| P1-65 | m/z = 653.28 ($C_{48}H_{35}N_3$ = 653.81) |
| P1-66 | m/z = 703.30 ($C_{52}H_{37}N_3$ = 703.87) |
| P1-67 | m/z = 805.35 ($C_{60}H_{43}N_3$ = 806.00) |
| P1-68 | m/z = 753.31 ($C_{56}H_{39}N_3$ = 753.93) |
| P1-69 | m/z = 818.34 ($C_{60}H_{42}N_4$ = 819.00) |
| P1-70 | m/z = 835.30 ($C_{60}H_{41}N_3S$ = 836.05) |
| P1-71 | m/z = 655.27 ($C_{46}H_{33}N_5$ = 655.79) |
| P1-72 | m/z = 885.32 ($C_{64}H_{43}N_3S$ = 886.11) |
| P1-73 | m/z = 759.27 ($C_{54}H_{37}N_3S$ = 759.96) |
| P1-74 | m/z = 706.28 ($C_{49}H_{34}N_6$ = 706.83) |
| P1-75 | m/z = 960.39 ($C_{69}H_{48}N_6$ = 961.16) |
| P1-76 | m/z = 853.35 ($C_{64}H_{43}N_3$ = 854.05) |
| P1-77 | m/z = 894.37 ($C_{66}H_{46}N_4$ = 895.10) |
| P1-78 | m/z = 834.38 ($C_{62}H_{38}D_5N_3$ = 835.06) |
| P1-79 | m/z = 855.36 ($C_{64}H_{45}N_3$ = 856.06) |
| P1-80 | m/z = 853.35 ($C_{64}H_{43}N_3$ = 854.05) |

Synthesis Method of Final Product 2

The final product 2 of the present invention, represented by Formula 2, can be synthesized by reaction between Sub 3 and Sub 4 as illustrated in, but not limited to, the following Reaction Scheme 4.

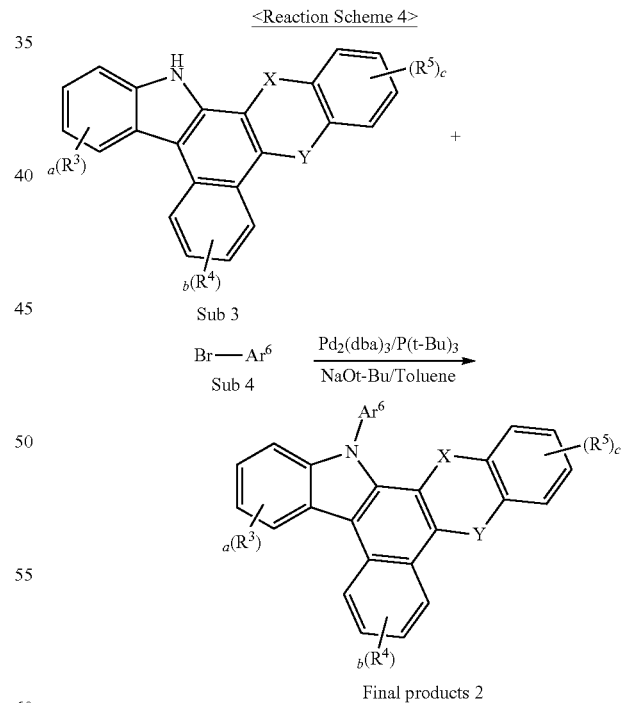

<Reaction Scheme 4>

Sub 3

Br—Ar⁶
Sub 4

Pd₂(dba)₃/P(t-Bu)₃
NaOt-Bu/Toluene

Final products 2

Synthesis Method of Sub 3

Sub 3 of Reaction Scheme 4 can be synthesized according to, but not limited to, the following Reaction Scheme 5.

<Reaction Scheme 5>

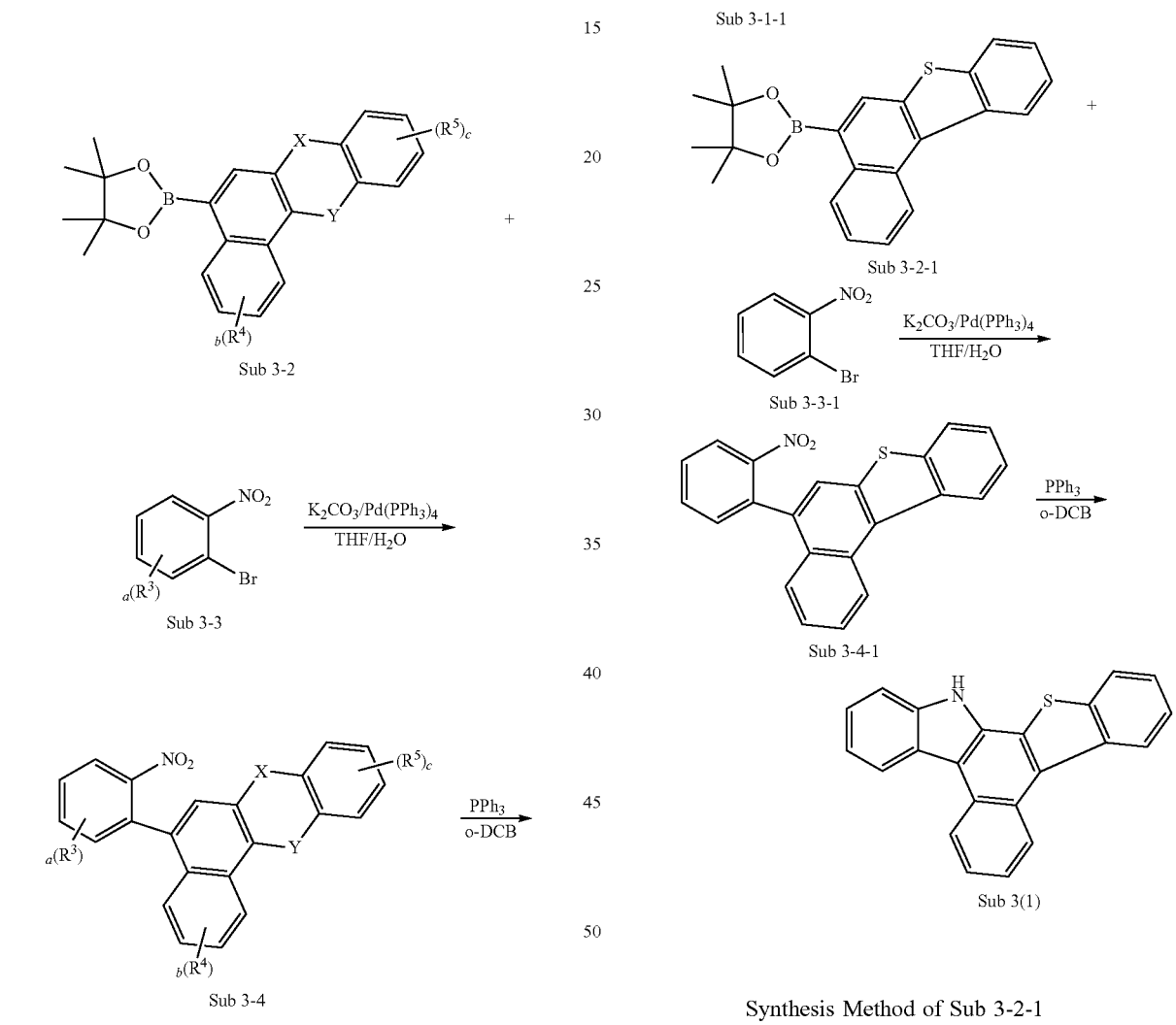

Sub 3-1

Sub 3-2

Sub 3-3

Sub 3-4

Sub 3

Synthesis Method of Sub 3(1) (X=S, Y=Single Bond)

Sub 3-1-1

Sub 3-2-1

Sub 3-3-1

Sub 3-4-1

Sub 3(1)

Synthesis Method of Sub 3-2-1

To a solution of the starting material 5-bromobenzo[b]naphtha[1,2-d]thiophene (50 g, 0.16 mol), bis(pinacolato)diboron (48.65 g, 0.19 mol), KOAc (47 g, 0.48 mol) and PdCl$_2$(dppf) (5.21 g, 4 mol %) were dissolved in DMF, followed by reflux at 100° C. for 12 hours. Upon completion of the reaction, the temperature of the reaction product was lowered to room temperature, the reaction product was extracted with CH$_2$Cl$_2$, and was washed with water. The extracted organic layer was dried with MgSO$_4$ and concentrated, and then the produced organic material was recrystallized by CH$_2$Cl$_2$ and methanol to obtain desired Sub 3-2-1 (46 g, yield 80%).

Synthesis Method of Sub 3-4-1

To a solution of the obtained Sub 3-2-1 (40 g, 0.11 mol), bromo-2-nitrobenzene (26.91 g, 0.13 mol), $K_2CO_3$ (46.03 g, 0.33 mol) and $Pd(PPh_3)_4$ (5.13 g, 4 mol %) were dissolved in anhydrous THF and a small amount of water, followed by reflux at 80° C. for 12 hours. Upon completion of the reaction, the temperature of the reaction product was lowered to room temperature, the reaction product was extracted with $CH_2Cl_2$, and was washed with water. The extracted organic layer was dried with $MgSO_4$ and concentrated, and then the produced organic material was separated by a silica gel column chromatography to obtain desired Sub 3-4-1 (27.62 g, yield 70%).

Synthesis Method of Sub 3(1)

To a solution of the obtained Sub 3-4-1 (20 g, 0.05 mol) and triphenylphosphine (44.28 g, 0.17 mol) were dissolved in o-dichlorobenzene, followed by reflux for 24 hours. Upon completion of the reaction, the solvent was removed using vacuum distillation, and then the concentrated product was separated by a silica gel column chromatography and recrystallized to obtain desired Sub 3(1) (26.68 g, yield 75%).

Synthesis Method of Sub 3(2) (X=Single Bond, Y=S)

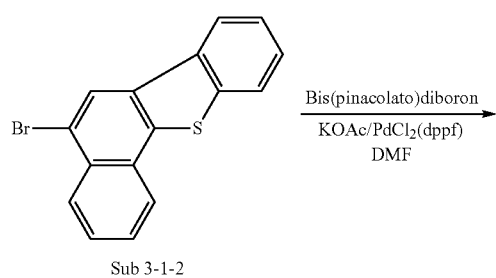

Sub 3-1-2

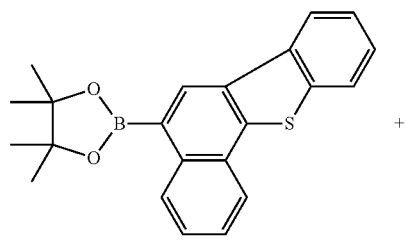

Sub 3-2-2

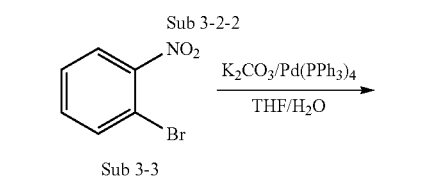

Sub 3-4-2

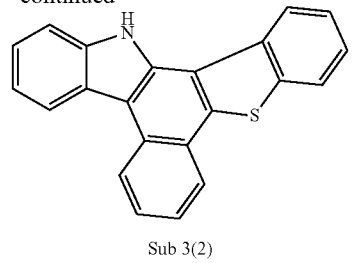

Sub 3(2)

Synthesis Method of Sub 3-2-2

To a solution of the starting material 5-5-bromobenzo[b]naphtha[2,1-d]thiophene (50 g, 0.16 mol), bis(pinacolato)diboron (48.65 g, 0.19 mol), KOAc (47 g, 0.48 mol) and $PdCl_2(dppf)$ (5.21 g, 4 mol %) were dissolved in DMF, followed by reflux at 100° C. for 12 hours. Upon completion of the reaction, the temperature of the reaction product was lowered to room temperature, the reaction product was extracted with $CH_2Cl_2$, and was washed with water. The extracted organic layer was dried with $MgSO_4$ and concentrated, and then the produced organic material was recrystallized by $CH_2Cl_2$ and methanol to obtain desired Sub 3-2-2 (45 g, yield 78%).

Synthesis Method of Sub 3-4-2

To a solution of the obtained Sub 3-2-2 (40 g, 0.11 mol), bromo-2-nitrobenzene (26.91 g, 0.13 mol), $K_2CO_3$ (46.03 g, 0.33 mol) and $Pd(PPh_3)_4$ (5.13 g, 4 mol %) were dissolved in anhydrous THF and a small amount of water, followed by reflux at 80° C. for 12 hours. Upon completion of the reaction, the temperature of the reaction product was lowered to room temperature, the reaction product was extracted with $CH_2Cl_2$, and was washed with water. The extracted organic layer was dried with $MgSO_4$ and concentrated, and then the produced organic material was separated by a silica gel column chromatography to obtain desired Sub 3-4-2 (25.4 g, yield 65%).

Synthesis Method of Sub 3(2)

To a solution of the obtained Sub 3-4-2 (20 g, 0.05 mol) and triphenylphosphine (44.28 g, 0.17 mol) were dissolved in o-dichlorobenzene, followed by reflux for 24 hours. Upon completion of the reaction, the solvent was removed using vacuum distillation, and then the concentrated product was separated by a silica gel column chromatography and recrystallized to obtain desired Sub 3(2) (23.48 g, yield 66%).

Meanwhile, examples of Sub 3 compounds include, but are not limited to, the following compounds, and FD-MS data of the Sub 3 compounds are given in Table 4 below.

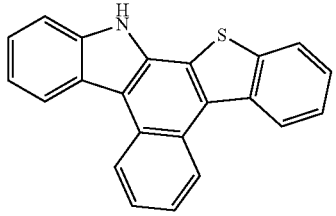

Sub 3(1)

Sub 3(2)
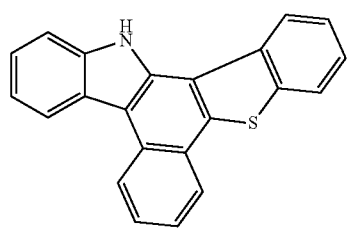
Sub 3(3)
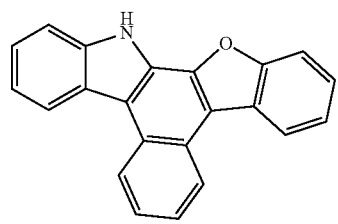
Sub 3(4)
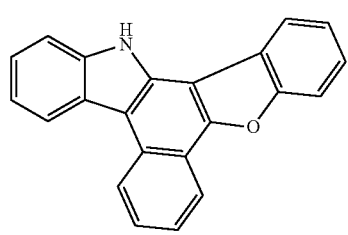
Sub 3(5)
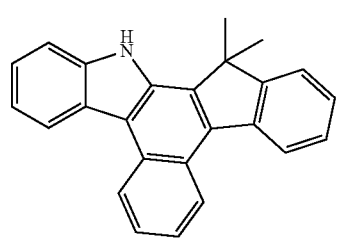
Sub 3(6)
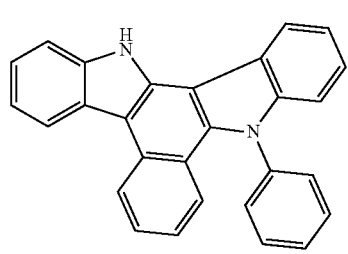
TABLE 4
| Compound | FD-MS |
| --- | --- |
| Sub 3 (1) | m/z = 323.08 ($C_{22}H_{13}NS$ = 323.41) |
| Sub 3 (2) | m/z = 323.08 ($C_{22}H_{13}NS$ = 323.41) |
| Sub 3 (3) | m/z = 307.10 ($C_{22}H_{13}NO$ = 307.34) |
| Sub 3 (4) | m/z = 307.10 ($C_{22}H_{13}NO$ = 307.34) |
| Sub 3 (5) | m/z = 333.15 ($C_{25}H_{19}N$ = 333.43) |
| Sub 3 (6) | m/z = 382.15 ($C_{28}H_{18}N_2$ = 382.46) |
Examples of Sub 4
Examples of Sub 4 compounds include, but are not limited to, the following compounds, and FD-MS data of the Sub 4 compounds are given in Table 5 below.
Sub 4-1
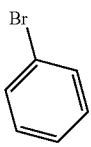
Sub 4-2
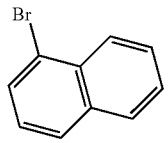
Sub 4-3
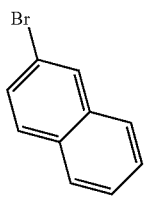
Sub 4-4
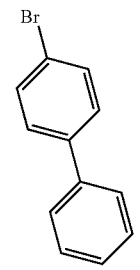
Sub 4-5
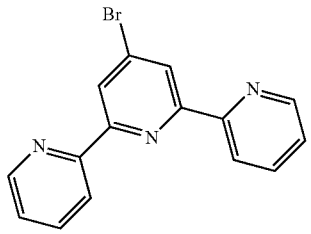
Sub 4-6
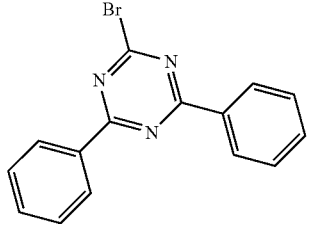
Sub 4-7
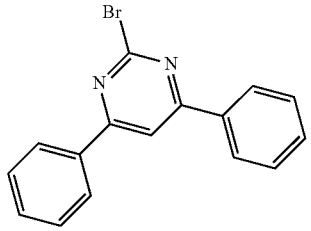

-continued
Sub 4-8
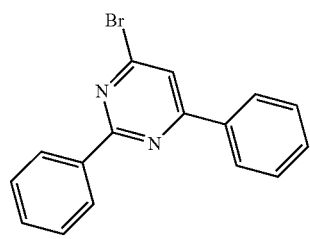
Sub 4-9
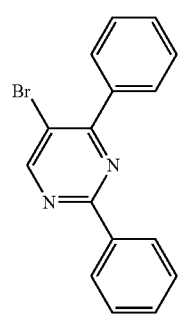
Sub 4-10
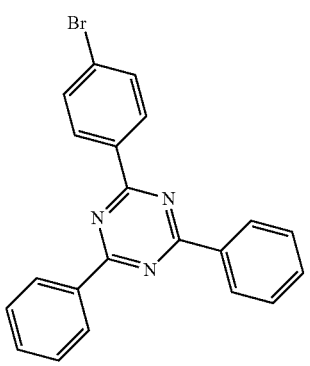
Sub 4-11
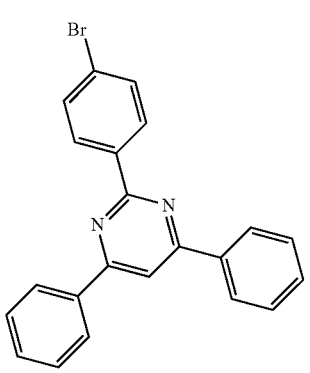
Sub 4-12
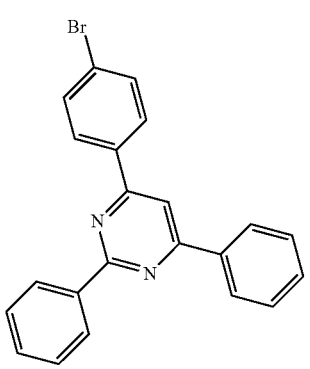
-continued
Sub 4-13
Sub 4-14
Sub 4-15
Sub 4-16
Sub 4-17

Sub 4-18
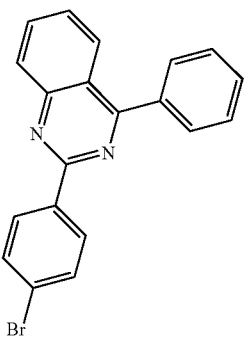
Sub 4-19
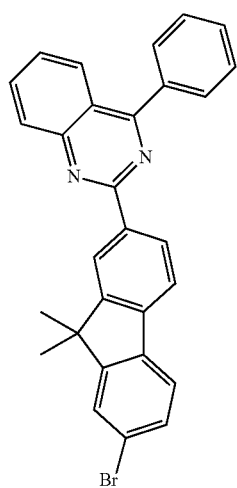
Sub 4-20
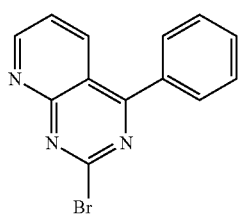
Sub 4-21
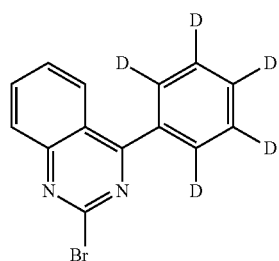
Sub 4-22
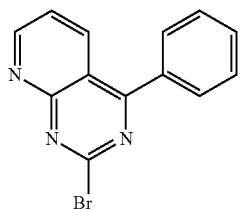
Sub 4-23
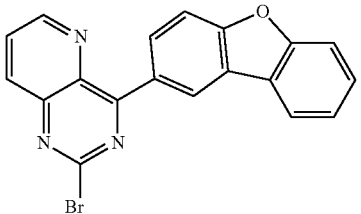
Sub 4-24
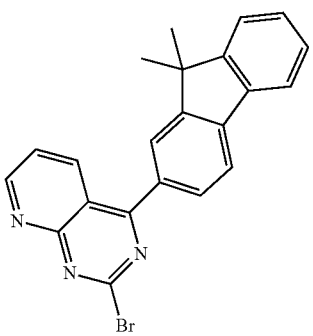
Sub 4-25
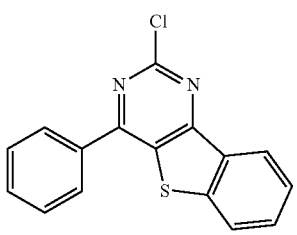
Sub 4-26
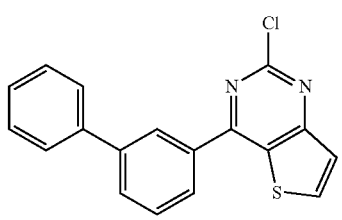
Sub 4-27
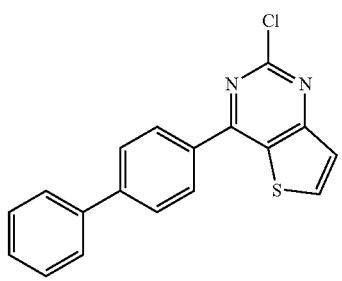
Sub 4-28
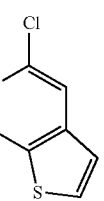

-continued
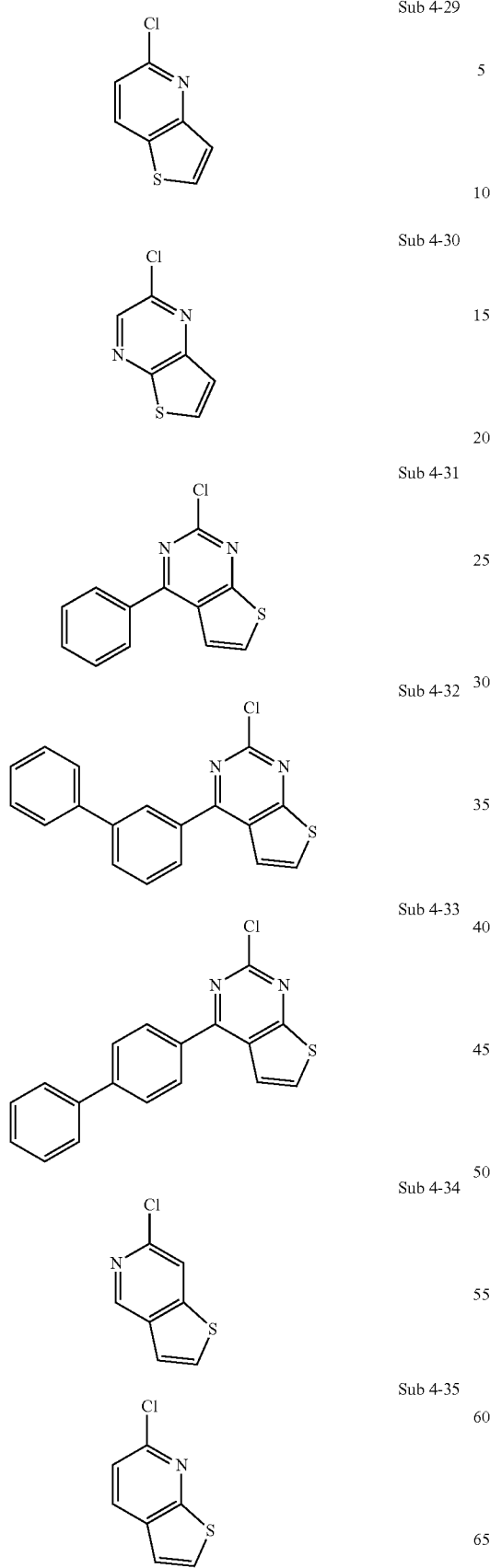
Sub 4-29
Sub 4-30
Sub 4-31
Sub 4-32
Sub 4-33
Sub 4-34
Sub 4-35
-continued
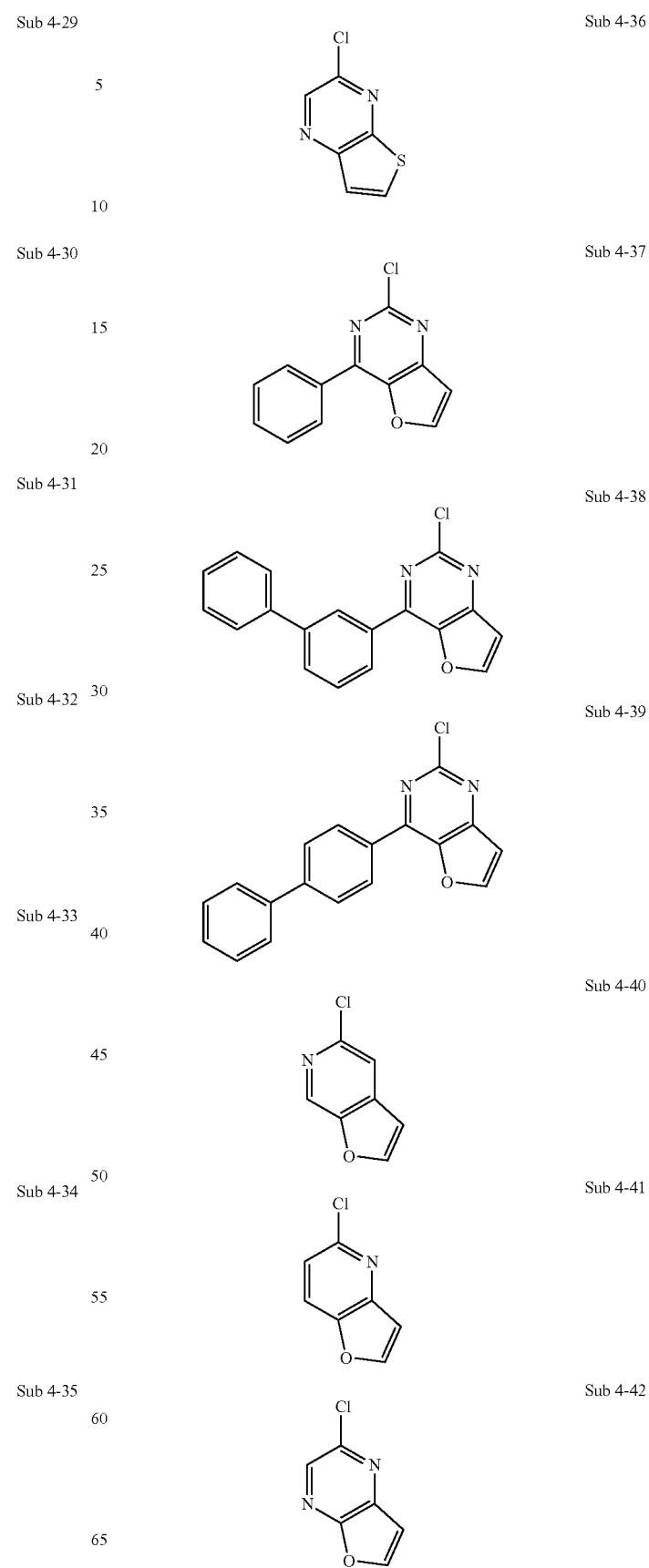
Sub 4-36
Sub 4-37
Sub 4-38
Sub 4-39
Sub 4-40
Sub 4-41
Sub 4-42

| | |
|---|---|
| Sub 4-43 | Sub 4-50 |
| Sub 4-44 | Sub 4-51 |
| Sub 4-45 | Sub 4-52 |
| Sub 4-46 | Sub 4-53 |
| Sub 4-47 | Sub 4-54 |
| Sub 4-48 | |
| Sub 4-49 | |
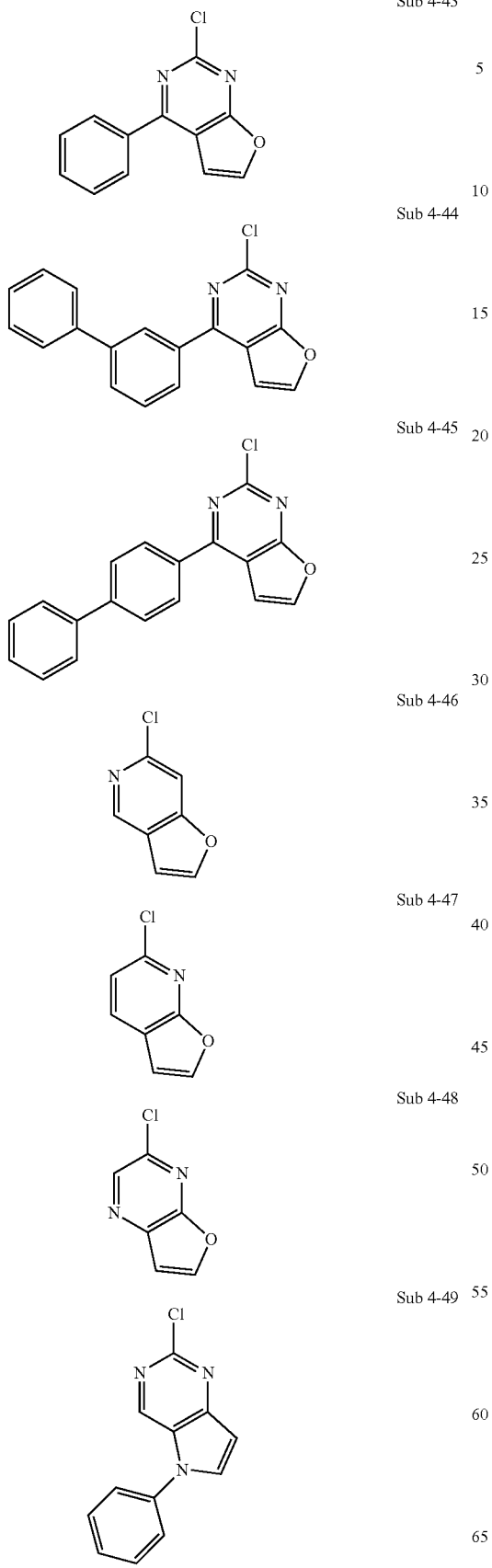
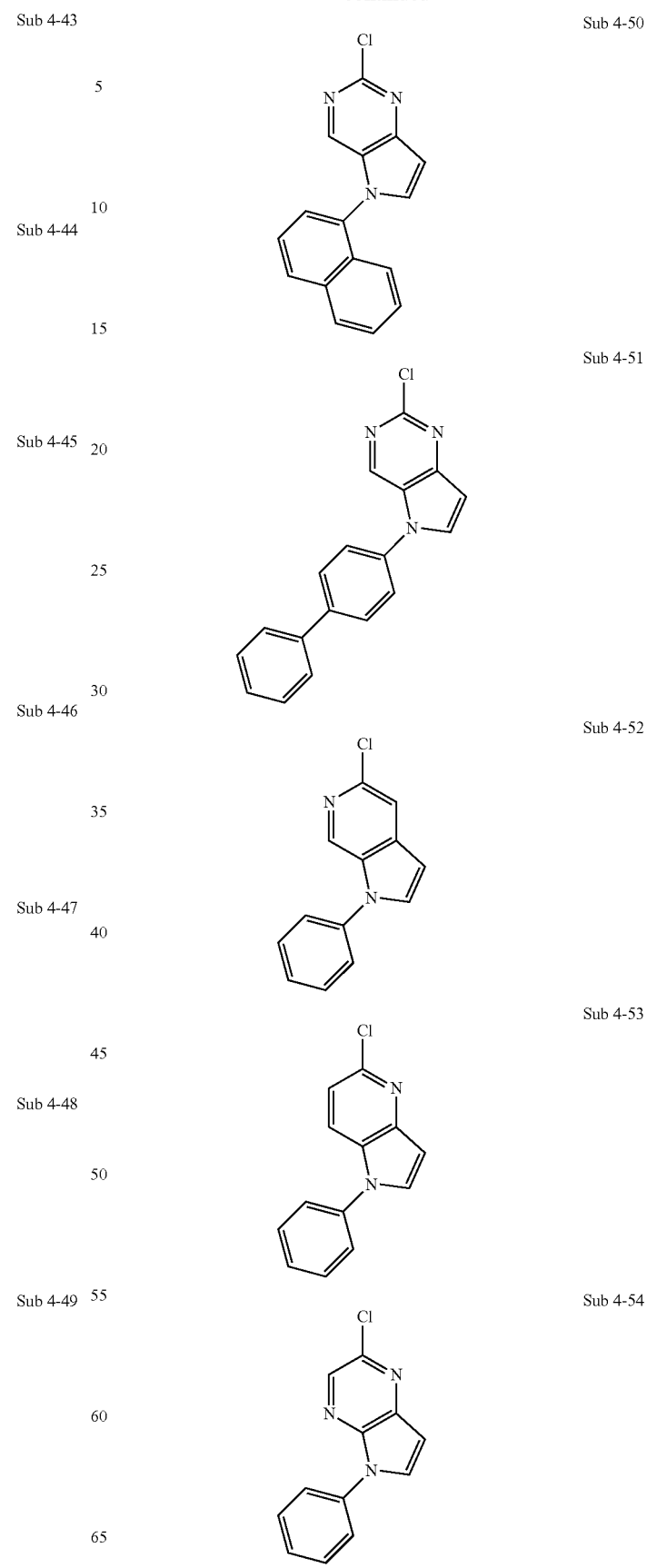

-continued

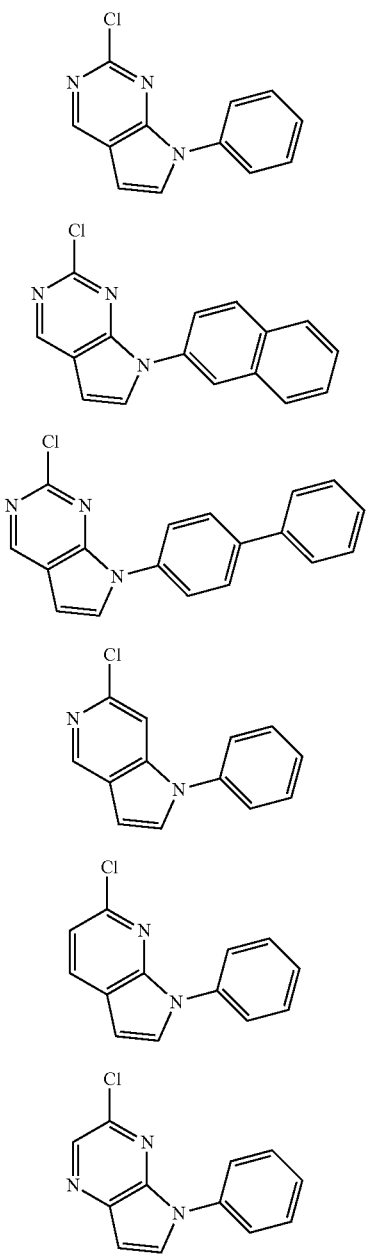

Sub 4-55

Sub 4-56

Sub 4-57

Sub 4-58

Sub 4-59

Sub 4-60

TABLE 5

| Compound | FD-MS |
|---|---|
| Sub 4-1 | m/z = 155.96 ($C_6H_5Br$ = 157.01) |
| Sub 4-2 | m/z = 205.97 ($C_{10}H_7Br$ = 207.07) |
| Sub 4-3 | m/z = 205.97 ($C_{10}H_7Br$ = 207.07) |
| Sub 4-4 | m/z = 231.99 ($C_{12}H_9Br$ = 233.10) |
| Sub 4-5 | m/z = 309.02 ($C_{17}H_{12}BrN$ = 310.19) |
| Sub 4-6 | m/z = 311.01 ($C_{15}H_{10}BrN_3$ = 312.16) |
| Sub 4-7 | m/z = 310.01 ($C_{16}H_{11}BrN_2$ = 311.18) |
| Sub 4-8 | m/z = 310.01 ($C_{16}H_{11}BrN_2$ = 311.18) |
| Sub 4-9 | m/z = 310.01 ($C_{16}H_{11}BrN_2$ = 311.18) |
| Sub 4-10 | m/z = 387.04 ($C_{21}H_{14}BrN_3$ = 388.26) |
| Sub 4-11 | m/z = 386.04 ($C_{22}H_{15}BrN_2$ = 387.27) |
| Sub 4-12 | m/z = 386.04 ($C_{22}H_{15}BrN_2$ = 387.27) |
| Sub 4-13 | m/z = 348.03 ($C_{19}H_{13}BrN_2$ = 349.22) |
| Sub 4-14 | m/z = 271.99 ($C_{13}H_9BrN_2$ = 273.13) |

TABLE 5-continued

| Compound | FD-MS |
|---|---|
| Sub 4-15 | m/z = 283.99 ($C_{14}H_9BrN_2$ = 285.14) |
| Sub 4-16 | m/z = 374.01 ($C_{20}H_{11}BrN_{20}$ = 375.22) |
| Sub 4-17 | m/z = 400.06 ($C_{23}H_{17}BrN_2$ = 401.30) |
| Sub 4-18 | m/z = 360.03 ($C_{20}H_{13}BrN_2$ = 361.23) |
| Sub 4-19 | m/z = 476.09 ($C_{29}H_{21}BrN_2$ = 477.39) |
| Sub 4-20 | m/z = 284.99 ($C_{13}H_8BrN_3$ = 286.13) |
| Sub 4-21 | m/z = 289.03 ($C_{14}H_4D_5BrN_2$ = 290.2) |
| Sub 4-22 | m/z = 284.99 ($C_{13}H_8BrN_3$ = 286.13) |
| Sub 4-23 | m/z = 375.00 ($C_{19}H_{10}BrN_3O$ = 376.2) |
| Sub 4-24 | m/z = 401.05 ($C_{22}H_{16}BrN_3$ = 402.29) |
| Sub 4-25 | m/z = 296.02 ($C_{16}H_9ClN_2S$ = 296.77) |
| Sub 4-26 | m/z = 322.03 ($C_{18}H_{11}ClN_2S$ = 322.81) |
| Sub 4-27 | m/z = 322.03 ($C_{18}H_{11}ClN_2S$ = 322.81) |
| Sub 4-28 | m/z = 168.98 ($C_7H_4ClNS$ = 169.63) |
| Sub 4-29 | m/z = 168.98 ($C_7H_4ClNS$ = 169.63)) |
| Sub 4-30 | m/z = 169.97 ($C_6H_3ClN_2S$ = 170.62) |
| Sub 4-31 | m/z = 246.00 ($C_{12}H_7ClN_2S$ = 246.72) |
| Sub 4-32 | m/z = 322.03 ($C_{18}H_{11}ClN_2S$ = 322.81) |
| Sub 4-33 | m/z = 322.03 ($C_{18}H_{11}ClN_2S$ = 322.81) |
| Sub 4-34 | m/z = 168.98 ($C_7H_4ClNS$ = 169.63) |
| Sub 4-35 | m/z = 168.98 ($C_7H_4ClNS$ = 169.63)) |
| Sub 4-36 | m/z = 169.97 ($C_6H_3ClN_2S$ = 170.62) |
| Sub 4-37 | m/z = 230.02 ($C_{12}H_7ClN_2O$ = 230.65) |
| Sub 4-38 | m/z = 306.06 ($C_{18}H_{11}ClN_2O$ = 306.75) |
| Sub 4-39 | m/z = 306.06 ($C_{18}H_{11}ClN_2O$ = 306.75) |
| Sub 4-40 | m/z = 153.00 ($C_7H_4ClNO$ = 153.57) |
| Sub 4-41 | m/z = 153.00 ($C_7H_4ClNO$ = 153.57) |
| Sub 4-42 | m/z = 153.99 ($C_6H_3ClN_2O$ = 154.55) |
| Sub 4-43 | m/z = 230.02 ($C_{12}H_7ClN_2O$ = 230.65) |
| Sub 4-44 | m/z = 306.06 ($C_{18}H_{11}ClN_2O$ = 306.75) |
| Sub 4-45 | m/z = 306.06 ($C_{18}H_{11}ClN_2O$ = 306.75) |
| Sub 4-46 | m/z = 153.00 ($C_7H_4ClNO$ = 153.57) |
| Sub 4-47 | m/z = 153.00 ($C_7H_4ClNO$ = 153.57) |
| Sub 4-48 | m/z = 153.99 ($C_6H_3ClN_2O$ = 154.55) |
| Sub 4-49 | m/z = 229.04 ($C_{12}H_8ClN_3$ = 229.67) |
| Sub 4-50 | m/z = 279.06 ($C_{16}H_{10}ClN_3$ = 279.72) |
| Sub 4-51 | m/z = 305.07 ($C_{18}H_{12}ClN_3$ = 305.76) |
| Sub 4-52 | m/z = 228.05 ($C_{13}H_9ClN_2$ = 228.68) |
| Sub 4-53 | m/z = 228.05 ($C_{13}H_9ClN_2$ = 228.68) |
| Sub 4-54 | m/z = 229.04 ($C_{12}H_8ClN_3$ = 229.67) |
| Sub 4-55 | m/z = 229.04 ($C_{12}H_8ClN_3$ = 229.67) |
| Sub 4-56 | m/z = 279.06 ($C_{16}H_{10}ClN_3$ = 279.72) |
| Sub 4-57 | m/z = 305.07 ($C_{18}H_{12}ClN_3$ = 305.76) |
| Sub 4-58 | m/z = 228.05 ($C_{13}H_9ClN_2$ = 228.68) |
| Sub 4-59 | m/z = 228.05 ($C_{13}H_9ClN_2$ = 228.68) |
| Sub 4-60 | m/z = 229.04 ($C_{12}H_8ClN_3$ = 229.67) |

Synthesis Method of Final Product 2

Synthesis Method of P2-4

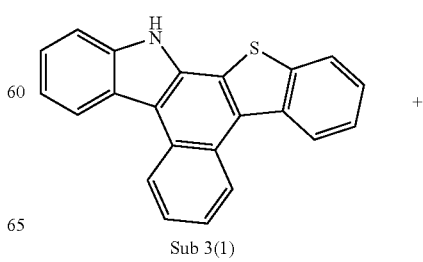

Sub 3(1)                    +

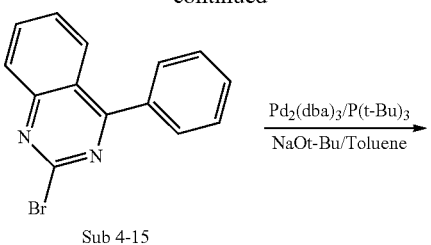

Sub 4-15

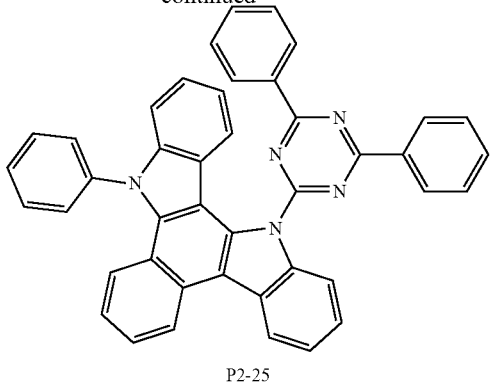

P2-25

Sub 3(1) (15.3 g, 47.3 mmol) was dissolved in toluene (500 mL) in a round bottom flask, and Sub 4-15 (14.8 g, 52.0 mmol), Pd$_2$(dba)$_3$ (2.2 g, 2.4 mmol), P(t-Bu)$_3$ (1 g, 4.73 mmol), and NaOt-Bu (13.6 g, 141.8 mmol) were added to the reaction solution, followed by stirring at 100° C. Upon completion of the reaction, the reaction product was extracted with CH$_2$Cl$_2$ and water. The extracted organic layer was dried with MgSO$_4$ and concentrated, and then the produced organic material was separated by a silica gel column and recrystallized to obtain 17.0 g (yield: 68%).

Synthesis Method of P2-25

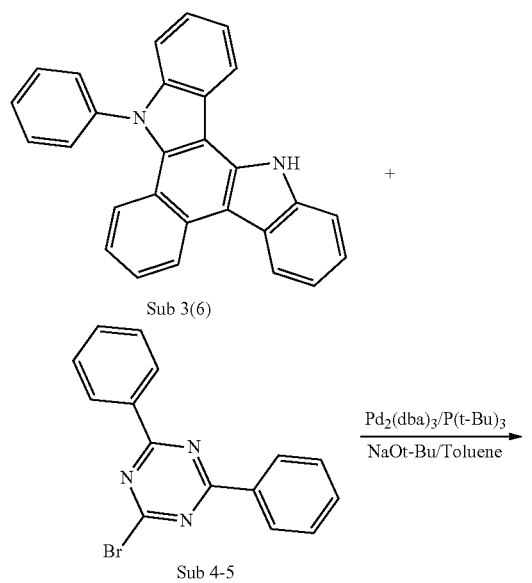

Sub 3(6)

Sub 4-5

Sub 3(6) (18.1 g, 47.3 mmol) was dissolved in toluene (500 mL) in a round bottom flask, and Sub 4-5 (16.2 g, 52.0 mmol), Pd$_2$ (dba)$_3$ (2.2 g, 2.4 mmol), P(t-Bu)$_3$ (1 g, 4.73 mmol), and NaOt-Bu (13.6 g, 141.8 mmol) were added to the reaction solution, followed by stirring at 100° C. Upon completion of the reaction, the reaction product was extracted with CH$_2$Cl$_2$ and water. The extracted organic layer was dried with MgSO$_4$ and concentrated, and then the produced organic material was separated by a silica gel column and recrystallized to obtain 20.3 g (yield: 70%).

In Table 6 below, FD-MS data of the compounds P2-1 to P2-28 prepared in the Synthesis Examples of the present invention are given.

TABLE 6

| Compound | FD-MS |
|---|---|
| P2-1 | m/z = 399.11 (C$_{28}$H$_{17}$NS = 399.51) |
| P2-2 | m/z = 554.16 (C$_{37}$H$_{22}$N$_4$S = 554.66) |
| P2-3 | m/z = 553.16 (C$_{38}$H$_{23}$N$_3$S = 553.67) |
| P2-4 | m/z = 527.15 (C$_{36}$H$_{21}$N$_3$S = 527.64) |
| P2-5 | m/z = 511.17 (C$_{36}$H$_{21}$N$_3$O = 511.57) |
| P2-6 | m/z = 653.19 (C$_{46}$H$_{27}$N$_3$S = 653.79) |
| P2-7 | m/z = 720.17 (C$_{50}$H$_{28}$N$_2$S$_2$ = 720.90) |
| P2-8 | m/z = 613.22 (C$_{44}$H$_{27}$N$_3$O = 613.70) |
| P2-9 | m/z = 553.16 (C$_{38}$H$_{23}$N$_3$S = 553.67) |
| P2-10 | m/z = 554.16 (C$_{37}$H$_{22}$N$_4$S = 554.66) |
| P2-11 | m/z = 527.15 (C$_{36}$H$_{21}$N$_3$S = 527.64) |
| P2-12 | m/z = 591.18 (C$_{41}$H$_{25}$N$_3$S = 591.72) |
| P2-13 | m/z = 511.17 (C$_{36}$H$_{21}$N$_3$O = 511.57) |
| P2-14 | m/z = 561.18 (C$_{40}$H$_{23}$N$_3$O = 561.63) |
| P2-15 | m/z = 561.18 (C$_{40}$H$_{23}$N$_3$O = 561.63) |
| P2-16 | m/z = 537.18 (C$_{38}$H$_{23}$N$_3$O = 537.61) |
| P2-17 | m/z = 794.25 (C$_{56}$H$_{34}$N$_4$S = 794.96) |
| P2-18 | m/z = 604.17 (C$_{41}$H$_{24}$N$_4$S = 604.72) |
| P2-19 | m/z = 627.18 (C$_{44}$H$_{25}$N$_3$S = 627.75) |
| P2-20 | m/z = 641.19 (C$_{45}$H$_{27}$N$_3$S = 641.78) |
| P2-21 | m/z = 613.23 (C$_{43}$H$_{27}$N$_5$ = 613.71) |
| P2-22 | m/z = 612.23 (C$_{44}$H$_{28}$N$_4$ = 612.72) |
| P2-23 | m/z = 583.12 (C$_{38}$H$_{21}$N$_3$S$_2$ = 583.72) |
| P2-24 | m/z = 564.23 (C$_{40}$H$_{28}$N$_4$ = 564.68) |
| P2-25 | m/z = 613.23 (C$_{43}$H$_{27}$N$_5$ = 613.71) |
| P2-26 | m/z = 564.23 (C$_{40}$H$_{28}$N$_4$ = 564.68) |
| P2-27 | m/z = 537.18 (C$_{38}$H$_{23}$N$_3$O = 537.61) |
| P2-28 | m/z = 633.13 (C$_{42}$H$_{23}$N$_3$S$_2$ = 633.78) |

Synthesis Method of Final Product 3

The final product 3 of the present invention, represented by Formula 7, can be synthesized by reaction between Sub 5 or Sub 6 and Sub 2 as illustrated in, but not limited to, the following Reaction Scheme 6.

Reaction Scheme 6

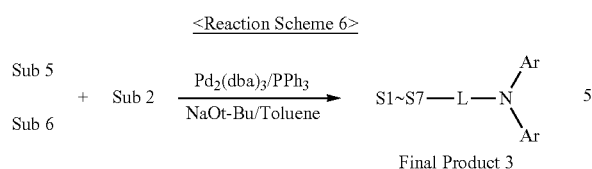

Final Product 3

L is L² to L⁴, and Ar is Ar⁷ and Ar⁸, as defined in Formula 7-1 to 7-3.

1. Synthesis Method of Sub 5

Reaction Scheme 7

S1~S7 + X—L—Br $\xrightarrow[\text{Nitrobenzene}]{\text{Na}_2\text{SO}_4/\text{K}_2\text{CO}_3/\text{Cu}}$ S1~S7—L—Br X = Br, I Sub 5

Examples of the Sub 5 may be compounds of S1 to S7.

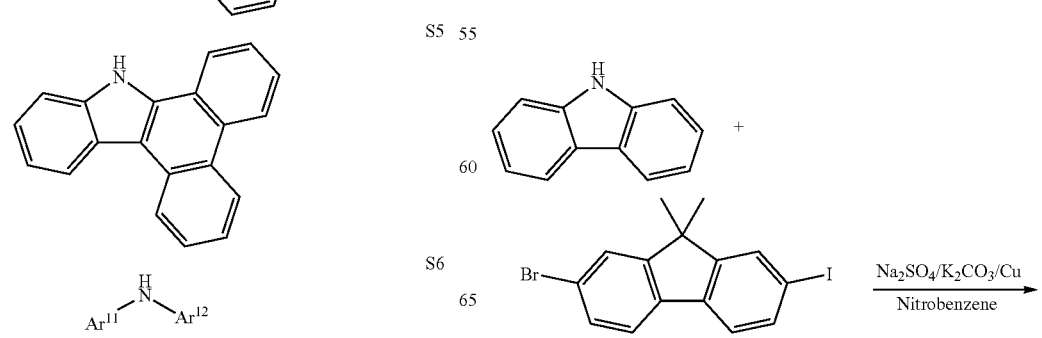

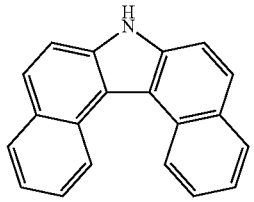

Synthesis Method of Sub 5-1-1 (L=Biphenyl)

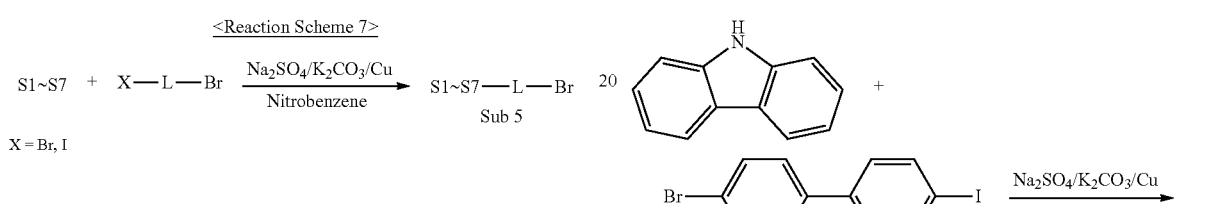

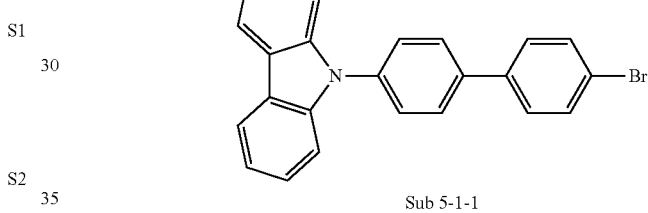

Sub 5-1-1

9H-carbazole (50.16 g, 300 mmol) as the starting material, and 4-bromo-4'-iodo-1,1'-biphenyl (129.2 g, 360 mmol), Na₂SO₄ (42.6 g, 300 mmol), K₂CO₃ (41.4 g, 300 mmol), Cu (5.72 g, 90 mmol), and nitrobenzene were added to the reaction solution, followed by stirring at 200° C. Upon completion of the reaction, nitrobenzene was removed by distillation, and the reaction product was extracted with CH₂Cl₂ and water. The extracted organic layer was dried with MgSO₄ and concentrated, and then the produced organic material was separated by a silica gel column and recrystallized to obtain 80.05 g of product (yield: 67%).

Synthesis Method of Sub 5-1-2
(L=9,9-dimethyl-9H-fluorene)

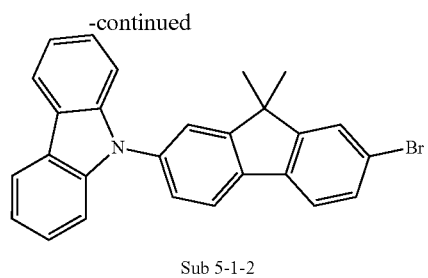

Sub 5-1-2

Using 9H-carbazole (50.16 g, 300 mmol) as the starting material and using 2-bromo-7-iodo-9,9-dimethyl-9H-fluorene (143.7 g, 360 mmol), Na₂SO₄ (42.6 g, 300 mmol), K₂CO₃ (41.4 g, 300 mmol), Cu (5.72 g, 90 mmol), and nitrobenzene, the same procedure as described in the synthesis method of Sub 5-1-1 was carried out to obtain 88.11 g of product (yield: 67%).

Synthesis Method of Sub 5-1-3 (L=biphenyl)

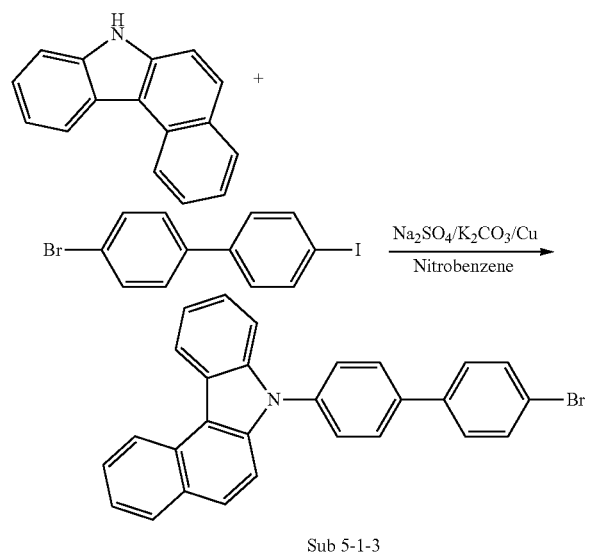

Sub 5-1-3

Using 7H-benzo[c]carbazole (65.18 g, 300 mmol) as the starting material and using 4-bromo-4'-iodo-1,1'-biphenyl (129.2 g, 360 mmol), Na₂SO₄ (42.6 g, 300 mmol), K₂CO₃ (41.4 g, 300 mmol), Cu (5.72 g, 90 mmol), and nitrobenzene, the same procedure as described in the synthesis method of Sub 5-1-1 was carried out to obtain 92.8 g of product (yield: 69%).

Synthesis Method of Sub 5-1-4
(L=9,9-dimethyl-9H-fluorene)

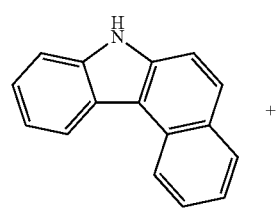 +

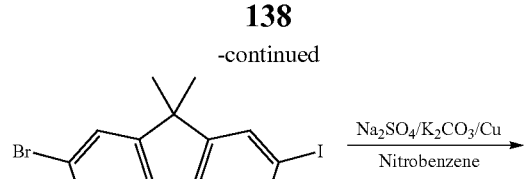

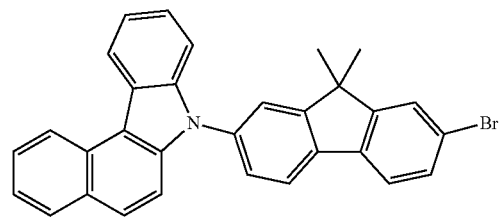

Sub 5-1-4

Using 7H-benzo[c]carbazole (65.18 g, 300 mmol) as the starting material and using 2-bromo-7-iodo-9,9-dimethyl-9H-fluorene (143.7 g, 360 mmol), Na₂SO₄ (42.6 g, 300 mmol), K₂CO₃ (41.4 g, 300 mmol), Cu (5.72 g, 90 mmol), and nitrobenzene, the same procedure as described in the synthesis method of Sub 5-1-1 was carried out to obtain 95.24 g of product (yield: 65%).

Synthesis Method of Sub 5-1-5 (L=Biphenyl)

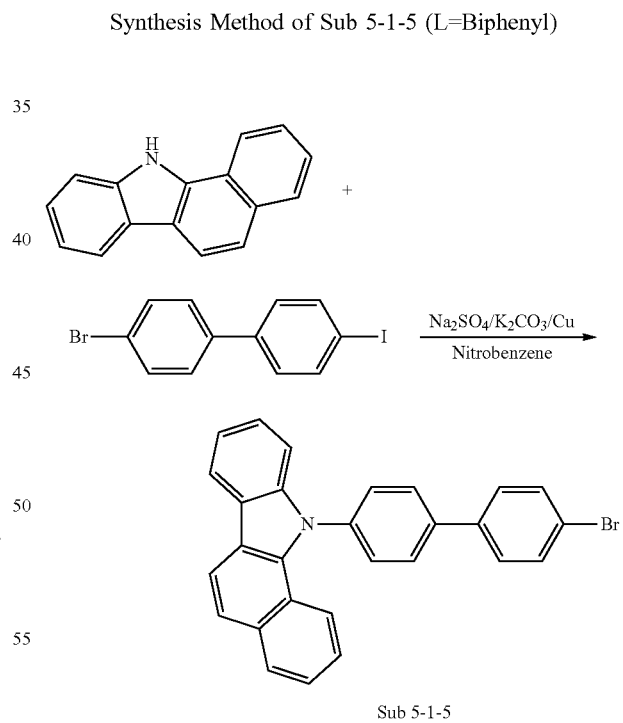

Sub 5-1-5

Using 11H-benzo[a]carbazole (65.18 g, 300 mmol) as the starting material and using 4-bromo-4'-iodo-1,1'-biphenyl (129.2 g, 360 mmol), Na₂SO₄ (42.6 g, 300 mmol), K₂CO₃ (41.4 g, 300 mmol), Cu (5.72 g, 90 mmol), and nitrobenzene, the same procedure as described in the synthesis method of Sub 5-1-1 was carried out to obtain 80.05 g of product (yield: 62%).

Synthesis Method of Sub 5-1-6
(L=9,9-dimethyl-9H-fluorene)

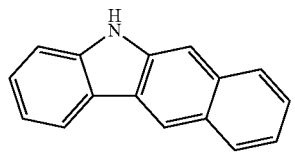

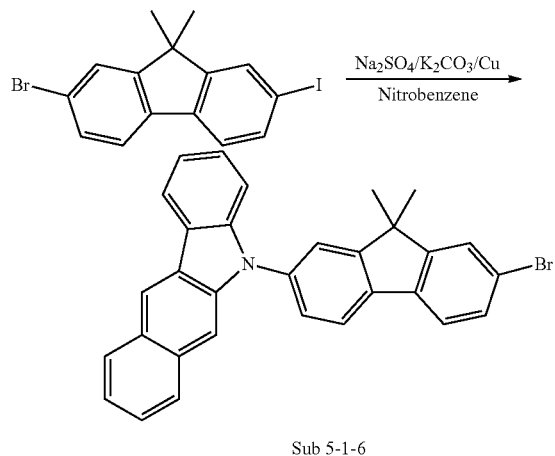

Sub 5-1-6

Using 5H-benzo[b]carbazole (65.18 g, 300 mmol) as the starting material and using 2-bromo-7-iodo-9,9-dimethyl-9H-fluorene (143.7 g, 360 mmol), Na$_2$SO$_4$ (42.6 g, 300 mmol), K$_2$CO$_3$ (41.4 g, 300 mmol), Cu (5.72 g, 90 mmol), and nitrobenzene, the same procedure as described in the synthesis method of Sub 5-1-1 was carried out to obtain 93.78 g of product (yield: 64%).

Synthesis Method of Sub 5-1-7 (L=Biphenyl)

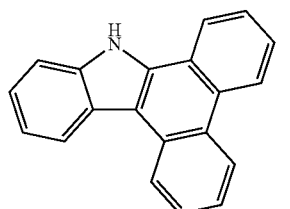

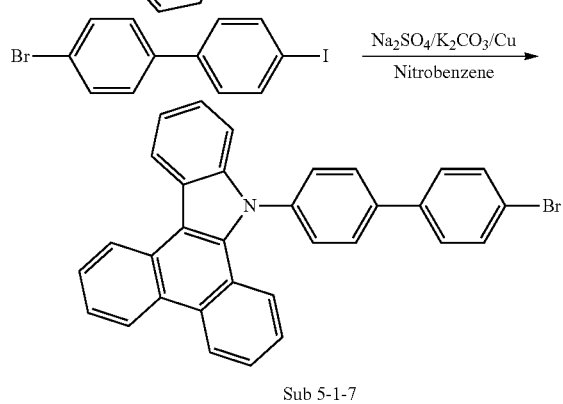

Sub 5-1-7

Using 9H-dibenzo[a,c]carbazole (80.2 g, 300 mmol) as the starting material and using 4-bromo-4'-iodo-1,1'-biphenyl (129.2 g, 360 mmol), Na$_2$SO$_4$ (42.6 g, 300 mmol), K$_2$CO$_3$ (41.4 g, 300 mmol), Cu (5.72 g, 90 mmol), and nitrobenzene, the same procedure as described in the synthesis method of Sub 5-1-1 was carried out to obtain 98.7 g of product (yield: 66%).

Synthesis Method of Sub 5-1-8 (L=Biphenyl)

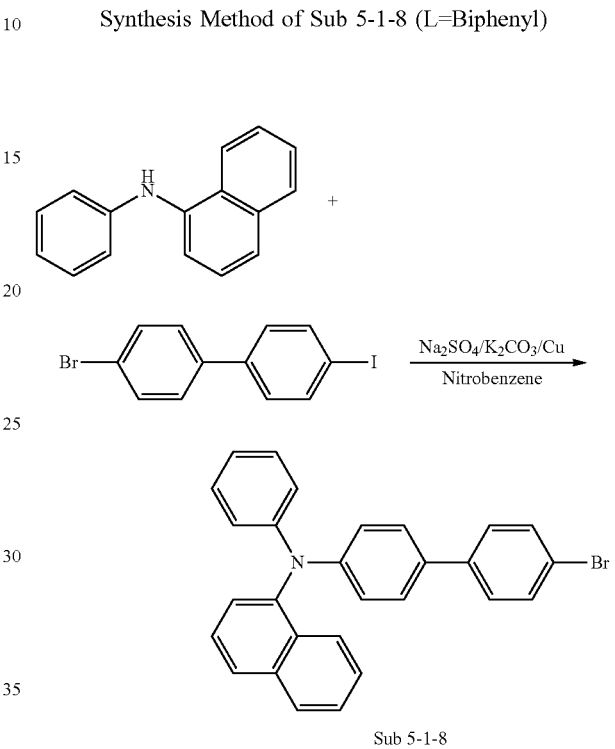

Sub 5-1-8

Using N-phenylnaphthalen-1-amine (65.8 g, 300 mmol) as the starting material and using 4-bromo-4'-iodo-1,1'-biphenyl (129.2 g, 360 mmol), Na$_2$SO$_4$ (42.6 g, 300 mmol), K$_2$CO$_3$ (41.4 g, 300 mmol), Cu (5.72 g, 90 mmol), and nitrobenzene, the same procedure as described in the synthesis method of Sub 5-1-1 was carried out to obtain 89.2 g of product (yield: 66%).

Synthesis Method of Sub 5-1-9
(L=9,9-dimethyl-9H-fluorene)

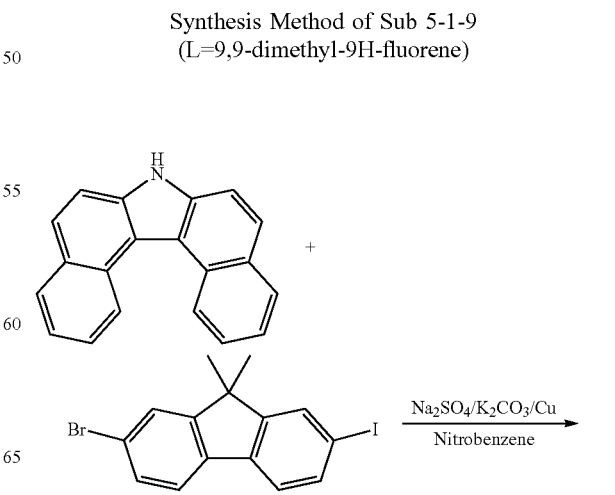

141

-continued

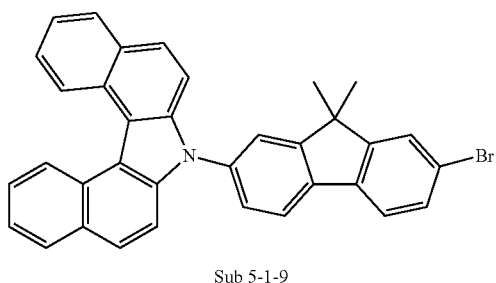

Sub 5-1-9

Using 7H-dibenzo[c,g]carbazole (80.2 g, 300 mmol) as the starting material and using 2-bromo-7-iodo-9,9-dimethyl-9H-fluorene (143.7 g, 360 mmol), $Na_2SO_4$ (42.6 g, 300 mmol), $K_2CO_3$ (41.4 g, 300 mmol), Cu (5.72 g, 90 mmol), and nitrobenzene, the same procedure as described in the synthesis method of Sub 5-1-1 was carried out to obtain 98.5 g of product (yield: 61%).

2. Synthesis Method of Sub 6

<Reaction Scheme 8>

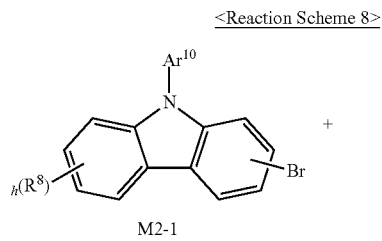

M2-1

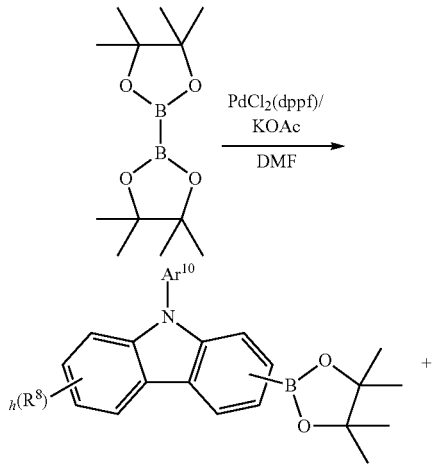

M2-2

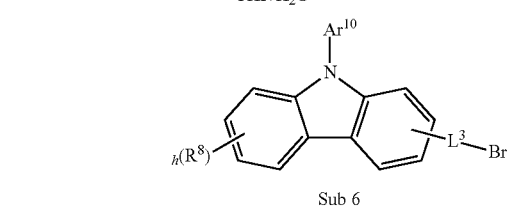

Sub 6

142

Synthesis Method of M2-2-1 (h=0, $Ar^{10}$=Phenyl)

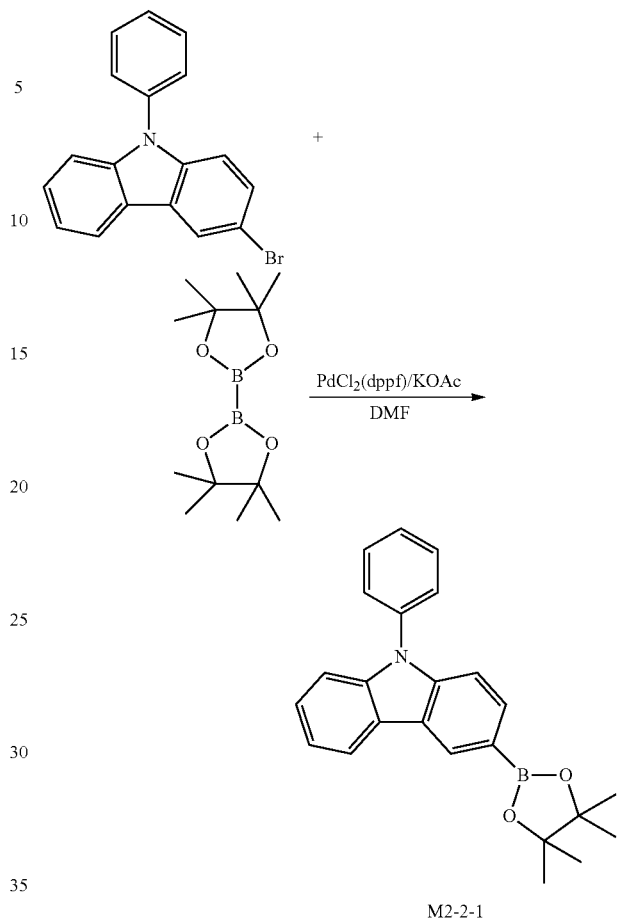

M2-2-1

3-bromo-9-phenyl-9H-carbazole (45.1 g, 140 mmol) was dissolved in DMF (980 mL), and Bispinacolborate (39.1 g, 154 mmol), $PdCl_2$(dppf) catalyst (3.43 g, 4.2 mmol), and KOAc (41.3 g, 420 mmol) were added in this order to the reaction solution, followed by stirring for 24 hours, and a borate compound were synthesized. The obtained compound was separated by a silica gel column and recrystallized to obtain 35.2 g (yield: 68%) of the borate compound.

Synthesis Method of M2-2-2 (h=0, $Ar^{10}$=Biphenyl)

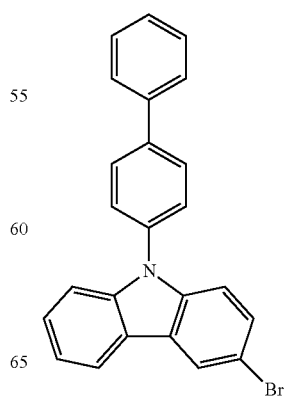

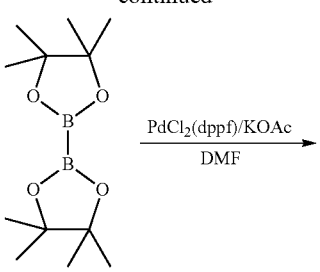

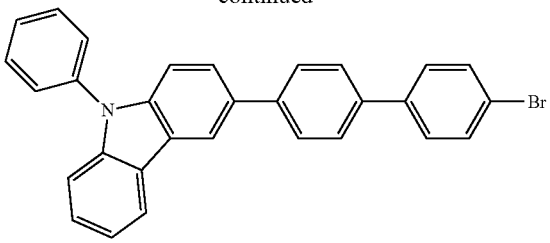

Sub 6-1-1

M2-2-1 (29.5 g, 80 mmol) was dissolved in THF (360 mL), and 4-bromo-4'-iodo-1,1'-biphenyl (30.16 g, 84 mmol), Pd(PPh$_3$)$_4$ (2.8 g, 2.4 mmol), NaOH (9.6 g, 240 mmol), and water (180 mL) were added to the reaction solution, followed by refluxing under stirring. Upon completion of the reaction, the reaction product was extracted with ether and water. The extracted organic layer was dried with MgSO$_4$ and concentrated, and then the produced organic material was separated by a silica gel column and recrystallized to obtain 26.56 g of product (yield: 70%).

Synthesis Method of Sub 6-1-2 (h=0, Ar$^{10}$=Phenyl, L$^3$=Phenyl)

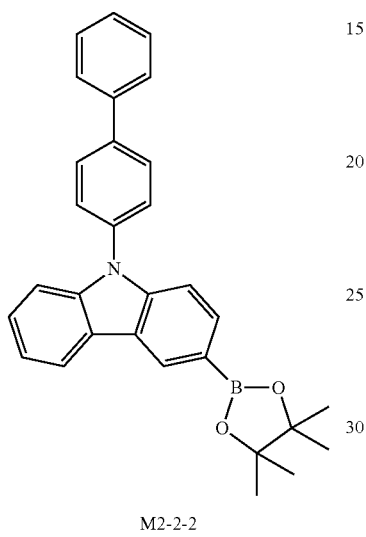

M2-2-2

The same procedure as described in the synthesis method of M2-2-1 was carried out to obtain 40.0 g (yield: 64%) of product. In the synthesis method of M2-2-1, Using 3-bromo-9-biphenyl-9H-carbazole (45.1 g, 140 mmol) instead of 3-bromo-9-phenyl-9H-carbazole (55.76 g, 140 mmol) as the starting material was different.

Synthesis Method of Sub 6-1-1 (h=0, Ar$^{10}$=Phenyl, L$^3$=Biphenyl (Linear))

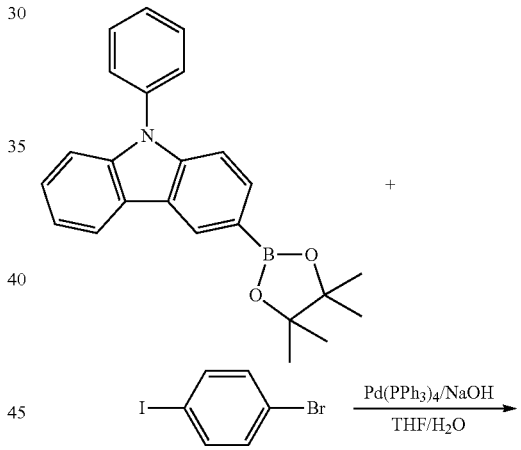

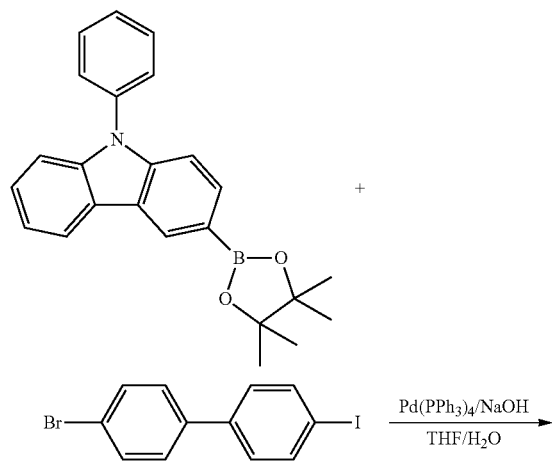

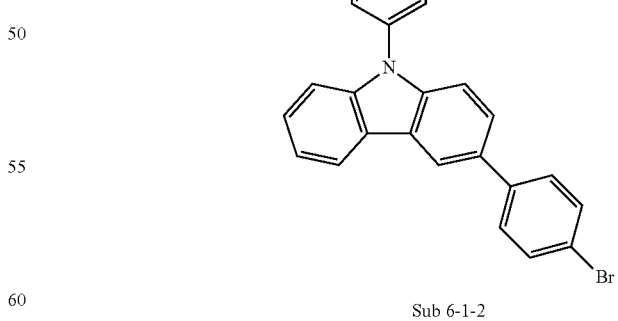

Sub 6-1-2

M2-2-1 (29.5 g, 80 mmol) was dissolved in THF (360 mL), and 1-bromo-4-iodobenzene (23.8 g, 84 mmol), Pd(PPh$_3$)$_4$ (2.8 g, 2.4 mmol), NaOH (9.6 g, 240 mmol), and water (180 mL) were added to the reaction solution, followed by refluxing under stirring. Upon completion of the reaction, the reaction product was extracted with ether and water. The extracted organic layer was dried with MgSO$_4$ and concentrated, and then the produced organic material was separated by a silica gel column and recrystallized to obtain 22.9 g of product (yield: 72%).

Synthesis Method of Sub 6-1-3 (h=0, Ar$^{10}$=Phenyl, L$^3$=Biphenyl (Non-Linear))

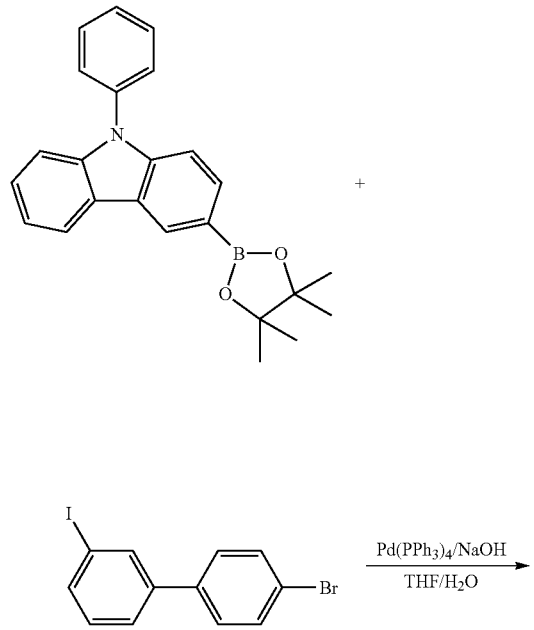

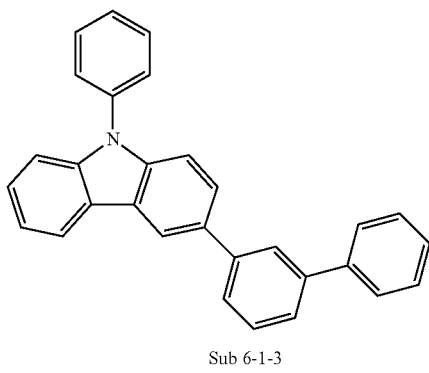

Sub 6-1-3

M2-2-1 (29.5 g, 80 mmol) was dissolved in THF (360 mL), and 4'-bromo-3-iodo-1,1'-biphenyl (30.16 g, 84 mmol), Pd(PPh$_3$)$_4$ (2.8 g, 2.4 mmol), NaOH (9.6 g, 240 mmol), and water (180 mL) were added to the reaction solution, followed by refluxing under stirring. Upon completion of the reaction, the reaction product was extracted with ether and water. The extracted organic layer was dried with MgSO$_4$ and concentrated, and then the produced organic material was separated by a silica gel column and recrystallized to obtain 24.7 g of product (yield: 65%).

Synthesis Method of Sub 6-1-4 (h=0, Ar''=Biphenyl, L$^3$=Biphenyl (Linear))

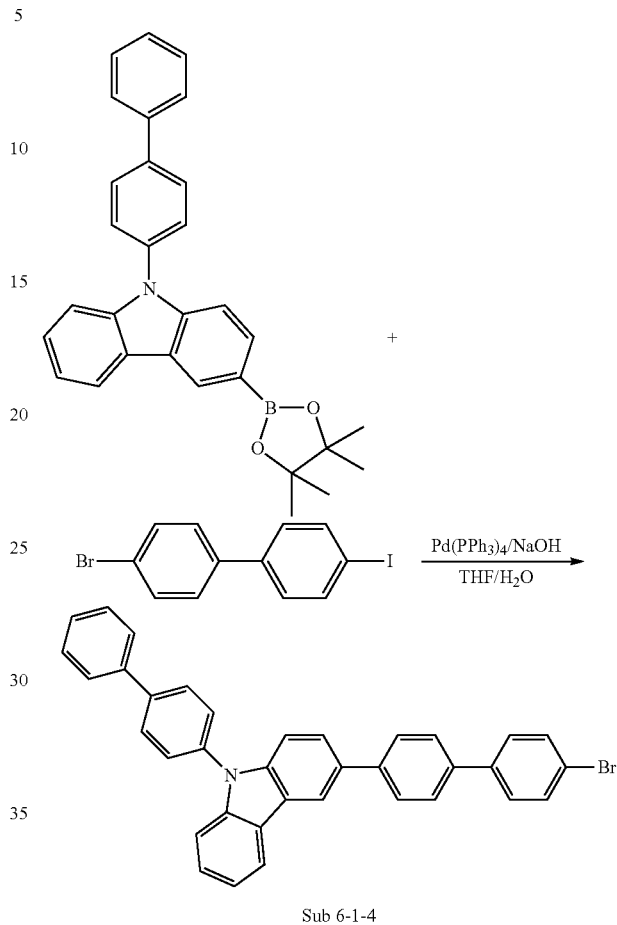

Sub 6-1-4

The obtained M2-2-2 (35.63 g, 80 mmol) was dissolved in THF (360 mL), and 4-bromo-4'-iodo-1,1'-biphenyl (30.16 g, 84 mmol), Pd(PPh$_3$)$_4$ (2.8 g, 2.4 mmol), NaOH (9.6 g, 240 mmol), and water (180 mL) were added to the reaction solution, followed by refluxing under stirring. Upon completion of the reaction, the reaction product was extracted with ether and water. The extracted organic layer was dried with MgSO$_4$ and concentrated, and then the produced organic material was separated by a silica gel column and recrystallized to obtain 29.51 g of product (yield: 67%).

Synthesis Method of Final Product 3

Synthesis Method of Compound 3-17

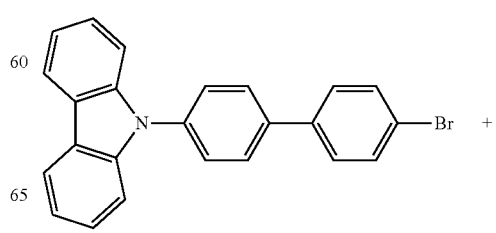

-continued

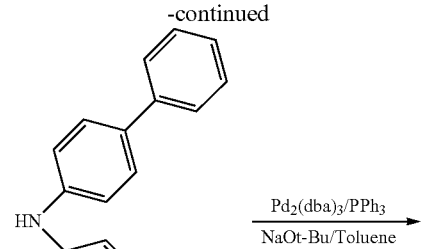

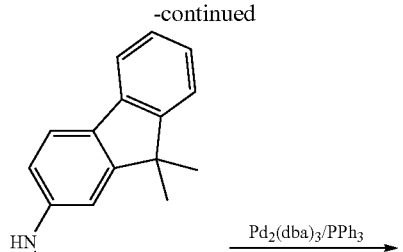

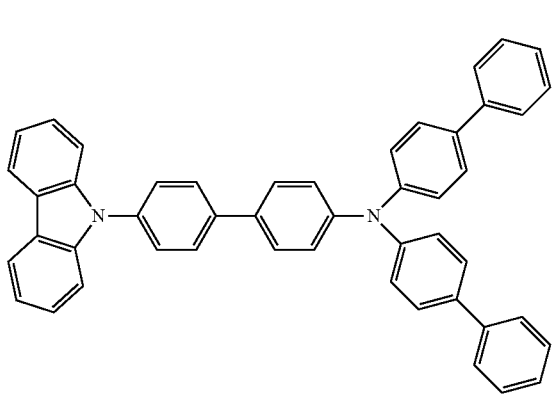

3-17

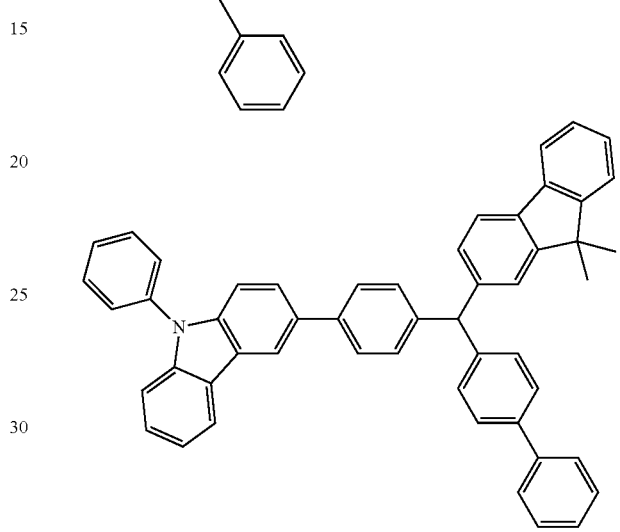

3-32

9-(4'-bromo-[1,1'-biphenyl]-4-yl)-9H-carbazole (9.6 g, 24 mmol) was dissolved in toluene and di([1,1'-biphenyl]-4-yl)amine (6.4 g, 20 mmol), Pd$_2$(dba)$_3$ (0.05 eq.), PPh$_3$ (0.1 eq.), and NaOt-Bu (3 eq.) were added to the reaction solution, followed by refluxing at 100° C. for 24 hours under stirring. Upon completion of the reaction, the reaction product was extracted with ether and water. The extracted organic layer was dried with MgSO$_4$ and concentrated, and then the produced organic material was separated by a silica gel column and recrystallized to obtain 12.9 g of product (yield: 84%).

Synthesis Method of Compound 3-32

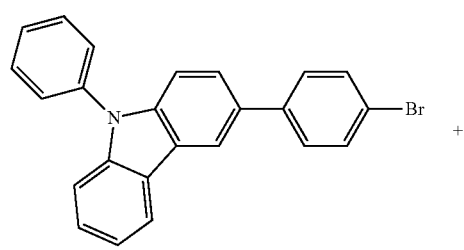

3-(4-bromophenyl)-9-phenyl-9H-carbazole (9.6 g, 24 mmol) was dissolved in toluene and N-([1,1'-biphenyl]-4-yl)-9,9-dimethyl-9H-fluoren-2-amine (7.2 g, 20 mmol), Pd$_2$(dba)$_3$ (0.05 eq.), PPh$_3$ (0.1 eq.), and NaOt-Bu (3 eq.) were added to the reaction solution, followed by refluxing at 100° C. for 24 hours under stirring. Upon completion of the reaction, the reaction product was extracted with ether and water. The extracted organic layer was dried with MgSO$_4$ and concentrated, and then the produced organic material was separated by a silica gel column and recrystallized to obtain 13.8 g of product (yield: 85%).

Synthesis Method of Compound 3-61

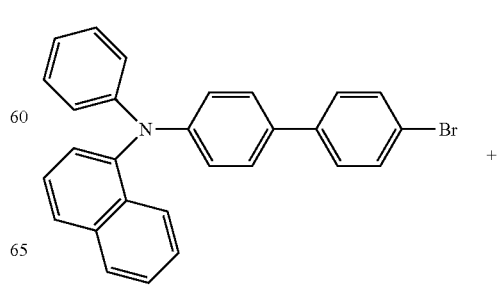

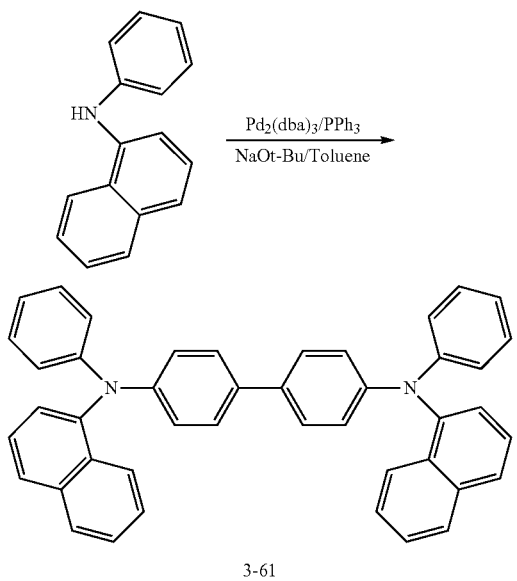

3-61

N-(4'-bromo-[1,1'-biphenyl]-4-yl)-N-phenylnaphthalen-1-amine (10.8 g, 24 mmol) was dissolved in toluene and N-phenylnaphthalen-1-amine (4.4 g, 20 mmol), Pd$_2$(dba)$_3$ (0.05 eq.), PPh$_3$ (0.1 eq.), and NaOt-Bu (3 eq.) were added to the reaction solution, followed by refluxing at 100° C. for 24 hours under stirring. Upon completion of the reaction, the reaction product was extracted with ether and water. The extracted organic layer was dried with MgSO$_4$ and concentrated, and then the produced organic material was separated by a silica gel column and recrystallized to obtain 11.4 g of product (yield: 81%).

In Table 7 below, FD-MS data of the compounds 3-1 to 3-71 prepared in the Synthesis Examples of the present invention are given.

TABLE 7

| Compound | FD-MS |
|---|---|
| 3-17 | m/z = 638.27 (C$_{48}$H$_{34}$N$_2$ = 638.80) |
| 3-20 | m/z = 678.30 (C$_{51}$H$_{38}$N$_2$ = 678.86) |
| 3-21 | m/z = 802.33 (C$_{61}$H$_{42}$N$_2$ = 803.00) |
| 3-22 | m/z = 800.32 (C$_{61}$H$_{40}$N$_2$ = 800.98) |
| 3-32 | m/z = 678.30 (C$_{51}$H$_{38}$N$_2$ = 678.86) |
| 3-33 | m/z = 802.33 (C$_{61}$H$_{42}$N$_2$ = 803.00) |
| 3-34 | m/z = 800.32 (C$_{61}$H$_{40}$N$_2$ = 800.98) |
| 3-43 | m/z = 714.30 (C$_{54}$H$_{38}$N$_2$ = 714.89) |
| 3-44 | m/z = 754.33 (C$_{54}$H$_{42}$N$_2$ = 754.96) |
| 3-45 | m/z = 878.37 (C$_{64}$H$_{46}$N$_2$ = 879.10) |
| 3-46 | m/z = 876.35 (C$_{64}$H$_{44}$N$_2$ = 877.08) |
| 3-47 | m/z = 744.26 (C$_{54}$H$_{36}$N$_2$S = 744.94) |
| 3-52 | m/z = 826.33 (C$_{63}$H$_{42}$N$_2$ = 827.02) |
| 3-53 | m/z = 824.32 (C$_{63}$H$_{40}$N$_2$ = 825.01) |
| 3-54 | m/z = 688.29 (C$_{52}$H$_{36}$N$_2$ = 688.86) |
| 3-55 | m/z = 728.32 (C$_{55}$H$_{40}$N$_2$ = 728.92) |
| 3-57 | m/z = 778.33 (C$_{59}$H$_{42}$N$_2$ = 778.98) |
| 3-58 | m/z = 902.37 (C$_{69}$H$_{46}$N$_2$ = 903.12) |
| 3-59 | m/z = 900.35 (C$_{69}$H$_{44}$N$_2$ = 901.10) |
| 3-60 | m/z = 538.24 (C$_{40}$H$_{30}$N$_2$ = 538.68) |
| 3-61 | m/z = 588.26 (C$_{44}$H$_{32}$N$_2$ = 588.74) |
| 3-62 | m/z = 588.26 (C$_{44}$H$_{32}$N$_2$ = 588.74) |
| 3-63 | m/z = 614.27 (C$_{46}$H$_{34}$N$_2$ = 614.78) |

Fabrication and Evaluation of Organic Electronic Element

[Example 1] Red Organic Light Emitting Diode

An ITO layer (anode) was formed on a glass substrate, and a film of N$^1$-(naphthalen-2-yl)-N$^4$,N$^4$-bis(4-(naphthalen-2-yl(phenyl)amino)phenyl)-N$^1$-phenylbenzene-1,4-diamine (hereinafter abbreviated as "2-TNATA") was vacuum-deposited on the ITO layer to form a hole injection layer with a thickness of 60 nm. Subsequently, a film of the compound P1-4 of the present invention was vacuum-deposited on the hole injection layer to form a hole transport layer with a thickness of 60 nm. Subsequently, a light emitting layer with a thickness of 30 nm was deposited on the hole transport layer by doping the hole transport layer with the compound P2-4 of the present invention as a host material and bis-(1-phenylisoquinolyl)iridium(III)acetylacetonate (hereinafter abbreviated as "(piq)$_2$Ir(acac)") as a dopant material in a weight ratio of 95:5. Next, a film of ((1,1'-bisphenyl)-4-olato)bis(2-methyl-8-quinolinolato)aluminum (hereinafter abbreviated as "BAlq") was vacuum-deposited with a thickness of 10 nm on the light emitting layer to form a hole blocking layer, and a film of tris(8-quinolinolato)aluminum (hereinafter abbreviated as "Alq$_3$") was formed with a thickness of 40 nm to form an electron transport layer. Next, LiF as halogenated alkali metal was deposited with a thickness of 0.2 nm on the electron transport layer to form an electron injection layer, and then Al was deposited with a thickness of 150 nm on the electron injection layer to form a cathode. In this way, the OLED was completed.

[Example 2] to [Example 49] Red Organic Light Emitting Diode

The OLED was manufactured in the same manner as described in Example 1, except that any one of the compounds of the present invention in the Table 8 below was used as the material of the hole transport layer, instead of the inventive compound P1-4, and any one of the compounds of the present invention in the Table 8 below was used as the host material of the light emitting layer, instead of the inventive compound P2-4.

[Comparative Example 1] to [Comparative Example 5]

OLEDs were manufactured in the same manner as described in Example 1, except that any one of omp.Com A to C, compound P2-28 and compound P1-53 in the Table 8 below was used as the material of the hole transport layer and the phosphorescent host material of the a light emitting layer.

<comp. Com. A>

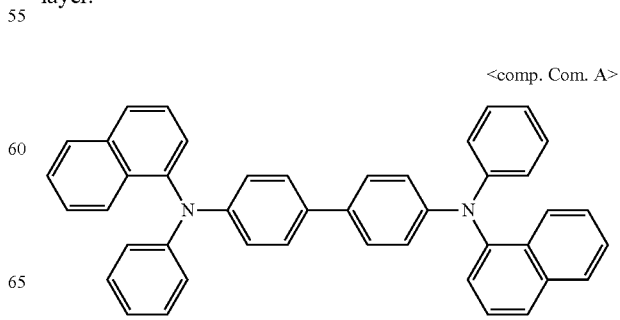

-continued

<comp. Com. B>

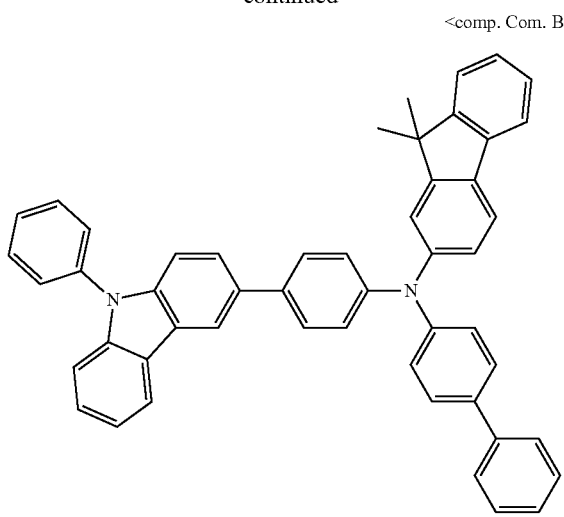

<comp. Com. c>

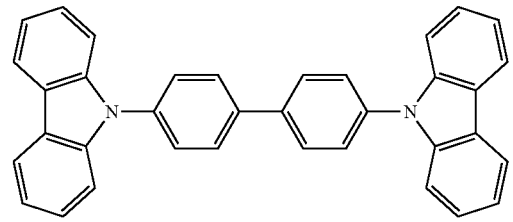

A forward bias DC voltage was applied to each of the OLEDs manufactured through the Examples 1 to 49 and Comparative Example 1 to 5, and electro-luminescence (EL) characteristics of the OLED were measured by PR-650 (Photoresearch). Also, T95 life span was measured by life span measuring equipment (Mcscience) at a reference brightness of 2500 cd/m². Table 8 below shows evaluation results of OLEDs manufactured the Examples and Comparative Examples.

TABLE 8

|  | Hole transport layer Compound | Phosphorescent Host Compound | Voltage (V) | Current Density (mA/cm²) | Brightness (cd/m²) | Efficiency (cd/A) | Lifetime T(95) |
|---|---|---|---|---|---|---|---|
| comp. Ex. (1) | comp. Com. A | comp. Com. C | 6.8 | 32.9 | 2500.0 | 7.6 | 79.7 |
| comp. Ex. (2) | comp. Com. B | comp. Com. C | 6.6 | 31.6 | 2500.0 | 7.9 | 83.7 |
| comp. Ex. (3) | comp. Com. A | Com. (P2-28) | 6.7 | 30.9 | 2500.0 | 8.1 | 85.5 |
| comp. Ex. (4) | comp. Com. B | Com. (P2-28) | 6.3 | 28.4 | 2500.0 | 8.8 | 95.3 |
| comp. Ex. (5) | Com. (P1-53) | comp. Com. C | 6.5. | 30.1 | 2500.0 | 8.3 | 84.6 |
| Ex. (1) | Com. (P1-4) | Com. (P2-4) | 5.7 | 23.5 | 2500.0 | 10.6 | 109.1 |
| Ex. (2) | Com. (P1-4) | Com. (P2-11) | 5.7 | 24.0 | 2500.0 | 10.4 | 101.8 |
| Ex. (3) | Com. (P1-4) | Com. (P2-16) | 5.6 | 20.7 | 2500.0 | 12.1 | 106.3 |
| Ex. (4) | Com. (P1-4) | Com. (P2-21) | 5.5 | 22.1 | 2500.0 | 11.3 | 102.1 |
| Ex. (5) | Com. (P1-4) | Com. (P2-23) | 5.8 | 22.6 | 2500.0 | 11.1 | 104.8 |
| Ex. (6) | Com. (P1-4) | Com. (P2-24) | 5.6 | 24.5 | 2500.0 | 10.2 | 109.4 |
| Ex. (7) | Com. (P1-4) | Com. (P2-28) | 5.6 | 21.1 | 2500.0 | 11.9 | 106.0 |
| Ex. (8) | Com. (P1-21) | Com. (P2-4) | 5.5 | 19.5 | 2500.0 | 12.8 | 105.6 |
| Ex. (9) | Com. (P1-21) | Com. (P2-11) | 5.7 | 20.2 | 2500.0 | 12.4 | 107.9 |
| Ex. (10) | Com. (P1-21) | Com. (P2-16) | 5.8 | 25.0 | 2500.0 | 10.0 | 103.4 |
| Ex. (11) | Com. (P1-21) | Com. (P2-21) | 5.8 | 19.7 | 2500.0 | 12.7 | 109.7 |
| Ex. (12) | Com. (P1-21) | Com. (P2-23) | 5.6 | 21.3 | 2500.0 | 11.7 | 107.1 |
| Ex. (13) | Com. (P1-21) | Com. (P2-24) | 5.5 | 23.9 | 2500.0 | 10.4 | 102.6 |
| Ex. (14) | Com. (P1-21) | Com. (P2-28) | 5.5 | 23.8 | 2500.0 | 10.5 | 102.0 |
| Ex. (15) | Com. (P1-50) | Com. (P2-4) | 5.7 | 22.5 | 2500.0 | 11.1 | 109.9 |
| Ex. (16) | Com. (P1-50) | Com. (P2-11) | 5.6 | 21.3 | 2500.0 | 11.8 | 101.6 |
| Ex. (17) | Com. (P1-50) | Com. (P2-16) | 5.5 | 22.0 | 2500.0 | 11.4 | 106.8 |
| Ex. (18) | Com. (P1-50) | Com. (P2-21) | 5.7 | 21.1 | 2500.0 | 11.9 | 105.2 |
| Ex. (19) | Com. (P1-50) | Com. (P2-23) | 5.8 | 21.9 | 2500.0 | 11.4 | 101.9 |
| Ex. (20) | Com. (P1-50) | Com. (P2-24) | 5.7 | 23.2 | 2500.0 | 10.8 | 107.2 |
| Ex. (21) | Com. (P1-50) | Com. (P2-28) | 5.7 | 19.3 | 2500.0 | 13.0 | 105.1 |
| Ex. (22) | Com. (P1-53) | Com. (P2-4) | 5.6 | 17.0 | 2500.0 | 14.7 | 117.4 |
| Ex. (23) | Com. (P1-53) | Com. (P2-11) | 5.5 | 17.6 | 2500.0 | 14.2 | 115.3 |
| Ex. (24) | Com. (P1-53) | Com. (P2-16) | 5.7 | 17.0 | 2500.0 | 14.7 | 115.0 |
| Ex. (25) | Com. (P1-53) | Com. (P2-21) | 5.6 | 17.1 | 2500.0 | 14.6 | 115.9 |
| Ex. (26) | Com. (P1-53) | Com. (P2-23) | 5.7 | 17.3 | 2500.0 | 14.5 | 118.8 |
| Ex. (27) | Com. (P1-53) | Com. (P2-24) | 5.5 | 17.8 | 2500.0 | 14.1 | 110.3 |
| Ex. (28) | Com. (P1-53) | Com. (P2-28) | 5.6 | 16.9 | 2500.0 | 14.8 | 113.4 |
| Ex. (29) | Com. (P1-65) | Com. (P2-4) | 5.7 | 23.3 | 2500.0 | 10.7 | 107.5 |
| Ex. (30) | Com. (P1-65) | Com. (P2-11) | 5.7 | 22.0 | 2500.0 | 11.4 | 108.7 |
| Ex. (31) | Com. (P1-65) | Com. (P2-16) | 5.5 | 24.7 | 2500.0 | 10.1 | 104.6 |
| Ex. (32) | Com. (P1-65) | Com. (P2-21) | 5.6 | 24.6 | 2500.0 | 10.1 | 102.3 |
| Ex. (33) | Com. (P1-65) | Com. (P2-23) | 5.7 | 19.3 | 2500.0 | 12.9 | 102.5 |
| Ex. (34) | Com. (P1-65) | Com. (P2-24) | 5.7 | 20.3 | 2500.0 | 12.3 | 105.3 |
| Ex. (35) | Com. (P1-65) | Com. (P2-28) | 5.7 | 19.4 | 2500.0 | 12.9 | 101.6 |
| Ex. (36) | Com. (P1-70) | Com. (P2-4) | 5.6 | 17.9 | 2500.0 | 14.0 | 114.6 |
| Ex. (37) | Com. (P1-70) | Com. (P2-11) | 5.6 | 19.2 | 2500.0 | 13.0 | 111.7 |
| Ex. (38) | Com. (P1-70) | Com. (P2-16) | 5.7 | 17.5 | 2500.0 | 14.3 | 119.7 |
| Ex. (39) | Com. (P1-70) | Com. (P2-21) | 5.7 | 19.1 | 2500.0 | 13.1 | 114.1 |
| Ex. (40) | Com. (P1-70) | Com. (P2-23) | 5.8 | 17.9 | 2500.0 | 14.0 | 117.7 |
| Ex. (41) | Com. (P1-70) | Com. (P2-24) | 5.8 | 17.0 | 2500.0 | 14.7 | 115.6 |
| Ex. (42) | Com. (P1-70) | Com. (P2-28) | 5.5 | 18.0 | 2500.0 | 13.9 | 112.0 |

TABLE 8-continued

|  | Hole transport layer Compound | Phosphorescent Host Compound | Voltage (V) | Current Density (mA/cm²) | Brightness (cd/m²) | Efficiency (cd/A) | Lifetime T(95) |
|---|---|---|---|---|---|---|---|
| Ex. (43) | Com. (P1-73) | Com. (P2-4) | 5.7 | 20.0 | 2500.0 | 12.5 | 100.8 |
| Ex. (44) | Com. (P1-73) | Com. (P2-11) | 5.8 | 19.5 | 2500.0 | 12.8 | 103.5 |
| Ex. (45) | Com. (P1-73) | Com. (P2-16) | 5.5 | 21.0 | 2500.0 | 11.9 | 100.3 |
| Ex. (46) | Com. (P1-73) | Com. (P2-21) | 5.6 | 20.2 | 2500.0 | 12.4 | 108.8 |
| Ex. (47) | Com. (P1-73) | Com. (P2-23) | 5.6 | 23.9 | 2500.0 | 10.5 | 101.6 |
| Ex. (48) | Com. (P1-73) | Com. (P2-24) | 5.6 | 20.9 | 2500.0 | 12.0 | 105.9 |
| Ex. (49) | Com. (P1-73) | Com. (P2-28) | 5.7 | 22.4 | 2500.0 | 11.2 | 101.2 |

As can be seen from the data of Table 8, when the material of the organic light emitting diode of the present invention, represented by Formula 1, is used as a material of the hole transporting layer, the material of the organic light emitting diode of the present invention, represented by Formula 2, is used as a material of the phosphorescent host, the driving voltage could be reduced, and light emitting efficiency, and lifespan could be improved compared to the comparative example 1 to 5.

That is, the examples 1 to 49 using the compound represented by Formula 1 as a material of the hole transporting layer, and the compound represented by Formula 2 as a material of the phosphorescent host were found to be improved in luminous efficiency, light emitting efficiency, and lifespan, compared to that of the comparative examples 1 and 2 using the comparative compound A or B as a material of the hole transporting layer, and the comparative compound C as a material of the phosphorescent host, the comparative examples 3 and 4 using the comparative compound A or B as a material of the hole transporting layer, and the compound represented by Formula 2 as a material of the phosphorescent host, and the comparative example 5 using the compound represented by Formula 1 as a material of the hole transporting layer, and the comparative compound C as a material of the phosphorescent host.

The intensive compounds represented by Formula 1 have faster mobility and wider band gaps, compared to that of the comparative compounds A and B. The intensive compounds represented by Formula 2 have more stability of hole as well as electron and higher T1 values compared to that of the comparative compound C.

Accordingly, when the organic light emitting diode is produced by appropriately combining the compounds represented by Formula 1 and Formula 2, more holes are quick and easy access to the light emitting layer which causes charge balance in the light emitting layer and thus light emission not at the light emitting layer-hole transport layer interface but in the light emitting layer. Accordingly, degradation in the ITO-HTL interface is also reduced, and then the driving voltage could be reduced, and light emitting efficiency, and lifespan could be improved. That is, when appropriately combining the compounds represented by Formula 1 and Formula 2, the electrochemically synergy seems to improve the performance of the device.

[Example 50] Red Organic Light Emitting Diode

An ITO layer (anode) was formed on a glass substrate, and a film of 2-TNATA was vacuum-deposited on the ITO layer to form a hole injection layer with a thickness of 60 nm. Subsequently, a film of the compound 3-17 of the present invention was vacuum-deposited on the hole injection layer to form a hole transport layer with a thickness of 60 nm. Next, the inventive compound P1-53 was vacuum-deposited with a thickness of 60 nm on the hole transport layer to form an emission-auxiliary layer. Thereafter, a light emitting layer with a thickness of 30 nm was deposited on the emission-auxiliary layer by doping the emission-auxiliary layer with the compound P2-4 of the present invention as a host material and (piq)$_2$Ir(acac) as a dopant material in a weight ratio of 95:5. Next, a film of BAlq was vacuum-deposited with a thickness of 10 nm on the light emitting layer to form a hole blocking layer, and a film of Alq$_3$ was formed with a thickness of 40 nm to form an electron transport layer. Next, LiF as halogenated alkali metal was deposited with a thickness of 0.2 nm on the electron transport layer to form an electron injection layer, and then Al was deposited with a thickness of 150 nm on the electron injection layer to form a cathode. In this way, the OLED was completed.

[Example 51] to [Example 79] Red Organic Light Emitting Diode

The OLED was manufactured in the same manner as described in Example 50, except that compound 3-17 or any one of the compounds of the present invention in the Table 9 below was used as the material of the hole transport layer, compound P1-53 or any one of the compounds of the present invention in the Table 9 below was used as the material of the emission-auxiliary layer, and compound P2-4 or any one of the compounds of the present invention in the Table 9 below was used as the host material of the light emitting layer.

[Comparative Example 6] to [Comparative Example 15]

OLEDs were manufactured in the same manner as described in Example 50, except that any one of compounds in the Table 9 below was used as the material of the hole transport layer, the material of the Emission-Auxiliary layer, and the phosphorescent host material of the a light emitting layer.

A forward bias DC voltage was applied to each of the OLEDs manufactured through the Examples 50 to 79 and Comparative Example 6 to 15, and electro-luminescence (EL) characteristics of the OLED were measured by PR-650 (Photoresearch). Also, T95 life span was measured by life span measuring equipment (Mcscience) at a reference brightness of 2500 cd/m². Table 9 below shows evaluation results of OLEDs manufactured the Examples and Comparative Examples.

TABLE 9

| | hole transport layer Compound | emission-auxiliary layer Compound | Phosphorescent Host Compound | Voltage (V) | Current Density (mA/cm²) | Brightness (cd/m²) | Efficiency (cd/A) | Lifetime T(95) |
|---|---|---|---|---|---|---|---|---|
| comp. Ex. (6) | Com. (3-17) | Com. (3-17) | Com. (P2-28) | 6.8 | 24.3 | 2500.0 | 10.3 | 107.3 |
| comp. Ex. (7) | Com. (3-32) | comp. Com. B | Com. (P2-28) | 6.5 | 20.2 | 2500.0 | 12.4 | 106.4 |
| comp. Ex. (8) | Com. (3-61) | comp. Com. A | Com. (P2-28) | 6.7 | 22.2 | 2500.0 | 11.3 | 107.2 |
| comp. Ex. (9) | Com. (3-17) | comp. Com. A | Com. (P2-28) | 6.5 | 14.6 | 2500.0 | 17.1 | 111.8 |
| comp. Ex. (10) | Com. (3-32) | comp. Com. A | Com. (P2-28) | 6.5 | 14.7 | 2500.0 | 17.0 | 113.7 |
| comp. Ex. (11) | Com. (3-17) | comp. Com. B | Com. (P2-28) | 6.4 | 14.1 | 2500.0 | 17.8 | 118.2 |
| comp. Ex. (12) | Com. (3-61) | comp. Com. B | Com. (P2-28) | 6.5 | 13.4 | 2500.0 | 18.6 | 115.9 |
| comp. Ex. (13) | Com. (3-17) | Com. (P1-53) | comp. Com. C | 6.4 | 12.8 | 2500.0 | 19.6 | 119.2 |
| comp. Ex. (14) | Com. (3-32) | Com. (P1-53) | comp. Com. C | 6.3 | 13.0 | 2500.0 | 19.2 | 118.5 |
| comp. Ex. (15) | Com. (3-61) | Com. (P1-53) | comp. Com. C | 6.4 | 12.6 | 2500.0 | 19.9 | 118.0 |
| Ex. (50) | Com. (3-17) | Com. (P1-53) | Com. (P2-4) | 6.0 | 8.7 | 2500.0 | 28.8 | 124.5 |
| Ex. (51) | Com. (3-17) | Com. (P1-53) | Com. (P2-11) | 5.9 | 9.6 | 2500.0 | 26.0 | 120.0 |
| Ex. (52) | Com. (3-17) | Com. (P1-53) | Com. (P2-16) | 6.1 | 8.7 | 2500.0 | 28.7 | 124.5 |
| Ex. (53) | Com. (3-17) | Com. (P1-53) | Com. (P2-21) | 6.0 | 8.7 | 2500.0 | 28.6 | 123.9 |
| Ex. (54) | Com. (3-17) | Com. (P1-53) | Com. (P2-28) | 6.0 | 8.8 | 2500.0 | 28.5 | 120.4 |
| Ex. (55) | Com. (3-17) | Com. (P1-70) | Com. (P2-4) | 6.0 | 8.8 | 2500.0 | 28.5 | 122.4 |
| Ex. (56) | Com. (3-17) | Com. (P1-70) | Com. (P2-11) | 5.9 | 9.1 | 2500.0 | 27.5 | 123.5 |
| Ex. (57) | Com. (3-17) | Com. (P1-70) | Com. (P2-16) | 6.0 | 10.0 | 2500.0 | 25.0 | 120.1 |
| Ex. (58) | Com. (3-17) | Com. (P1-70) | Com. (P2-21) | 6.0 | 9.1 | 2500.0 | 27.5 | 121.3 |
| Ex. (59) | Com. (3-17) | Com. (P1-70) | Com. (P2-28) | 6.0 | 9.8 | 2500.0 | 25.6 | 124.0 |
| Ex. (60) | Com. (3-32) | Com. (P1-53) | Com. (P2-4) | 6.0 | 8.0 | 2500.0 | 31.1 | 128.5 |
| Ex. (61) | Com. (3-32) | Com. (P1-53) | Com. (P2-11) | 6.0 | 7.7 | 2500.0 | 32.5 | 125.9 |
| Ex. (62) | Com. (3-32) | Com. (P1-53) | Com. (P2-16) | 6.0 | 7.7 | 2500.0 | 32.5 | 127.7 |
| Ex. (63) | Com. (3-32) | Com. (P1-53) | Com. (P2-21) | 5.9 | 7.8 | 2500.0 | 32.2 | 127.5 |
| Ex. (64) | Com. (3-32) | Com. (P1-53) | Com. (P2-28) | 5.9 | 7.3 | 2500.0 | 36.8 | 128.5 |
| Ex. (65) | Com. (3-32) | Com. (P1-70) | Com. (P2-4) | 6.0 | 7.8 | 2500.0 | 32.1 | 125.4 |
| Ex. (66) | Com. (3-32) | Com. (P1-70) | Com. (P2-11) | 6.1 | 7.8 | 2500.0 | 32.2 | 127.6 |
| Ex. (67) | Com. (3-32) | Com. (P1-70) | Com. (P2-16) | 6.0 | 7.3 | 2500.0 | 34.3 | 126.0 |
| Ex. (68) | Com. (3-32) | Com. (P1-70) | Com. (P2-21) | 6.0 | 8.3 | 2500.0 | 30.1 | 129.7 |
| Ex. (69) | Com. (3-32) | Com. (P1-70) | Com. (P2-28) | 6.1 | 7.9 | 2500.0 | 31.7 | 135.7 |
| Ex. (70) | Com. (3-61) | Com. (P1-53) | Com. (P2-4) | 6.0 | 8.5 | 2500.0 | 29.3 | 121.3 |
| Ex. (71) | Com. (3-61) | Com. (P1-53) | Com. (P2-11) | 6.0 | 9.1 | 2500.0 | 27.4 | 120.5 |
| Ex. (72) | Com. (3-61) | Com. (P1-53) | Com. (P2-16) | 6.0 | 9.6 | 2500.0 | 26.0 | 122.1 |
| Ex. (73) | Com. (3-61) | Com. (P1-53) | Com. (P2-21) | 6.0 | 9.3 | 2500.0 | 26.8 | 121.8 |
| Ex. (74) | Com. (3-61) | Com. (P1-53) | Com. (P2-28) | 5.9 | 9.2 | 2500.0 | 27.2 | 125.0 |
| Ex. (75) | Com. (3-61) | Com. (P1-70) | Com. (P2-4) | 6.0 | 8.3 | 2500.0 | 29.9 | 124.6 |
| Ex. (76) | Com. (3-61) | Com. (P1-70) | Com. (P2-11) | 6.1 | 8.8 | 2500.0 | 28.5 | 124.9 |
| Ex. (77) | Com. (3-61) | Com. (P1-70) | Com. (P2-16) | 6.0 | 9.4 | 2500.0 | 26.5 | 121.8 |
| Ex. (78) | Com. (3-61) | Com. (P1-70) | Com. (P2-21) | 6.0 | 8.3 | 2500.0 | 29.9 | 120.4 |
| Ex. (79) | Com. (3-61) | Com. (P1-70) | Com. (P2-28) | 5.9 | 8.8 | 2500.0 | 28.4 | 120.6 |

As can be seen from the data of Table 9, when the compounds of the present invention, represented by Formula 7, is used as a material of the hole transporting layer, the compounds of the present invention, represented by Formula 1, is used as a material of the emission-auxiliary layer, and the compounds of the present invention, represented by Formula 2, is used as a material of the phosphorescent host, the driving voltage could be reduced, and light emitting efficiency, and lifespan could be improved compared to that of the comparative example not using the emission-auxiliary layer (In the comparative example 6 of Table 9, this is merely for comparison with the same thickness of the element. Actually he material of the hole transport layer is further laminated by the thickness of the emission-auxiliary layer not forming the emission-auxiliary layer separately.), the comparative examples 7 to 12 using the comparative compound A or B as a material of the emission-auxiliary layer, and the comparative examples 13 to 15 using the comparative compound C as a material of the phosphorescent host.

When the compounds of the present invention, represented by Formula 1, is used as a material of the emission-auxiliary layer alone, the compounds have higher T1 energy levels and deeper HOMO energy levels which causes charge balance and thus light emission not at the light emitting layer-hole transport layer interface but in the light emitting layer, and light emitting efficiency can be maximized. In addition, by using the compound represented by Formula 2 as a material of the phosphorescent host, appropriately combining the materials of the the emission-auxiliary layer and the phosphorescent host makes the performance of the device to improve by the electrochemically synergy. This can be seen from the comparative examples 13 to 15.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

The invention claimed is:
1. An organic electric element, comprising:
a first electrode,
a second electrode, and
an organic material layer formed between the first electrode and the second electrode, the organic material layer comprising a light emitting layer, an emission-auxiliary layer formed between the first electrode and the light emitting layer, and a hole transport layer formed between the first electrode and the emission-auxiliary layer, at least one layer of the emission-auxiliary layer and the hole transport layer comprising a compound represented by Formula 1 below, singly or as a mixture of two or more, and the light emitting layer comprising a compound, represented by Formula 2 below, singly or as a mixture of two or more:

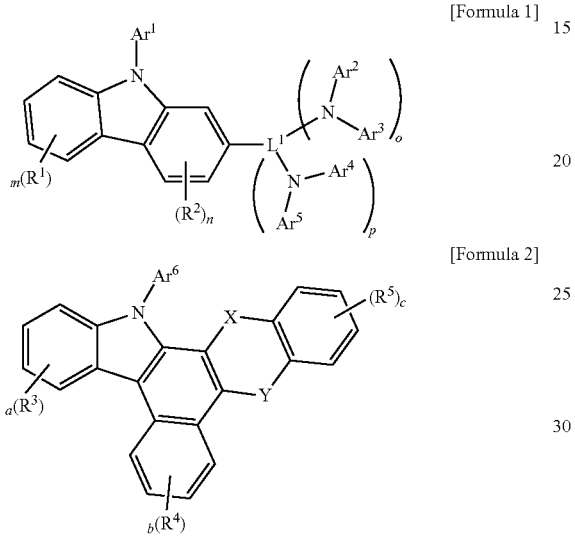

wherein, $Ar^1$ to $Ar^6$ are independently selected from the group consisting of a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N($R^a$)($R^b$), o and p are each an integer of 0 or 1, with the proviso that at least one of o and p is 1, $R^1$ to $R^5$ are independently selected from the group consisting of hydrogen, deuterium, halogen, a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N($R^a$)($R^b$), and any two adjacent groups of $R^1$s to $R^5$s are optionally linked together to form a fused ring, a, b, c, and m are each an integer from 1 to 4, and n is an integer from 1 to 3, L' is selected from the group consisting of a single bond, a $C_6$-$C_{60}$ arylene group, a fluorenylene group, a bivalent fused ring group of a $C_3$-$C_{60}$ aliphatic ring and a $C_6$-$C_{60}$ aromatic ring, and a bivalent $C_2$-$C_{60}$ heterocyclic group containing at least one heteroatom selected from the group consisting of O, N, S, Si, and P, $R^a$ and $R^b$ are independently selected from the group consisting of a $C_6$-$C_{60}$ aryl group, a fluorenyl group, a fused ring group of a $C_3$-$C_{60}$ aliphatic ring and a $C_6$-$C_{60}$ aromatic ring, and a $C_2$-$C_{60}$ heterocyclic group containing at least one heteroatom selected from the group consisting of O, N, S, Si, and P, $L^1$ is selected from the group consisting of a bivalent or trivalent $C_6$-$C_{60}$ aromatic hydrocarbon group, a bivalent or trivalent $C_2$-$C_{60}$ aliphatic hydrocarbon group, a bivalent or trivalent fluorene group, and a bivalent or trivalent $C_2$-$C_{60}$ heterocyclic group containing at least one heteroatom selected from the group consisting of O, N, S, Si, and P, X and Y are independently selected from the group consisting of a single bond, S, O, N(R'), and C(R')(R"), with the proviso that X and Y are not a single bond at the same time, here, R' and R" are independently selected from the group consisting of hydrogen, a $C_6$-$C_{60}$ aryl group, a fluorenyl group, a $C_2$-$C_{60}$ heterocyclic group containing at least one heteroatom selected from the group consisting of O, N, S, Si, and P, and a $C_1$-$C_{50}$ alkyl group, and, with the provisos that the aryl group, fluorenyl group, fused ring group, heterocyclic group, alkyl group, alkenyl group, alkynyl group, alkoxy group, aryloxy group, arylene group, fluorenylene group, aromatic hydrocarbon group, aliphatic hydrocarbon group and fluorene group may be substituted by one or more substituents selected from the group consisting of deuterium, halogen, a silane group, a siloxane group, a boron group, a germanium group, a cyano group, a nitro group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted by deuterium, a fluorenyl group, a $C_2$-$C_{20}$ heterocyclic group containing at least one heteroatom selected from the group consisting of O, N, S, Si, and P, a $C_3$-$C_{20}$ cycloalkyl group, a $C_7$-$C_{20}$ arylalkyl group, a $C_8$-$C_{20}$ arylalkenyl group, an arylamine group and a heteroarylamine group.

2. The organic electric element as claimed in claim 1, wherein Formula 1 comprising Formula 3 or Formula 4 below:

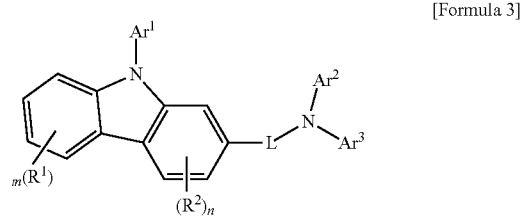

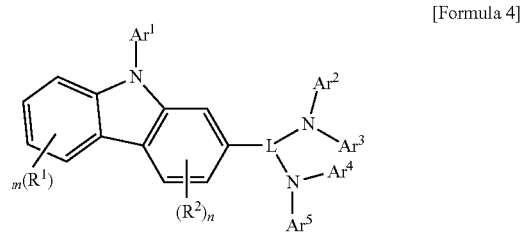

wherein, $Ar^1$ to $Ar^5$, L, $R^1$, $R^2$, m and n are defined as in claim 1.

3. The organic electric element as claimed in claim 1, wherein at least one of $Ar^2$ to $Ar^5$ is a $C_2$-$C_{60}$ heterocyclic group.

4. The organic electric element as claimed in claim 1, wherein Formula 2 comprising Formula 5 or Formula 6 below:

[Formula 5]

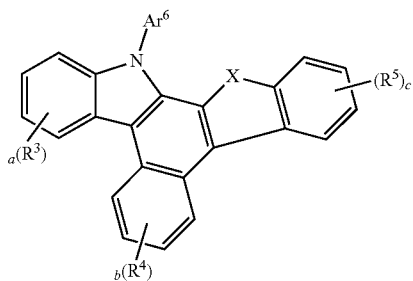

[Formula 6]

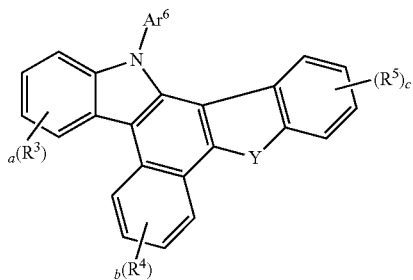

wherein, $Ar^6$, X, Y $R^3$ to $R^5$, a, b, and c are defined as in claim 1.

5. The organic electric element as claimed in claim 1, wherein Formula 1 comprising any one of compounds below:

P1-1

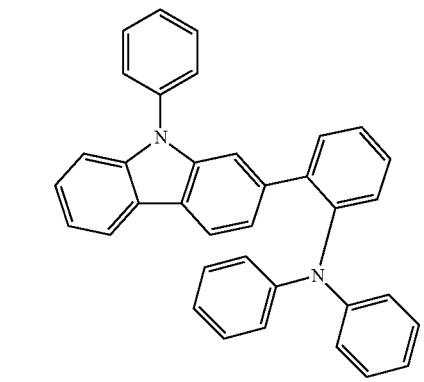

-continued

P1-2

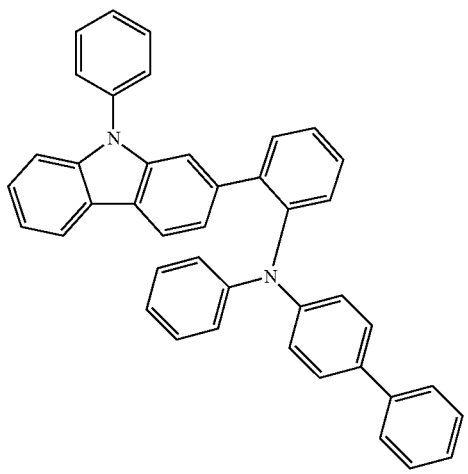

P1-3

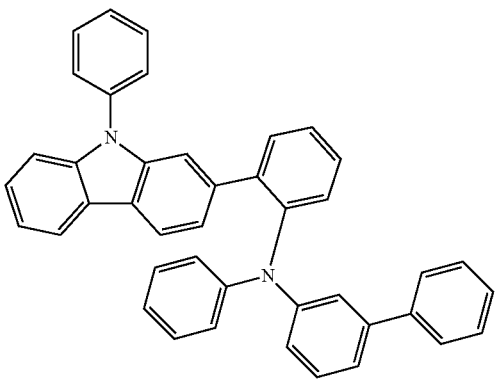

P1-4

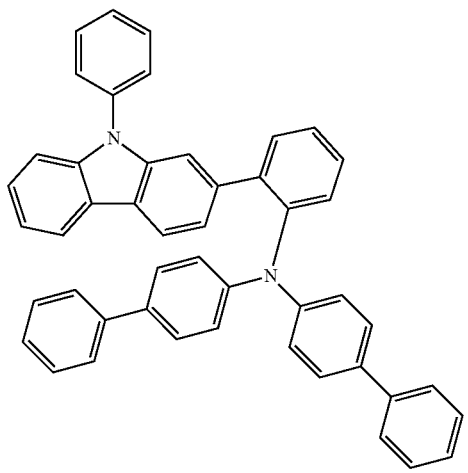

-continued
P1-5
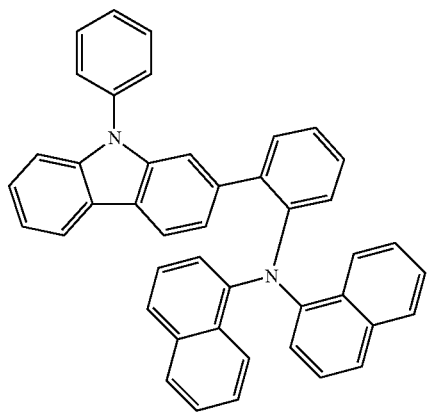
P1-6
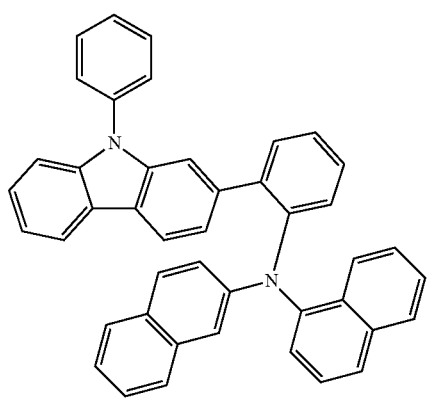
P1-7
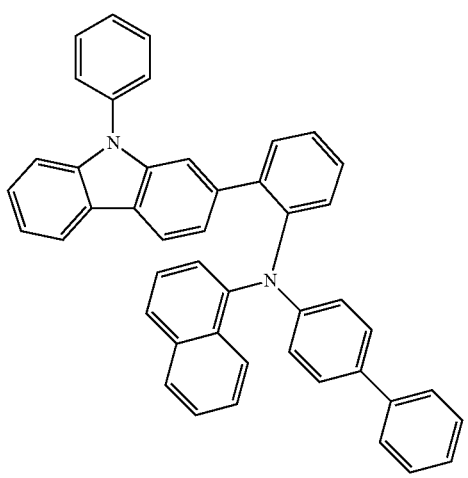
-continued
P1-8
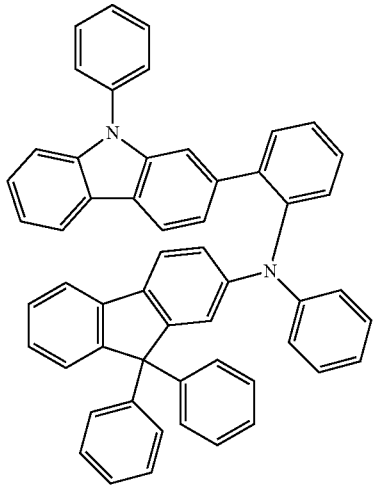
P1-9
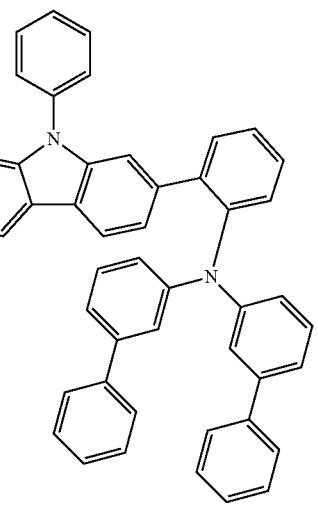
P1-10
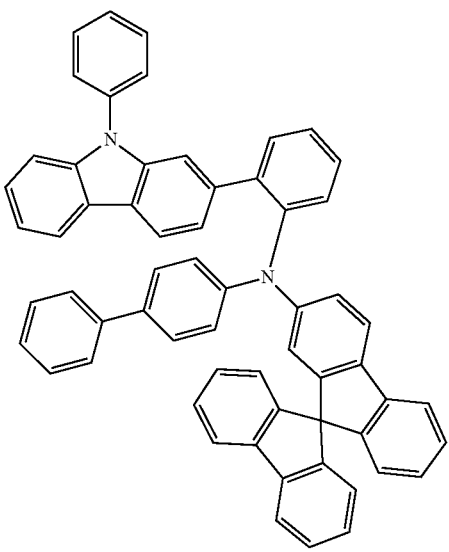

-continued
P1-11
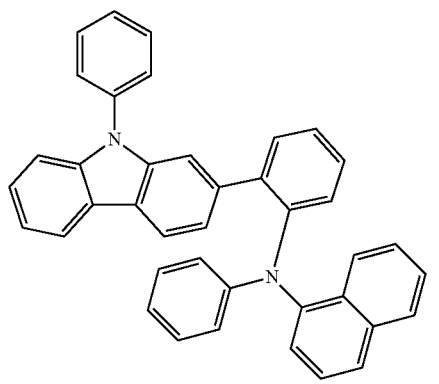
P1-12
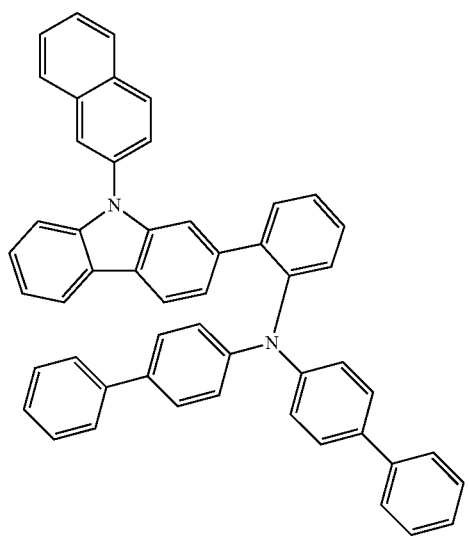
P1-13
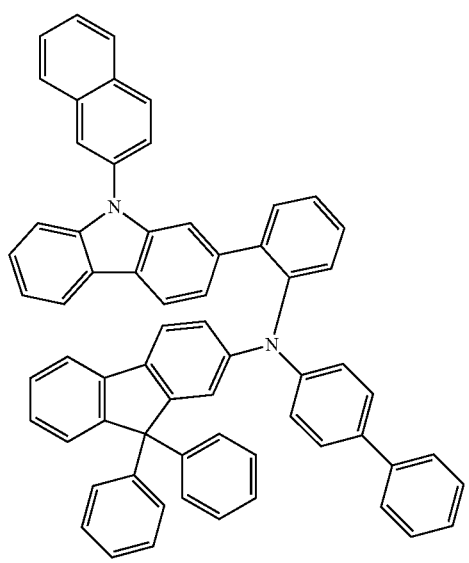
-continued
P1-14
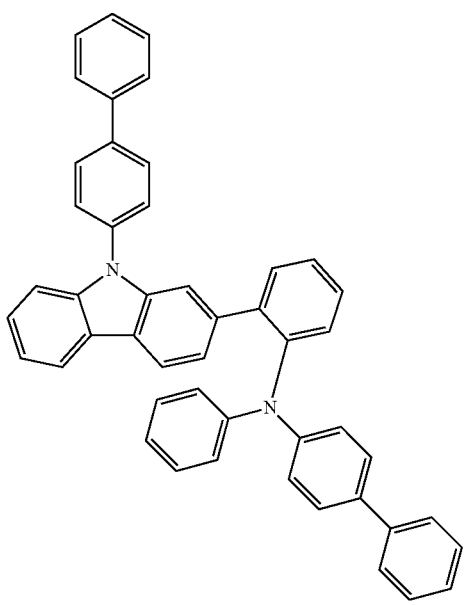
P1-15
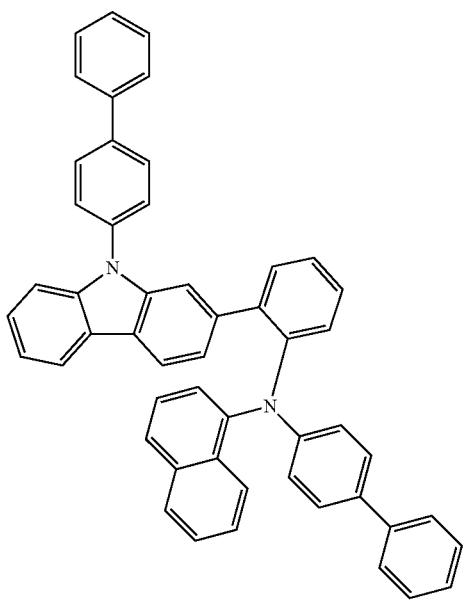

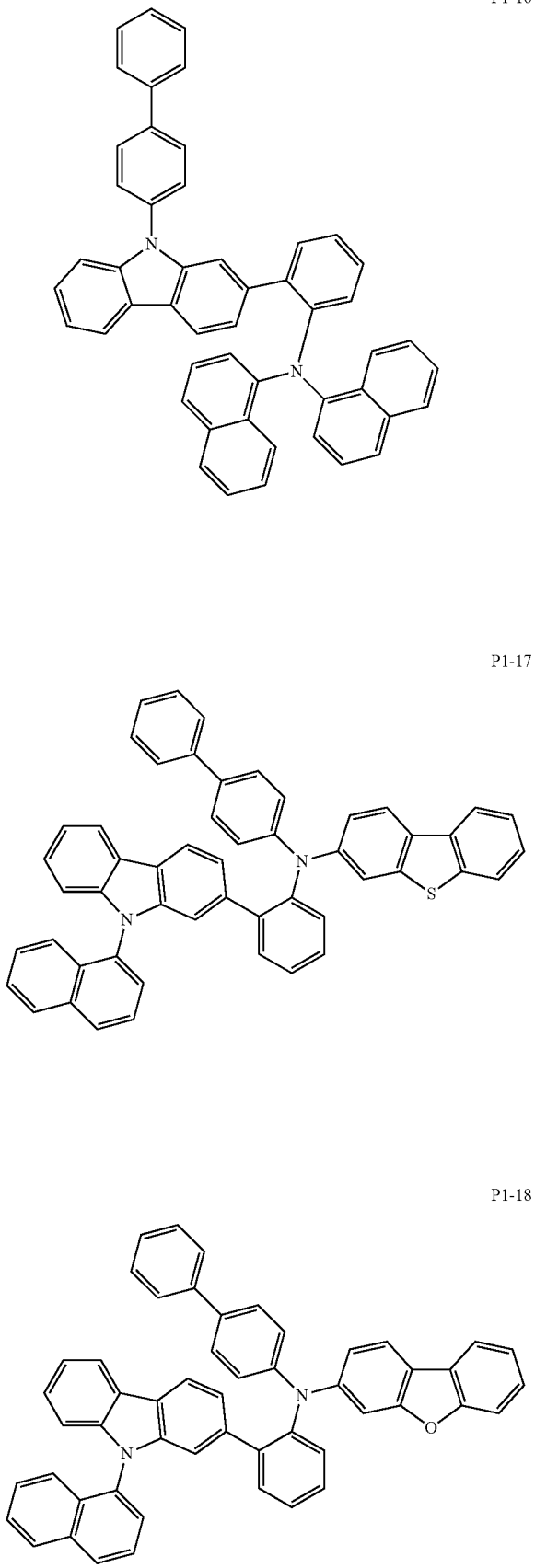
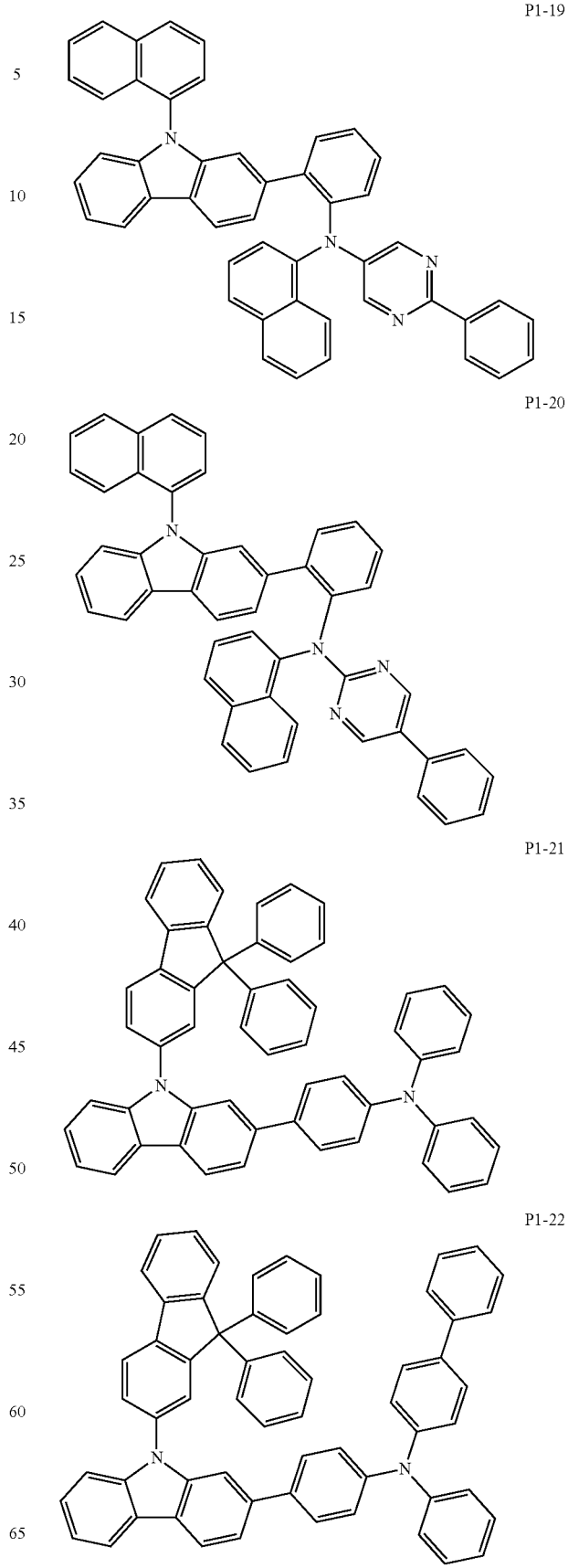

P1-23
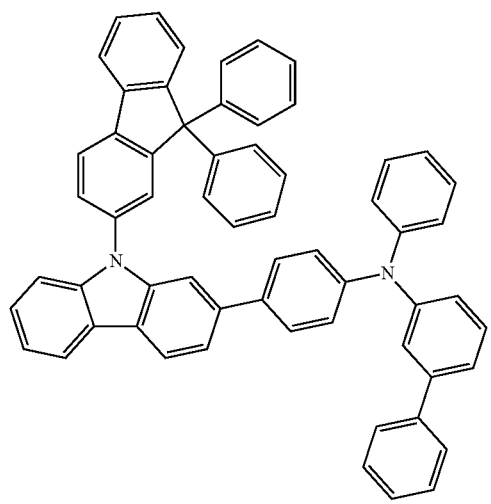
P1-24
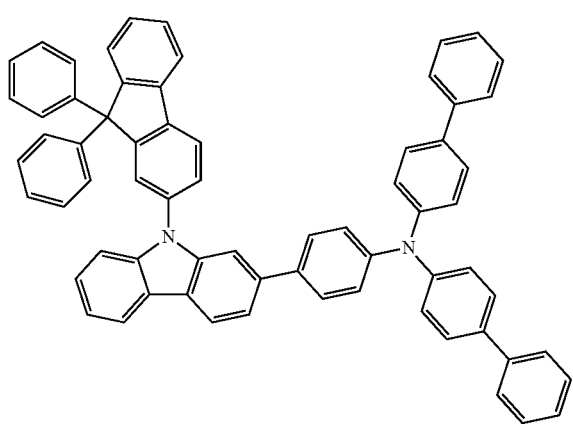
P1-25
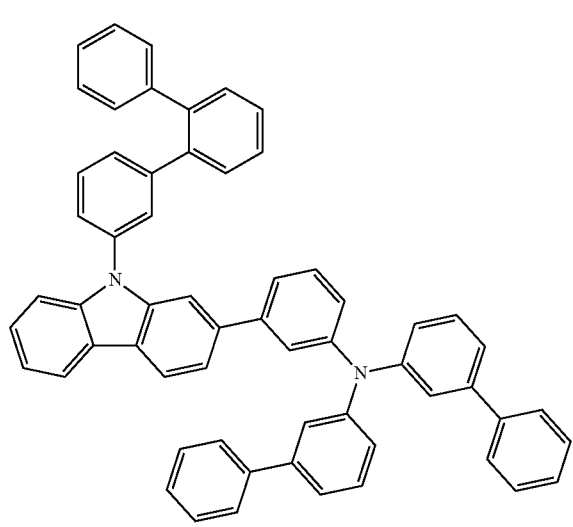
P1-26
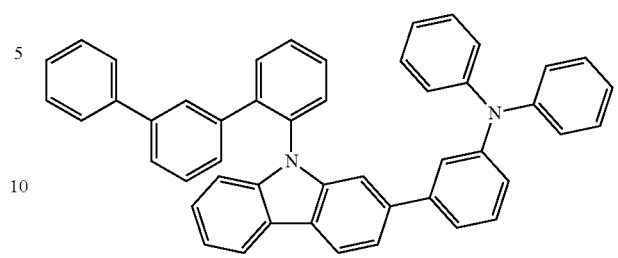
P1-27
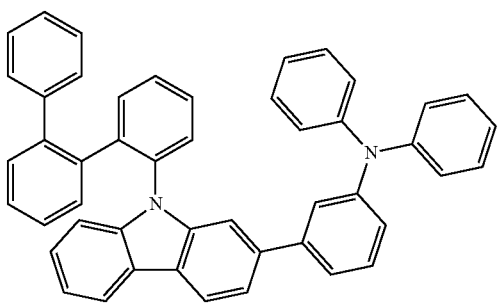
P1-28
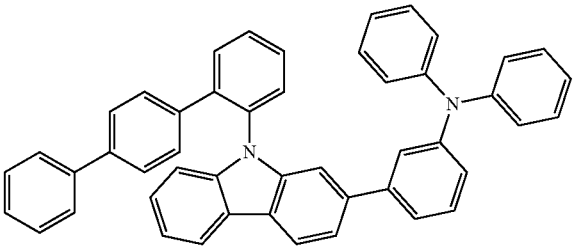
P1-29
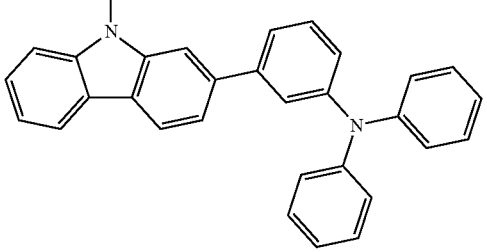

P1-30
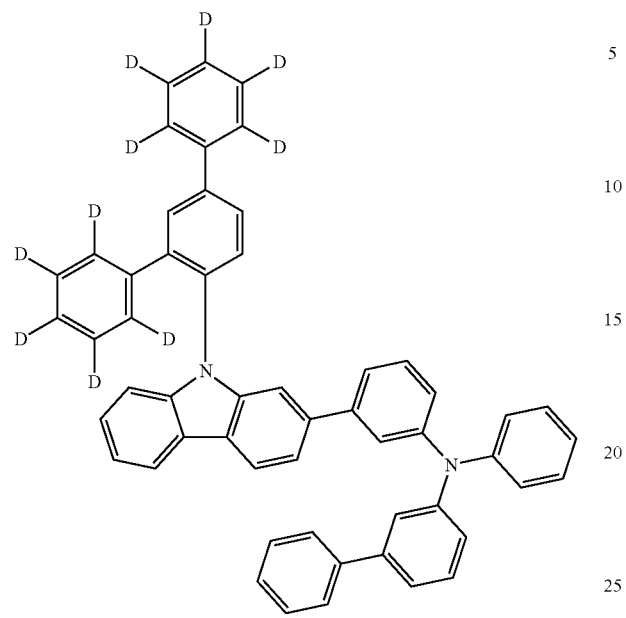
P1-31
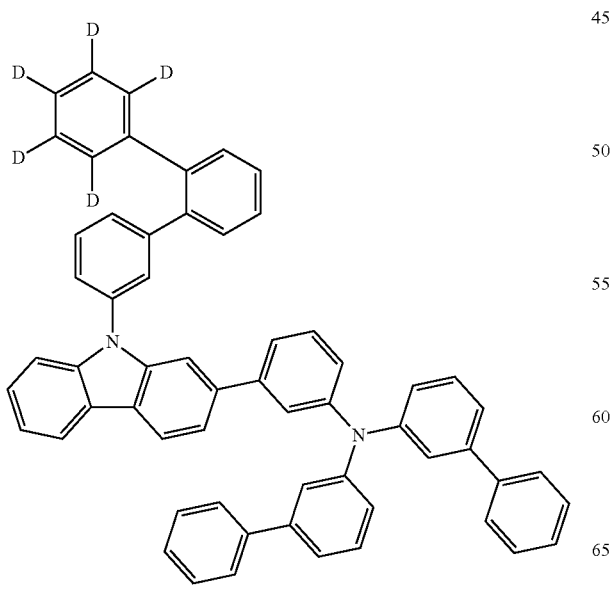
P1-32
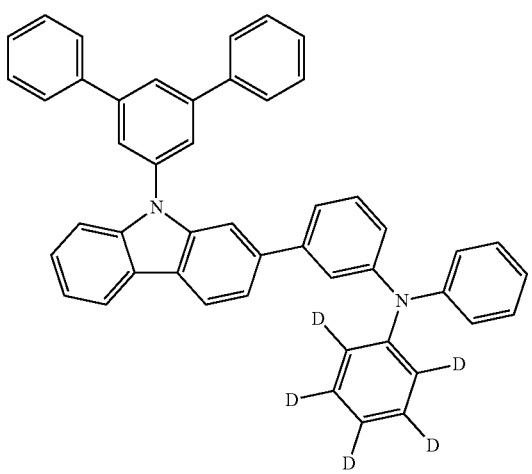
P1-33
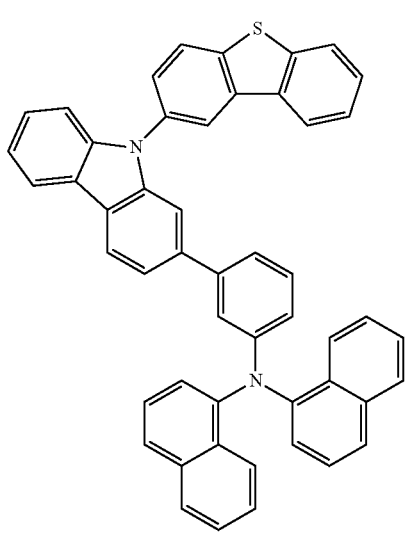
P1-34
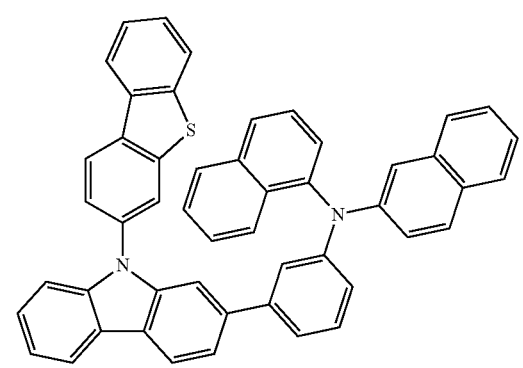

-continued
P1-35
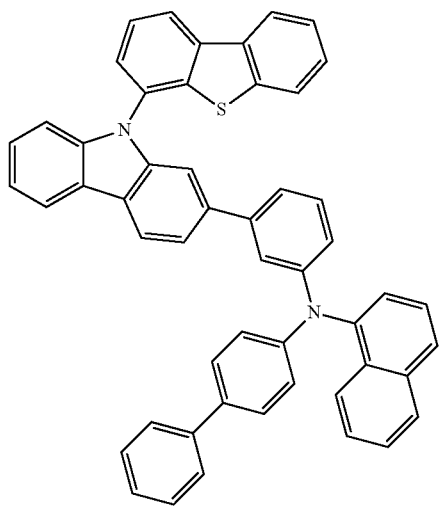
P1-36
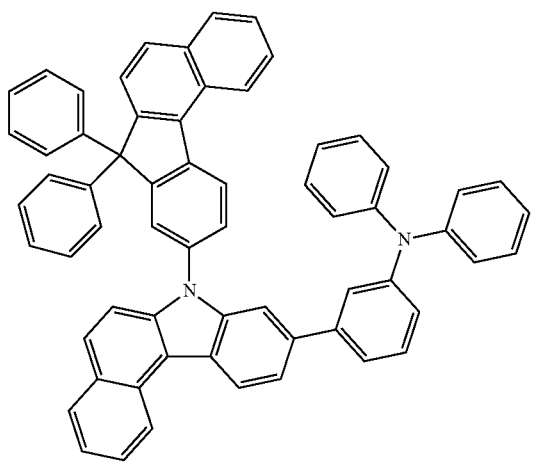
P1-37
P1-38
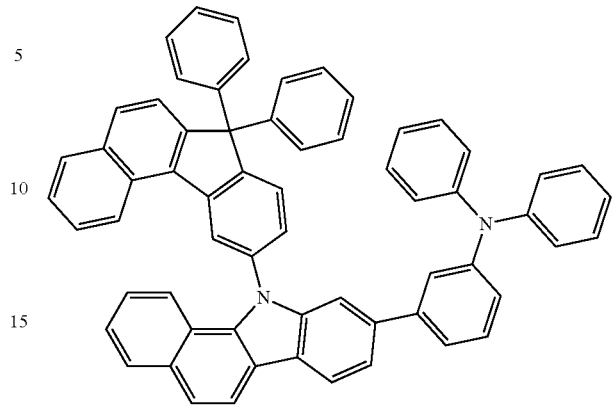
P1-39
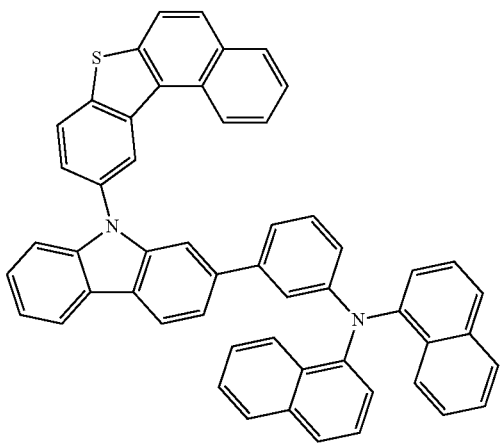
P1-40
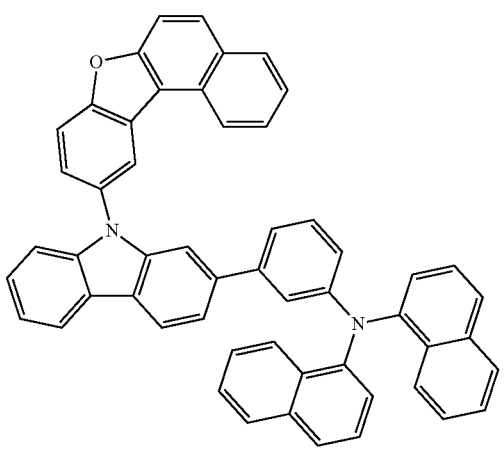

P1-41
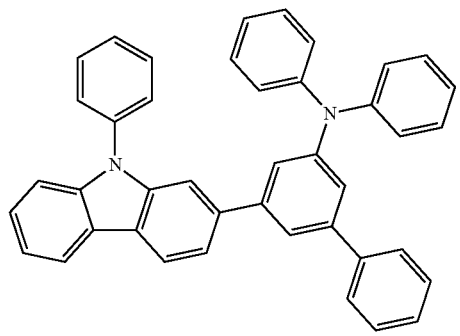
P1-42
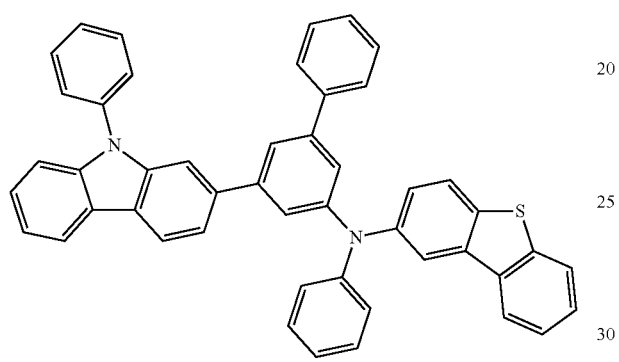
P1-43
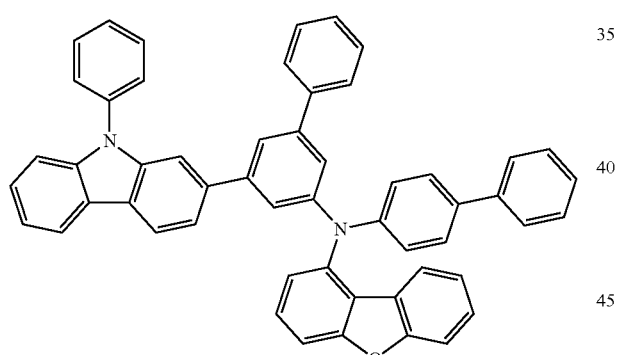
P1-44
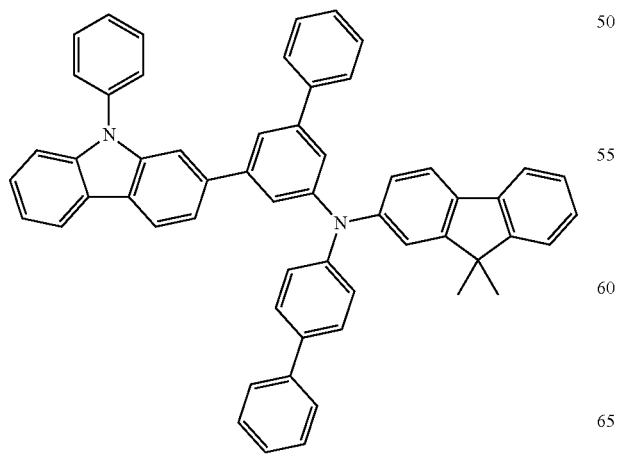
P1-45
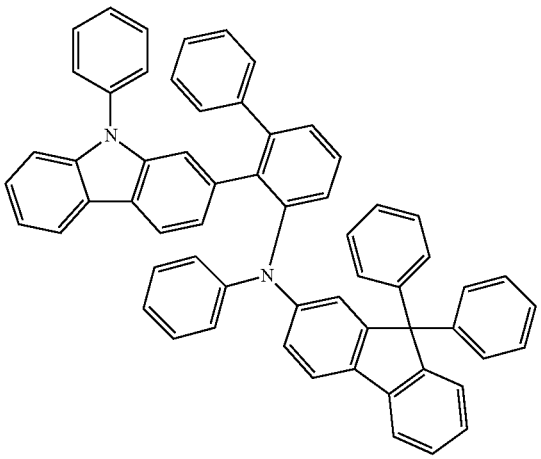
P1-46
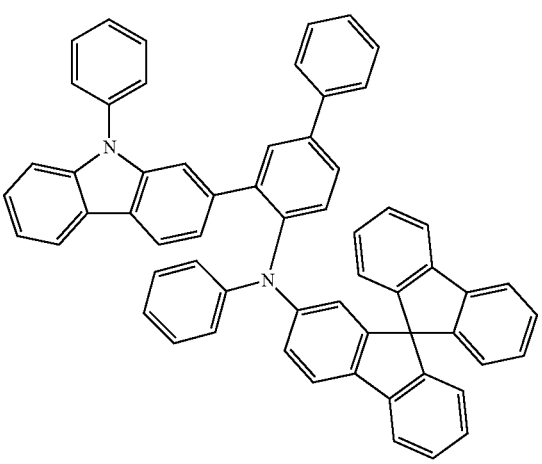
P1-47
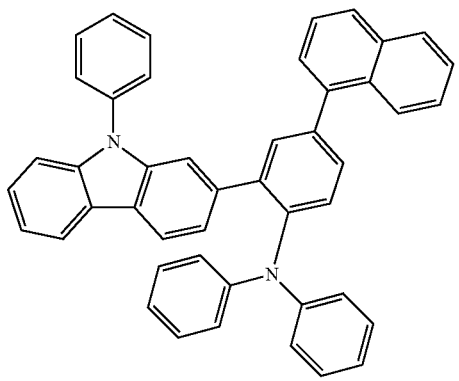

P1-48
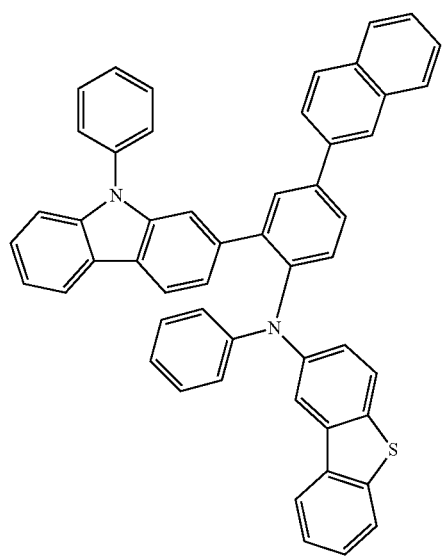
P1-51
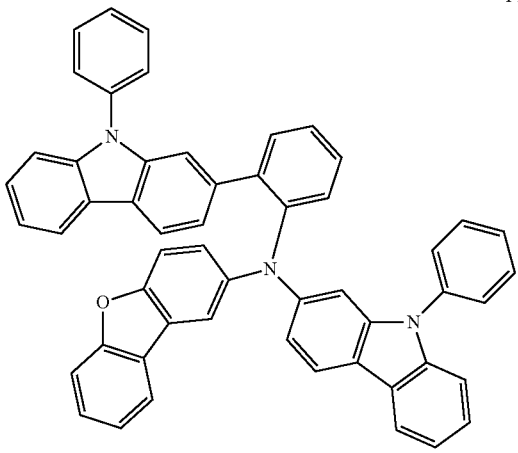
P1-49
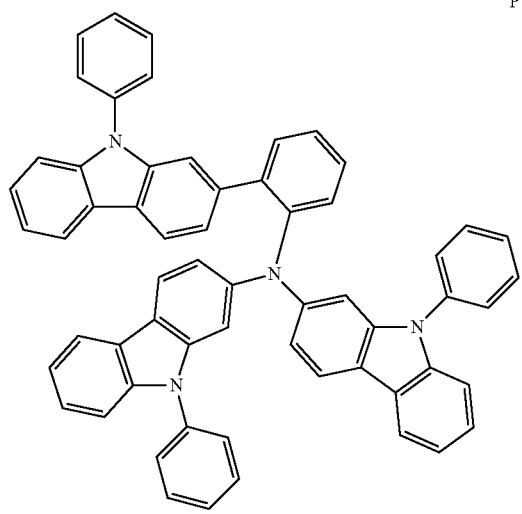
P1-52
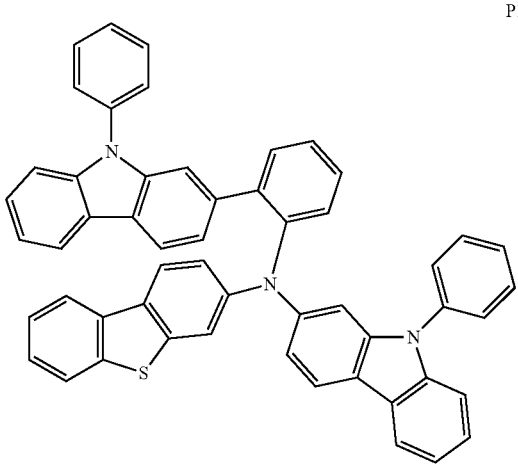
P1-50
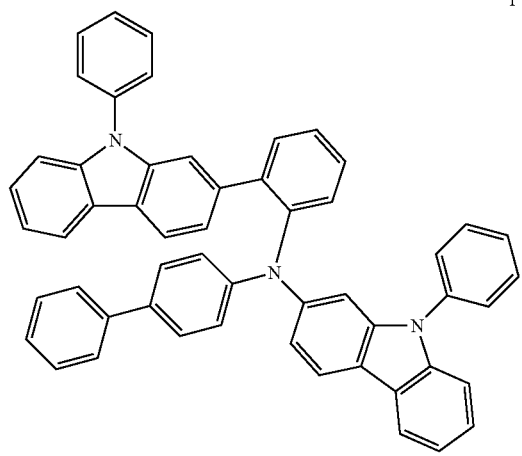
P1-53
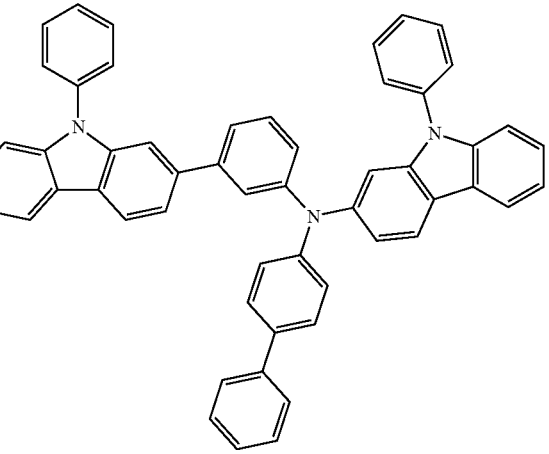

P1-54
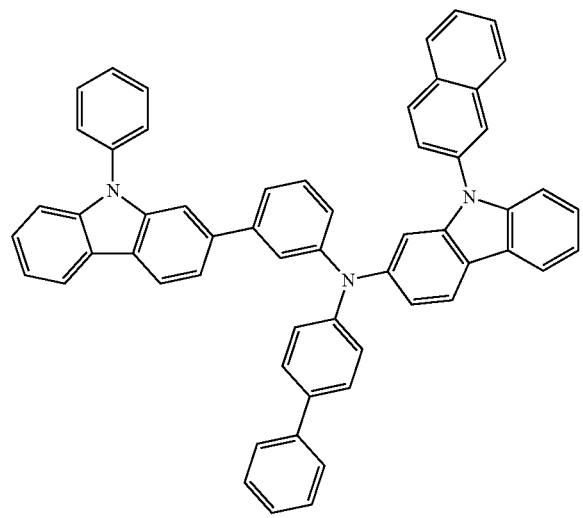
P1-55
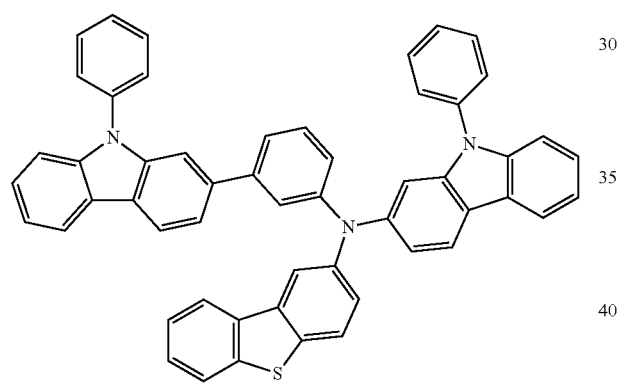
P1-56
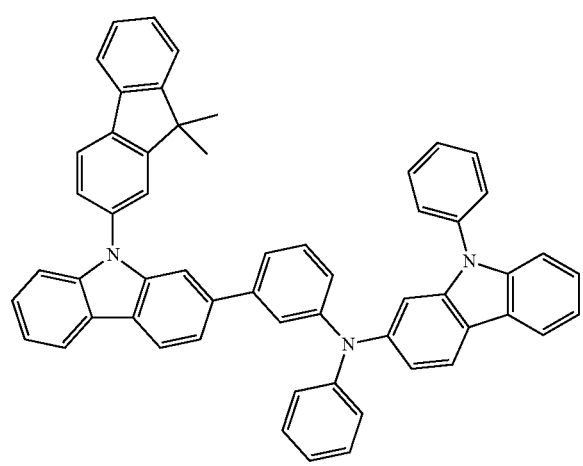
P1-57
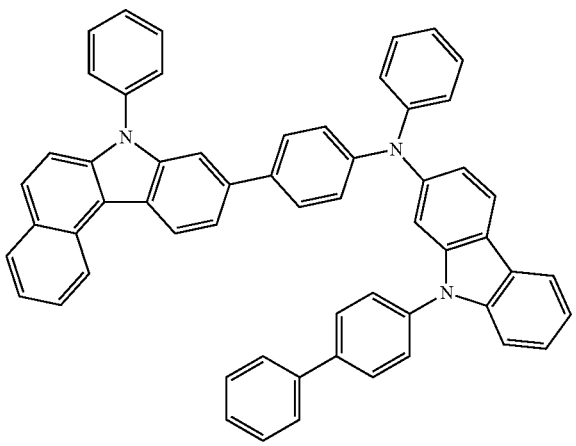
P1-58
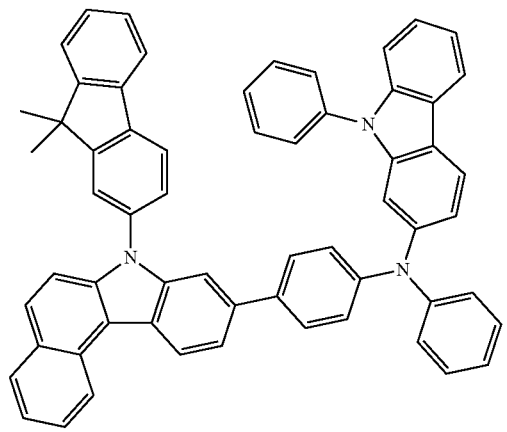
P1-59
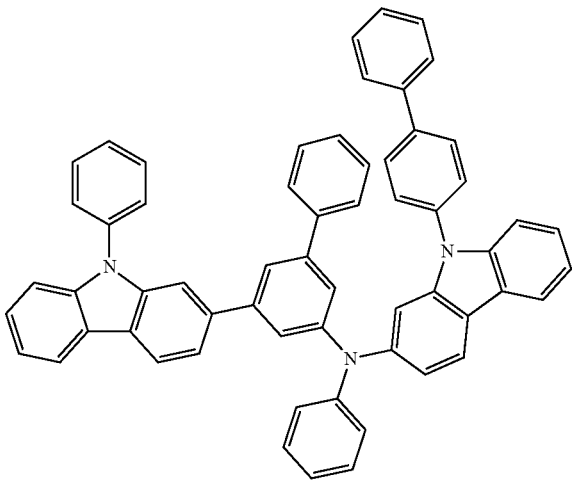

P1-60
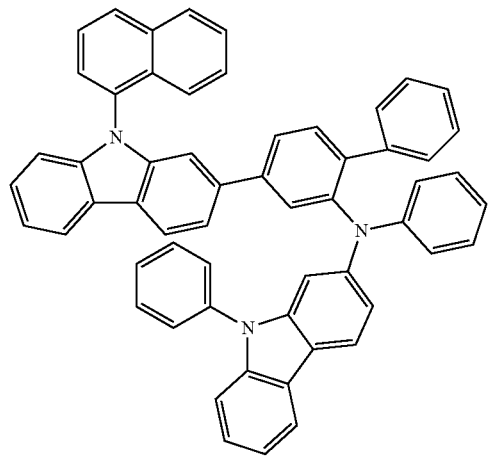
P1-61
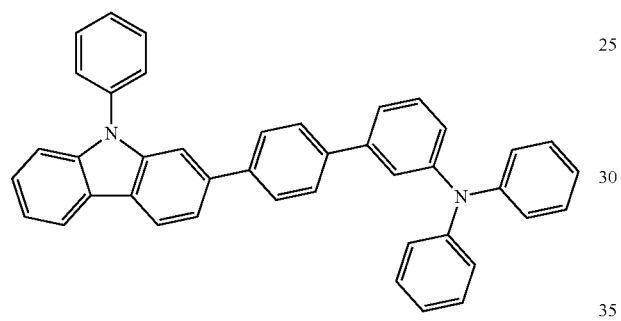
P1-62
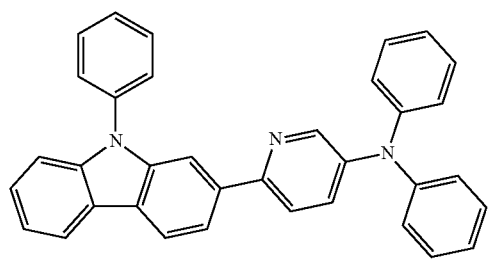
P1-63
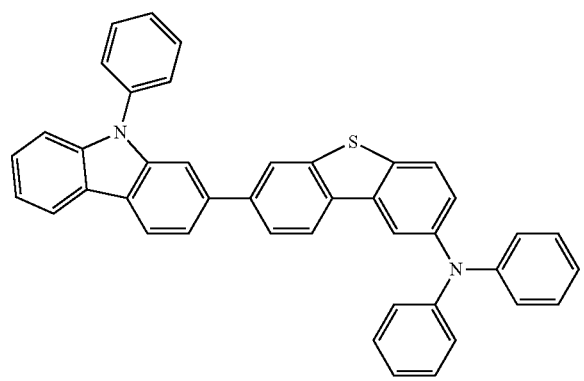
P1-64
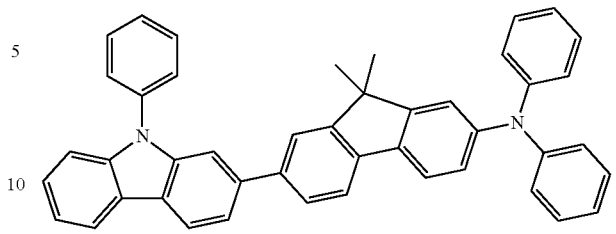
P1-65
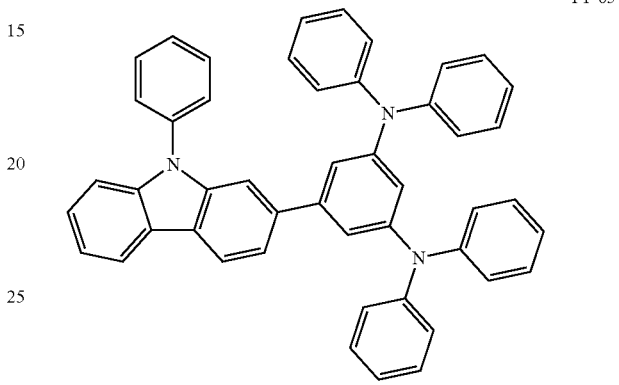
P1-66
P1-67
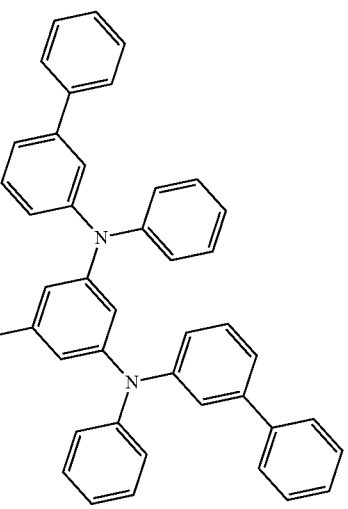

P1-68
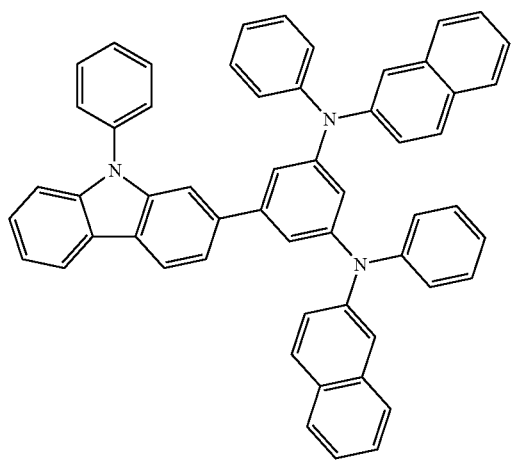
P1-71
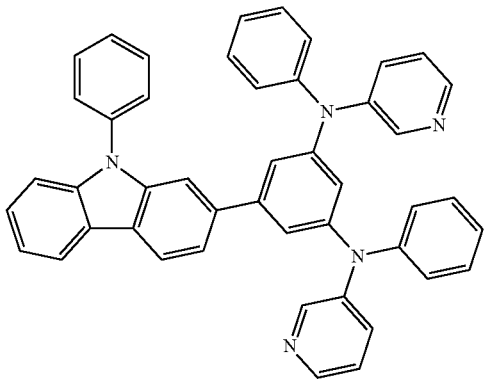
P1-69
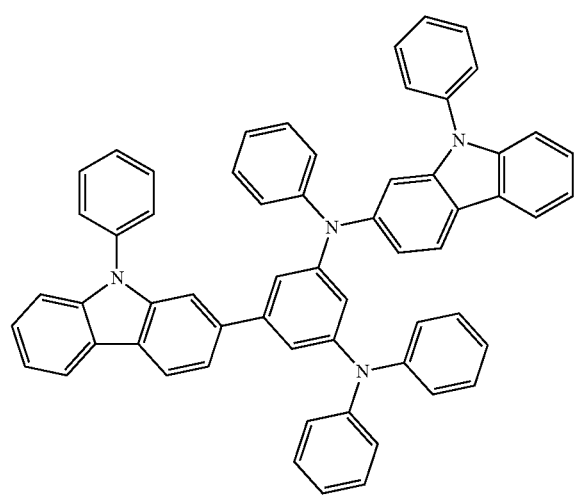
P1-72
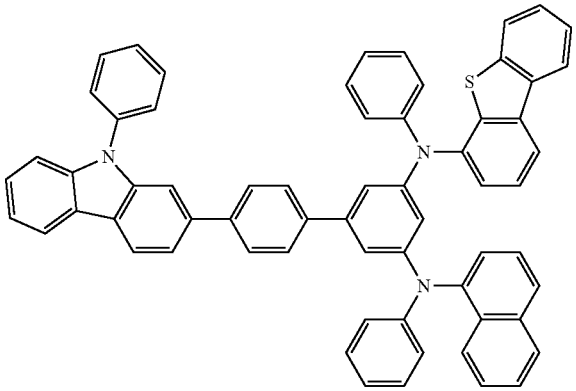
P1-70
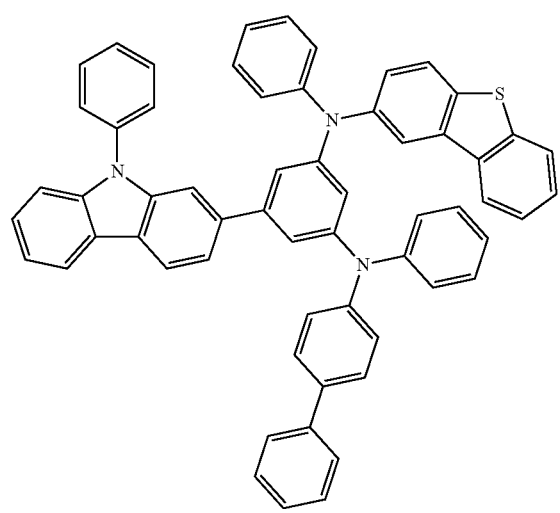
P1-73
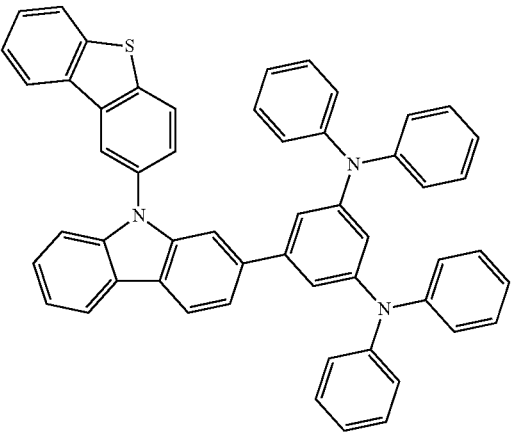

P1-74
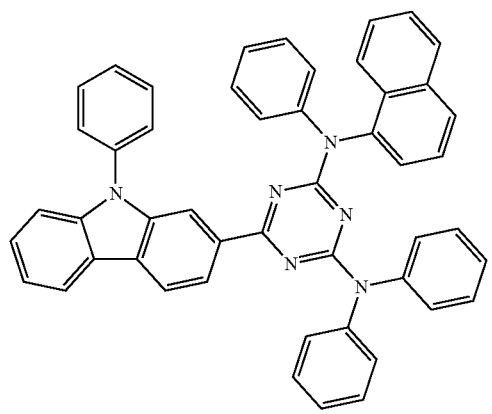
P1-75
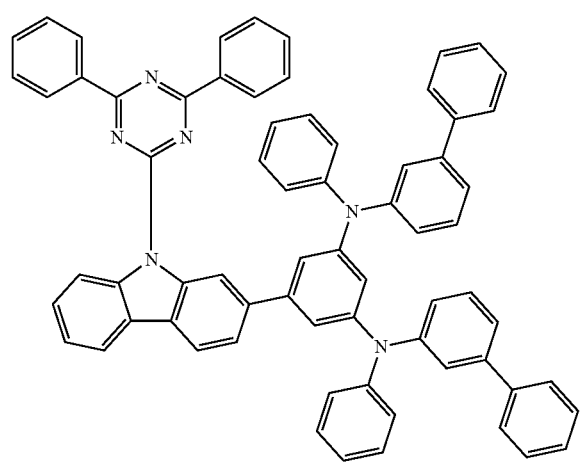
P1-76
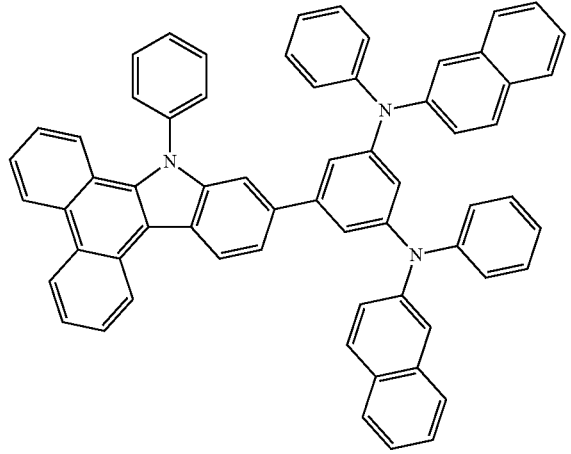
P1-77
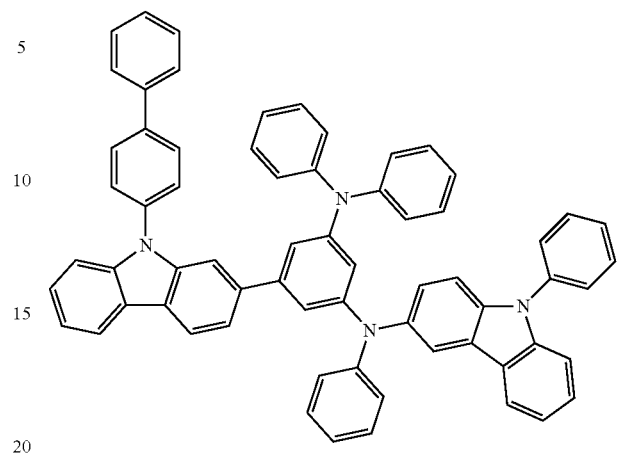
P1-78
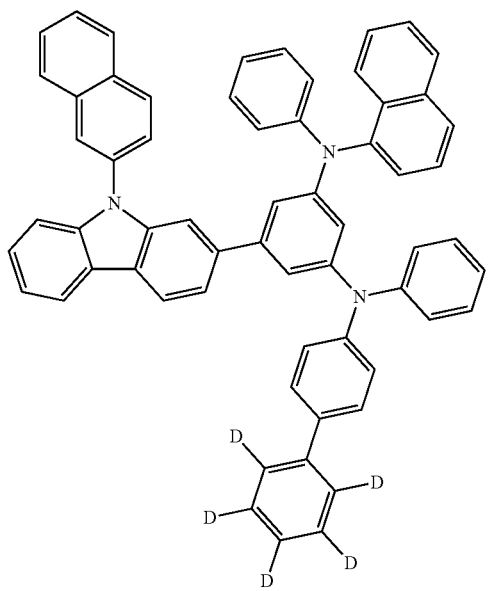
P1-79
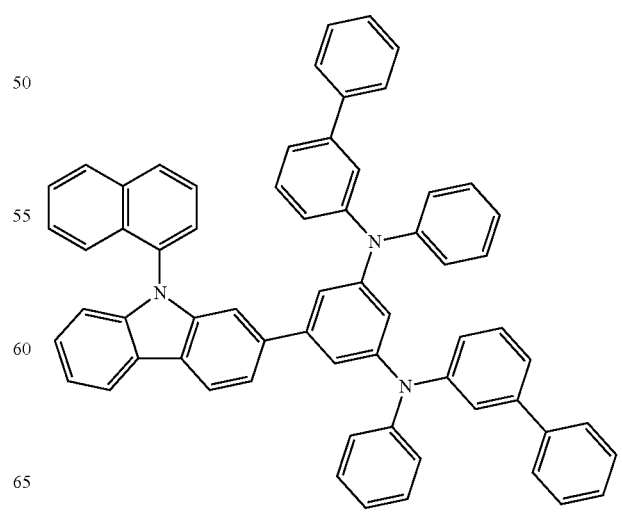

P1-80
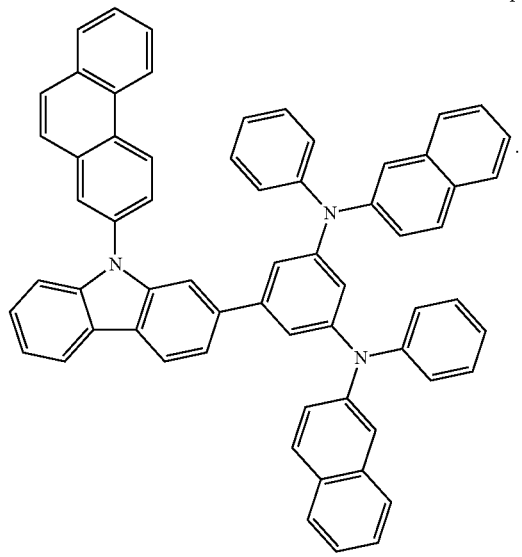
6. The organic electric element as claimed in claim 1, wherein Formula 2 comprising any one of compounds below:
P2-1
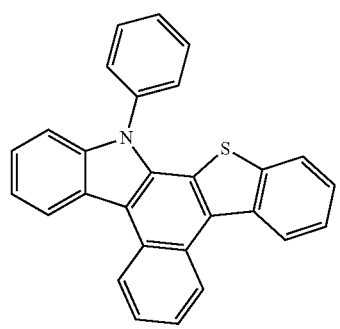
P2-2
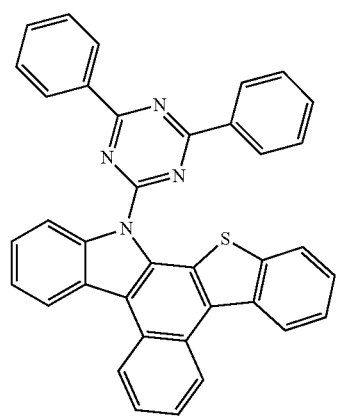
P2-3
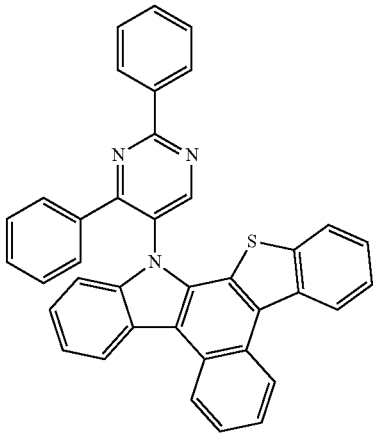
P2-4
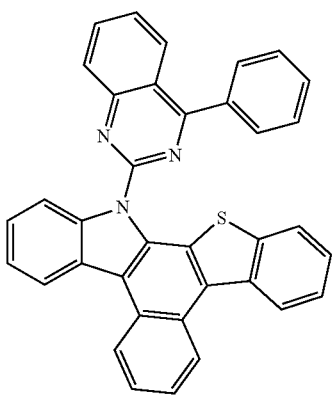
P2-5
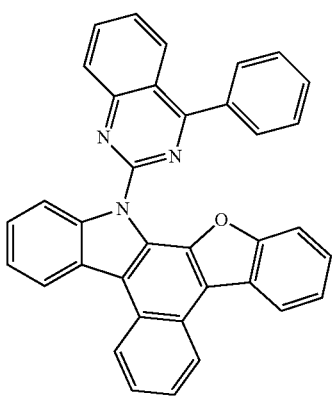

-continued
P2-6
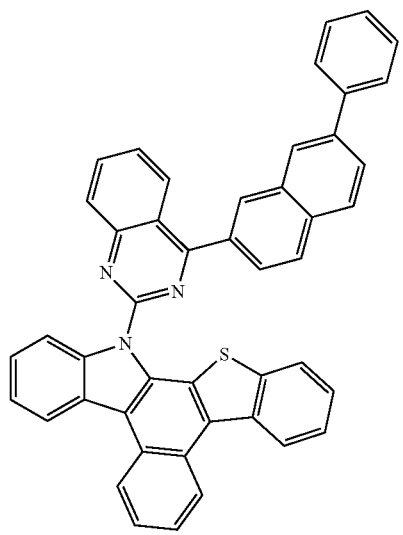
P2-7
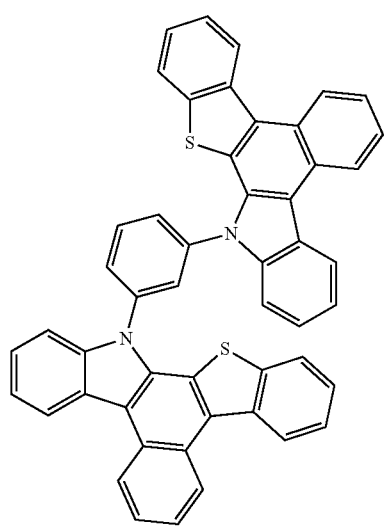
P2-8
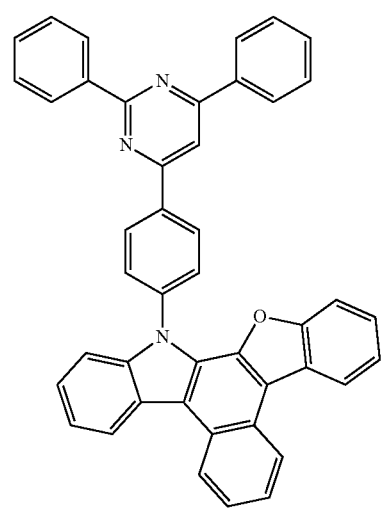
-continued
P2-9
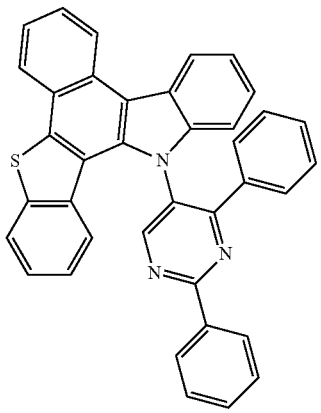
P2-10
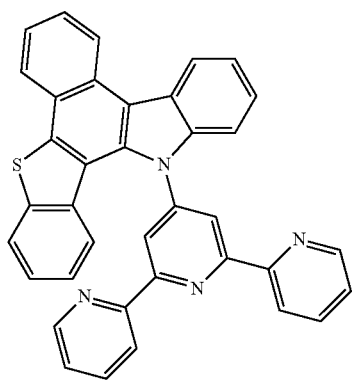
P2-11
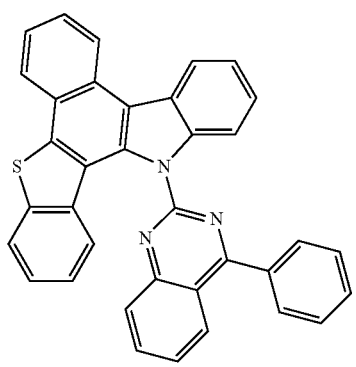
P2-12
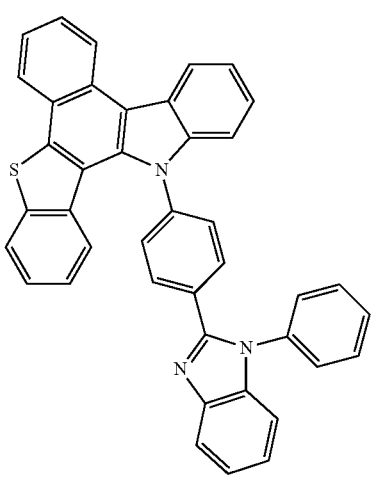

P2-13
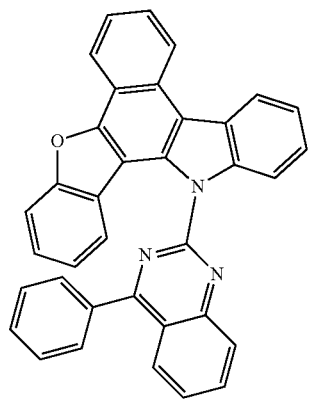
P2-14
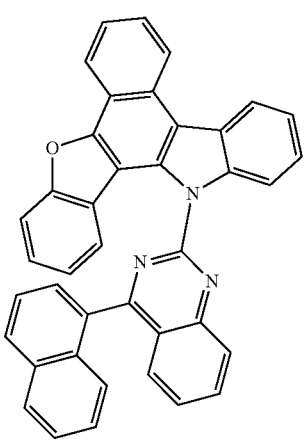
P2-15
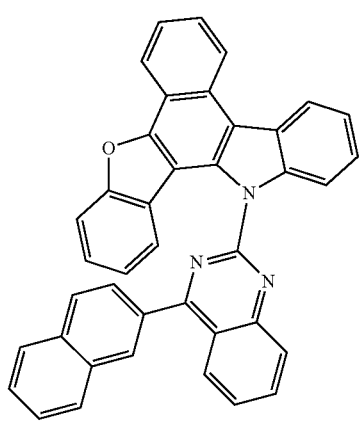
P2-16
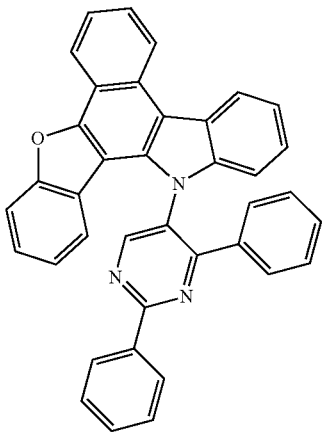
P2-17
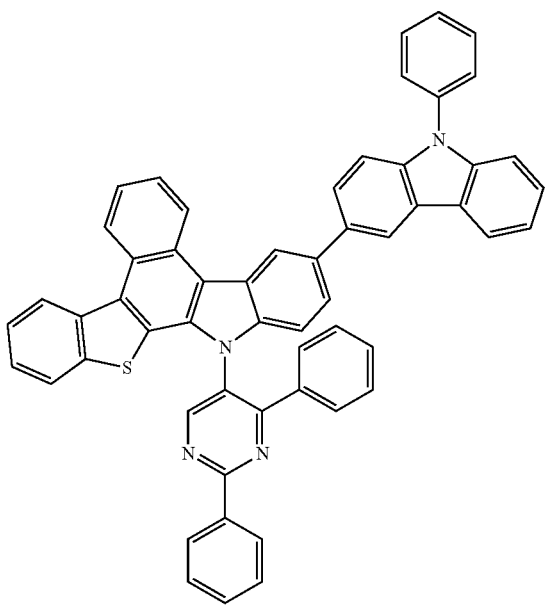
P2-18
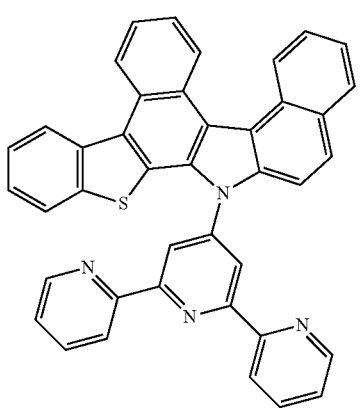

-continued
P2-19
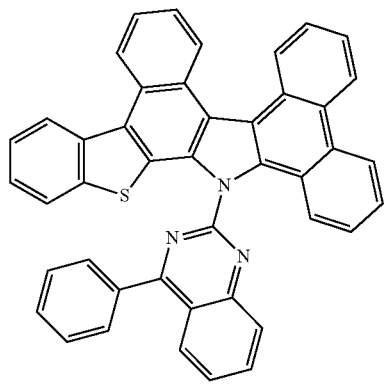
P2-20
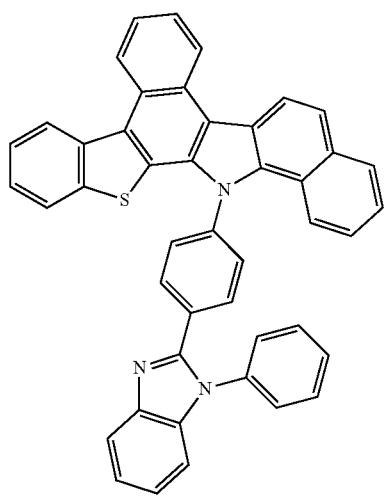
P2-21
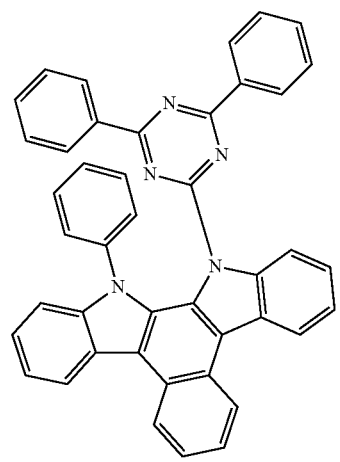
-continued
P2-22
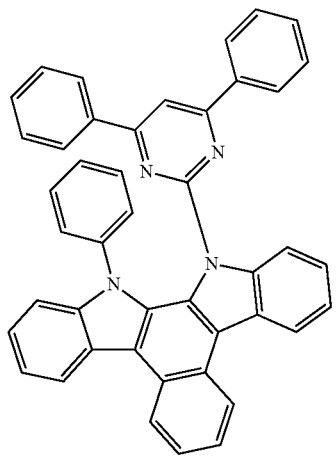
P2-23
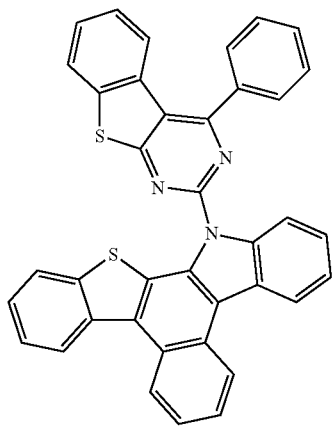
P2-24
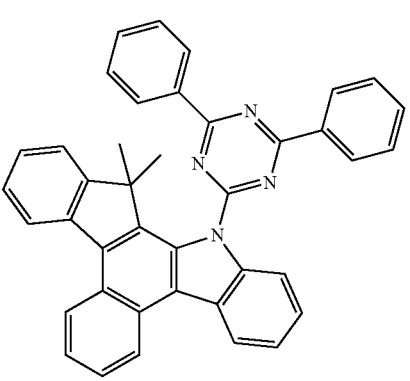
P2-25
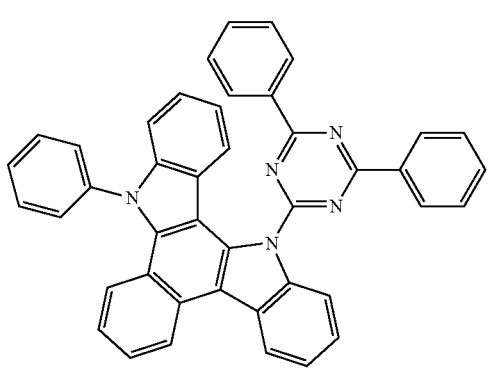

-continued

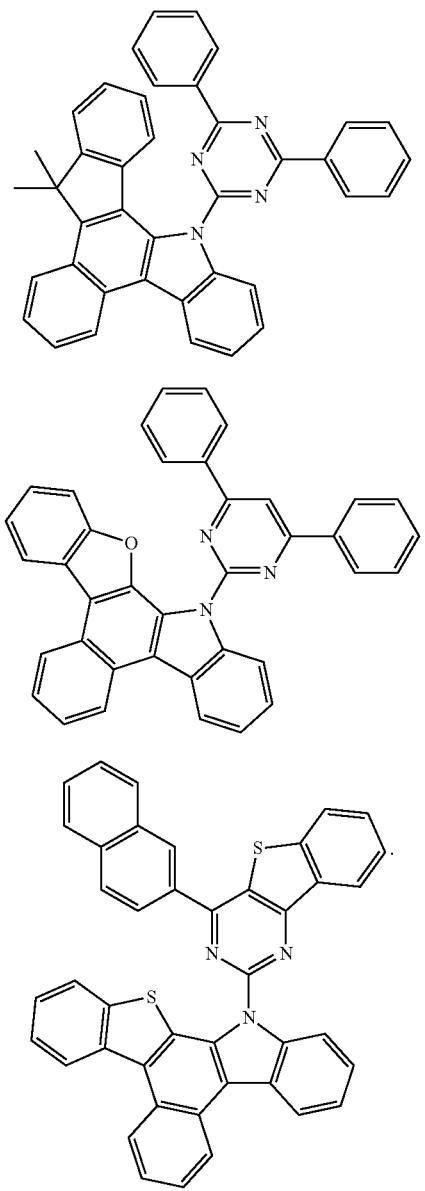

P2-26

P2-27

P2-28

7. The organic electric element as claimed in claim 1, wherein the emission-auxiliary layer comprising the compound represented by Formula 1, singly or as a mixture of two or more.

8. The organic electric element as claimed in claim 1, wherein the emission-auxiliary layer comprising the compound represented by Formula 1, singly or as a mixture of two or more, and the hole transport layer comprising a compound represented by Formula 7 below, singly or as a mixture of two or more:

[Formula 7]

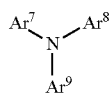

wherein, $Ar^9$ is any one of Formula 7-1 to 7-3 below,

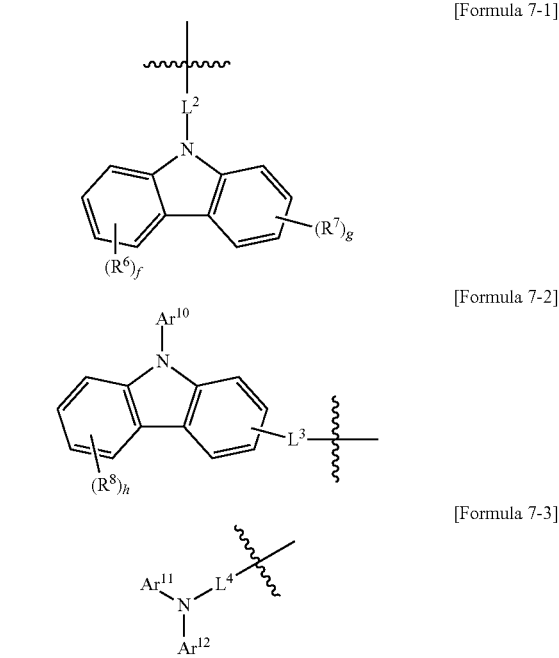

[Formula 7-1]

[Formula 7-2]

[Formula 7-3]

Wherein, $Ar^7$, $Ar^8$, $Ar^{10}$ to $Ar^{12}$ are independently selected from the group consisting of a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N($R^a$)($R^b$), $R^6$ to $R^8$ are independently selected from the group consisting of hydrogen, deuterium, halogen, a $C_6$-$C_{60}$ aryl group, a fluorenyl group, a $C_2$-$C_{60}$ heterocyclic group containing at least one heteroatom selected from the group consisting of O, N, S, Si, and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, and -L'-N($R^a$)($R^b$), and any two adjacent groups of $R^6$s to $R^8$s are optionally linked together to form a fused ring, f, g, and h are each an integer from 1 to 4, $L^2$ and $L^4$ are selected from the group consisting of a $C_6$-$C_{60}$ arylene group, a fluorenylene group, a fused ring group of a $C_3$-$C_{60}$ aliphatic ring and a $C_6$-$C_{60}$ aromatic ring, and a $C_2$-$C_{60}$ heterocyclic group containing at least one heteroatom selected from the group consisting of O, N, S, Si, and P, $L^3$ is selected from the group consisting of a single bond, a $C_6$-$C_{60}$ arylene group, a fluorenylene group, a fused ring group of a $C_3$-$C_{60}$ aliphatic ring and a $C_6$-$C_{60}$ aromatic ring, and a $C_2$-$C_{60}$ heterocyclic group containing at least one heteroatom selected from the group consisting of O, N, S, Si, and P, L', $R^a$ and $R^b$ are defined as in claim 1, and, with the provisos that when $Ar^7$, $Ar^8$, $Ar^{10}$, $Ar^{11}$, $Ar^{12}$, and $R^6$ to $R^8$ are the aryl group, fluorenyl group, heterocyclic group, fused ring group, alkyl group, alkenyl group, alkynyl group, alkoxy group or aryloxy group, and $L^1$ to $L^3$ are arylene group, fluorenylene group, fused ring group, or heterocyclic group, $Ar^7, Ar^8, Ar^{10}, Ar^{11}, Ar^{12}, R^6$ to $R^8$ and $L^1$ to $L^3$ may be substituted by one or more substituents selected from the group consisting of deuterium, halogen, a silane group, a siloxane group, a boron group, a germanium group, a cyano group, a nitro group, a $C_1$-$C_{20}$ alkylthio group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted by deuterium, a fluorenyl group, a $C_2$-$C_{20}$ heterocyclic group containing at least one heteroatom selected from the group consisting of O, N, S, Si, and P, a $C_3$-$C_{20}$ cycloalkyl group, a $C_7$-$C_{20}$ arylalkyl group, a $C_8$-$C_{20}$ arylalkenyl group, an arylamine group and a heteroarylamine group.

9. The organic electric element as claimed in claim 8, wherein Formula 7 comprising any one of compounds below:

3-1
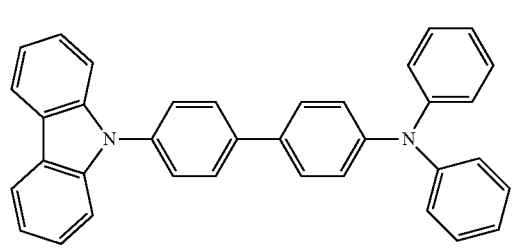

3-2
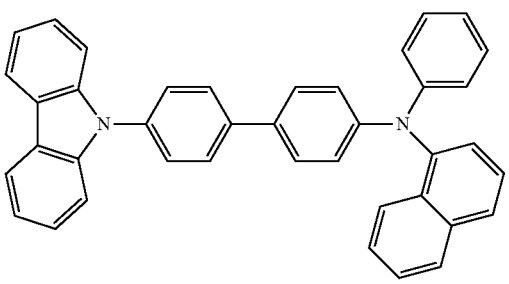

3-3
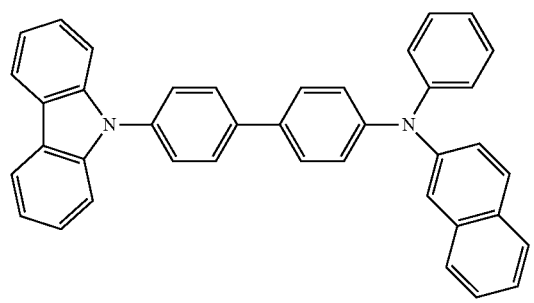

3-4
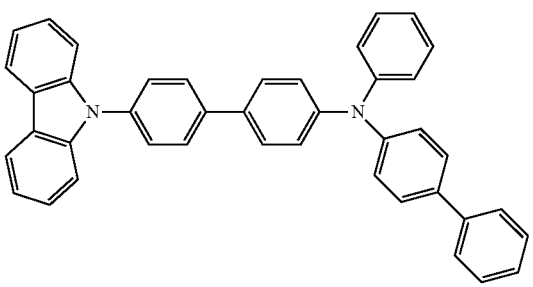

3-5
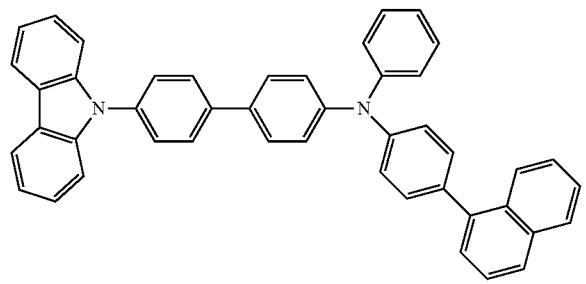

3-6
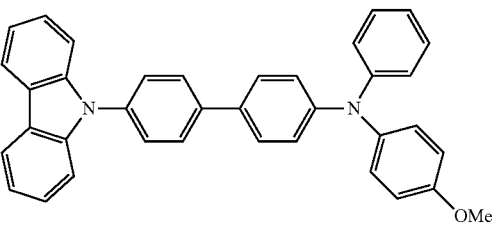

3-7
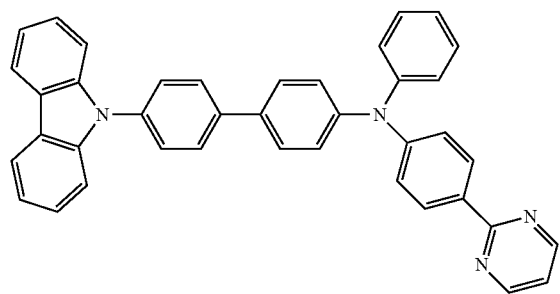

3-8
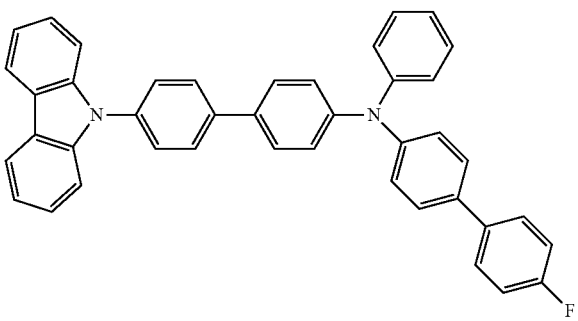

-continued
3-9
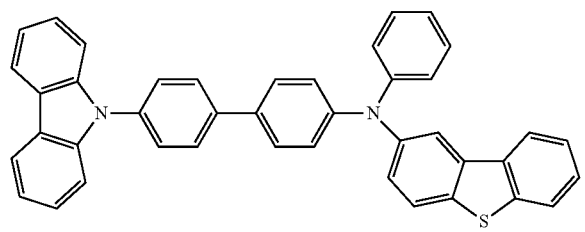
3-10
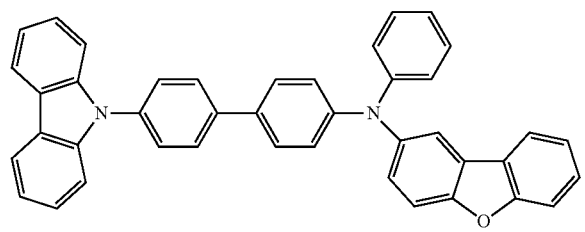
3-11
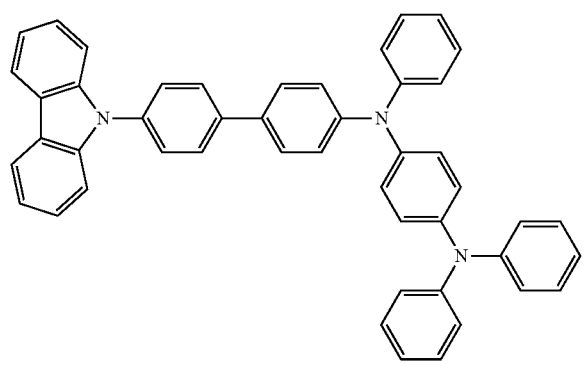
3-12
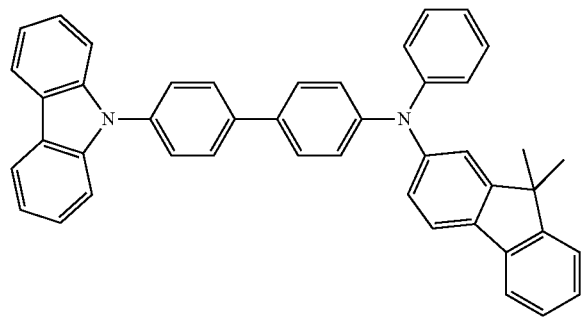
3-13
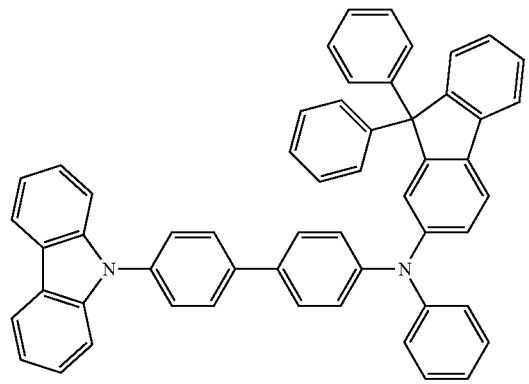
3-14
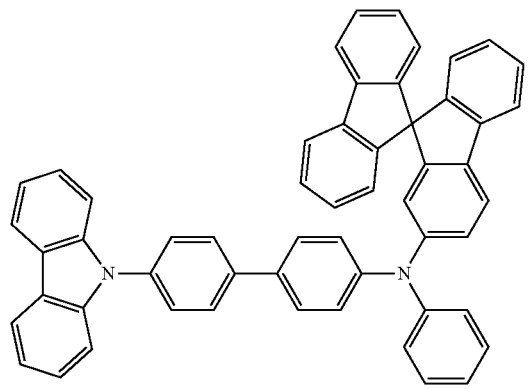
3-15
3-16
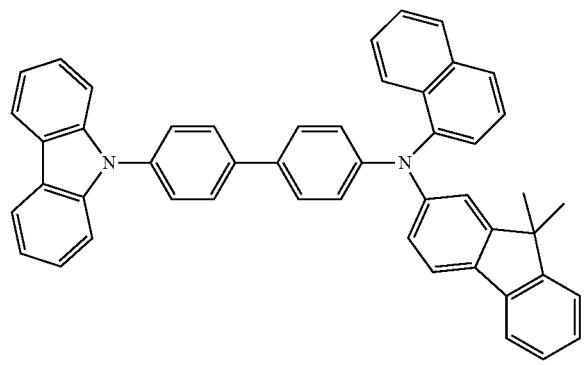

-continued
3-17
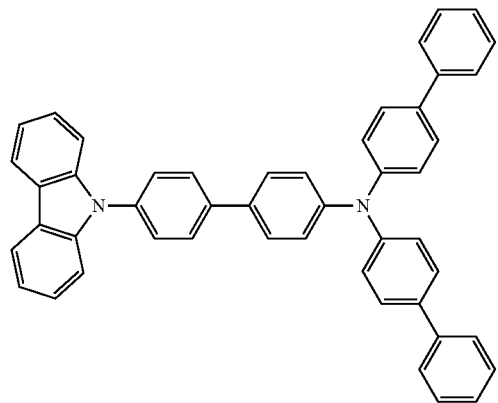
3-18
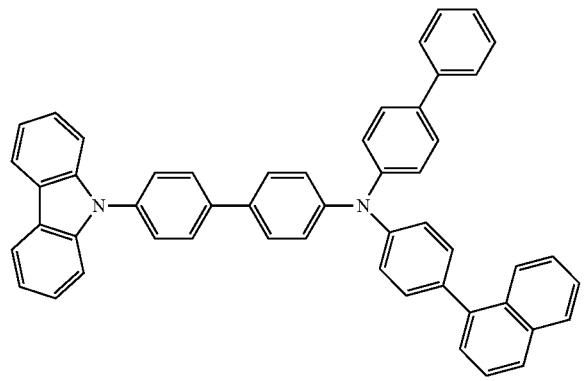
3-19
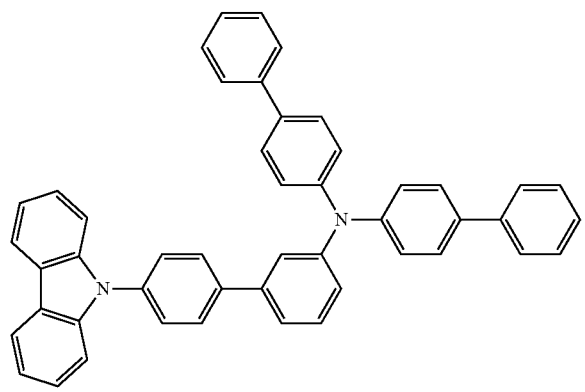
3-20
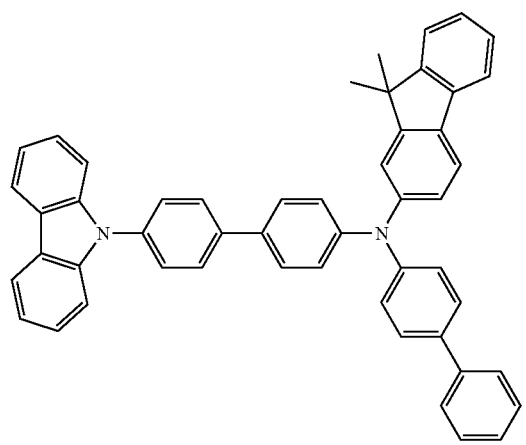
3-21
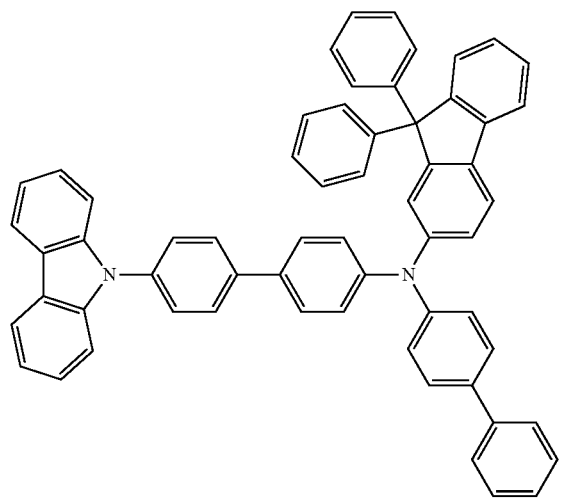
3-22
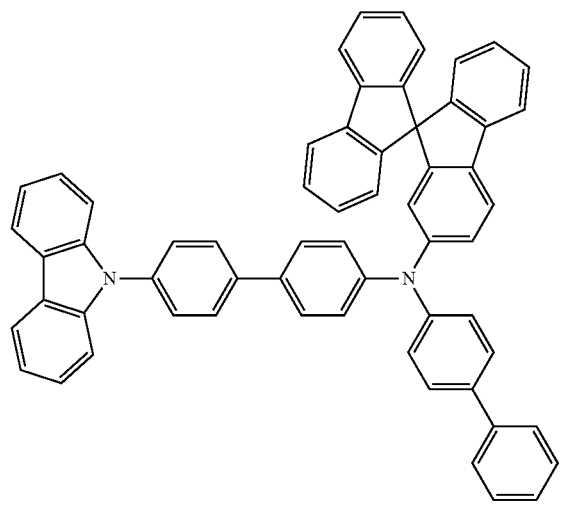

-continued
3-23
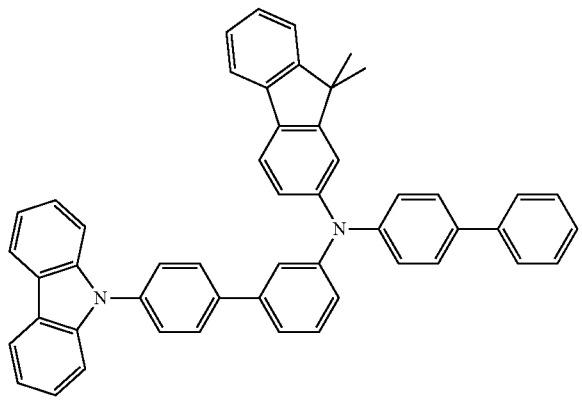
3-24
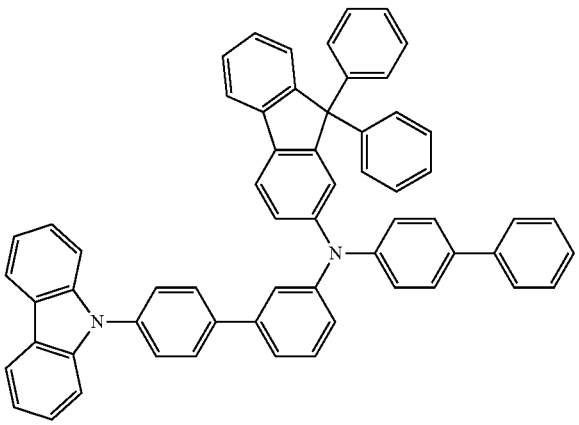
3-25
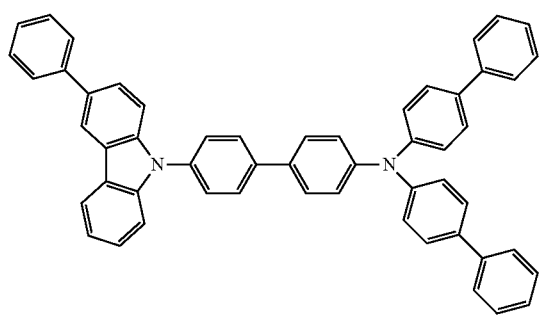
3-26
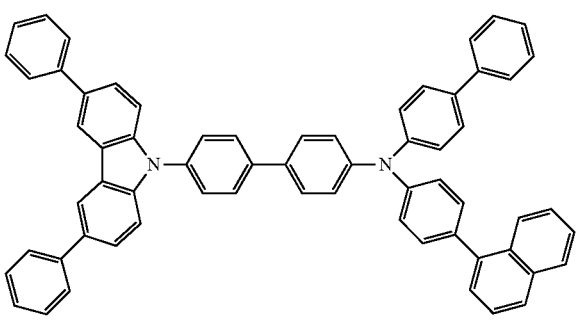
3-27
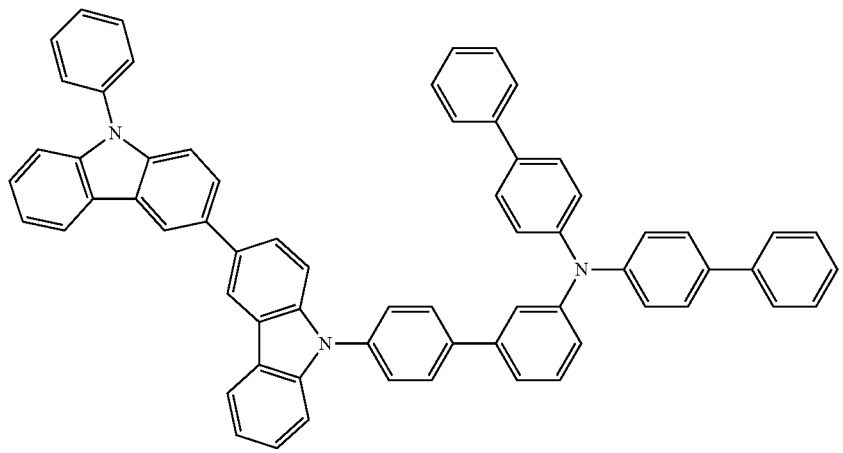
3-28
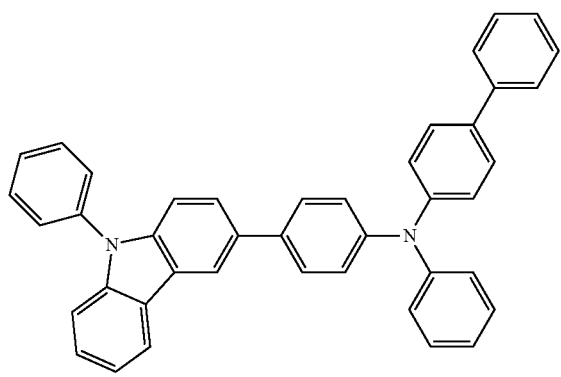
3-29
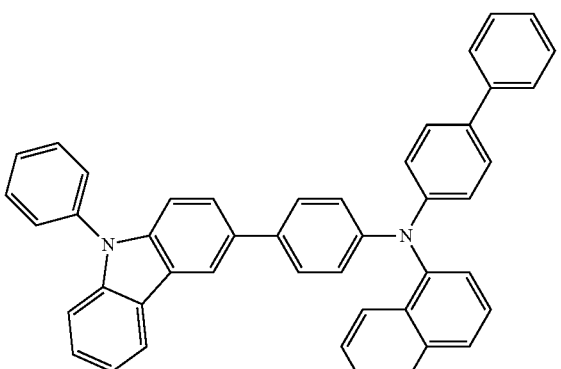

-continued
3-30
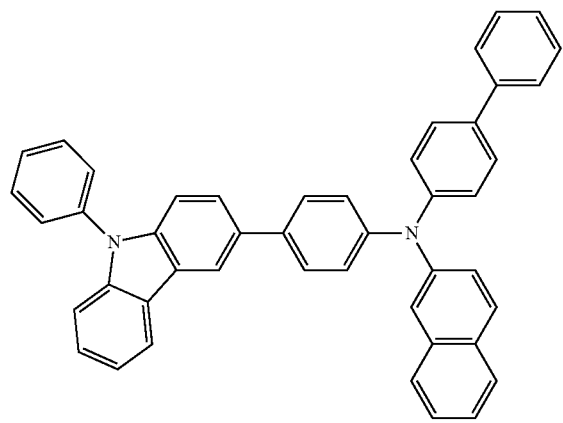
3-31
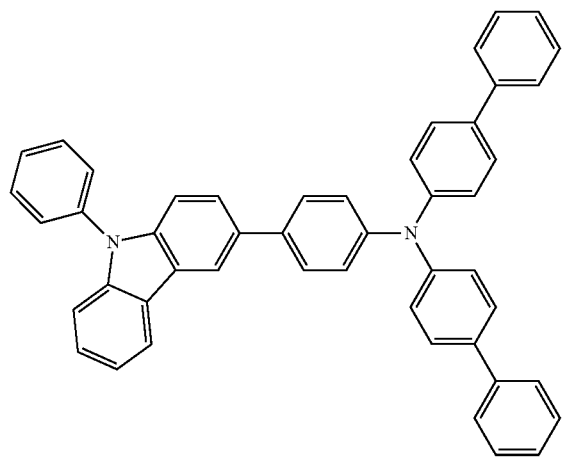
3-32
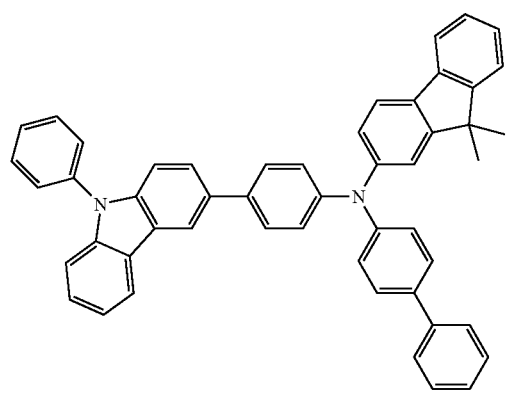
3-33
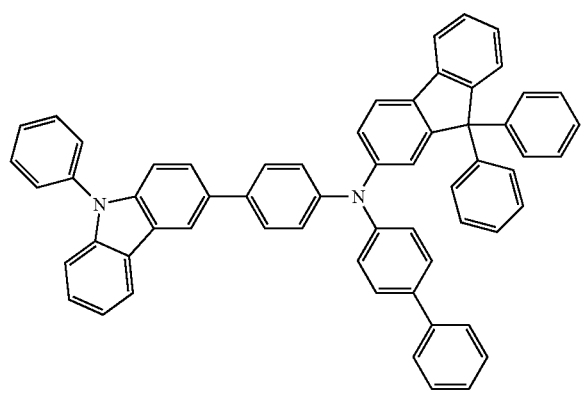
3-34
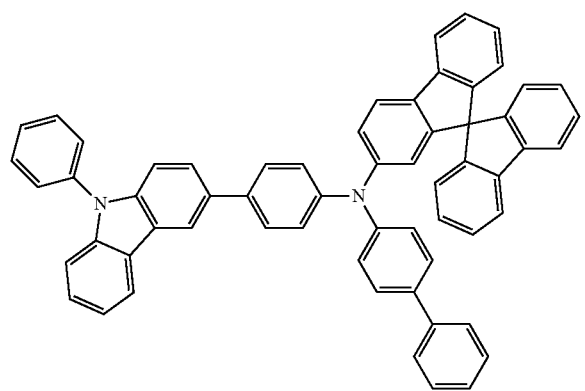
3-35
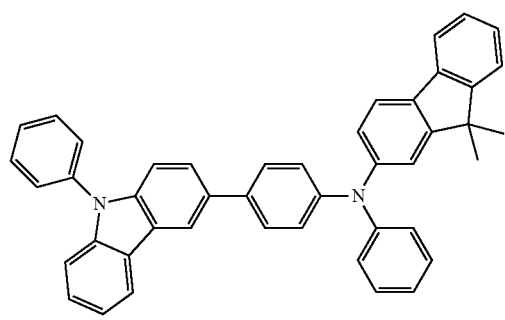

-continued
3-36
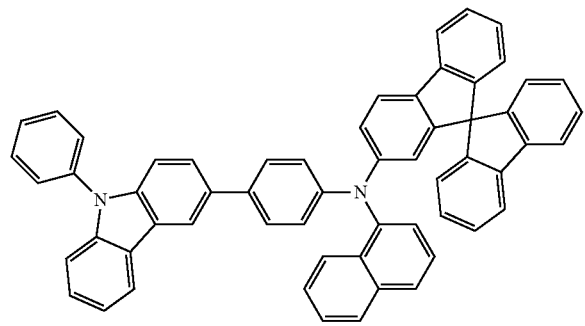
3-37
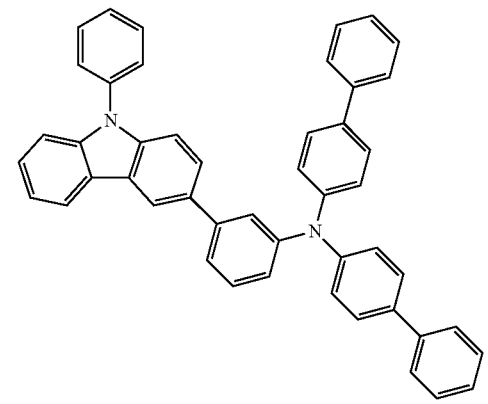
3-38
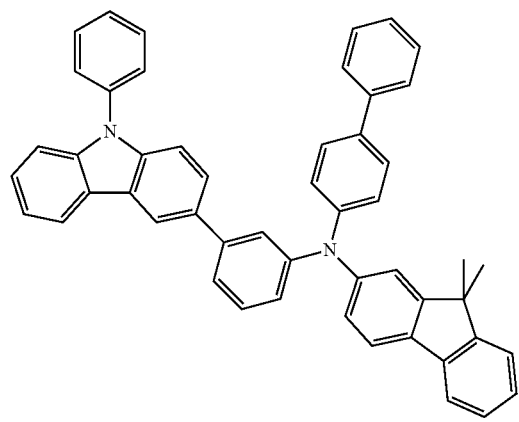
3-39
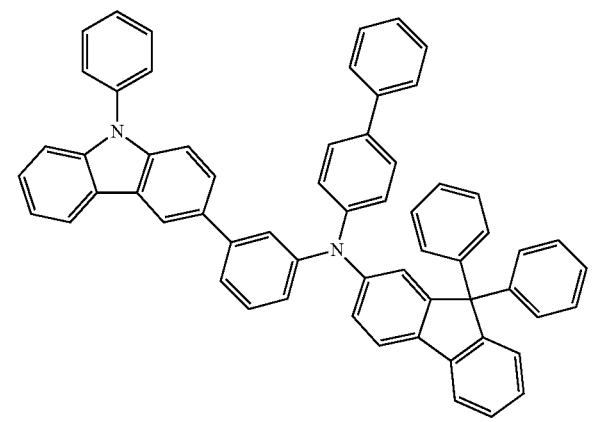
3-40
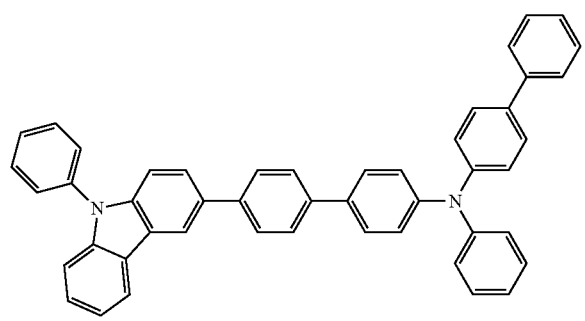
3-41
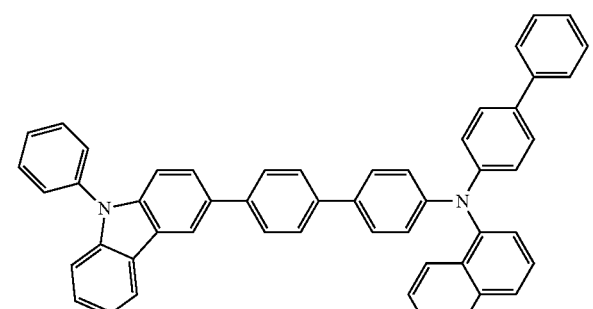
3-42
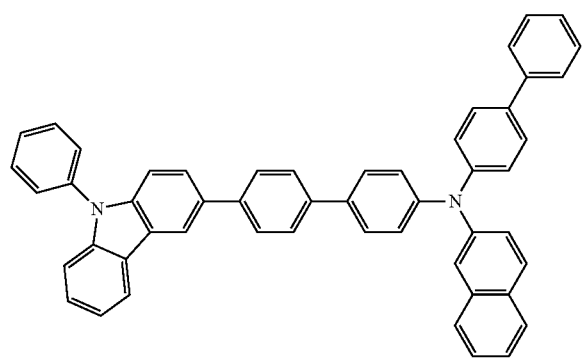
3-43
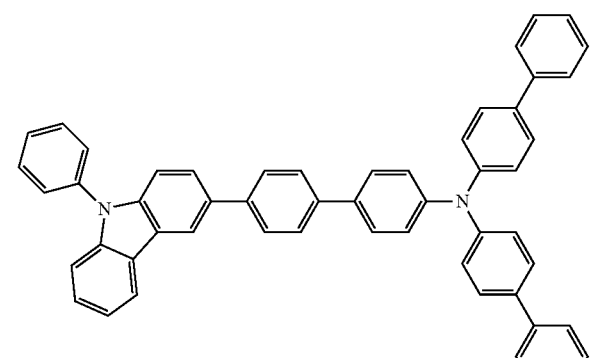

-continued
3-44
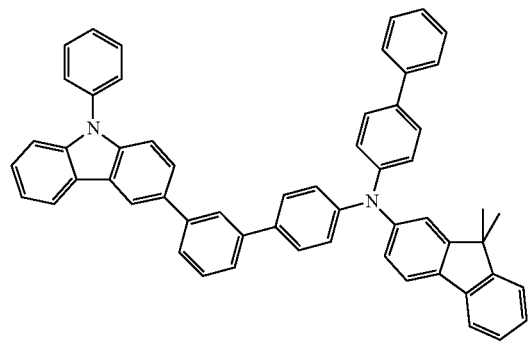
3-45
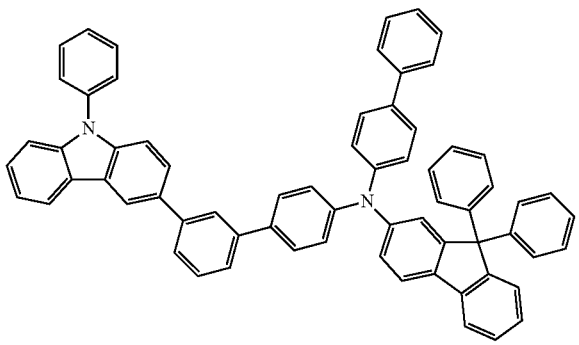
3-46
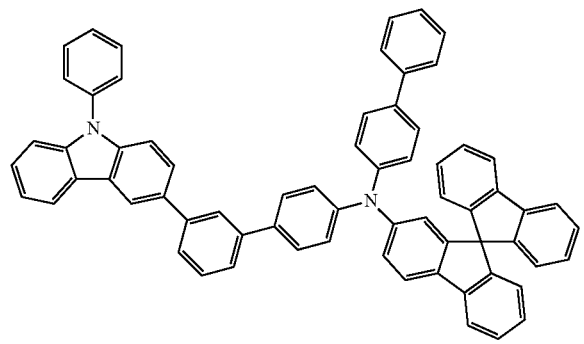
3-47
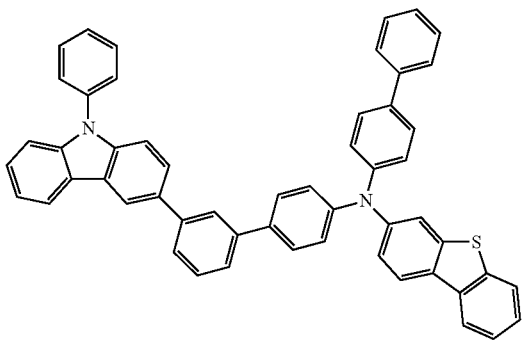
3-48
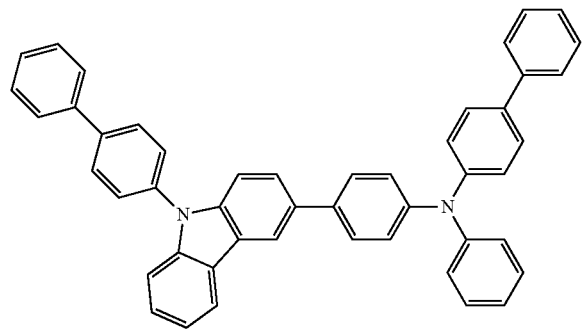
3-49
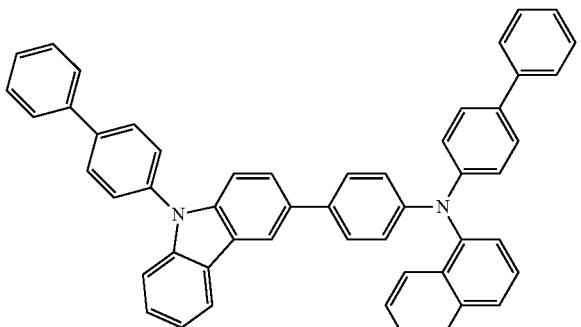
3-50
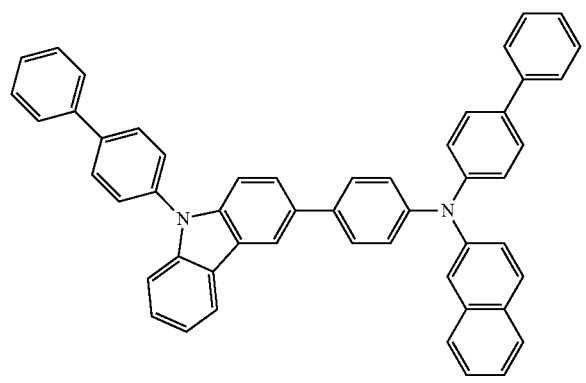
3-51
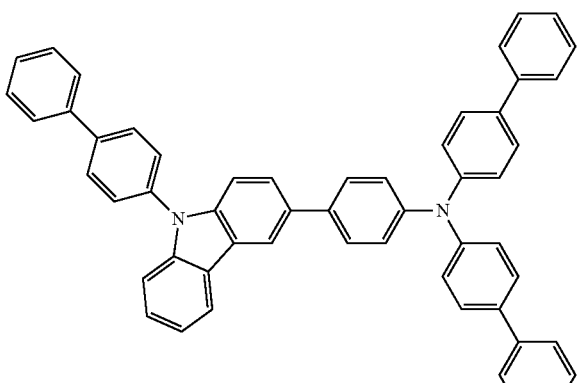

-continued
3-52
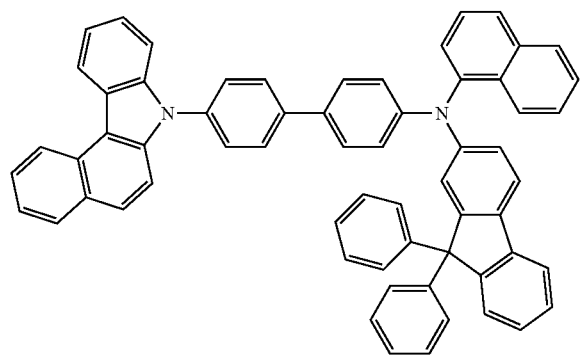
3-53
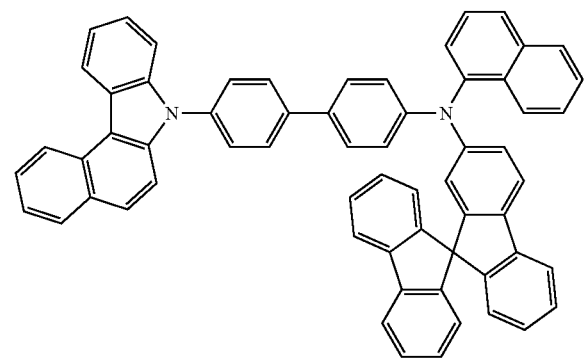
3-54
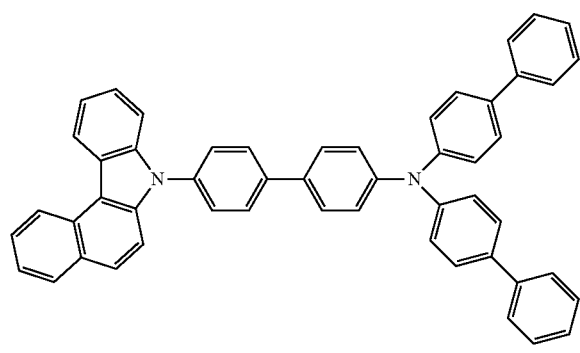
3-55
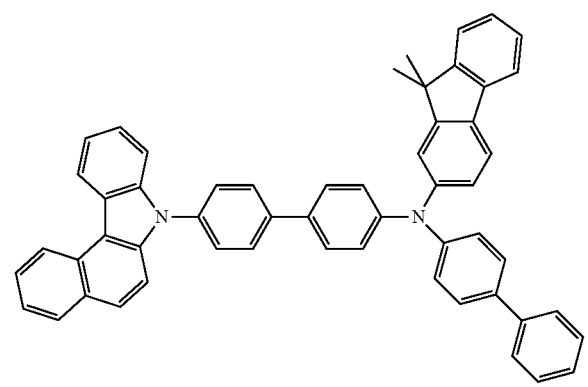
3-56
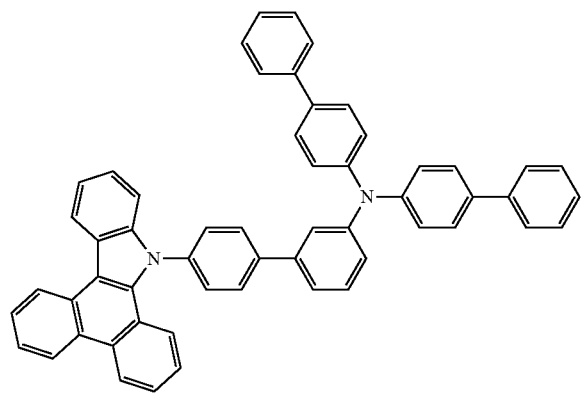
3-57
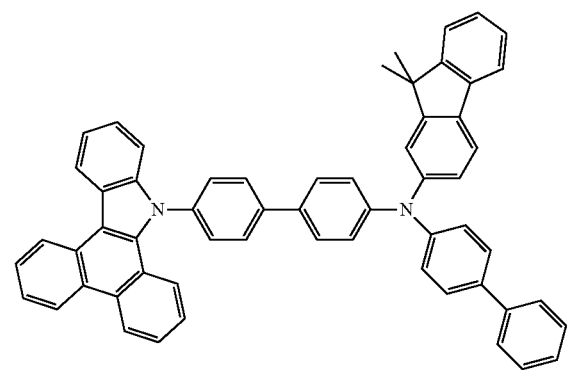

-continued
3-58
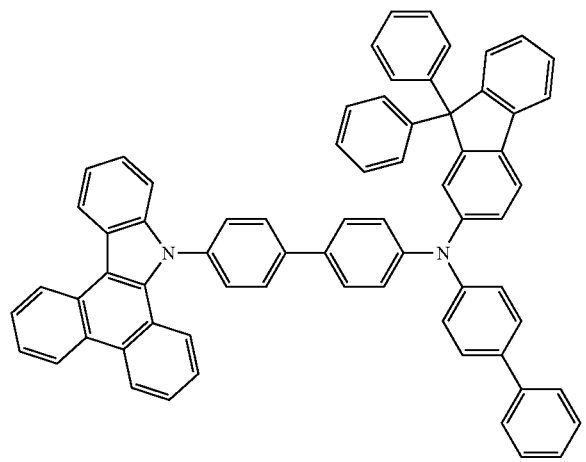
3-59
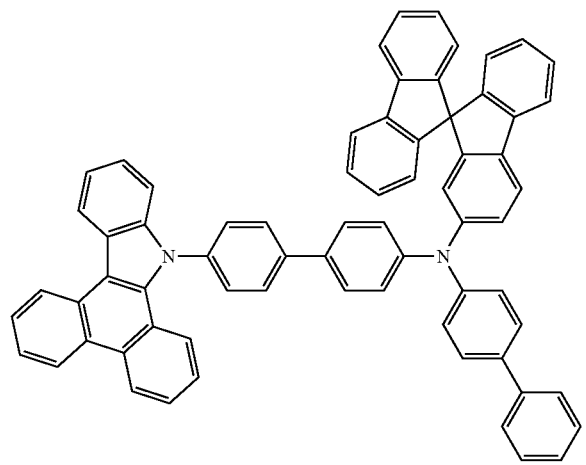
3-60
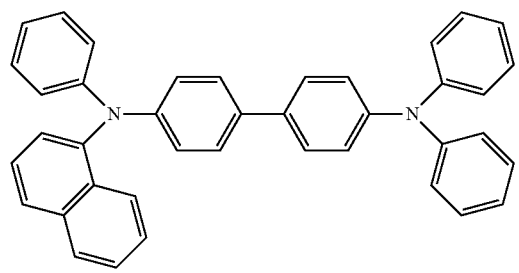
3-61
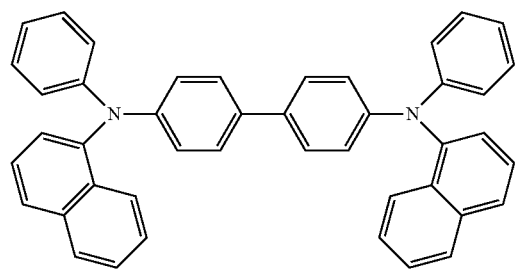
3-62
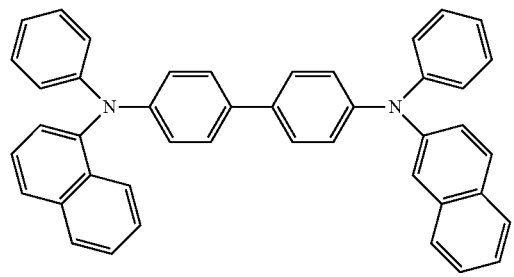
3-63
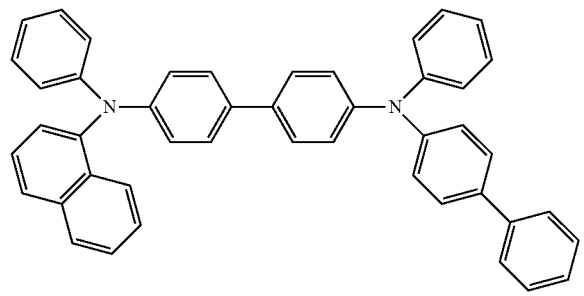
3-64
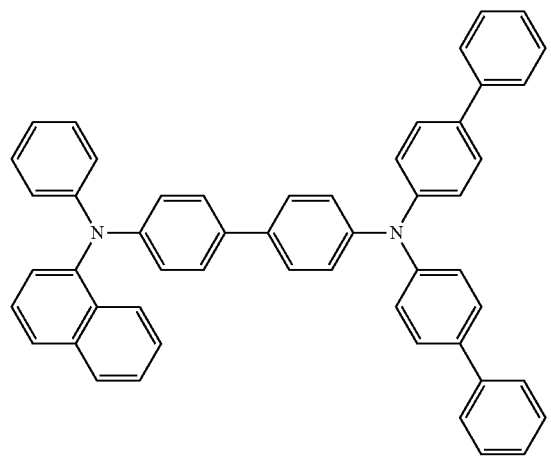
3-65
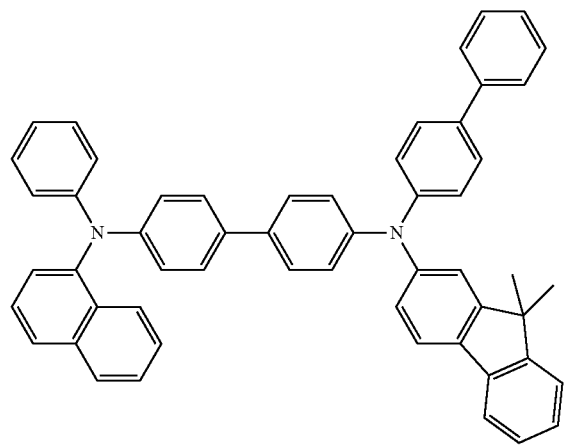

3-66
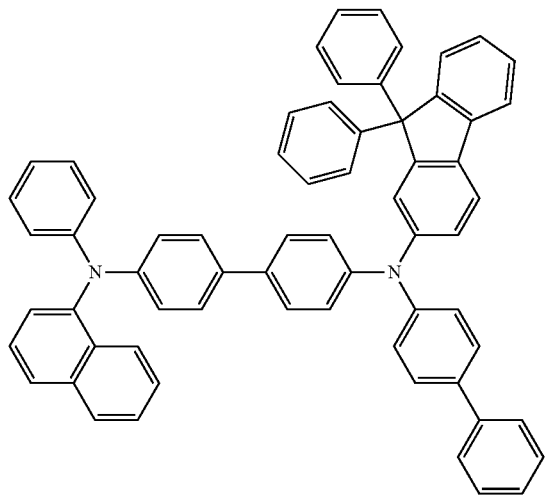

3-67
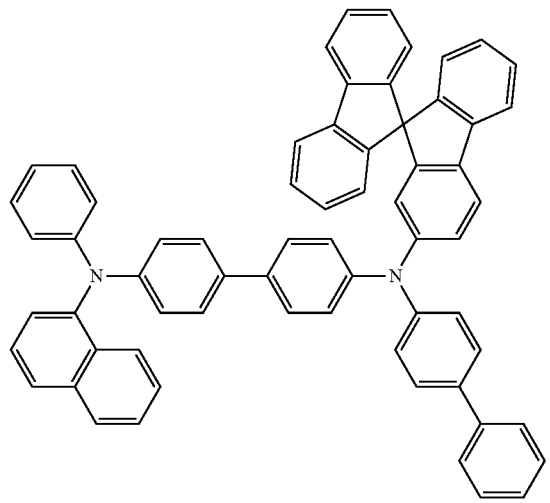

3-68
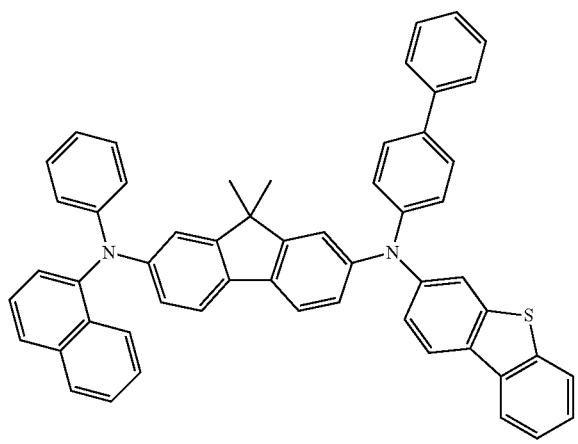

3-69
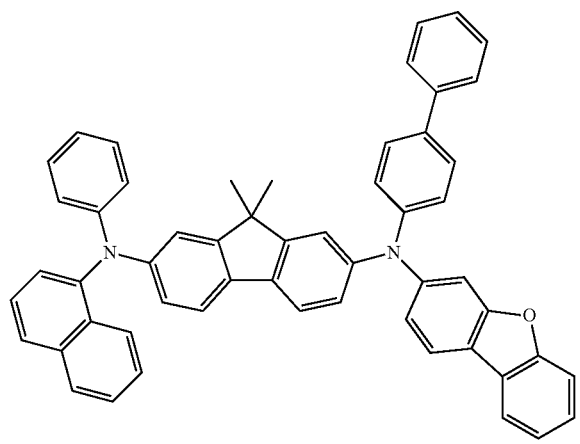

3-70
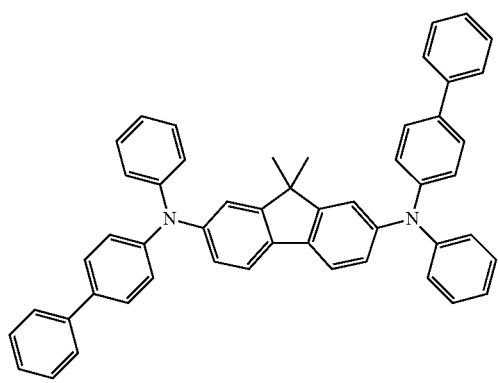

3-71
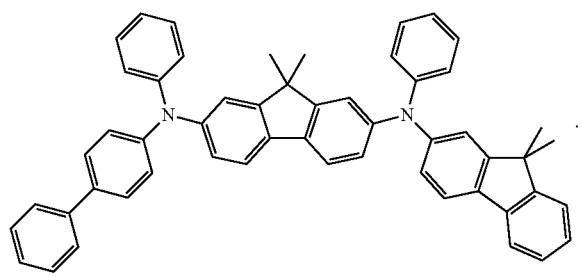

10. The organic electric element as claimed in claim 1, wherein the organic electric element further including at least a layer to improve luminous efficiency which is formed on at least one of the sides the first and second electrodes, which is opposite to the organic material layer.

11. The organic electric element as claimed in claim 1, wherein the organic material layer is formed by any one of the process of spin coating, nozzle printing, inkjet printing, slot coating, dip coating and roll-to-roll.

12. An electronic device comprising a display device, which comprises the organic electric element as claimed in claim 1, and a control unit for driving the display device.

13. The electronic device as claimed in claim 12, wherein the organic electric element is one selected from the group consisting of an organic light emitting diode, an organic solar cell, an organic photo conductor, an organic transistor, and an element for monochromatic or white illumination.

* * * * *